(12) United States Patent
Uchida et al.

(10) Patent No.: US 11,652,115 B2
(45) Date of Patent: May 16, 2023

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Tetsuya Uchida, Kanagawa (JP); Ryoji Suzuki, Kanagawa (JP); Yoshiharu Kudoh, Kanagawa (JP); Hiroyuki Mori, Kanagawa (JP); Harumi Tanaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 81 days.

(21) Appl. No.: 16/758,537

(22) PCT Filed: Nov. 9, 2018

(86) PCT No.: PCT/JP2018/041669
§ 371 (c)(1),
(2) Date: Apr. 23, 2020

(87) PCT Pub. No.: WO2019/093479
PCT Pub. Date: May 16, 2019

(65) Prior Publication Data
US 2020/0266221 A1    Aug. 20, 2020

(30) Foreign Application Priority Data

Nov. 9, 2017    (JP) .............................. JP2017-216078
Oct. 9, 2018    (JP) .............................. JP2018-190802
Nov. 6, 2018    (JP) .............................. JP2018-208680

(51) Int. Cl.
*H01L 27/146* (2006.01)

(52) U.S. Cl.
CPC ...... *H01L 27/1461* (2013.01); *H01L 27/1463* (2013.01); *H01L 27/1464* (2013.01);
(Continued)

(58) Field of Classification Search
CPC .......... H01L 27/1464; H01L 27/14623; H01L 27/1463
See application file for complete search history.

(56) References Cited

U.S. PATENT DOCUMENTS 5,235,196 A * 8/1993 Anagnostopoulos ....................... H01L 27/14831
257/230
9,887,217 B2 * 2/2018 Ahn ................... H04N 5/37452
(Continued)

FOREIGN PATENT DOCUMENTS

JP    2011-049445    3/2011
JP    2013-065888    4/2013
(Continued)

OTHER PUBLICATIONS

International Search Report and Written Opinion prepared by the Japanese Patent Office dated Jan. 4, 2019, for International Application No. PCT/JP2018/041669.

*Primary Examiner* — David A Zarneke
(74) *Attorney, Agent, or Firm* — Sheridan Ross PC

(57) ABSTRACT

The present technology relates to a solid-state imaging device capable of suppressing deterioration in dark characteristics, and an electronic apparatus. The present invention is provided with: a photoelectric conversion section that performs photoelectric conversion; a charge retaining section that temporarily retains electric charge converted by the photoelectric conversion section; and a first trench formed in a semiconductor substrate between the photoelectric conversion section and the charge retaining section, the first trench being higher than the photoelectric conversion sec- (Continued)

tion in a depth direction of the semiconductor substrate. Alternatively, the first trench is lower than the photoelectric conversion section and higher than the charge retaining section in the depth direction of the semiconductor substrate. The present technology can be applied to, for example, a back-illuminated CMOS image sensor.

16 Claims, 81 Drawing Sheets

(52) U.S. Cl.
CPC .. *H01L 27/14621* (2013.01); *H01L 27/14623* (2013.01); *H01L 27/14627* (2013.01); *H01L 27/14634* (2013.01); *H01L 27/14636* (2013.01); *H01L 27/14645* (2013.01); *H01L 27/14685* (2013.01); *H01L 27/14689* (2013.01)

(56) References Cited

U.S. PATENT DOCUMENTS

| | | |
|---|---|---|
| 2011/0049336 A1 | 3/2011 | Matsunuma |
| 2013/0070131 A1 | 3/2013 | Ohkubo et al. |
| 2013/0313616 A1 | 11/2013 | Matsunuma |
| 2014/0131779 A1 | 5/2014 | Takeda |
| 2015/0124140 A1 | 5/2015 | Ohkubo et al. |
| 2015/0357363 A1 | 12/2015 | Kawamura |
| 2016/0056199 A1 | 2/2016 | Kim et al. |
| 2016/0111461 A1 | 4/2016 | Ahn |
| 2016/0118422 A1 | 4/2016 | Takeda |
| 2016/0204150 A1 | 7/2016 | Oh et al. |
| 2017/0200754 A1 | 7/2017 | Kawamura |
| 2017/0244920 A1 | 8/2017 | Ohkubo et al. |
| 2018/0026062 A1 | 1/2018 | Takeda |
| 2018/0315785 A1 | 11/2018 | Kawamura |

FOREIGN PATENT DOCUMENTS

| | | |
|---|---|---|
| JP | 2014-096490 | 5/2014 |
| JP | 2015-053411 | 3/2015 |
| JP | 2015-162603 | 9/2015 |
| JP | 2017-147353 | 8/2017 |
| KR | 20110023758 A | 3/2011 |
| KR | 20160044879 A | 4/2016 |
| WO | WO 2017/187957 | 11/2017 |

* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/041669 having an international filing date of 9 Nov. 2018, which designated the United States, which PCT application claimed the benefit of Japanese Patent Application Nos. 2017-216078 filed 9 Nov. 2017; 2018-190802 filed 9 Oct. 2018 and 2018-208680 filed 6 Nov. 2018, the entire disclosures of each of which are incorporated herein by reference.

TECHNICAL FIELD

The present technology relates to a solid-state imaging device and an electronic apparatus, and more particularly to a solid-state imaging device and an electronic apparatus in which a P-type solid-phase diffusion layer and an N-type solid-phase diffusion layer are formed on a sidewall of an inter-pixel light-shielding wall formed between pixels such that a strong electric field region is formed to retain electric charge and a saturation charge amount Qs of each pixel is thus increased.

BACKGROUND ART

Traditionally, there is known a technology in which, for the purpose of increasing a saturation charge amount Qs of each pixel of a solid-state imaging device, a P-type diffusion layer and an N-type diffusion layer are formed on a sidewall of a trench formed between pixels for forming a strong electric field region to retain electric charge (for example, see Patent Document 1).

CITATION LIST

Patent Document

Patent Document 1: Japanese Patent Application Laid-Open No. 2015-162603

SUMMARY OF THE INVENTION

Problems to be Solved by the Invention

However, in the structure disclosed in Patent Document 1, pinning on the light entrance side of a silicon (Si) substrate weakens. As a result, generated electric charge flows into a photodiode, which may deteriorate dark characteristics. For example, white spot may appear or dark current may be generated.

The present technology has been made in view of the above circumstances, and is intended to suppress deterioration in dark characteristics.

Solutions to Problems

A first solid-state imaging device according to one aspect of the present technology includes: a photoelectric conversion section that performs photoelectric conversion; a charge retaining section that temporarily retains electric charge converted by the photoelectric conversion section; and a first trench formed in a semiconductor substrate between the photoelectric conversion section and the charge retaining section, the first trench being higher than the photoelectric conversion section in a depth direction of the semiconductor substrate.

A first electronic apparatus according to one aspect of the present technology is an electronic apparatus equipped with a solid-state imaging device, the solid-state imaging device including: a photoelectric conversion section that performs photoelectric conversion; a charge retaining section that temporarily retains electric charge converted by the photoelectric conversion section; and a first trench formed in a semiconductor substrate between the photoelectric conversion section and the charge retaining section, the first trench being higher than the photoelectric conversion section in a depth direction of the semiconductor substrate.

A second solid-state imaging device according to one aspect of the present technology includes: a photoelectric conversion section that performs photoelectric conversion; a charge retaining section that temporarily retains electric charge converted by the photoelectric conversion section; and a first trench formed in a semiconductor substrate between the photoelectric conversion section and the charge retaining section, the first trench being lower than the photoelectric conversion section and higher than the charge retaining section in a depth direction of the semiconductor substrate.

A second electronic apparatus according to one aspect of the present technology is an electronic apparatus equipped with a solid-state imaging device, the solid-state imaging device including: a photoelectric conversion section that performs photoelectric conversion; a charge retaining section that temporarily retains electric charge converted by the photoelectric conversion section; and a first trench formed in a semiconductor substrate between the photoelectric conversion section and the charge retaining section, the first trench being lower than the photoelectric conversion section and higher than the charge retaining section in a depth direction of the semiconductor substrate.

The first solid-state imaging device according to one aspect of the present technology includes: a photoelectric conversion section that performs photoelectric conversion; a charge retaining section that temporarily retains electric charge converted by the photoelectric conversion section; and a trench formed in a semiconductor substrate between the photoelectric conversion section and the charge retaining section, the trench being higher than the photoelectric conversion section in a depth direction of the semiconductor substrate.

The first electronic apparatus according to one aspect of the present technology includes the first solid-state imaging device.

The second solid-state imaging device according to one aspect of the present technology includes: a photoelectric conversion section that performs photoelectric conversion; a charge retaining section that temporarily retains electric charge converted by the photoelectric conversion section; and a trench formed in a semiconductor substrate between the photoelectric conversion section and the charge retaining section, the trench being lower than the photoelectric conversion section and higher than the charge retaining section in a depth direction of the semiconductor substrate.

The second electronic apparatus according to one aspect of the present technology includes the second solid-state imaging device.

Effects of the Invention

According to the present technology, deterioration in dark characteristics can be prevented.

Note that the effects described herein are not necessarily limitative, and any of the effects described in the present disclosure may be exhibited.

BRIEF DESCRIPTION OF DRAWINGS

FIG. 73 is a plan view showing a configuration example in a case where two pixels share an FD or the like.

MODE FOR CARRYING OUT THE INVENTION

Hereinafter, the best mode for carrying out the present technology (hereinafter, referred to as an embodiment) will be described in detail with reference to the drawings.

Since the present technology can be applied to an imaging device, a case in which the present technology is applied to an imaging device will be described here as an example. Note that, here, the description will be given by taking an imaging device as an example, but the present technology is not limited to being applied to an imaging device, and is applicable to electronic apparatus in general which uses an imaging device for an image capturing section (photoelectric conversion section), such as: an imaging device including a digital still camera, a video camera, and the like; a mobile terminal device having an imaging function such as a mobile phone; and a copier that uses an imaging device for an image reader. It should be noted that a module-type configuration mounted on an electronic apparatus, that is, a camera module, may be defined as an imaging device.

Figure 1:
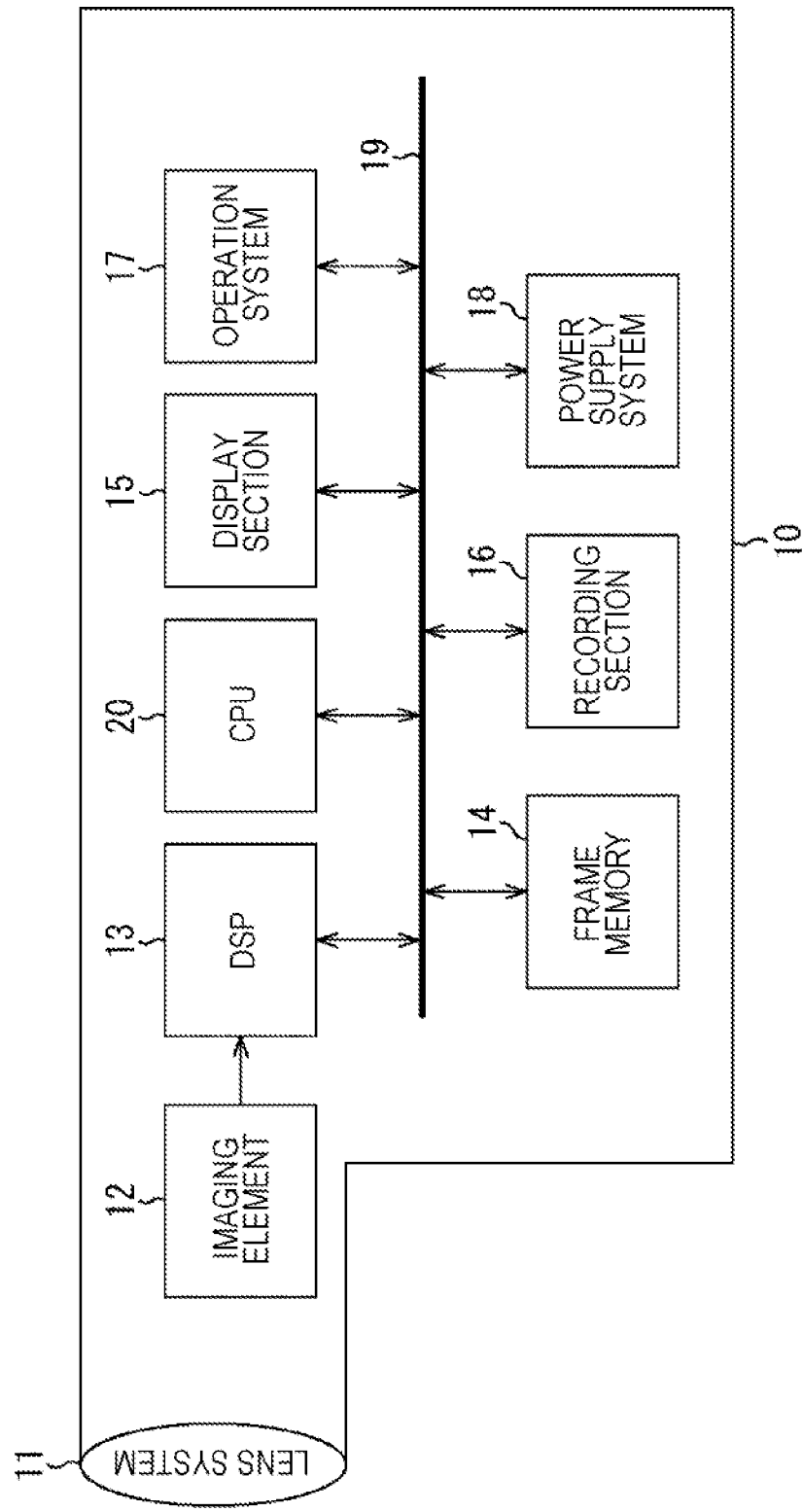
FIG. 1 is a diagram showing a configuration example of an imaging device.

FIG. 1 is a block diagram illustrating a configuration example of an imaging device that is an example of an electronic apparatus according to the present disclosure. As shown in FIG. 1, an imaging device 10 includes an optical system including a lens group 11 and the like, an imaging element 12, a DSP circuit 13 serving as a camera signal processor, a frame memory 14, a display section 15, a recording section 16, an operation system 17, a power supply system 18, and the like.

Then, in this configuration, the DSP circuit 13, the frame memory 14, the display section 15, the recording section 16, the operation system 17, and the power supply system 18 are interconnected via a bus line 19. A CPU 20 controls each section in the imaging device 10.

The lens group 11 captures incident light (image light) from a subject and forms an image on an imaging surface of the imaging element 12. The imaging element 12 converts the amount of incident light formed into an image on the imaging surface by the lens group 11 into an electric signal on a pixel-by-pixel basis and outputs the electric signal as a pixel signal. As the imaging element 12, an imaging element (image sensor) including pixels described below can be used.

The display section 15 includes a panel-type display section such as a liquid crystal display section or an organic electro luminescence (EL) display section, and displays a moving image or a still image captured by the imaging element 12. The recording section 16 records the moving image or the still image captured by the imaging element 12 on a recording medium such as a video tape or a digital versatile disk (DVD).

The operation system 17 issues operation commands for various functions of the imaging device according to an operation performed by a user. The power supply system 18 appropriately supplies various power supplies, which are operation power supplies for the DSP circuit 13, the frame memory 14, the display section 15, the recording section 16, and the operation system 17, to these power supply targets.

<Configuration of Imaging Element>

Figure 2:
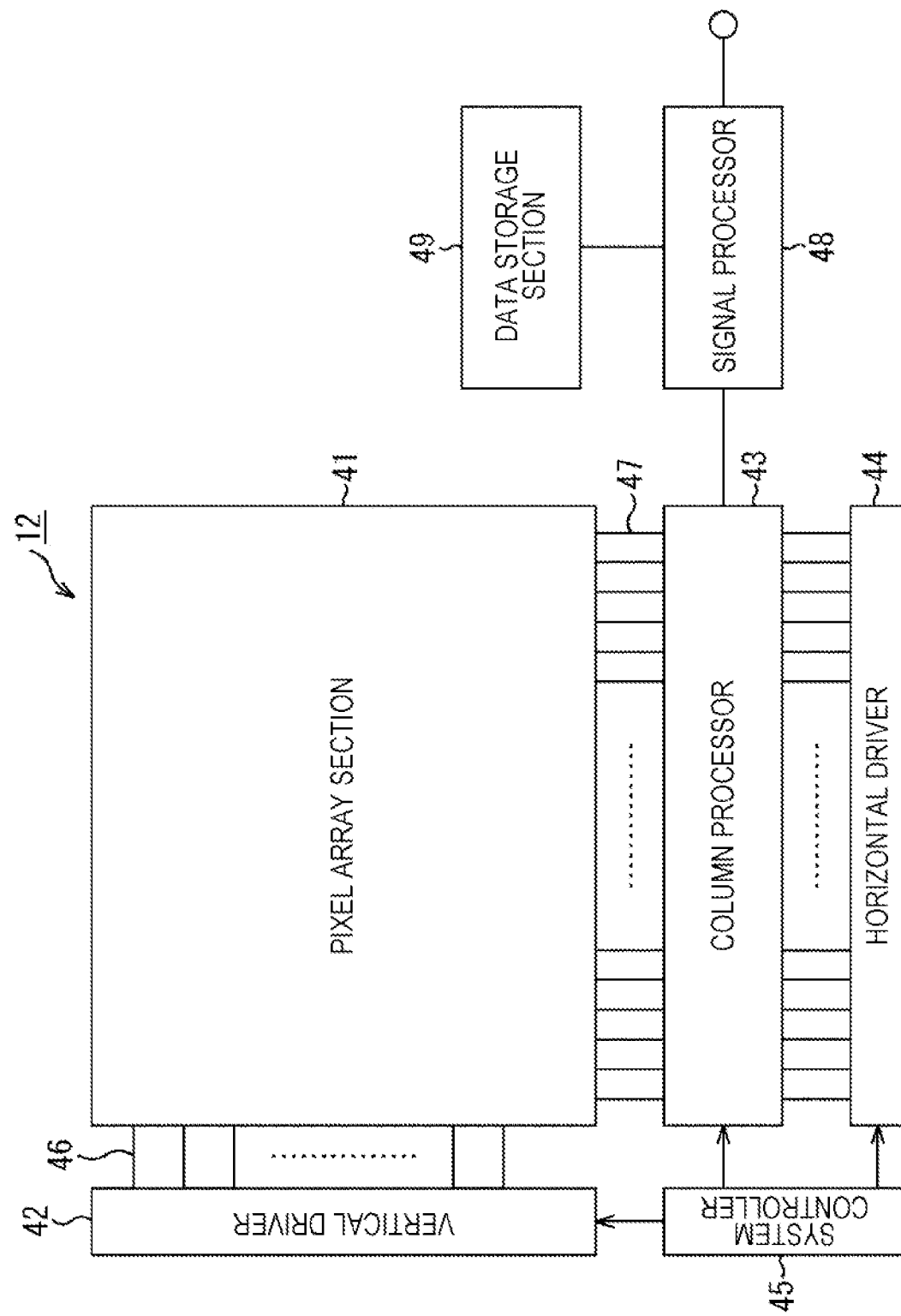
FIG. 2 is a diagram showing a configuration example of an imaging element.

FIG. 2 is a block diagram showing a configuration example of the imaging element 12. The imaging element 12 can be a complementary metal oxide semiconductor (CMOS) image sensor.

The imaging element 12 includes a pixel array section 41, a vertical driver 42, a column processor 43, a horizontal driver 44, and a system controller 45. The pixel array section 41, the vertical driver 42, the column processor 43, the horizontal driver 44, and the system controller 45 are formed on a semiconductor substrate (chip) not shown.

In the pixel array section 41, unit pixels (for example, the pixel 50 in FIG. 3) are two-dimensionally arrayed in a matrix, each unit pixel having a photoelectric conversion element that generates photoelectric charges in an amount corresponding to the amount of incident light and stores the generated photoelectric charges therein. Note that, in the following, photoelectric charges in an amount corresponding to the amount of incident light may be simply referred to as "electric charges", and the unit pixel may be simply referred to as "pixel".

The pixel array section 41 is also provided with pixel drive lines 46 and vertical signal lines 47 with respect to the pixels arrayed in a matrix. The pixel drive lines 46 are formed for each row along the horizontal direction (arraying direction of pixels in each pixel row) in the figure, and the vertical signal lines 47 are formed for each column along the vertical direction (arraying direction of pixels in each column) in the figure. One ends of the pixel drive lines 46 are connected to output ends of the vertical driver 42 corresponding to the respective rows.

The imaging element 12 further includes a signal processor 48 and a data storage section 49. The signal processor 48 and the data storage section 49 may be implemented by an external signal processor, for example, a digital signal processor (DSP), provided on a separate substrate from the imaging element 12 or implemented by a process of software, or may be provided on the same substrate as the imaging element 12.

The vertical driver 42 is a pixel driver that includes a shift register, an address decoder, and the like, and that drives all pixels in the pixel array section 41 simultaneously or drives the pixels in the pixel array section 41 on, for example, a row-by-row basis. Although the specific configuration of the vertical driver 42 is not shown, the vertical driver 42 has a configuration including a read scanning system and a sweep scanning system. Alternatively, the vertical driver 42 has a configuration in which a batch sweep and a batch transfer are performed.

The read scanning system selectively scans the unit pixels in the pixel array section 41 sequentially on a row-by-row basis in order to read signals from the unit pixels. In a case of row driving (a rolling shutter operation), when a sweep operation is performed, a sweep scanning operation is performed on a read row which is subjected to a read scanning operation by the read scanning system, prior to the read scanning operation by the time corresponding to a shutter speed. Furthermore, in a case of global exposure (a global shutter operation), a batch sweep operation is performed prior to a batch transfer operation by the time corresponding to a shutter speed.

Due to the sweeping operation described above, unnecessary electric charges are swept (reset) from the photoelectric conversion elements of the unit pixels in the read row. Then, a so-called electronic shutter operation is performed in such a manner that unnecessary electric charges are swept (reset). In this case, the electronic shutter operation means an operation in which photoelectric charges in the photoelectric conversion element are removed and exposure is started anew (accumulation of the photoelectric charges is started).

The signal which is read by the read operation of the read scanning system corresponds to an amount of light which is received immediately before the read operation or received after the electronic shutter operation. In a case of row driving, a period from the reading time by the preceding read operation or the sweeping time by the electronic shutter operation to the reading time by the current read operation is set to an accumulation period (an exposure period) of photoelectric charges in the unit pixel. In a case of the global exposure, a period from a batch sweep to a batch transfer is set to the accumulation period (the exposure period).

Pixel signals output from the unit pixels in the pixel row selectively scanned by the vertical driver 42 are supplied to the column processor 43 through the corresponding vertical signal lines 47. The column processor 43 performs, for each pixel column of the pixel array section 41, a predetermined signal process on pixel signals output from the unit pixels in the selected row through the vertical signal lines 47, and temporarily stores the pixel signals which have been subjected to the predetermined signal process.

Specifically, the column processor 43 performs at least a noise removal process, for example, a correlated double sampling (CDS) process as a signal process. Due to the correlated double sampling by the column processor 43, fixed pattern noise unique to pixels, such as reset noise and variation in threshold value of an amplifier transistor, is removed. Note that the column processor 43 may have, for example, an analog-digital (AD) conversion function in addition to the noise removal function, and output a signal level in digital form.

The horizontal driver 44 includes a shift register, an address decoder, and the like, and selects one by one a unit circuit corresponding to each column of pixels in the column processor 43. Due to the selective scanning by the horizontal driver 44, the pixel signals subjected to the signal process by the column processor 43 are sequentially output to the signal processor 48.

The system controller 45 includes a timing generator that generates various types of timing signals, and the like, and controls drives of the vertical driver 42, the column processor 43, the horizontal driver 44, and the like on the basis of various types of timing signals generated by the timing generator.

The signal processor 48 has at least an addition process function, and performs various signal processes such as an addition process on the pixel signal output from the column processor 43. The data storage section 49 temporarily stores data necessary for the signal process by the signal processor 48.

<Structure of Unit Pixel>

Next, a specific structure of each of the unit pixels 50 arrayed in a matrix in the pixel array section 41 will be described. The pixel 50 described below can reduce a possibility of deterioration in dark characteristics, that is, for example, generation of white spots or occurrence of dark current, which is caused because pinning on the light entrance side of a silicon (Si) substrate (Si substrate 70 in FIG. 3) weakens, and a generated electric charge thus flows into a photodiode (PD 71 in FIG. 3).

<Configuration Example of Pixel According to First Embodiment>

Figure 3:
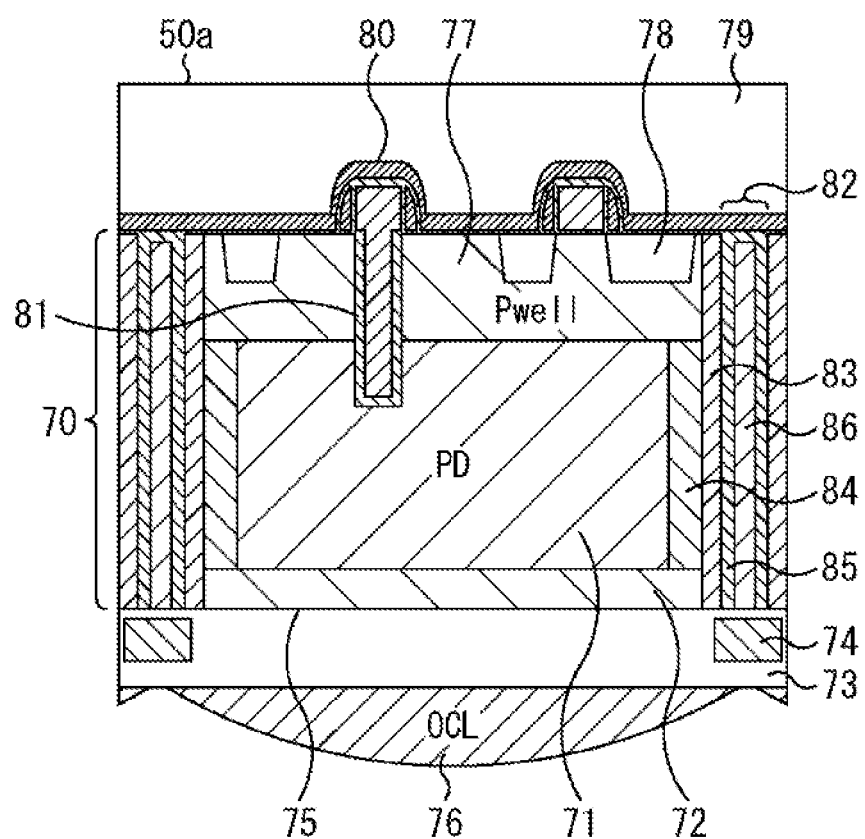
FIG. 3 is a vertical sectional view showing a first configuration example of a pixel to which the present technology is applied.
Figure 4:
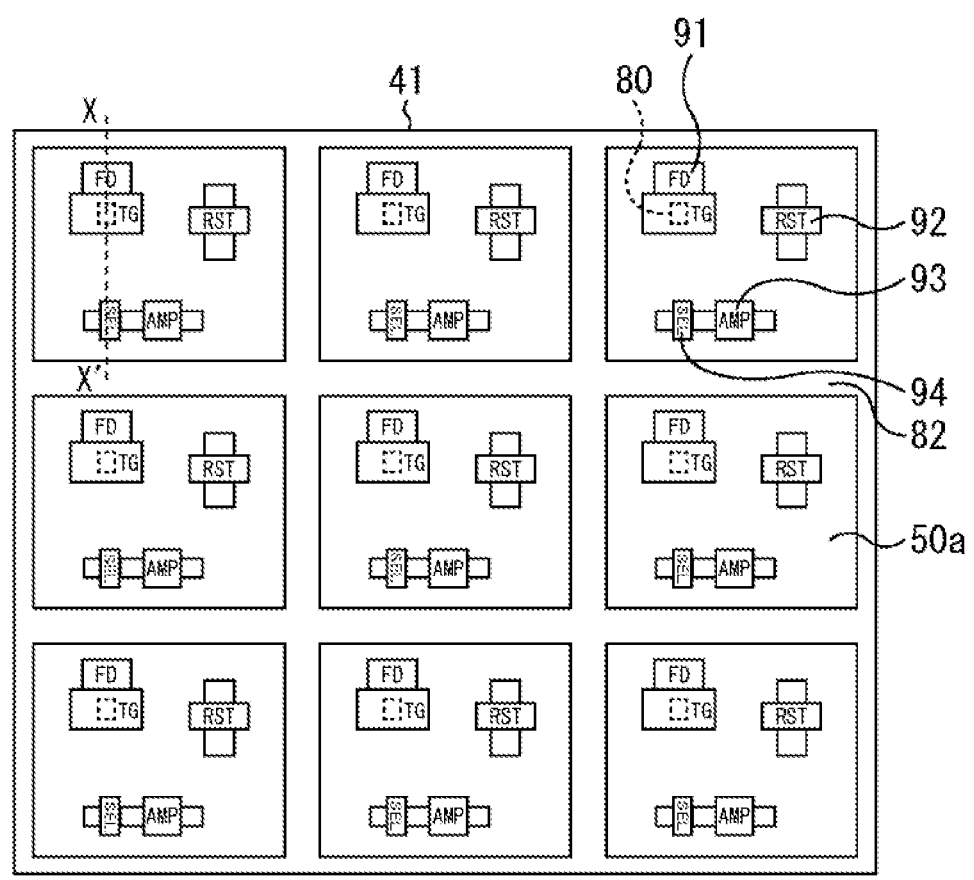
FIG. 4 is a plan view of a front surface side of the pixel to which the present technology is applied according to a first embodiment.

FIG. 3 is a vertical sectional view of a pixel 50a according to the first embodiment of the pixel 50 to which the present technology is applied, and FIG. 4 is a plan view of the front surface side of the pixel 50a. Note that FIG. 3 corresponds to a position along a line X-X' in FIG. 4.

In the following, the pixel 50 will be described as a back-illuminated type as an example. However, the present technology can also be applied to a front-illuminated type.

The pixel 50 shown in FIG. 3 has a photodiode (PD) 71 which is a photoelectric conversion element of each pixel formed inside the Si substrate 70. A P-type region 72 is formed on the light entrance side (in the figure, lower side that is the back surface side) of the PD 71, and a planarized film 73 is formed further below the P-type region 72. The boundary between the P-type region 72 and the planarized film 73 is defined as a backside Si interface 75.

A light-shielding film 74 is formed in the planarized film 73. The light-shielding film 74 is provided to prevent light from leaking into an adjacent pixel, and is formed between adjacent PDs 71. The light-shielding film 74 includes, for example, a metal material such as tungsten (W).

An on-chip lens (OCL) 76 for converging incident light to the PD 71 is formed on the planarized film 73 and on the back surface side of the Si substrate 70. An inorganic material can be used for the OCL 76. For example, SiN, SiO, or SiOxNy ($0<x\leq1$, $0<y\leq1$) can be used.

Although not shown in FIG. 3, a cover glass or a transparent plate such as a resin plate may be bonded on the OCL 76. Further, although not shown in FIG. 3, a color filter layer may be formed between the OCL 76 and the planarized film 73. Furthermore, in the color filter layer, a plurality of color filters may be provided for each pixel, and the colors of the color filters may be arranged, for example, in a Bayer arrangement.

An active region (Pwell) 77 is formed on the side (in the figure, upper side that is the front surface side) reverse to the light entrance side of the PD 71. In the active region 77, a device isolation region (hereinafter, referred to as shallow trench isolation (STI)) 78 for isolating a pixel transistor or the like is formed.

A wiring layer 79 is formed on the front surface side (upper side in the figure) of the Si substrate 70 and on the active region 77, and a plurality of transistors is formed in the wiring layer 79. FIG. 3 shows an example in which a transfer transistor 80 is formed. The transfer transistor (gate) 80 is a vertical transistor. That is, in the transfer transistor (gate) 80, a vertical transistor trench 81 is opened, and a transfer gate (TG) 80 for reading electric charge from the PD 71 is formed therein.

Further, pixel transistors such as an amplifier (AMP) transistor, a selection (SEL) transistor, and a reset (RST) transistor are formed on the front surface side of the Si substrate 70. The arrangement of these transistors will be described with reference to FIG. 4, and the operation will be described with reference to a circuit diagram in FIG. 5.

A trench is formed between the pixels 50a. This trench is referred to as deep trench isolation (DTI) 82. The DTI 82 is formed between the adjacent pixels 50a, and penetrates the Si substrate 70 in the depth direction (in the figure, vertical direction, that is, a direction from the front surface to the back surface). Further, the DTI 82 also functions as a light-shielding wall between pixels so that unnecessary light does not leak to the adjacent pixels 50a.

A P-type solid-phase diffusion layer 83 and an N-type solid-phase diffusion layer 84 are formed between the PD 71 and the DTI 82 in order from the DTI 82 toward the PD 71. The P-type solid-phase diffusion layer 83 is formed along the DTI 82 so as to be in contact with the backside Si interface 75 of the Si substrate 70. The N-type solid-phase diffusion layer 84 is formed along the DTI 82 so as to be in contact with the P-type region 72 of the Si substrate 70.

It should be noted that the solid-phase diffusion layer refers to a layer in which a P-type layer and an N-type layer generated by impurity doping are formed in accordance with a method to be described later. However, in the present technology, the method is not limited to a solid-phase diffusion method, and a P-type layer and an N-type layer generated by another method, such as ion implantation, may be provided between the DTI 82 and the PD 71. Further, the PD 71 in the embodiment includes an N-type region. The photoelectric conversion is performed in a partial area or entire area of the N-type region.

The P-type solid-phase diffusion layer 83 is formed so as to be in contact with the backside Si interface 75, while the N-type solid-phase diffusion layer 84 does not contact the backside Si interface 75. Therefore, there is a gap between the N-type solid-phase diffusion layer 84 and the backside Si interface 75.

With such a configuration, the PN junction region between the P-type solid-phase diffusion layer 83 and the N-type solid-phase diffusion layer 84 forms a strong electric field region, and retains electric charge generated in the PD 71. According to such a configuration, the P-type solid-phase diffusion layer 83 and the N-type solid-phase diffusion layer 84 formed along the DTI 82 form a strong electric field region, and can retain electric charge generated in the PD 71.

If the N-type solid-phase diffusion layer 84 is formed along the DTI 82 so as to be in contact with the backside Si interface 75 of the Si substrate 70, pinning of electric charge weakens in the portion where the N-type solid-phase diffusion layer 84 is in contact with the backside Si interface 75 of the Si substrate 70 on the light entrance surface side, resulting in that the generated electric charge flows into the PD 71. As a result, dark characteristics may deteriorate. For example, a white spot may appear, or a dark current may occur.

However, in the pixel 50a shown in FIG. 3, the N-type solid-phase diffusion layer 84 does not contact the backside Si interface 75 of the Si substrate 70, and is formed along the DTI 82 so as to be in contact with the P-type region 72 of the Si substrate 70. With such a configuration, it is possible to prevent weakening of the pinning of electric charge, and therefore, deterioration in dark characteristics due to the electric charge flowing into the PD 71 can be prevented.

In addition, in the pixel 50a shown in FIG. 3, a sidewall film 85 including SiO2 is formed on the inner wall of the DTI 82, and a filler 86 including polysilicon is embedded inside the sidewall film 85.

The pixel 50a according to the first embodiment has a configuration in which the P-type region 72 is provided on the back surface side, and the PD 71 and the N-type solid-phase diffusion layer 84 do not exist near the backside Si interface 75. As a result, weakening of pinning near the backside Si interface 75 does not occur. Therefore, deterioration in dark characteristics due to the electric charge flowing into the PD 71 can be prevented.

Note that, regarding the DTI 82, SiN may be used for the sidewall film 85 instead of SiO2. Further, doping polysilicon may be used for the filler 86 instead of polysilicon. In a case of being filled with doping polysilicon or in a case of being doped with an N-type or P-type impurity after being filled with polysilicon, application of a negative bias to the resultant filler makes it possible to strengthen pinning on the sidewall of the DTI 82, and thus, the dark characteristics can be further improved.

Figure 5:
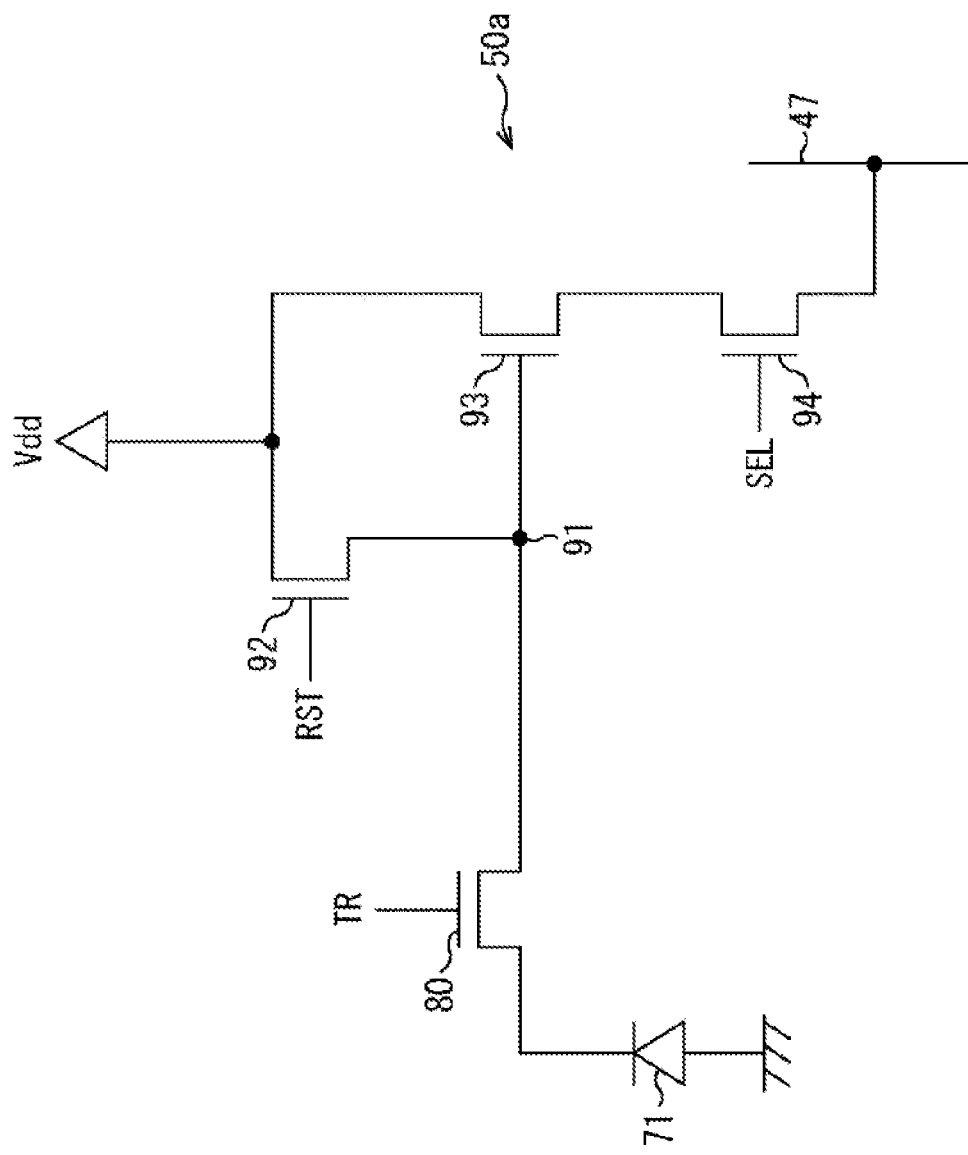
FIG. 5 is a circuit diagram of the pixel.

The arrangement of transistors formed in the pixel 50a and the operation of each transistor will be described with reference to FIGS. 4 and 5. FIG. 4 is a plan view of nine pixels 50a in 3×3 array in the pixel array section 41 (FIG. 2) when viewed from the front surface side (upper side in FIG. 3), and FIG. 5 is a circuit diagram for describing a connection relationship between the transistors shown in FIG. 4.

In FIG. 4, one rectangle represents one pixel 50a. As shown in FIG. 4, the DTI 82 is formed so as to surround the pixels 50a (the PDs 71 included in the pixels 50a). Further, a transfer transistor (gate) 80, a floating diffusion (FD) 91, a reset transistor 92, an amplifier transistor 93, and a selection transistor 94 are formed on the front surface of the pixel 50a.

The PD 71 generates and accumulates electric charges (signal charges) corresponding to an amount of received light. The PD 71 has an anode terminal grounded and a cathode terminal connected to the FD 91 via the transfer transistor 80.

When turned on by a transfer signal TR, the transfer transistor 80 reads the electric charge generated in the PD 71 and transfers the generated electric charge to the FD 91.

The FD 91 retains the electric charge read from the PD 71. The reset transistor 92 resets the potential of the FD 91 by discharging electric charges accumulated in the FD 91 to a drain (constant voltage source Vdd), when turned on by a reset signal RST.

The amplifier transistor 93 outputs a pixel signal according to the potential of the FD 91. That is, the amplifier transistor 93 constitutes a source follower circuit with a load MOS (not shown) as a constant current source connected via a vertical signal line 33, and a pixel signal indicating a level according to the electric charge accumulated in the FD 91 is output to the column processor 43 (FIG. 2) from the amplifier transistor 93 via the selection transistor 94 and the vertical signal line 47.

The selection transistor 94 is turned on when the pixel 31 is selected by a selection signal SEL, and outputs the pixel signal of the pixel 31 to the column processor 43 via the vertical signal line 33. The signal lines to which the transfer signal TR, the selection signal SEL, and the reset signal RST are transmitted correspond to the pixel drive lines 46 in FIG. 2.

The pixel 50a can be configured as described above, but is not limited to having the above configuration.

The pixel 50a may have another configuration.

<Manufacturing Method of DTI 82 and Periphery Thereof>

Figure 6:
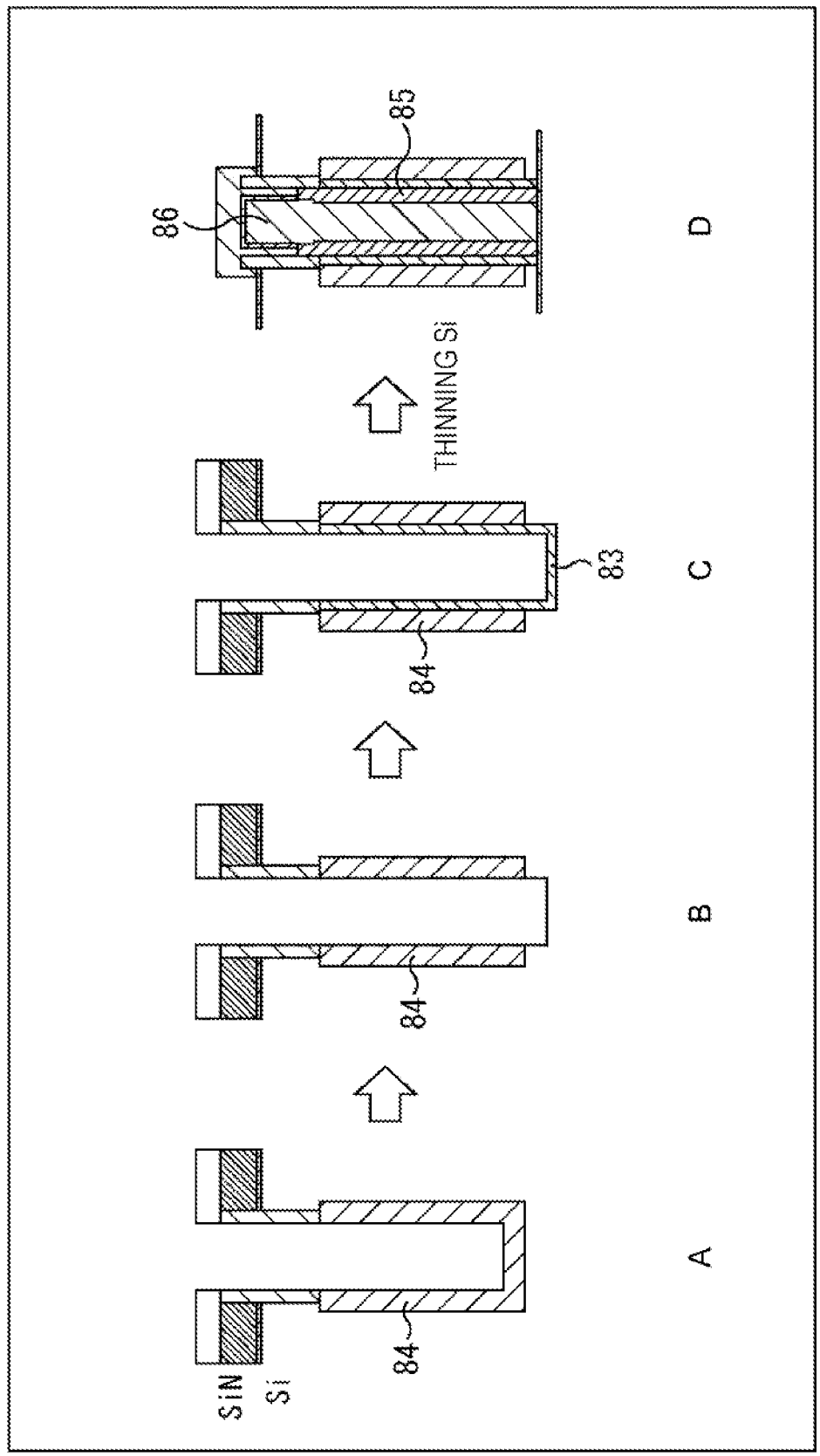
FIG. 6 is a diagram for describing a manufacturing method of a DTI 82 and a periphery thereof.

FIG. 6 is a diagram for describing a manufacturing method of the DTI 82 and a periphery thereof.

As shown in A of FIG. 6, when the DTI 82 is opened in the Si substrate 70, an area other than the position where the DTI 82 is to be formed on the Si substrate 70 is covered with a hard mask using SiN and SiO2, and the area not covered with the hard mask is dry etched. Thus, a groove is opened to a predetermined depth of the Si substrate 70 in the vertical direction.

Next, an SiO2 film containing phosphorus (P), which is an N-type impurity, is formed on the inner side of the opened groove, and then a heat treatment is performed to dope a portion from the SiO2 film into the Si substrate 70 with phosphorus (P) (hereinafter referred to as solid-phase diffusion).

Then, as shown in B of FIG. 6, after the SiO2 film containing P formed inside the opened groove is removed, a heat treatment is again performed to diffuse phosphorus (P) to the inside of the Si substrate 70. Thus, the N-type solid-phase diffusion layer 84 self-aligned to the current groove shape is formed. Thereafter, the bottom part of the groove is dry etched, whereby the groove is extended in the depth direction.

Next, as shown in C of FIG. 6, an SiO2 film containing boron (B), which is a P-type impurity, is formed inside the extended groove, and then, a heat treatment is performed. With this treatment, boron (B) is diffused from the SiO2 film toward the Si substrate 70 by solid-phase diffusion, whereby the P-type solid-phase diffusion layer 83 self-aligned to the shape of the extended groove is formed.

Thereafter, the SiO2 film containing boron (B) formed on the inner wall of the groove is removed.

Next, as shown in D of FIG. 6, a sidewall film 85 including SiO2 is formed on the inner wall of the opened groove and filled with polysilicon. Thus, the DTI 82 is formed. Thereafter, pixel transistors and wires are formed. Then, the Si substrate 70 is thinned from the back surface side. When the Si substrate 70 is thinned, the bottom of the DTI 82 including the P-type solid-phase diffusion layer 83 is simultaneously thinned. The thinning process is performed to a depth not reaching the N-type solid-phase diffusion layer 84.

Through the above steps, the strong electric field region constituted by the N-type solid-phase diffusion layer 84 not in contact with the backside Si interface 75 and the P-type solid-phase diffusion layer 83 in contact with the backside Si interface 75 can be formed adjacent to the PD 71.

Second Embodiment

Figure 7:
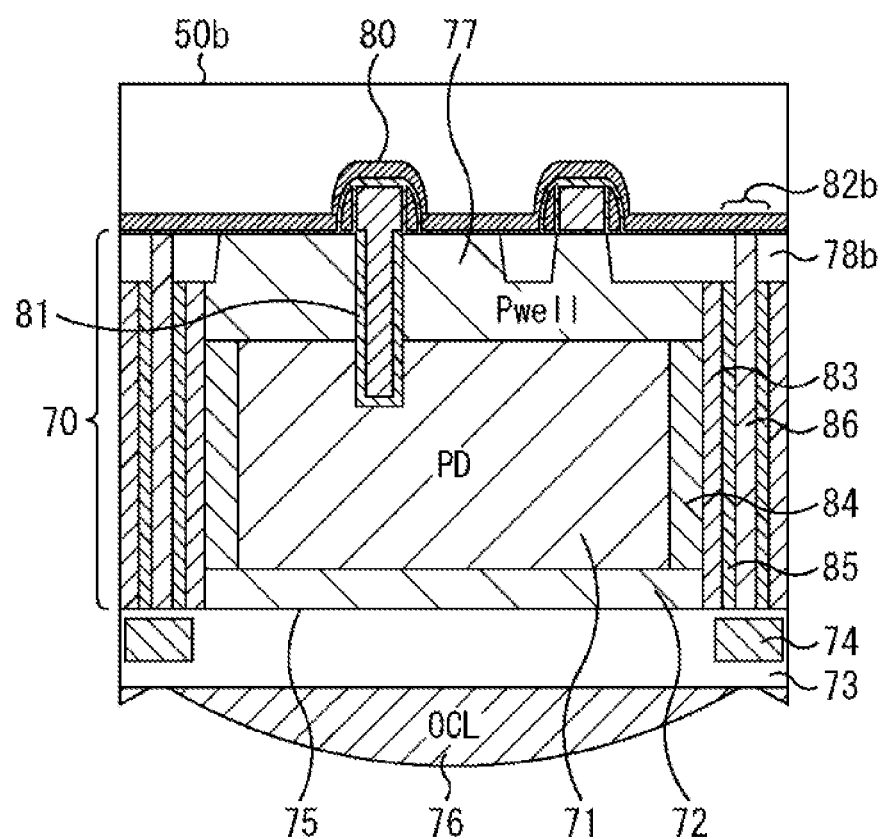
FIG. 7 is a vertical sectional view showing a second configuration example of the pixel to which the present technology is applied.

FIG. 7 is a vertical sectional view of a pixel 50b according to a second embodiment to which the present technology is applied.

The second embodiment is different from the first embodiment in that the DTI 82 is formed in the STI 78, and is similar to the first embodiment in the other configurations. Therefore, the portions similar to those in the first embodiment are denoted by the same reference signs, and the description thereof will be omitted as appropriate. In the following description of the pixel 50, the same portions as those of the pixel 50b in the first embodiment are denoted by the same reference signs, and the description thereof will be omitted as appropriate.

In the pixel 50b shown in FIG. 7, an STI 78b formed in the active region 77 is formed up to the portion where a DTI 82b is formed (up to the end of the pixel 50b). Then, the DTI 82b is formed under the STI 78b.

In other words, the STI 78b is formed at the portion where the DTI 82b is formed, and the STI 78b and the DTI 82b are formed at positions where the STI 78b and the DTI 82b are in contact with each other.

With such a formation, it is possible to reduce the size of the pixel 50b as compared with a case where the STI 78b and the DTI 82b are formed at different positions (for example, the pixel 50a (FIG. 3) in the first embodiment).

The pixel 50b according to the second embodiment can also provide an effect similar to that of the pixel 50a according to the first embodiment, that is, an effect of preventing deterioration in dark characteristics.

Third Embodiment

Figure 8:
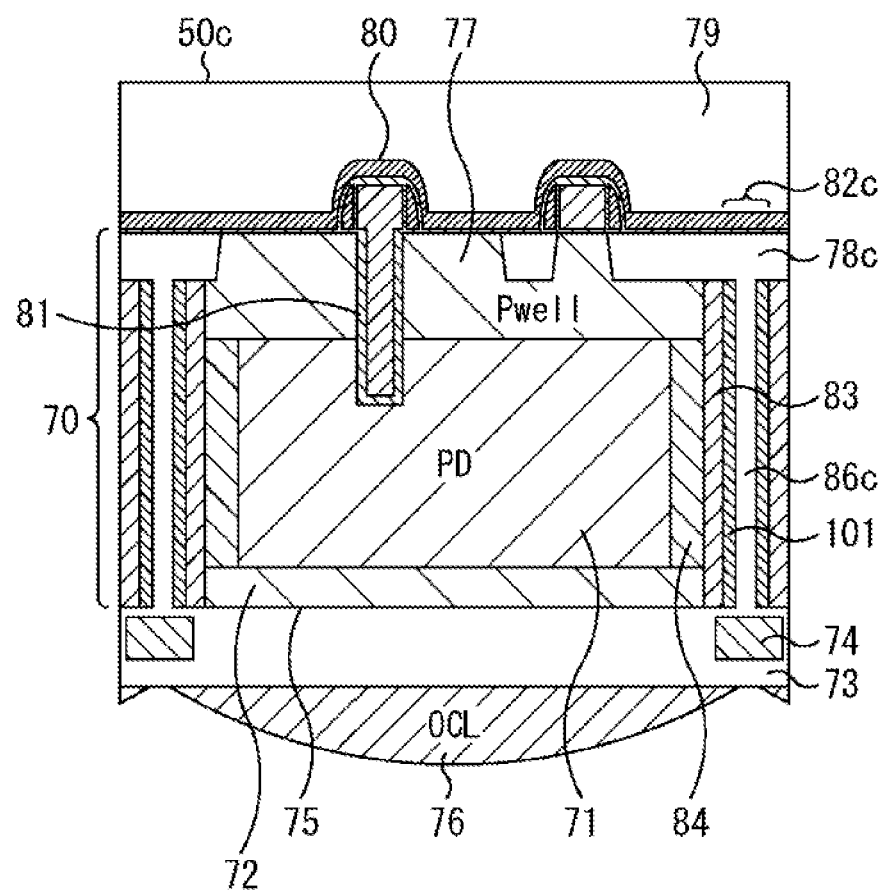
FIG. 8 is a vertical sectional view showing a third configuration example of the pixel to which the present technology is applied.

FIG. 8 is a vertical sectional view of a pixel 50c according to a third embodiment to which the present technology is applied.

The third embodiment is different from the pixels 50a and 50b in the first and second embodiments in that a film 101 having a negative fixed charge is formed on the sidewall of a DTI 82c, and the inside of the film 101 is filled with SiO2 as a filler 86c.

The pixel 50a in the first embodiment has a configuration in which the sidewall film 85 including SiO2 is formed on the sidewall of the DTI 82 and filled with polysilicon, whereas in the pixel 50c in the third embodiment, the film 101 having a negative fixed charge is formed on the sidewall of the DTI 82c, and the inside of the film 101 is filled with SiO2.

The film 101 having a negative fixed charge formed on the sidewall of the DTI 82c can be, for example, a hafnium oxide (HfO2) film, an aluminum oxide (Al2O3) film, a zirconium oxide (ZrO2) film, a tantalum oxide (Ta2O5) film, or a titanium oxide (TiO2) film. The above-mentioned types of films have been used as gate insulating films of insulated-gate field effect transistors and the like, and therefore, a film formation method has been established. Accordingly, such films can be easily formed.

Examples of the film formation method include a chemical vapor deposition method, a sputtering method, an atomic layer deposition method, and the like. If the atomic layer deposition method is used, an SiO2 layer that reduces the interface state during film formation is simultaneously formed with a thickness of about 1 nm, and thus, preferable.

In addition, examples of the material other than the above materials include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), and yttrium oxide (Y2O3).

Further, the film 101 having a negative fixed charge can be formed using a hafnium nitride film, an aluminum nitride film, a hafnium oxynitride film, or an aluminum oxynitride film.

The film 101 having a negative fixed charge may be added with silicon (Si) or nitrogen (N), as long as the insulating property is not impaired. The concentration of the additive is appropriately determined as long as the insulating property of the film is not impaired. However, in order to prevent an occurrence of image defects such as white spots, it is preferable that the additive such as silicon or nitrogen is added to the surface of the film 101 having a negative fixed charge, that is, the surface reverse to the PD 71. As described above, the addition of silicon (Si) and nitrogen (N) makes it possible to increase the heat resistance of the film and the ability to prevent ion implantation during the process.

In the third embodiment, it is possible to enhance the pinning on the trench sidewall of the DTI 82. Therefore, when compared with, for example, the pixel 50a in the first embodiment, the pixel 50c can more reliably prevent deterioration in dark characteristics.

In order to form the DTI 82 in the third embodiment, such a process as described below may be performed. Specifically, in the state shown in D of FIG. 6, the back surface is polished until the polysilicon added as the filler 86 is exposed. Then, the filler 86 (polysilicon) and the sidewall film 85 (SiO2) inside the groove are removed by photoresist and wet etching, and the film 101 is formed. Thereafter, the groove is filled with SiO2.

Note that the inside of the groove may be filled with a metal material such as tungsten (W) as a filler instead of SiO2. In this case, transmission of obliquely entering light through the DTI 82 is suppressed, so that color mixing can be reduced.

Fourth Embodiment

Figure 9:
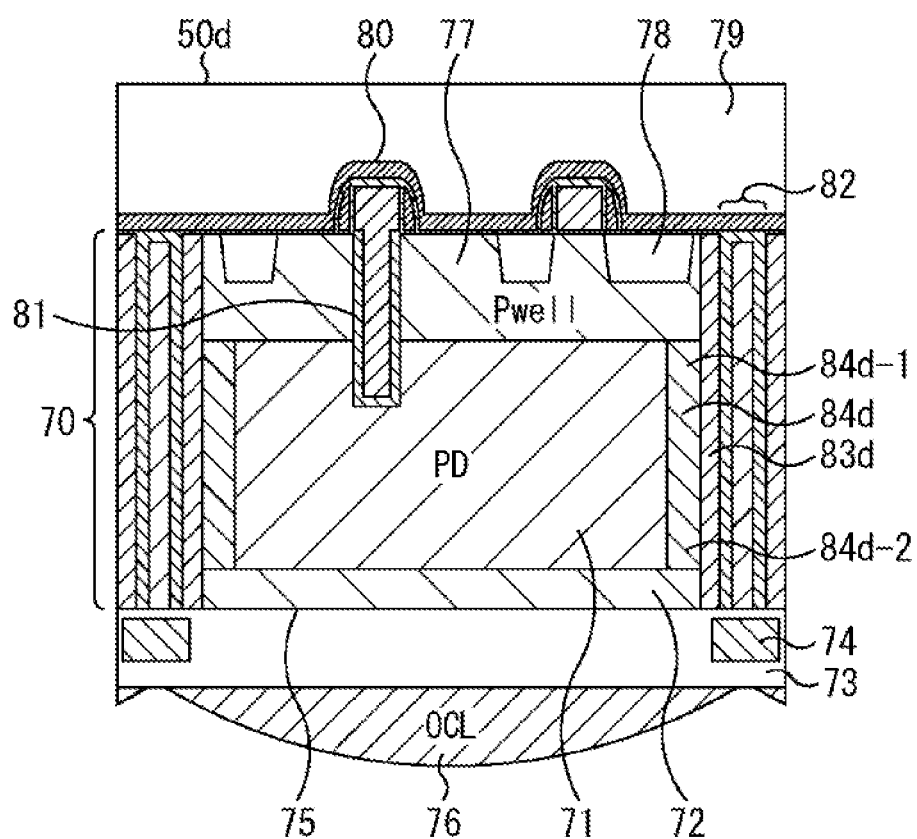
FIG. 9 is a vertical sectional view showing a fourth configuration example of the pixel to which the present technology is applied.

FIG. 9 is a vertical sectional view of a pixel 50d according to a fourth embodiment to which the present technology is applied.

The fourth embodiment is different from the pixel 50a in the first embodiment in that an N-type solid-phase diffusion layer 84d formed along the DTI 82 has a concentration gradient in the depth direction of the Si substrate 70. The other configurations are similar to those of the pixel 50a in the first embodiment.

The N-type impurity concentration of the N-type solid-phase diffusion layer 84 of the pixel 50a in the first embodiment is constant regardless of the depth direction, whereas the N-type impurity concentration of the N-type solid-phase diffusion layer 84d of the pixel 50d in the fourth embodiment varies in the depth direction.

That is, an N-type solid-phase diffusion layer 84d-1 near the front surface of the N-type solid-phase diffusion layer 84d of the pixel 50d has a high N-type impurity concentration, and an N-type solid-phase diffusion layer 84d-2 near the back surface has a low N-type impurity concentration.

The pixel 50d according to the fourth embodiment can provide an effect similar to that of the pixel 50a according to the first embodiment. In addition, the pixel 50d can also provide another effect of making it possible to easily read electric charge due to the potential on the back surface side being shallow by the concentration gradient provided in the N-type solid-phase diffusion layer 84d.

A concentration gradient can be provided in the N-type solid-phase diffusion layer 84d in the manner described below, for example. Specifically, when a groove for the DTI 82 is opened, etching damage is caused on the sidewall of the groove, and the concentration gradient can be provided by utilizing a difference in a doping amount by solid-phase diffusion due to an amount of damage.

Note that, instead of providing a concentration gradient in the N-type solid-phase diffusion layer 84d, the concentration of P-type impurities in the P-type solid-phase diffusion layer 83d near the front surface may be reduced, and the concentration of P-type impurities in the P-type solid-phase diffusion layer 83d near the back surface may be increased. In this case, an effect similar to the effect obtained when the concentration gradient is provided in the N-type solid-phase diffusion layer 84d can also be obtained.

In addition, both the N-type solid-phase diffusion layer 84d and the P-type solid-phase diffusion layer 83d may have a concentration gradient.

Fifth Embodiment

Figure 10:
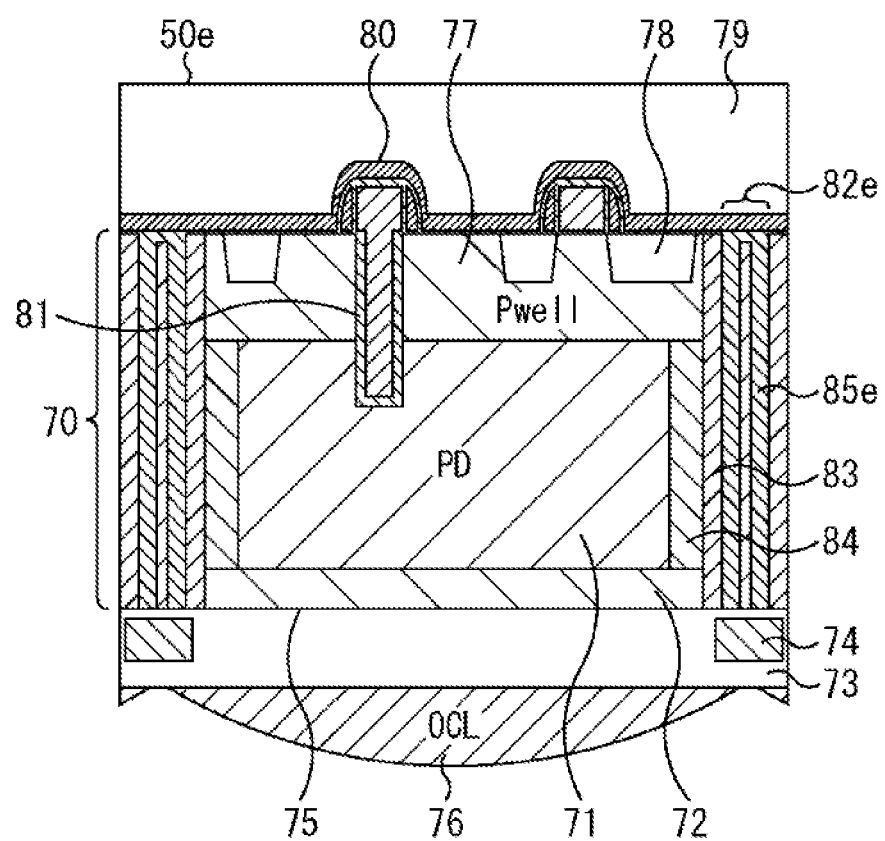
FIG. 10 is a vertical sectional view showing a fifth configuration example of the pixel to which the present technology is applied.

FIG. 10 is a vertical sectional view of a pixel 50e according to a fifth embodiment to which the present technology is applied.

The pixel 50e according to the fifth embodiment is different from the first embodiment in that a sidewall film 85e including SiO2 and formed on the inner wall of a DTI 82e is formed thicker than the sidewall film 85 of the pixel 50e according to the first embodiment. The other configurations are similar to those of the first embodiment.

SiO2 has a lower refractive index of light than Si. Therefore, light entering the Si substrate 70 is reflected according to Snell's law, so that transmission of light to the adjacent pixel 50 is prevented. However, if the sidewall film 85 is thin, Snell's law is not completely established, and transmitted light may be increased.

The sidewall film 85e of the pixel 50e in the fifth embodiment is formed to be thick. Therefore, deviation from Snell's law can be reduced, and the reflection of incident light on the sidewall film 85e increases. As a result, transmission of incident light to the adjacent pixel 50e can be reduced. Accordingly, the pixel 50e according to the fifth embodiment can provide an effect similar to the effect of the pixel 50a according to the first embodiment, and can further provide an effect of preventing color mixing to the adjacent pixel 50e due to the obliquely entering light.

Sixth Embodiment

Figure 11:
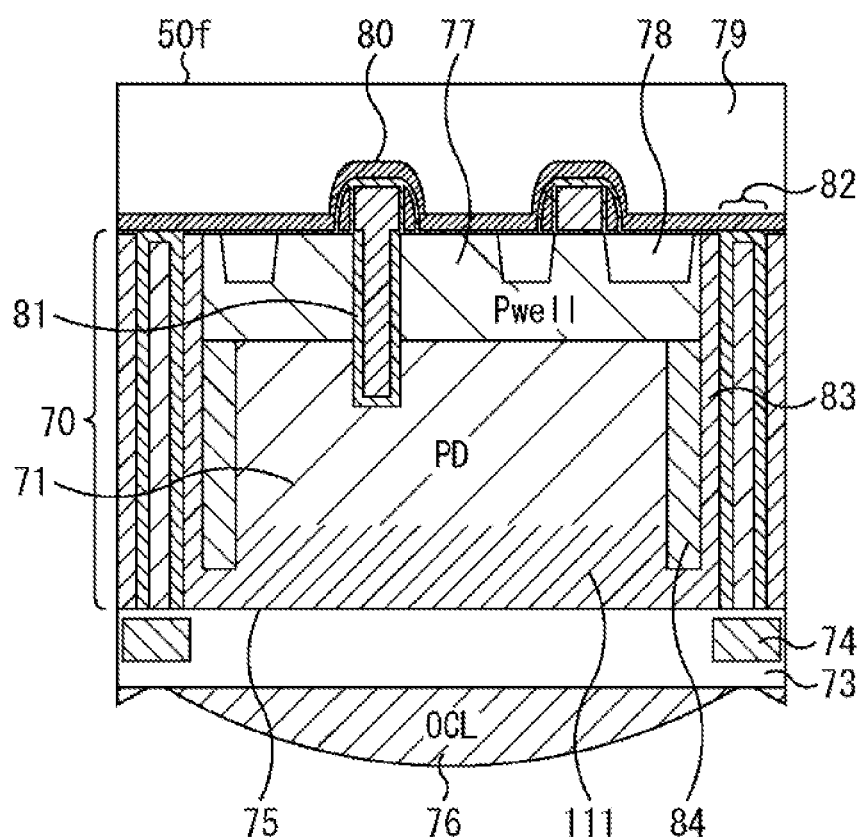
FIG. 11 is a vertical sectional view showing a sixth configuration example of the pixel to which the present technology is applied.

FIG. 11 is a vertical sectional view of a pixel 50f according to a sixth embodiment to which the present technology is applied.

The pixel 50f according to the sixth embodiment is different from the pixel 50a in the first embodiment in that a region 111 between the PD 71 and the backside Si interface 75 is doped with a P-type impurity, by which a concentration gradient is provided such that the concentration of the P-type impurity is higher on the back surface side than on the front surface side in the Si substrate 70. The other configurations are similar to those of the pixel 50a in the first embodiment.

Referring to FIG. 3 again, in the pixel 50a of the first embodiment, the Si substrate 70 has no concentration gradient, and the P-type region 72 is formed between the PD 71 and the backside Si interface 75. In the pixel 50f according to the sixth embodiment, the Si substrate 70 has a concentration gradient. The concentration gradient is such that the concentration of the P-type impurity is higher on the back surface side (P-type region 111 side) than on the front surface side.

The pixel 50f according to the sixth embodiment having such a concentration gradient can provide an effect similar to that of the pixel 50a according to the first embodiment, and can also provide a further effect of making it easier to read electric charge as compared with the pixel 50a in the first embodiment.

Seventh Embodiment

Figure 12:
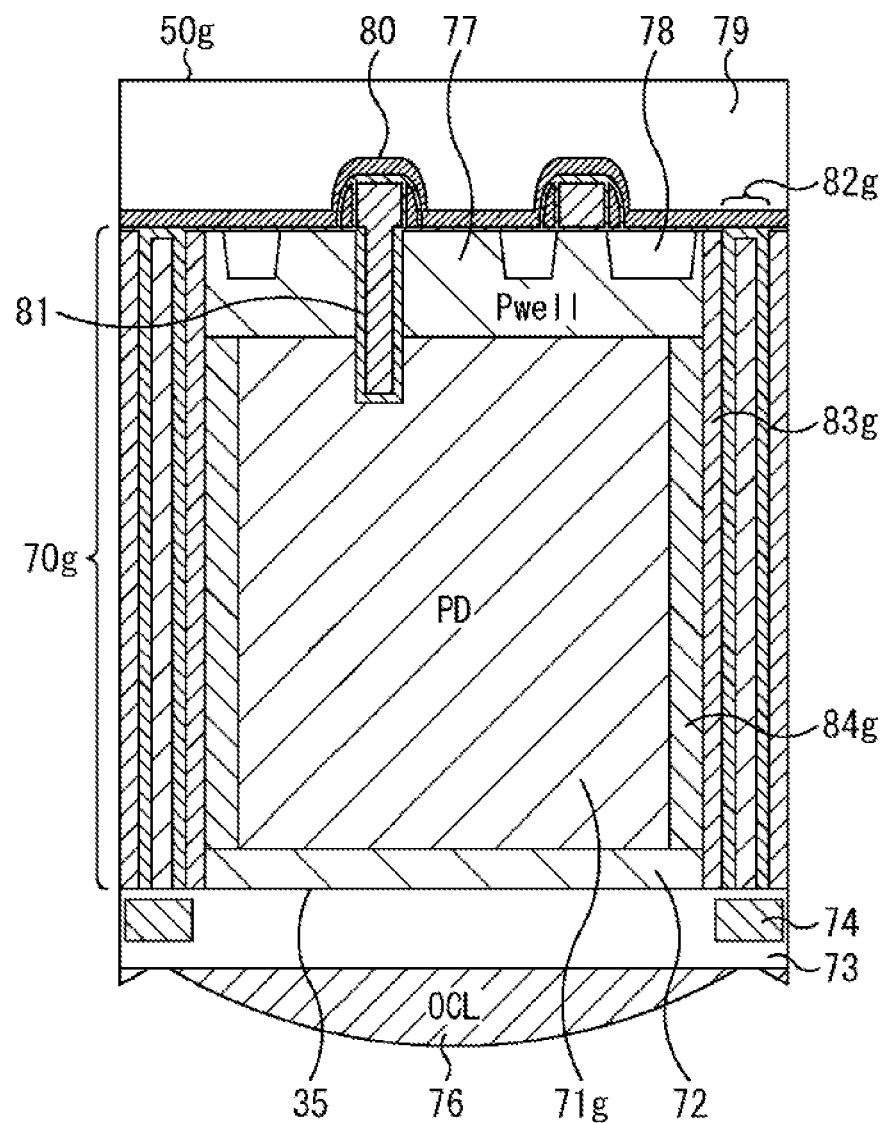
FIG. 12 is a vertical sectional view showing a seventh configuration example of the pixel to which the present technology is applied.

FIG. 12 is a vertical sectional view of a pixel 50g according to a seventh embodiment to which the present technology is applied.

The pixel 50g according to the seventh embodiment is different from the pixel 50a according to the first embodiment in that the pixel 50g has a thicker Si substrate 70 than the pixel 50a, and with an increase in the thickness of the Si substrate 70, the DTI 82 or the like is formed deeper.

The pixel 50g in the seventh embodiment has a thick Si substrate 70g. With an increase in the thickness of the Si substrate 70g, the area (volume) of the PD 71g increases, and a DTI 82g is deeper. Further, since the DTI 82g is formed deeper, a P-type solid-phase diffusion layer 83g and an N-type solid-phase diffusion layer 84g are also formed deeper (wider).

Since the P-type solid-phase diffusion layer 83g and the N-type solid-phase diffusion layer 84g are wider, the area of the PN junction region constituted by the P-type solid-phase diffusion layer 83g and the N-type solid-phase diffusion layer 84g increases. Therefore, the pixel 50g according to the seventh embodiment can provide an effect similar to that of the pixel 50g according to the first embodiment, and can further provide an effect of increasing the saturation charge amount Qs as compared with the pixel 50a according to the first embodiment.

Eighth Embodiment

Figure 13:
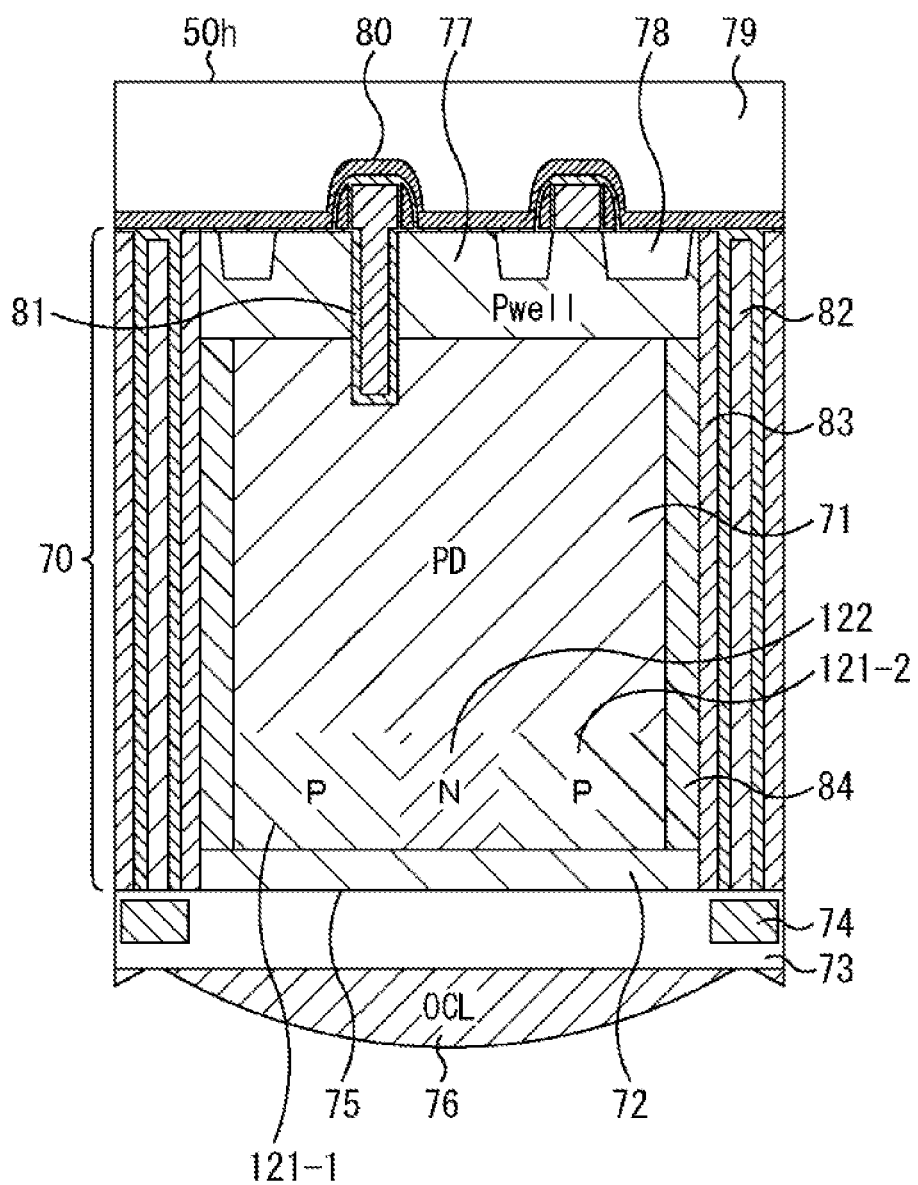
FIG. 13 is a vertical sectional view showing an eighth configuration example of the pixel to which the present technology is applied.

FIG. 13 is a vertical sectional view of a pixel 50h according to an eighth embodiment to which the present technology is applied.

In the pixel 50h according to the eighth embodiment, the length of the Si substrate 70g in the depth direction is increased as in the pixel 50g according to the seventh embodiment shown in FIG. 12.

Further, in the pixel 50r, a P-type region 121-1, an N-type region 122, and a P-type region 121-2 are formed in the PD 71 on the back surface side by ion implantation. A strong electric field is generated at the PN junction formed by the P-type region 121-1, the N-type region 122, and the P-type region 121-2, whereby electric charge can be retained.

Therefore, the pixel 50h according to the eighth embodiment can provide an effect similar to that of the pixel 50g according to the seventh embodiment, and can further provide an effect of increasing the saturation charge amount Qs.

Ninth Embodiment

Figure 14:
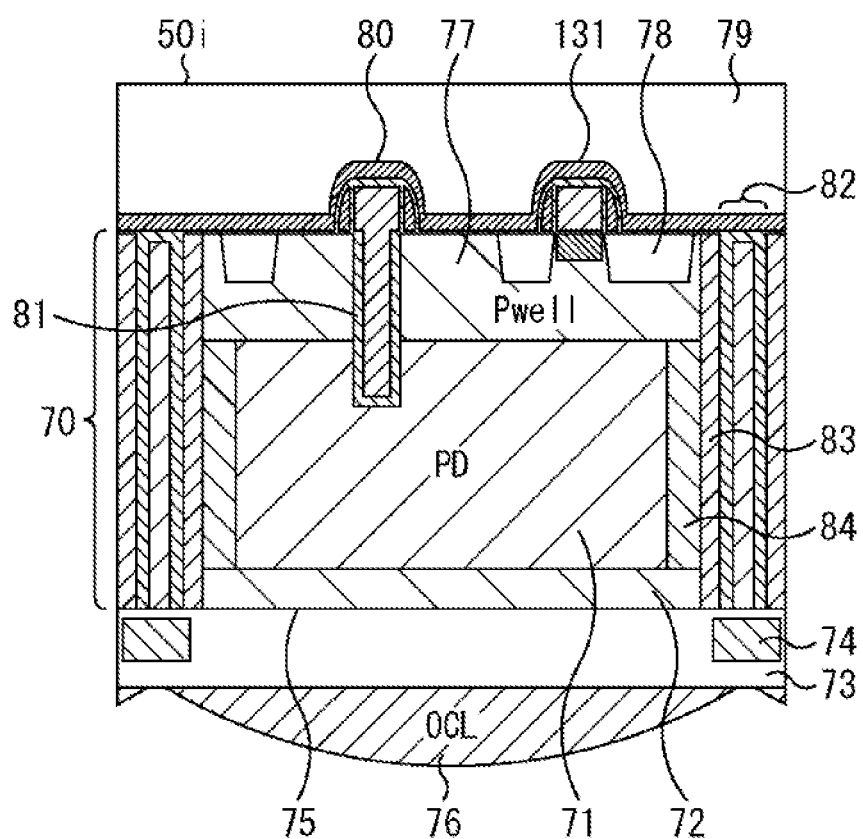
FIG. 14 is a vertical sectional view showing a ninth configuration example of the pixel to which the present technology is applied.

FIG. 14 is a vertical sectional view of a pixel 50i according to a ninth embodiment to which the present technology is applied.

The pixel 50i according to the ninth embodiment is different from the pixel 50a according to the first embodiment in that a MOS capacitor 131 and a pixel transistor (not shown) are formed on the front surface side of the Si substrate 70. The other configurations are similar to those of the pixel 50a in the first embodiment.

Normally, even if the saturation charge amount Qs of the PD 71 is increased, the output is limited by the amplitude limit of the vertical signal line VSL (vertical signal line 47 shown in FIG. 2) unless the conversion efficiency is reduced, and it is difficult to make full use of the increased saturation charge amount Qs.

In order to reduce the conversion efficiency of the PD 71, it is necessary to add capacitance to the FD 91 (FIG. 4). In view of this, the pixel 50i according to the ninth embodiment has a configuration in which the MOS capacitor 131 is added as a capacitance to be added to the FD 91 (not shown in FIG. 11).

The pixel 50i according to the ninth embodiment can provide an effect similar to that of the pixel 50a according to the first embodiment. Further, the pixel 50i can reduce the conversion efficiency of the PD 71 due to the addition of the MOS capacitor 131 to the FD 91, and can make full use of the increased saturation charge amount Qs.

Tenth Embodiment

Figure 15:
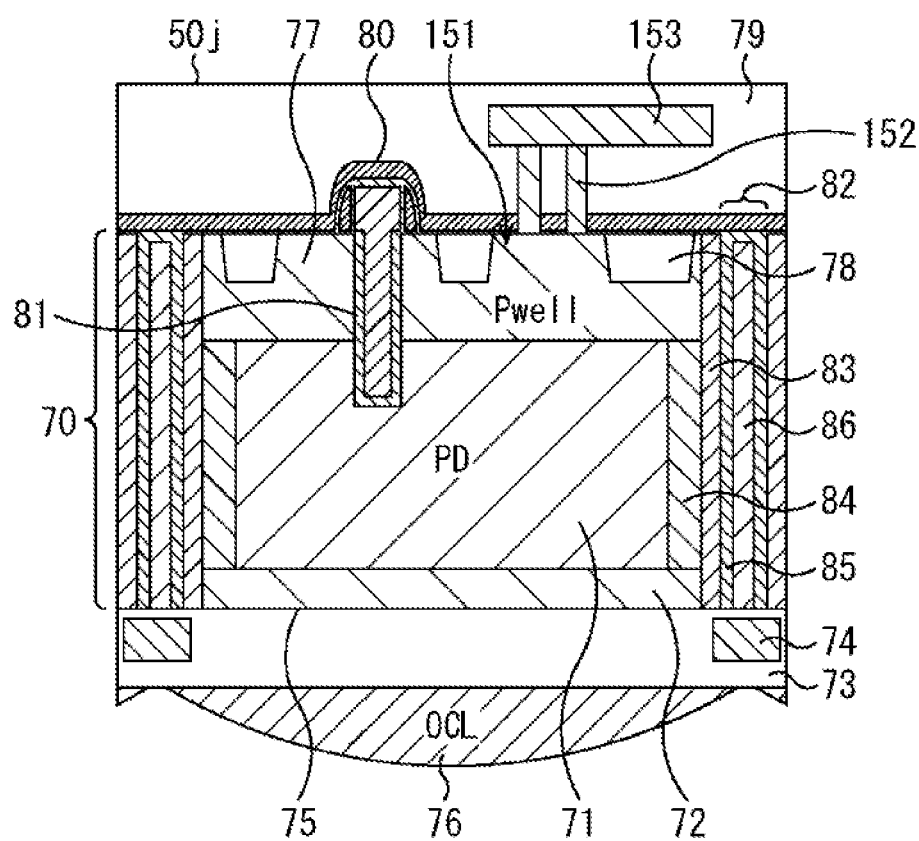
FIG. 15 is a vertical sectional view showing a tenth configuration example of the pixel to which the present technology is applied.

FIG. 15 is a vertical sectional view of a pixel 50j according to a tenth embodiment to which the present technology is applied.

The pixel 50j according to the tenth embodiment is different from the pixel 50a according to the first embodiment in that two contacts 152 are formed in a well contact section 151 formed in an active region 77, and the contacts 152 are connected to a Cu wire 153. The other configurations are similar to those of the pixel 50a according to the first embodiment.

As described above, the well contact section 151 may be provided. Note that, although FIG. 15 shows an example in which two contacts 152 are formed, two or more contacts 152 may be formed in the well contact section 151.

The pixel 50j according to the tenth embodiment can provide an effect similar to that of the pixel 50a according to the first embodiment, and can further provide an effect of enhancing critical yield defect.

Eleventh Embodiment

Figure 16:
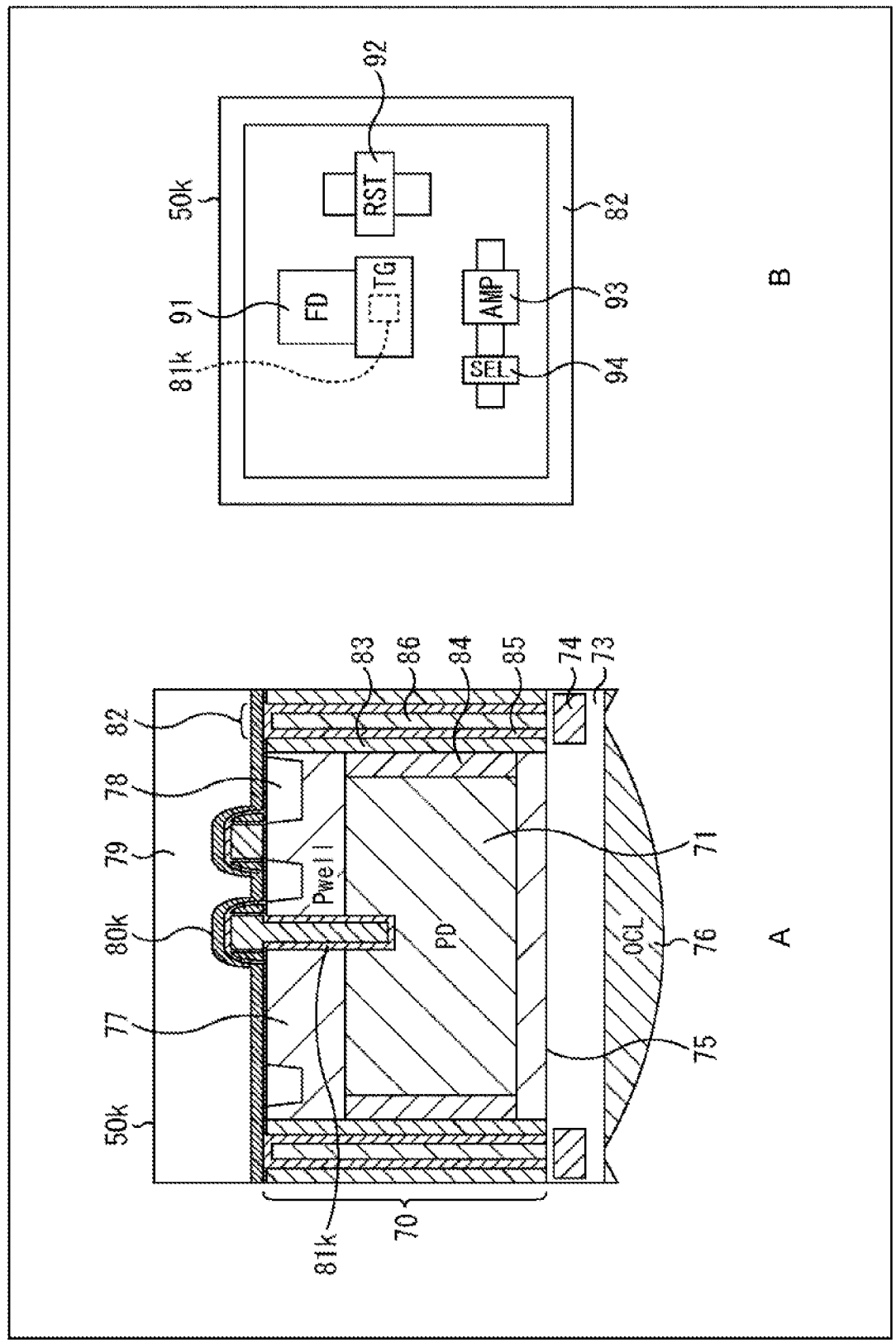
FIG. 16 shows a vertical sectional view and a plan view showing an eleventh configuration example of the pixel to which the present technology is applied.

FIG. 16 shows a vertical sectional view and a plan view of a pixel 50k according to an eleventh embodiment to which the present technology is applied.

The pixel 50k according to the eleventh embodiment is different from the pixel 50a according to the first embodiment in that a transfer transistor (gate) 80k is formed by opening a vertical transistor trench 81k in the center of the pixel 50k. The other configurations are similar to those of the pixel 50a in the first embodiment.

In the pixel 50k shown in FIG. 16, the transfer transistor (gate) 80k is positioned equidistant from the outer periphery of the PD 71. Therefore, the pixel 50k according to the eleventh embodiment can provide an effect similar to that of the pixel 50a according to the first embodiment, and further, can improve transfer of electric charge because the transfer transistor (gate) is positioned equidistant from the outer periphery of the PD 71.

Twelfth Embodiment

Figure 17:
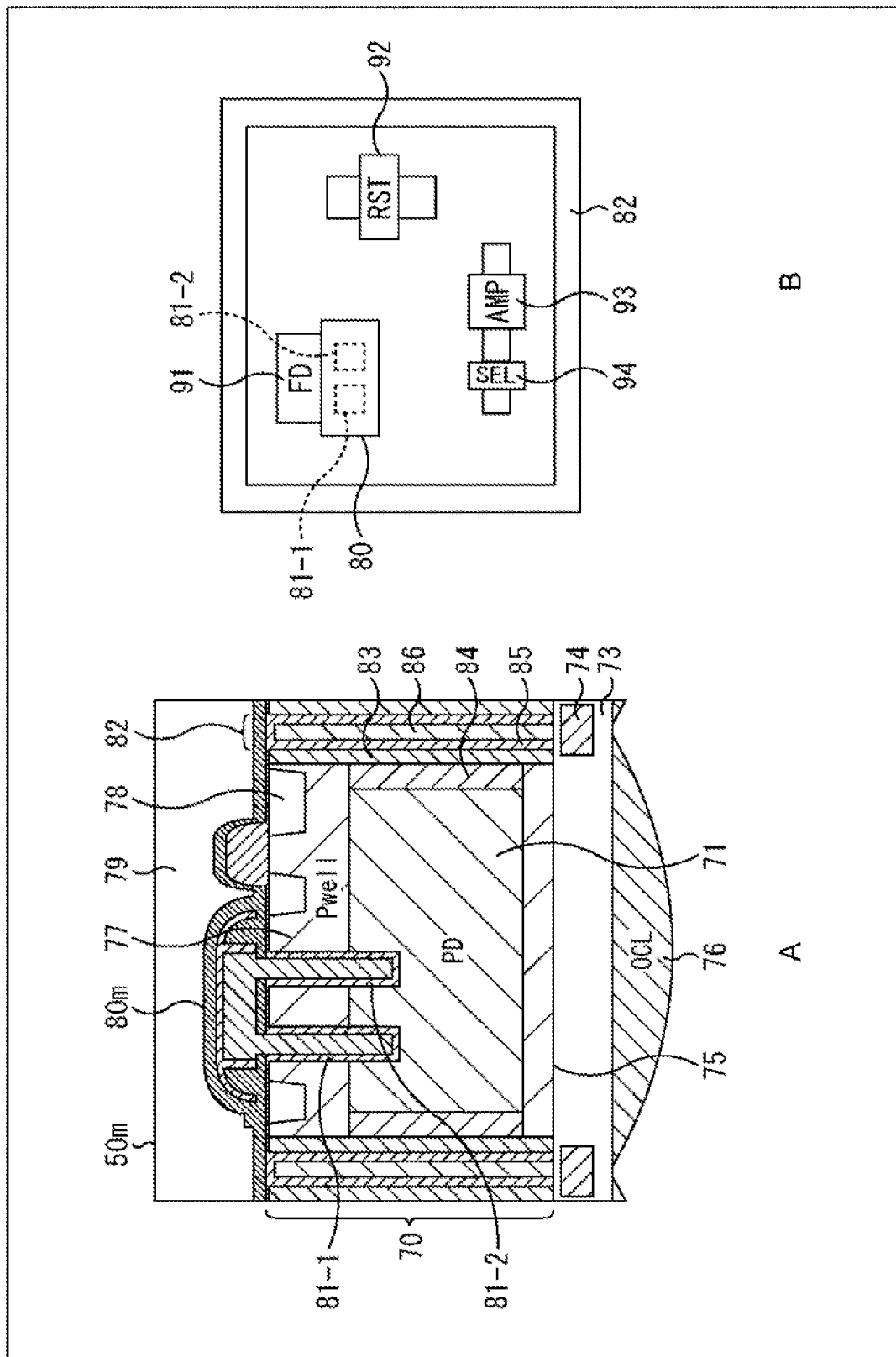
FIG. 17 shows a vertical sectional view and a plan view showing a twelfth configuration example of the pixel to which the present technology is applied.

FIG. 17 shows a vertical sectional view and a plan view of a pixel 50m according to a twelfth embodiment to which the present technology is applied.

The pixel 50m according to the twelfth embodiment is different from the pixel 50a according to the first embodiment in that a transfer transistor 80m includes two vertical transistor trenches 81-1 and 81-2. The other configurations are similar to those of the pixel 50a in the first embodiment.

The pixel 50a (FIG. 3) according to the first embodiment has a configuration in which the transfer transistor 80 includes one vertical transistor trench 81, whereas the pixel 50m according to the twelfth embodiment has a configuration in which the transfer transistor 80m includes two vertical transistor trenches 81-1 and 81-2.

Due to the above configuration including the two vertical transistor trenches 81-1 and 81-2, the followability of the potential in the region between the two vertical transistor trenches 81-1 and 81-2 upon changing the potential of the transfer transistor 80k is improved. Therefore, the degree of modulation can be increased. As a result, the charge transfer efficiency can be improved.

Further, the effect similar to the effect of the pixel 50a according to the first embodiment can also be obtained.

It is to be noted that, although the transfer transistor 80k includes, as one example, two vertical transistor trenches 81-1 and 81-2 in the above description, two or more vertical transistor trenches 81 may be provided in each pixel region.

Further, an example in which the two vertical transistor trenches 81-1 and 81-2 are formed to have the same size (length and thickness) has been described. However, in a case where multiple vertical transistor trenches 81 are formed, they may have different sizes. For example, one of the two vertical transistor trenches 81-1 and 81-2 may be longer than the other, or thicker than the other.

Thirteenth Embodiment

Figure 18:
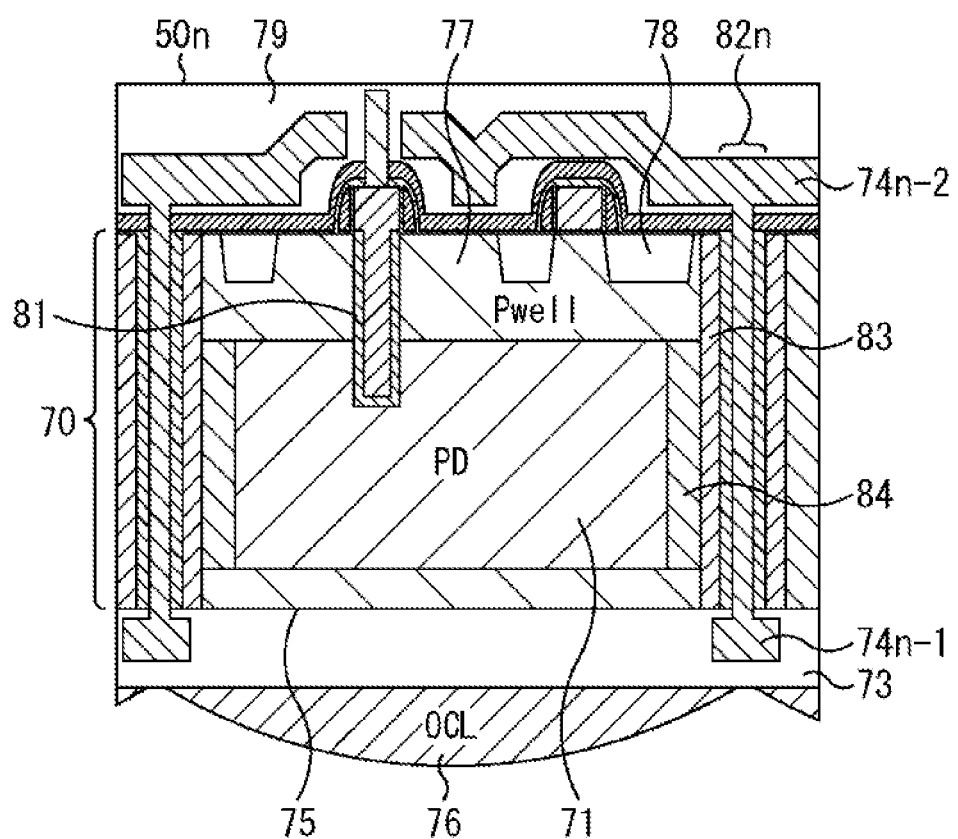
FIG. 18 is a vertical sectional view showing a thirteenth configuration example of the pixel to which the present technology is applied.

FIG. 18 is a vertical sectional view of a pixel 50n according to a thirteenth embodiment to which the present technology is applied.

The pixel 50n according to the thirteenth embodiment is different from the pixel 50a according to the first embodiment in the configuration of the light-shielding film 74, and the other configurations are similar to those of the pixel 50a.

In the pixel 50n according to the thirteenth embodiment, a light-shielding film 74n-1 and a light-shielding film 74n-2 are formed above and below a DTI 82n, respectively. The pixel 50a according to the first embodiment (FIG. 3) has the light-shielding film 74 that covers the back surface side of the DTI 82 (lower side in the figure) on the back surface side thereof, whereas in the pixel 50n (FIG. 18), the DTI 82n is filled with a metal material (for example, tungsten) same as the material of the light-shielding film 74, and the front surface side (upper side in the figure) of the Si substrate 70 is also covered with the metal material.

In other words, each pixel region is surrounded by the metal material except for the back surface (light entrance surface). It is to be noted, however, that in the configuration in which the pixel 50n is enclosed by the metal material except for the back surface of the pixel 50n, an opening is formed as appropriate at necessary portions. For example, a portion of the light-shielding film 74n-2 where the transfer transistor 80n is located is opened, and a terminal for connection to the outside is formed therein.

Note that a metal material other than tungsten (W) may be used for the light-shielding film 74 and the like.

According to the pixel 50n in the thirteenth embodiment, it is possible to prevent the incident light from leaking to the adjacent pixel 50n, so that color mixing can be suppressed.

Further, light entering from the back surface and reaching the front surface without being photoelectrically converted is reflected by the metal material (light-shielding film 74n-2) and again enters the PD 71. Therefore, the pixel 50n according to the thirteenth embodiment can provide an effect similar to that of the pixel 50a according to the first embodiment, and can further provide an effect of enhancing the sensitivity of the PD 71.

Fourteenth Embodiment

Figure 19:
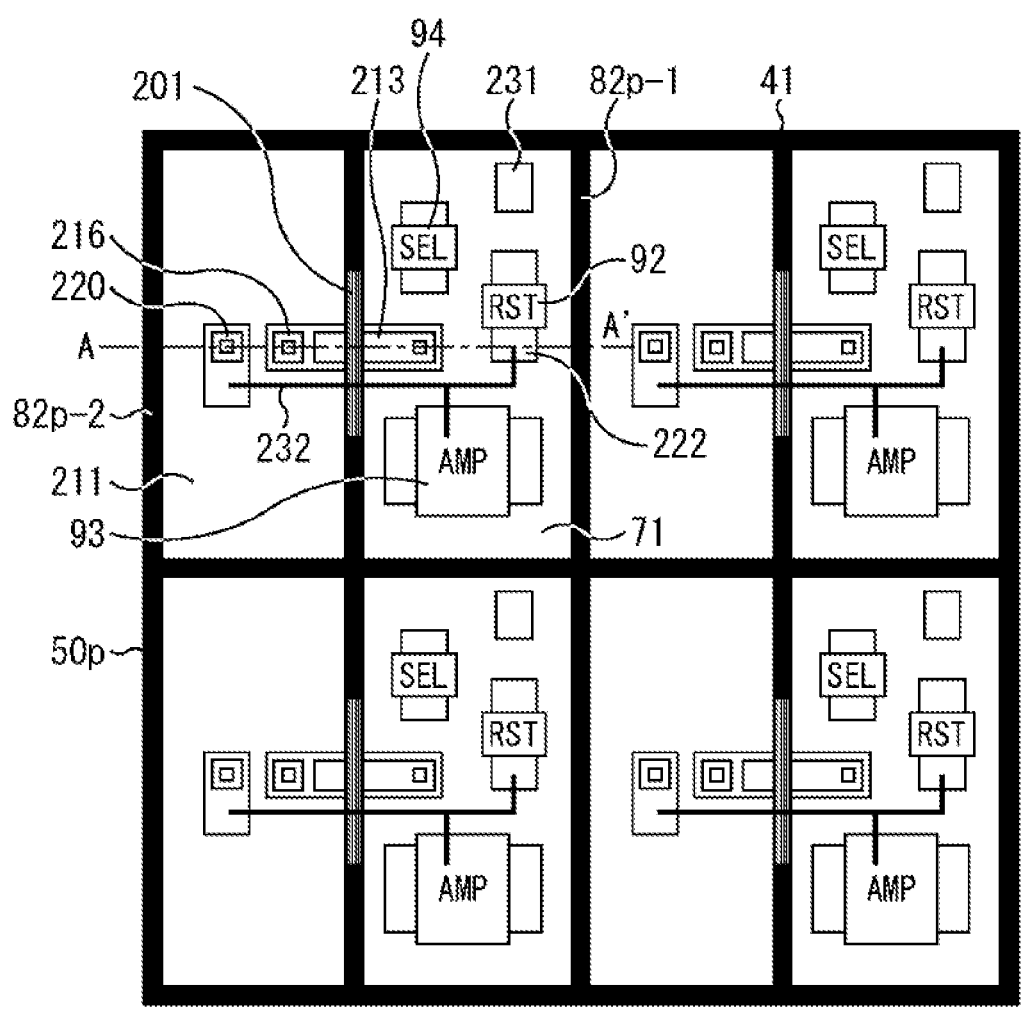
FIG. 19 is a horizontal plan view showing a fourteenth configuration example of the pixel to which the present technology is applied.
Figure 20:
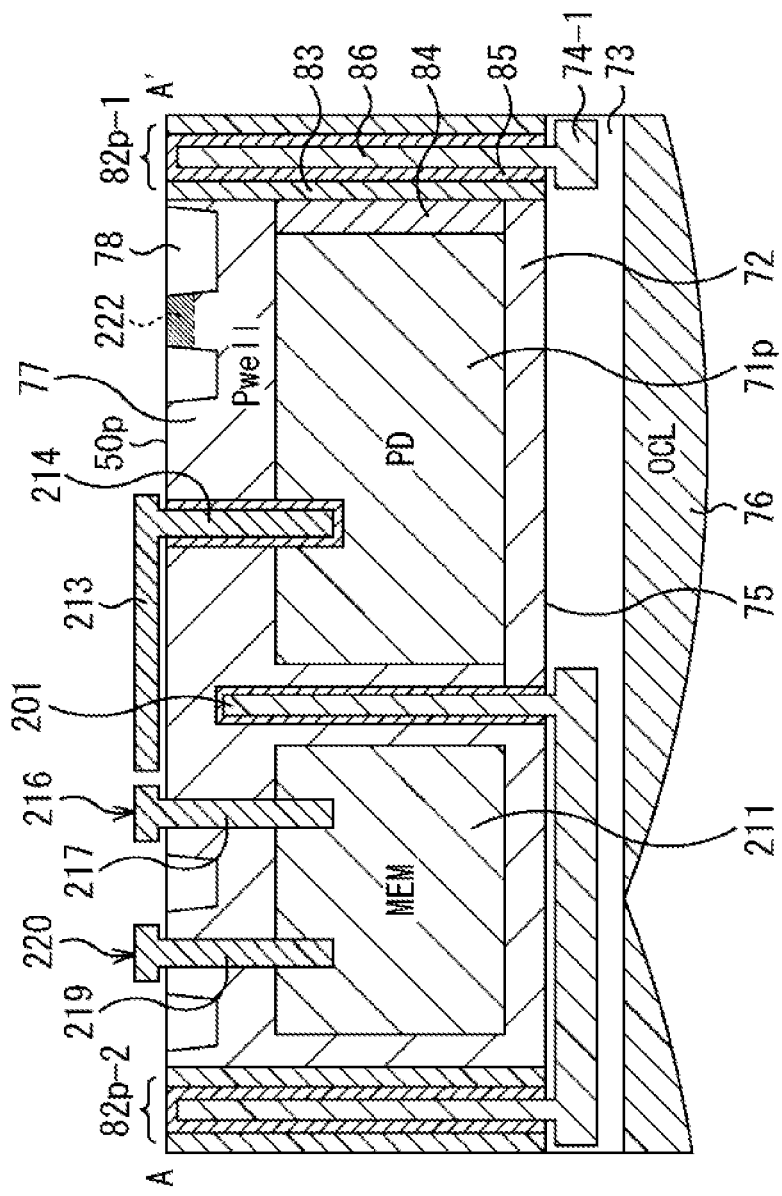
FIG. 20 is a vertical sectional view showing the fourteenth configuration example of the pixel to which the present technology is applied.

FIG. 19 is a horizontal plan view of a pixel 50p according to a fourteenth embodiment to which the present technology is applied, and FIG. 20 is a vertical sectional view of the pixel 50p cut along a line A-A' in the pixel 50p shown in FIG. 19.

The pixel 50p according to the fourteenth embodiment includes the abovementioned pixel 50 (the pixel 50a herein, for example) and a charge retaining region (corresponding to a memory 211 described below). Due to the charge retaining region being provided, a global shutter can be implemented.

The pixels 50a to 50p in the first to fourteenth embodiments are back-illuminated sensors. In general, a CMOS image sensor is of a rolling shutter type that sequentially reads each pixel, so that image distortion may occur due to a difference in exposure timing.

As a countermeasure against the occurrence of such distortion, a global shutter method for simultaneously reading all pixels by providing a charge retaining section in a pixel has been proposed. According to the global shutter method, after all pixels are simultaneously read into the charge retaining section, the read pixels can be sequentially read. Therefore, an exposure timing can be set to be the same in each pixel, and image distortion can be suppressed.

In a case where a PD 71p (photoelectric conversion section) and a memory 211 (charge retaining section) are provided on the same substrate as shown in FIG. 20, light leaked from the PD 71p may enter the memory 211. If this happens, a false image may occur.

In order to prevent such a situation, as shown in FIG. 20, a part of the substrate between the PD 71p and the memory 211 is drilled, and a light shielding material is embedded in the drilled part. The drilled part and the material embedded in the drilled part are shown as a DTI 201.

The pixel 50p has the PD 71p and the memory 211 formed in a Si substrate 70p. The memory 211 is a region having a high N-type impurity concentration like the PD 71p. The memory 211 is provided as a charge retaining section that temporarily retains electric charge photoelectrically converted by the PD 71p.

The pixel 50p is surrounded by a DTI 82p formed so as to penetrate the Si substrate 70p in the depth direction as in the other embodiments, for example, the pixel 50a shown in FIG. 3. In the pixel 50p shown in FIG. 20, a DTI 82p-1 is formed on the right side and a DTI 82p-2 is formed on the left side. The DTI 82p is formed to surround the pixel 50a (region including the PD 71p and the memory 211) as shown in the plan view of FIG. 19.

In the DTI 82p surrounding the pixel 50a, a P-type solid-phase diffusion layer 83 and an N-type solid-phase diffusion layer 84 are formed as in the other embodiments. Due to the P-type solid-phase diffusion layer 83 and the N-type solid phase diffusion layer 84, a strong electric field region is formed. Therefore, an effect of preventing deterioration in dark characteristic can be obtained as in the embodiments described above.

The DTI 201 is provided between the PD 71p and the memory 211 so as not to penetrate the Si substrate 70p in the depth direction. Unlike the DTI 82p surrounding the pixel 50p, the DTI 201 does not penetrate the Si substrate 70p. In other words, the DTI 201 formed between the PD 71p and the memory 211 is a trench that is drilled with the Pwell region 77 remaining above the DTI 201 (upper part in the figure).

A read gate 213 is formed on the DTI 201 which is formed in a non-penetrating manner. The read gate 213 includes a vertical transistor trench 214, and the vertical transistor trench 214 reaches the inside of the PD 71p. That is, the read gate 213 for reading electric charge from the PD 71p extends in the vertical direction and in the horizontal direction with respect to the PD 71p, and the read gate 213 (vertical transistor trench 214) extending in the vertical direction is formed so as to be in contact with the PD 71p.

Note that, while the description will be continued assuming that the vertical transistor trench 214 reaches the inside of the PD 71p, the vertical transistor trench 214 may be formed to be just in contact with the PD 71p or may not be in contact with the PD 71p (with a little distance therebetween). This similarly applies to other vertical transistor trenches.

A write gate 216 is formed in a region adjacent to the read gate 213. The write gate 216 is provided with a vertical transistor trench 217, and the vertical transistor trench 217 reaches (contacts) the inside of the memory 211.

Electric charges stored in the PD 71p are read by the read gate 213, and the read electric charges are written to the memory 211 by the write gate 216. In other words, the DTI 201 is configured not to penetrate the Si substrate 70p in order to provide a region where the read gate 213 and the write gate 216 are formed for enabling such processing.

A read gate 220 is formed in a region adjacent to the write gate 216. The read gate 220 includes a vertical transistor trench 219, and the vertical transistor trench 219 reaches (contacts) the inside of the memory 211.

The electric charges written (stored) in the memory 211 are read by the read gate 220 and transferred to an amplifier transistor 93 (FIG. 19). Referring to FIG. 19, the read gate 220 and the amplifier transistor 93 are connected by means of an FD wire 232. Further, the amplifier transistor 93 is connected to an N+ diffusion layer 222.

The N+ diffusion layer 222 is a region provided for suppressing blooming, and has a high N-type impurity concentration. Referring to FIG. 20, the N+ diffusion layer 222 is formed on the upper right of the PD 71p. In the region on the upper right of the PD 71p, an STI 78 is formed. That is, the region is located on the reverse side to the side where the memory 211 is located. Here, the N+ diffusion layer 222 is formed at a position distant from the accumulation region (memory 211) as one example. However, the N+ diffusion layer 222 may be formed near the accumulation region. Further, the N+ diffusion layer 222 is biased to a voltage VDD.

Due to the formation of the DTI 201 between the PD 71p and the memory 211, it is possible to prevent electric charge from flowing from the PD 71p to the memory 211. However, when the PD 71p is saturated, there is a possibility that electric charge may flow out of the PD 71p to the memory 211 because of the presence of the Pwell region 77 above the DTI 201. The N+ diffusion layer 222 is formed so that, when the PD 71p is saturated, electric charge does not flow into the memory 211 from the PD 71p.

In a case where the PD 71p is saturated, electric charge in the PD 71p flows into the N+ diffusion layer 222 formed above the PD 71*p*. Therefore, it is possible to prevent the electric charge from flowing from the PD 71*p* to the memory 211 when the PD 71*p* is saturated.

As shown in FIG. 20, the PD 71*p* and the memory 211 of the pixel 50*p* are embedded without using the surface of the Si substrate 70*p*. Since the PD 71*p* and the memory 211 are embedded, blooming can be further suppressed.

In a case where the PD 71*p* and the memory 211 are embedded, when the vertical direction in FIG. 20 is defined as a height direction, the following relation is satisfied where the height of the PD 71*p* is defined as a height H1, the height of the memory 211 is defined as a height H2, and the height of the DTI 201 is defined as a height H3.

Height H1 of PD 71*p*<Height H3 of DTI 201

Height H2 of memory 211<Height H3 of DTI 201

As described above, the pixel 50*p* has the embedded PD 71*p* and the memory 211. Therefore, electric charge is read from the PD 71*p* by the read gate 213 including the vertical transistor trench 214. Further, the read gate 213 is configured to transfer electric charge to the memory 211 over the DTI 201.

Further, in the pixel 50*p*, the N+ diffusion layer 222 is formed so that electric charge from the PD 71*p* does not flow into the memory 211 when the PD 71*p* is saturated.

Since the PD 71*p* is embedded and surrounded by the DTI 82*p*, electric charge blooms only to the upper side (upper side in FIG. 20, that is, reverse side to the entrance surface). Further, the N+ diffusion layer 222 biased to the voltage VDD is formed in the direction in which the blooming may occur. Therefore, electric charge overflowing from the PD 71*p* flows into the N+ diffusion layer 222, and thus, blooming does not occur.

Moreover, as shown in FIG. 19, the N+ diffusion layer 222 is connected to the reset transistor 92, so that electric charge flowing into the N+ diffusion layer 222 can be discharged by turning on the reset transistor 92 during a standby period.

As described above, according to the pixel 50*p*, an effect similar to the effect of the pixel 50*a* in the first embodiment can be obtained, and further, an effect of suppressing blooming can be obtained.

The configuration of the pixel 50*p* will be further described with reference to FIG. 19. FIG. 19 is a plan view of the pixel 50*p* as viewed from the wiring layer side (the side reverse to the light entrance surface). FIG. 19 shows four pixels in 2×2 array in the pixel array section 41 (FIG. 2). Focusing on one pixel 50*p* of the four pixels, in FIG. 19, the left side of the pixel 50*p* is an area where the memory 211 is provided, and the right side is an area where the PD 71*p* is provided.

The reset transistor 92, the amplifier transistor 93, the selection transistor 94, and the well contact section 231 are formed on the PD 71*p*. Further, the read gate 213 is formed so as to extend over the PD 71*p* and the memory 211 and on the DTI 201 formed in a non-penetrating manner.

The write gate 216 and the read gate 220 are formed on the memory 211. Further, as described above, the read gate 220, the amplifier transistor 93, and the N+ diffusion layer 222 are connected by means of the FD wire 232. The FD wire 232 is formed so as to extend over the DTI 201 which is formed in a non-penetrating manner.

Further, the pixel 50*p* is surrounded by the DTI 82P (DTI 82*p*-1 and DTI 82*p*-2) penetrating the Si substrate 70*p*. That is, the pixel 50*p* has a completely separated structure in which the pixels are completely separated from each other.

The configuration of the back surface side (light entrance side) of the pixel 50*p* will be described with reference to FIG. 20. The light-shielding film 74 is formed on the back surface side of the pixel 50*p*. The filler 86 formed in the DTI 82*p*-*l* and the light-shielding film 74-1 are connected. For example, the light-shielding film 74-1 may include a metal material such as tungsten (W), the filler 86 may also include the metal material forming the light-shielding film 74-1, and the filler 86 and the light-shielding film 74-1 may be integrally (continuously) formed. In the following description, the filler 86 and the light-shielding film 74 are continuously formed using the same material.

The filler 86 in the DTI 82*p*-2, the light-shielding film 74-2, and the filler in the DTI 201 are also continuously formed using the same material. The light-shielding film 74-2 is formed on the light entrance surface side of the memory 211. With this configuration, light does not enter the memory 211 from the light entrance surface side by the light-shielding film 74-2, and stray light from the adjacent pixel 50*p* (PD 71*p*) does not enter the memory 211 by the DTI 82*p*-2 and the DTI 201.

As described above, the pixel 50*p* is configured such that light does not enter the memory 211. On the other hand, the PD 71*p* is formed with an opening for allowing light to enter. The OCL 76 is formed so as to be aligned with the center of the opening (the center in the horizontal direction of the PD 71*p*).

Note that, in a case where the pixel 50*p* is used as a pixel (ZAF pixel) for detecting a phase difference on an image plane, a half of the opening in the PD 71*p* is shielded by the light-shielding film 74, and the height and curvature of the OCL 76 are adjusted so that light is focused on the light-shielding film 74.

Due to the configuration of the pixel 50*p* described above, an effect similar to the effect of the pixel 50*a* according to the first embodiment can be obtained, and further, an effect of suppressing blooming can be obtained.

Figure 21:
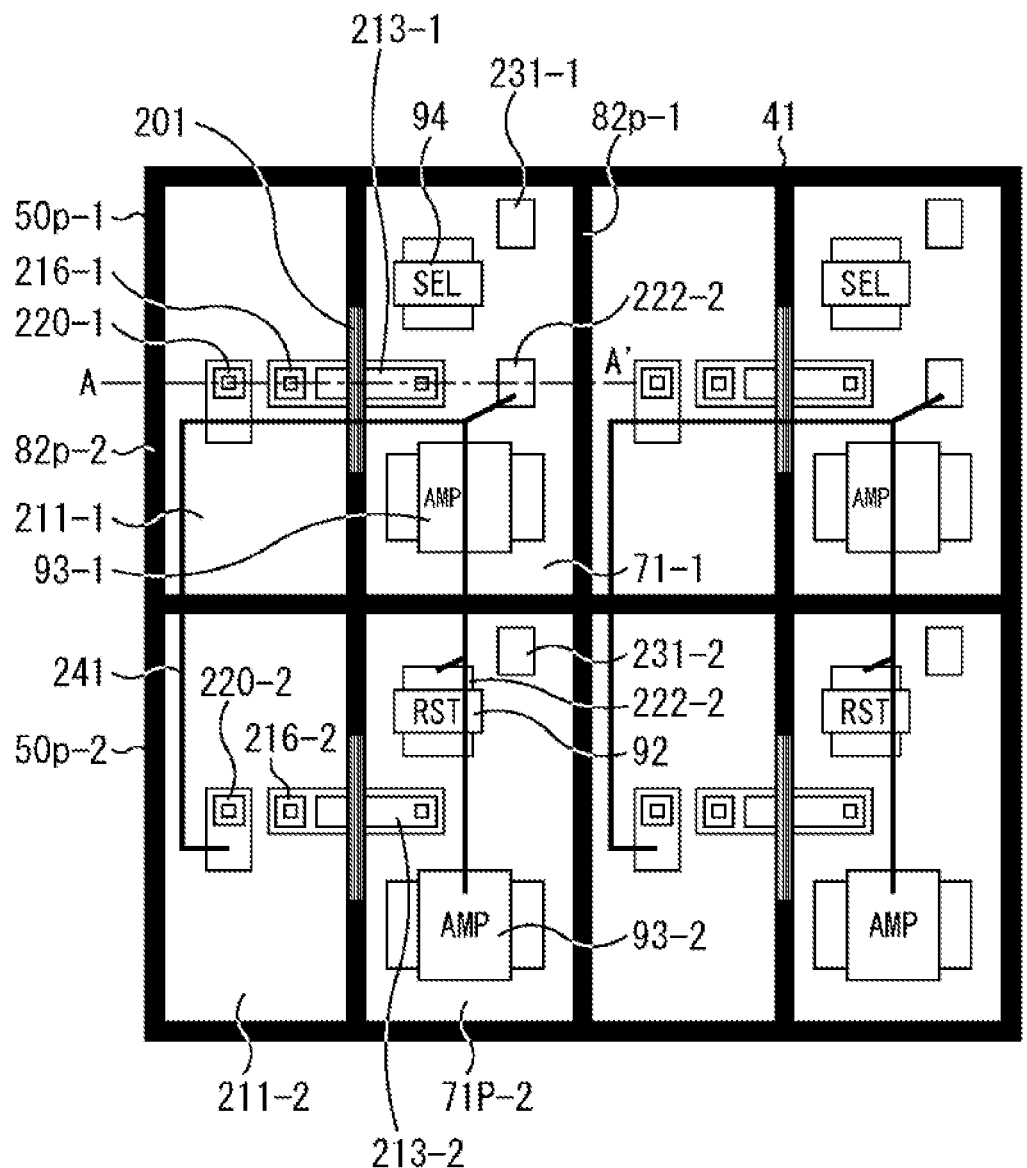
FIG. 21 is a plan view showing a configuration example in a case where a transistor is shared by two pixels.

Here, the case where each pixel 50*p* includes transistors such as the selection transistor 94 has been described as an example. However, the present technology is applicable to a case where a plurality of pixels 50*p* shares a predetermined transistor as shown in FIG. 21. As an example, a case where the reset transistor 92 and the selection transistor 94 are shared by two pixels 50*p* arranged in the vertical direction will be described with reference to FIG. 21.

FIG. 21 shows four pixels in 2×2 array in the pixel array section 41 (FIG. 2). Pixels 50*p*-1 and 50*p*-2 arranged in the vertical direction are sharing pixels.

An amplifier transistor 93-1, a selection transistor 94, a well contact section 231-1, and an N+ diffusion layer 222-1 are formed on a PD 71P-1 of the pixel 50*p*-1. A read gate 213-1 is formed so as to extend over the PD 71P-1 and a memory 211-1 on the pixel 50*p*-1. Further, a write gate 216-1 and a read gate 220-1 are formed on the memory 211-1 on the pixel 50*p*-1.

An amplifier transistor 93-2, a reset transistor 92, a well contact section 231-2, and an N+ diffusion layer 222-2 are formed on a PD 71P-2 of the pixel 50*p*-2. A read gate 213-2 is formed so as to extend over the PD 71P-2 and a memory 211-2 on the pixel 50*p*-21. Further, a write gate 216-2 and a read gate 220-2 are formed on the memory 211-2 on the pixel 50*p*-2.

The amplifier transistor 93-2 of the pixel 50*p*-2, the N+ diffusion layer 222-2 of the pixel 50*p*-2, the amplifier transistor 93-1 of the pixel 50*p*-1, the N+ diffusion layer 222-1 of the pixel 50*p*-1, the read gate 220-1 of the pixel 50*p*-1, and the read gate 220-2 of the pixel 50*p*-2 are connected by means of an FD wire 241.

As described above, the reset transistor 92 and the selection transistor 94 may be shared by two pixels.

The configuration shown in FIG. 21 is merely an example. In the configuration shown in FIG. 21, the amplifier transistors 93 are formed in the pixel 50p-1 and the pixel 50p-2, respectively, as an example. However, for example, the amplifier transistor may be shared. That is, the amplifier transistor 93 may be formed in either of the pixel 50p-1 or the pixel 50p-2.

Further, in the configuration where one amplifier transistor 93 is formed in either the pixel 50p-1 or the pixel 50p-2, a region where the amplifier transistor 93 is disposed can be increased, so that a large amplifier transistor 93 may formed.

Further, the positions of the reset transistor 92 and the amplifier transistor 93-2 may be switched.

In a case where two amplifier transistors 93 are formed as shown in FIG. 21, or in a case where one large amplifier transistor 93 is formed, random noise can be suppressed.

Further, due to the configuration shown in FIG. 21 in which a predetermined transistor is shared by a plurality of pixels, the pixel size can be reduced, whereby a reduction in size of the imaging device can be achieved.

<Manufacture of Pixel 50p>

Figure 22:
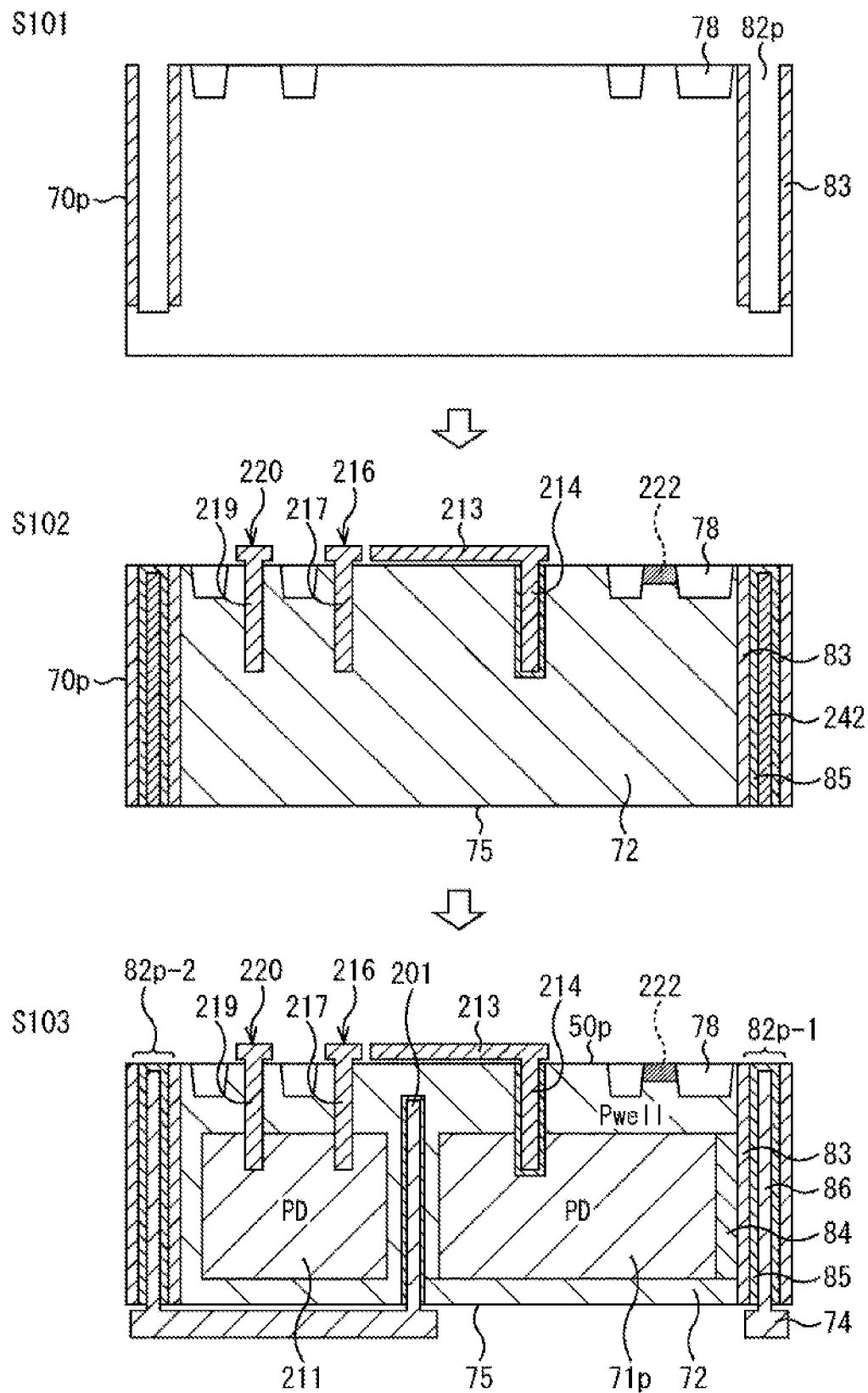
FIG. 22 is a view for describing a manufacturing method of a pixel.

The manufacture of the pixel 50p will be briefly described with reference to FIG. 22.

In step S101, a Si substrate 70p is prepared, and a trench is formed in the Si substrate 70p. Thus, a portion corresponding to the DTI 82p is formed. The formed DTI 82p is doped with a P-type impurity by a solid-phase diffusion process, whereby the P-type solid-phase diffusion layer 83 is formed.

The doping (formation of the P-type solid-phase diffusion layer 83) can be performed by oblique ion implantation or plasma doping instead of solid-phase diffusion. Further, a method may be used in which a P-type impurity layer is formed in advance by performing ion implantation a plurality of times using a resist mask from the surface before the formation of the DTI 82p.

The process involved with solid-phase diffusion described with reference to FIG. 6, for example, can be applied to the process in step S101 such as solid-phase diffusion.

In step S102, after an SiO2 film is formed in the DTI 82p, the DTI 82p is filled with polysilicon 242. Thereafter, the read gate 213 having the vertical transistor trench 214, the write gate 216 having the vertical transistor trench 217, and the read gate 220 having the vertical transistor trench 219 are respectively formed. Then, the Si substrate 70p is polished from the entrance surface side (lower side in the figure), and is thinned until the thickness thereof becomes, for example, about 4 μm.

In step S103, the DTI 201 (DTI formed in a non-penetrating manner) is formed by etching the Si substrate 70p from the light entrance surface side (the surface reverse to the surface on which the transistors are formed in step S102). After that, the polysilicon 242 with which the DTI 82p is filled is removed. Due to the processes so far, neither the DTI 82p nor the DTI 201 is filled with the filler.

The DTI 82p and the DTI 201 are filled with a metal material such as tungsten. Further, a film (referred to as a metal film) is formed on the light entrance surface side of the Si substrate 70p using the metal material. The metal film on the light entrance side of the PD 71p in the metal film formed on the light entrance surface side of the Si substrate 70p is removed by a process such as etching, whereby an opening is formed in the PD 71p. After that, the PD 71p, the memory 211, the color filter, the OCL 76, and the like are formed.

In this manner, the DTI 82p that surrounds the pixel 50p and penetrates the Si substrate 70p and the DTI 201 formed in a non-penetrating manner between the PD 71p and the memory 211 are formed at different timings.

Usually, the solid-phase diffusion process is performed at a high temperature, and after such a process at a high temperature (step S101), a metal film serving as the light-shielding film 74 is formed (step S103). Therefore, the metal film is processed without being exposed to a high temperature.

As described above, in the pixel 50p according to the fourteenth embodiment, the side surface of the PD 71p is surrounded by the DTI 82. Therefore, it is possible to prevent electric charge from flowing from the PD 71p to the memory 211, whereby blooming to the memory 211 can be suppressed.

Further, since the N+ diffusion layer 222 is formed above the PD 71p, electric charge overflowing from the PD 71p when the PD 71p is saturated can be received by the N+ diffusion layer 222. Thus, even when the PD 71p is saturated, flow of electric charge from the PD 71p into the memory 211 can be prevented, whereby blooming to the memory 211 can be suppressed.

Moreover, the DTI 82p formed in the side surfaces of the PD 71p and the memory 211 has a strong electric field region formed by the p-type solid-phase diffusion layer 83p and the N-type solid-phase diffusion layer 84p, so that the capacity of the PD 71p and the memory 211 can be increased, and the saturation signal amount Qs can be ensured.

Fifteenth Embodiment

Figure 23:
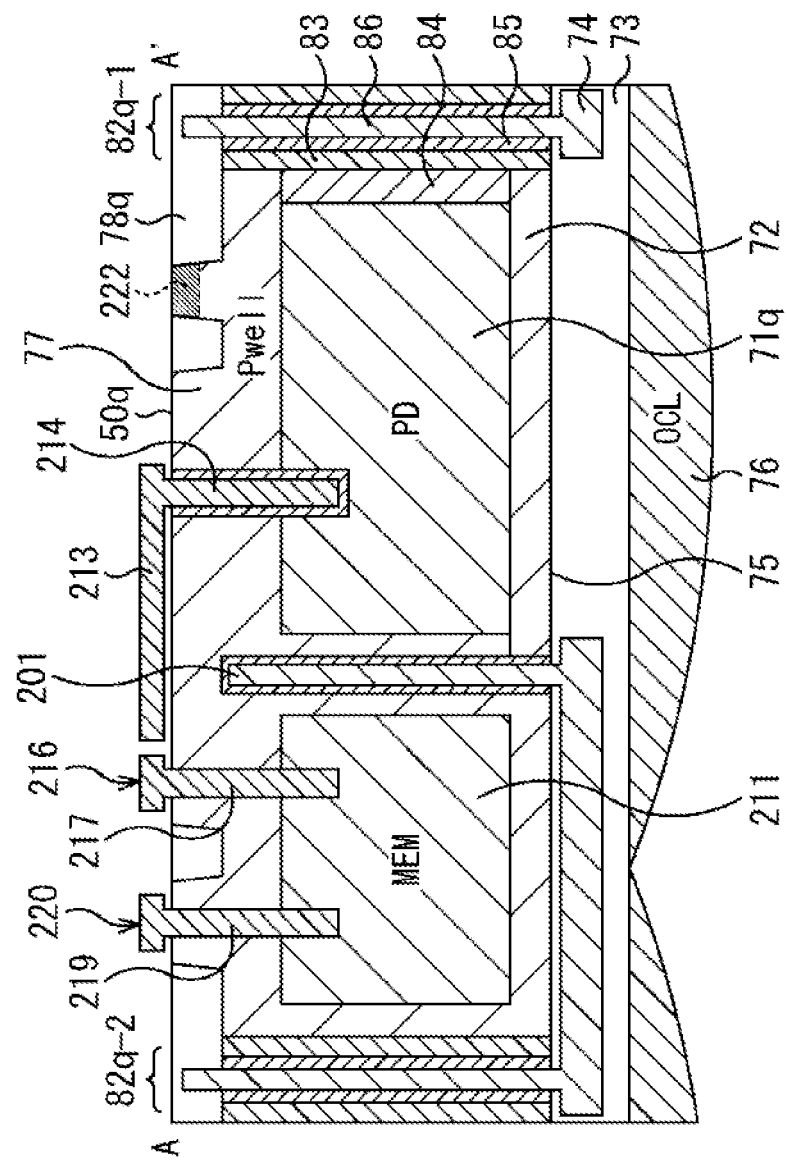
FIG. 23 is a vertical sectional view showing a fifteenth configuration example of the pixel to which the present technology is applied.

FIG. 23 is a vertical sectional view of a pixel 50q according to a fifteenth embodiment to which the present technology is applied.

The fifteenth embodiment is different from the fourteenth embodiment in that the DTI 82 is formed in the STI 78, and is similar to the fourteenth embodiment in the other configurations. Therefore, the portions similar to those in the fourteenth embodiment are denoted by the same reference signs, and the description thereof will be omitted as appropriate.

In the pixel 50q shown in FIG. 23, an STI 78q formed in the active region 77 is formed up to the portion where a DTI 82q is formed (up to the end of the pixel 50q). Then, the DTI 82q is formed under the STI 78q.

In other words, the STI 78q is formed at the portion where the DTI 82q is formed, and the STI 78q and the DTI 82q are formed at positions where the STI 78q and the DTI 82q are in contact with each other.

With such a formation, it is possible to reduce the size of the pixel 50q as compared with a case where the STI 78q and the DTI 82q are formed at different positions (for example, the pixel 50p (FIG. 20) in the fourteenth embodiment).

The pixel 50q according to the fifteenth embodiment can also provide an effect similar to that of the pixel 50a according to the fourteenth embodiment, that is, an effect of preventing deterioration in dark characteristics and an effect of suppressing blooming.

Sixteenth Embodiment

Figure 24:
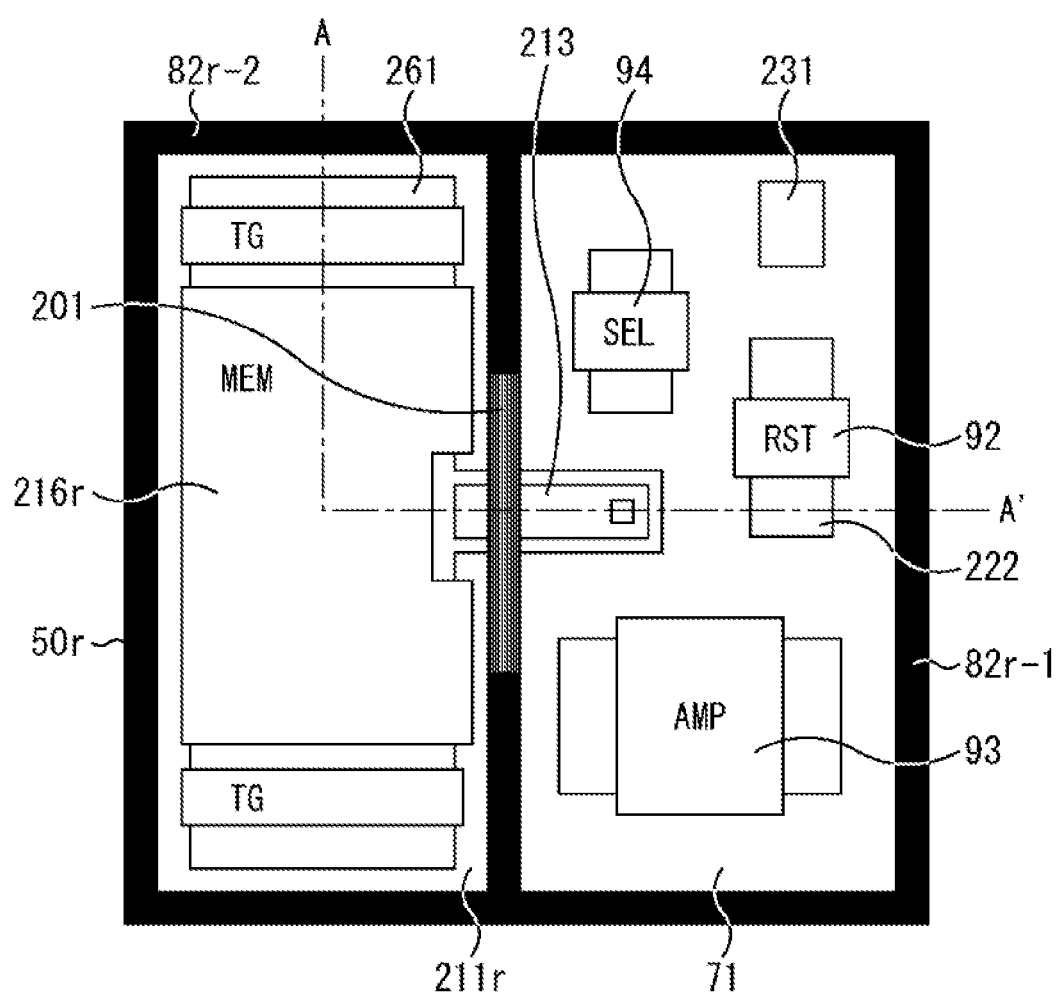
FIG. 24 is a horizontal plan view showing a sixteenth configuration example of the pixel to which the present technology is applied.
Figure 25:
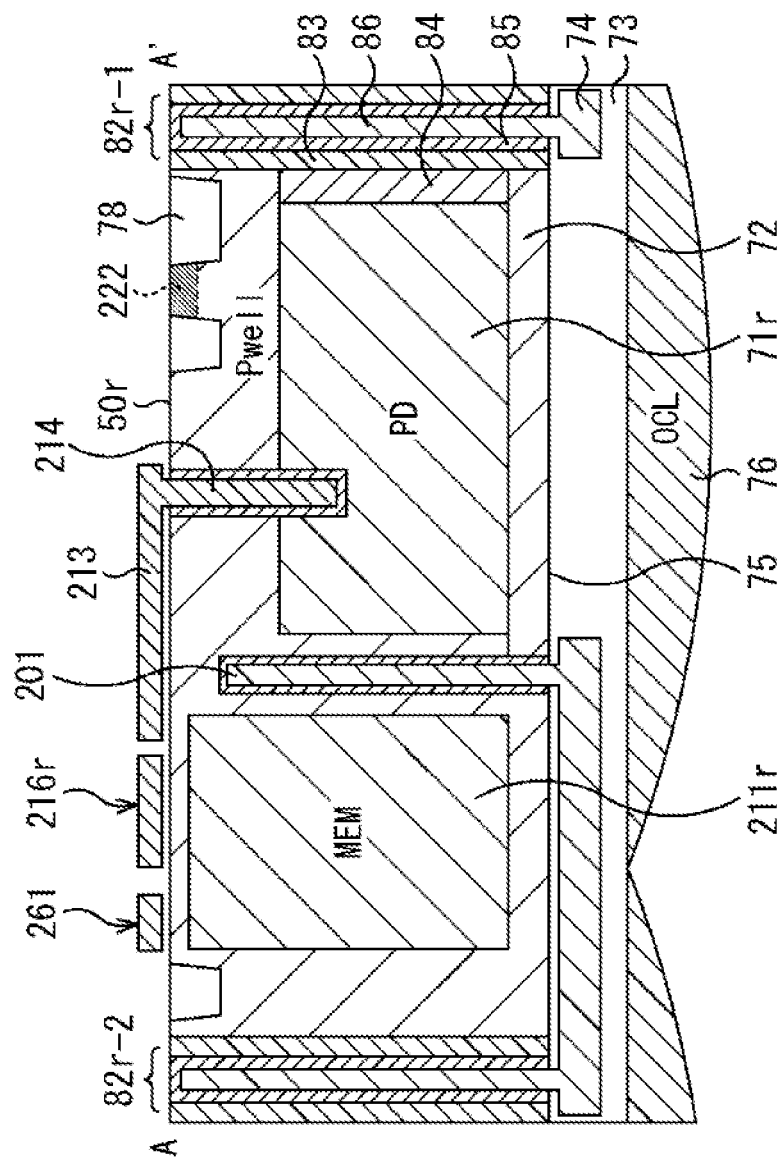
FIG. 25 is a vertical sectional view showing the sixteenth configuration example of the pixel to which the present technology is applied.

FIG. 24 is a horizontal plan view of a pixel 50r according to a sixteenth embodiment to which the present technology is applied, and FIG. 25 is a vertical sectional view of the pixel 50r cut along a line A-A' in the pixel 50r shown in FIG. 24.

In the above fourteenth and fifteenth embodiments, the PD 71 and the memory 211 are both embedded as an example. However, the present technology is also applicable to a pixel 50 in which one of the PD 71 and the memory 211 is embedded and the other is not embedded. In the pixel 50r in the embodiment in FIG. 16, a PD 71r is embedded, and a memory 211r is not embedded.

The memory 211r of the pixel 50r shown in FIG. 25 is formed using the surface of the Si substrate 70 as well. With such a configuration, electric charge can be accumulated near the surface of the Si substrate 70r immediately below the gate, and the capacity of the memory 211r can be increased.

In the pixel 50r, when the vertical direction in FIG. 25 is defined as a height direction, the following relation is satisfied where the height of the PD 71r is defined as a height H1, the height of the memory 211r is defined as a height H2, and the height of the DTI 201 is defined as a height H3.

Height H1 of PD 71r<Height H3 of DTI 201<Height H2 of memory 211r

Due to the configuration in which the memory 211r is not embedded as described above, a gate having no vertical transistor trench can be used. That is, as shown in FIG. 25, a write gate 216r for writing electric charge read from the PD 71r into the memory 211r is constituted by a gate having no vertical transistor trench. Further, the write gate 216r also serves as a memory gate for reading electric charge from the memory 211r.

Further, a transfer transistor gate 261 is also formed above the memory 211r. In a plan view, as shown in FIG. 25, the transfer transistor gate 261 is formed on the end side of the region where the memory 211r is formed.

As shown in FIG. 24, a reset transistor 92, an amplifier transistor 93, a selection transistor 94, and a well contact section 231 are formed on the PD 71r of the pixel 50r. Further, a read gate 213 is formed on the DTI 201 so as to extend over the PD 71r and the memory 211r. The write gate 216r and the transfer transistor gate 261 are formed on the memory 211r.

As shown in FIG. 25, an N+ diffusion layer 222 is formed in the pixel 50r. Therefore, when the PD 71r is saturated, electric charge from the PD 71r does not flow into the memory 211r.

The pixel 50r according to the sixteenth embodiment can also provide an effect similar to that of the pixel 50a according to the fourteenth embodiment, that is, an effect of preventing deterioration in dark characteristics and an effect of suppressing blooming.

Seventeenth Embodiment

Figure 26:
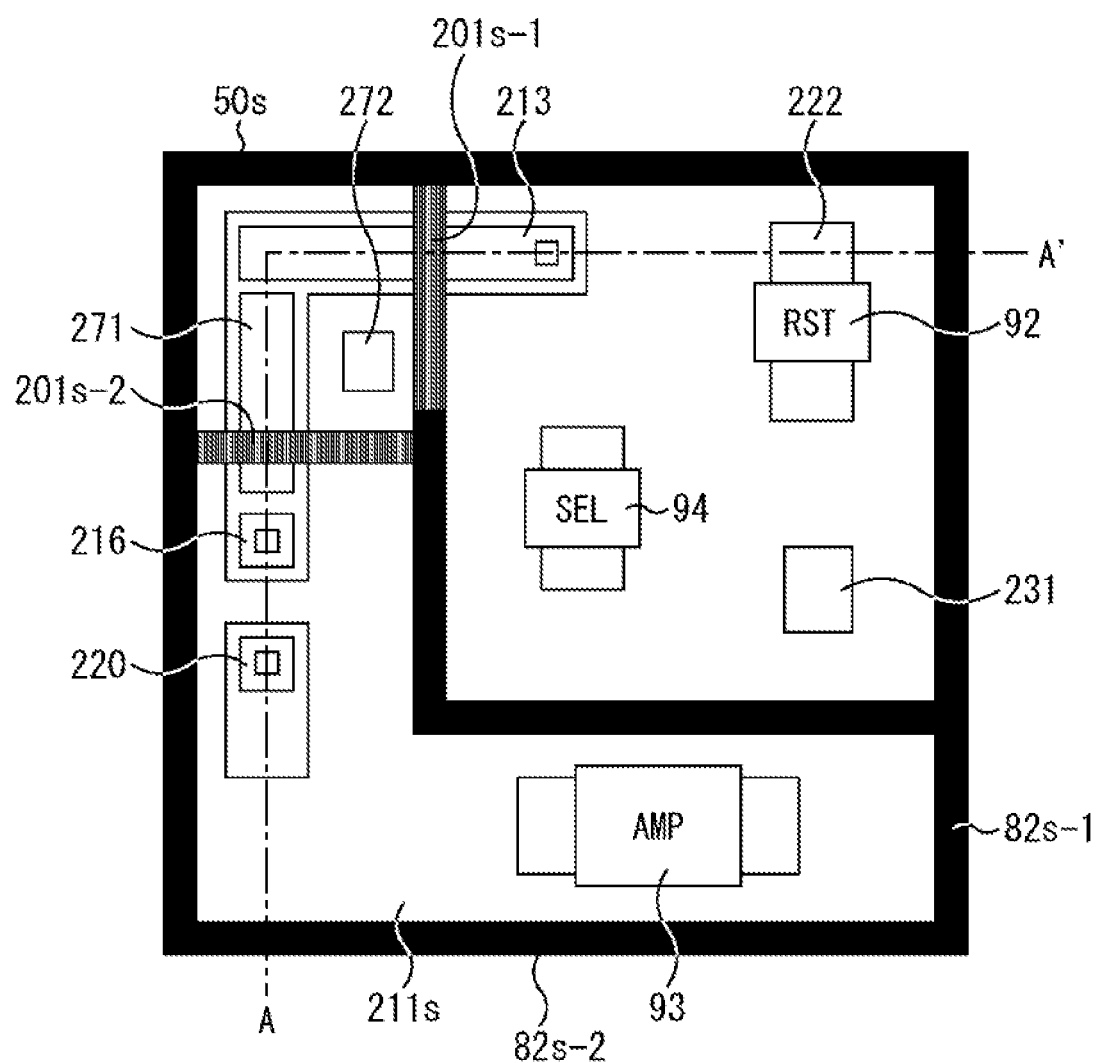
FIG. 26 is a horizontal plan view showing a seventeenth configuration example of the pixel to which the present technology is applied.
Figure 27:
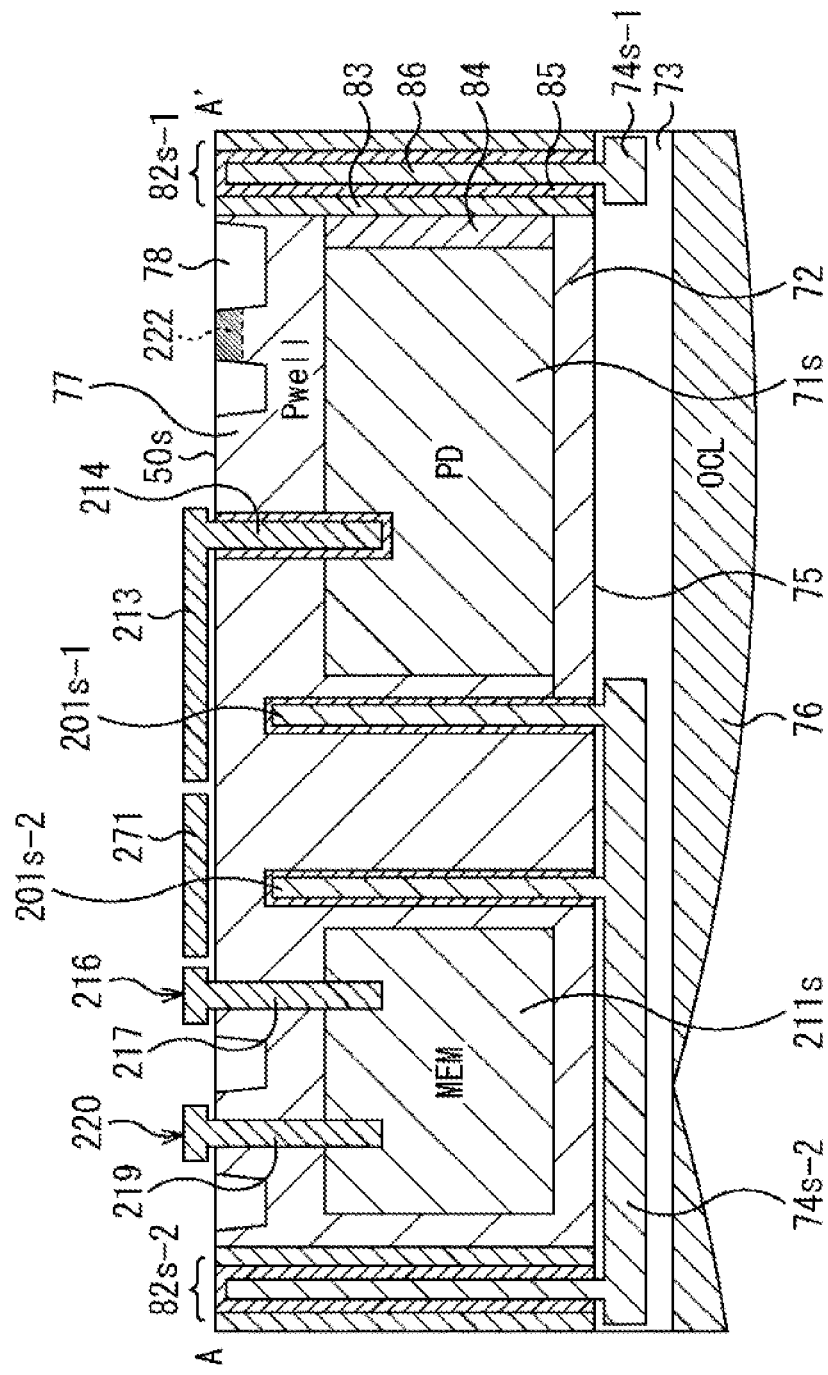
FIG. 27 is a vertical sectional view showing the seventeenth configuration example of the pixel to which the present technology is applied.

FIG. 26 is a horizontal plan view of a pixel 50s according to a seventeenth embodiment to which the present technology is applied, and FIG. 27 is a vertical sectional view of the pixel 50s cut along a line A-A' in the pixel 50s shown in FIG. 26.

The pixel 50s according to the seventeenth embodiment is different from the pixel 50p according to the fourteenth embodiment in that a transfer gate 271 is added. The other configurations are similar to those of the pixel 50p according to the fourteenth embodiment.

Referring to the pixel 50p shown in FIG. 27, a read gate 213 for reading electric charge from a PD 71s, a transfer gate 271 for transferring the read electric charge to a memory 211s, a write gate 216 for writing the transferred electric charge to the memory 211s, and a read gate 220 for reading the electric charge written to the memory 211s are formed on the front surface side (upper side in the figure) of the pixel 50p.

Among these gates, the read gate 213, the write gate 216, and the read gate 220 include a vertical transistor trench 214, a vertical transistor trench 217, and a vertical transistor trench 219, respectively.

Returning back to the plan view of FIG. 26, such gate arrangement will be further described. As shown in FIG. 26, a reset transistor 92, a selection transistor 94, and a well contact section 231 are formed on the PD 71s of the pixel 50s. Further, the read gate 213 is formed on a DTI 201s-1 so as to extend over the PD 71s and the memory 211s.

In addition, the transfer gate 271 is formed on a Pwell region 77 existing between the PD 71s and the memory 211s. The transfer gate 271 is formed so as to extend over a DTI 201s-2. In addition, in the Pwell region 77 existing between the PD 71s and the memory 211s, an N+ diffusion layer 272 (FIG. 26) is also formed.

The write gate 216, the read gate 220, and an amplifier transistor 93 are formed on the memory 211s.

Referring to the pixel 50r shown in FIGS. 26 and 27, the DTI 201s-1 and the DTI 201s-2 are formed between the PD 71s and the memory 211s, and the Pwell region 77 is provided between the DTI 201s-1 and the DTI 201s-2.

Here, the case where two DTIs, the DTI 201s-1 and the DTI 201s-2, are formed is described as an example. However, either the DTI 201s-1 or the DTI 201s-2 may only be formed. Further, the DTI 201s-1 and the DTI 201s-2 may have the same shape, or may have different shapes. For example, one of them may be thicker than the other, or may be higher than the other.

Note that the arrangement position, shape, size, and the like of the gates of the pixel 50r shown in FIGS. 26 and 27 are examples, and other arrangement positions, shapes, sizes, and the like may be employed. For example, the transfer gate 271 may be longer than the illustrated transfer gate, and the read gate 213 may be shorter than the illustrated read gate.

Referring to FIG. 27, the DTI 201s-1, the DTI 201s-2, and the DTI 82s-2 are continuously formed by being connected via a light-shielding film 74s-2. As described above, in the pixel 50s according to the seventeenth embodiment as well, the PD 71p is embedded and surrounded by the DTI 82p and the DTI 201s, whereby electric charge blooms only to the upper side (upper side in FIG. 27, that is, reverse side to the entrance surface).

Further, the N+ diffusion layer 222 biased to the voltage VDD is formed in the direction in which the blooming may occur. Therefore, electric charge overflowing from the PD 71s flows into the N+ diffusion layer 222, and thus, blooming does not occur.

In addition, two DTIs, DTI 201s-1 and DTI 201s-2, are formed between the PD 71s and the memory 211s. This makes it possible to enhance the effect of suppressing smear on the memory 211s. Furthermore, due to the formation of two DTIs, the possibility of an occurrence of blooming can be reduced as compared with the case where only one DTI is formed.

Furthermore, electric charge can be more reliably transferred from the PD 71s to the memory 211 by providing the transfer gate 271. In the pixel 50s, the electric charge read from the PD 71s is once held in a region under the transfer gate 271 or both in the region under the transfer gate 271 and in the memory 211s. Then, after the read gate 213 is turned off, all electric charges are moved from the region under the transfer gate 271 to the memory 211s.

Since the read gate 213 is turned off when the electric charges are transferred to the memory 211s, it is possible to prevent the electric charges from flowing back to the PD 71s. Therefore, according to the pixel 50s, electric charge can be more reliably transferred from the PD 71s to the memory 211.

The pixel 50s according to the seventeenth embodiment can also provide an effect similar to that of the pixel 50a according to the fourteenth embodiment, that is, an effect of preventing deterioration in dark characteristics and an effect of suppressing blooming. Further, according to the pixel 50s in the seventeenth embodiment, it is possible to more reliably transfer electric charge from the PD 71s to the memory 211.

Eighteenth Embodiment

Figure 28:
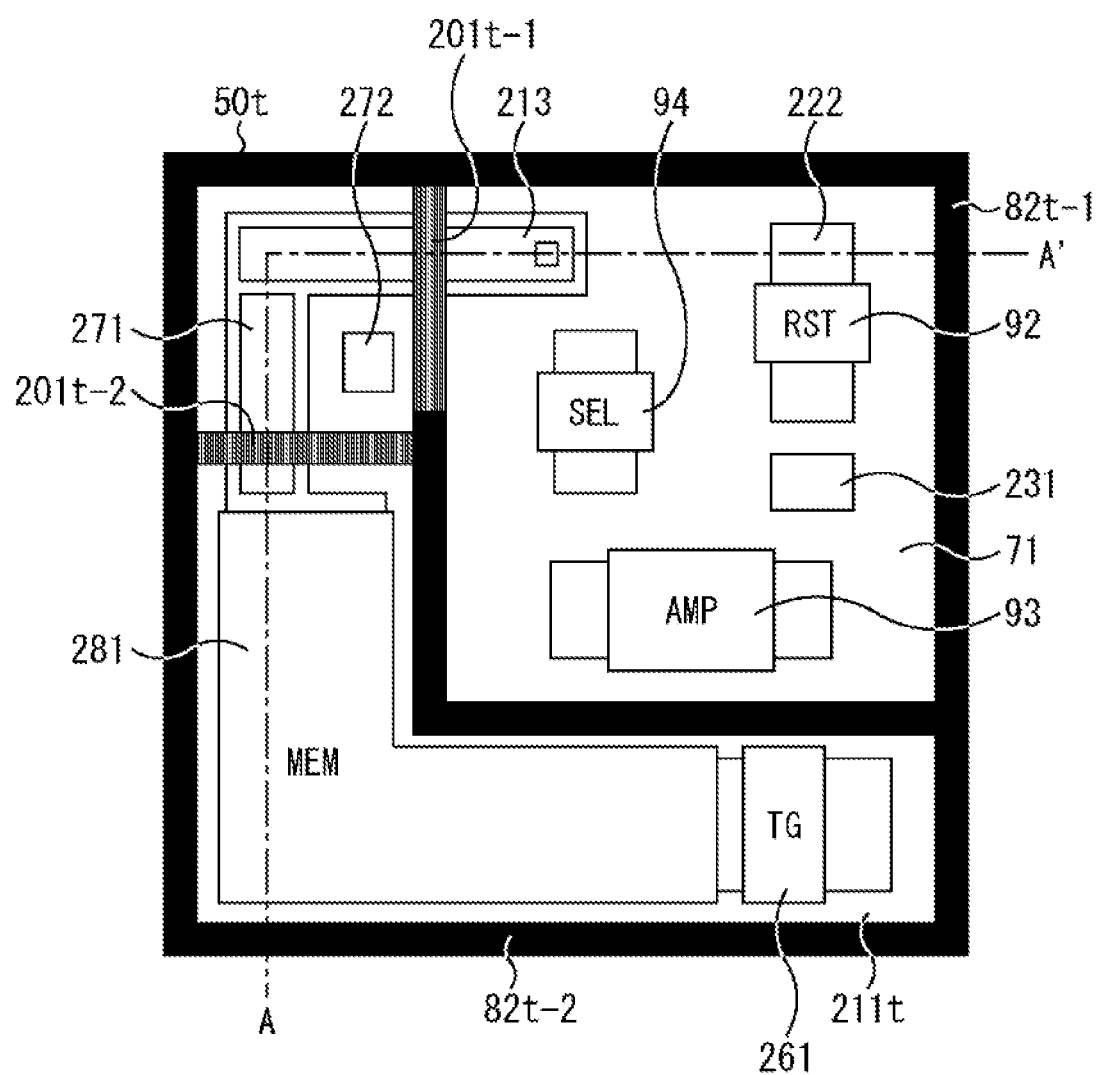
FIG. 28 is a horizontal plan view showing an eighteenth configuration example of the pixel to which the present technology is applied.
Figure 29:
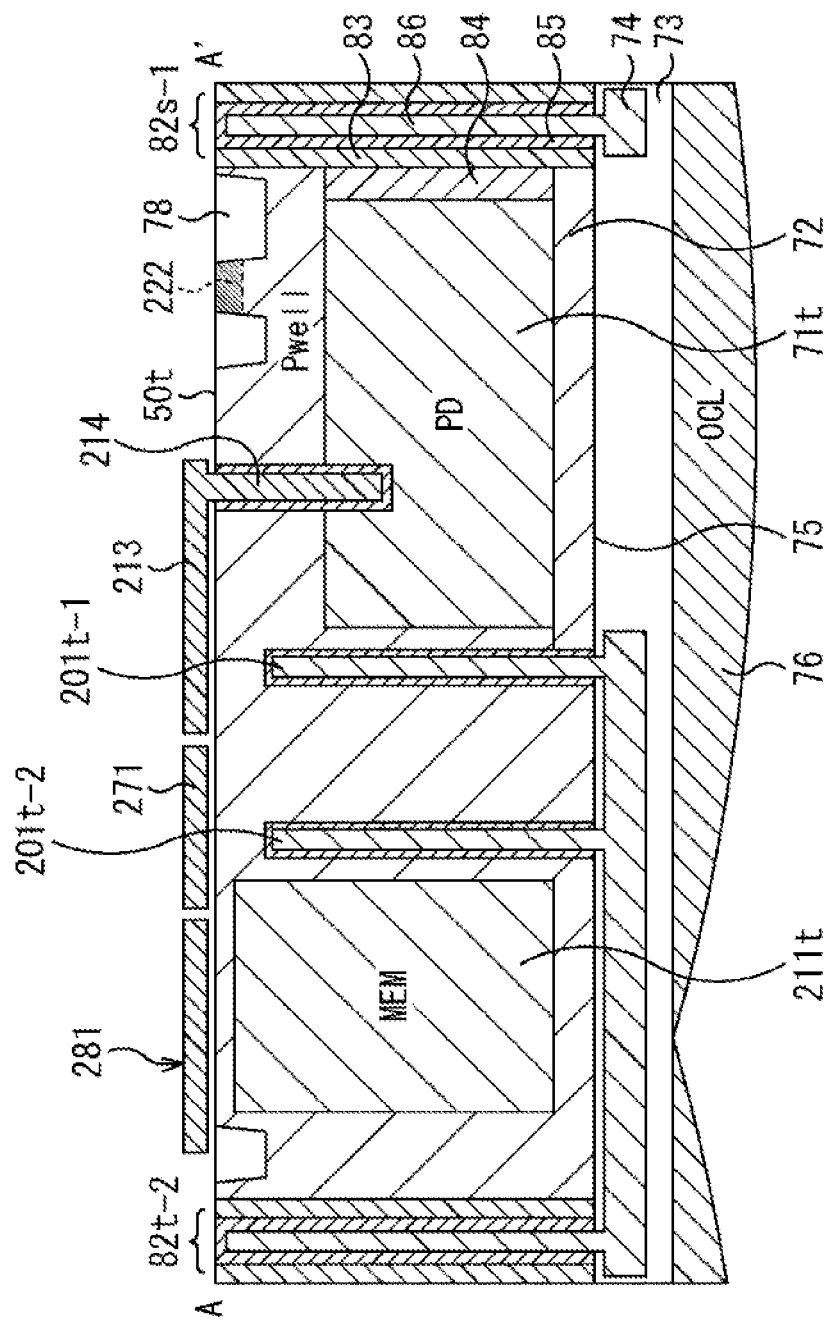
FIG. 29 is a vertical sectional view showing the eighteenth configuration example of the pixel to which the present technology is applied.

FIG. 28 is a horizontal plan view of a pixel 50t according to an eighteenth embodiment to which the present technology is applied, and FIG. 29 is a vertical sectional view of the pixel 50t cut along a line A-A' in the pixel 50t shown in FIG. 28.

The pixel 50t according to the eighteenth embodiment has a configuration obtained by combining the configuration of the pixel 50r according to the sixteenth embodiment and the configuration of the pixel 50s according to the seventeenth embodiment. That is, the pixel 50t in the eighteenth embodiment has a configuration in which a memory 211t is not embedded like the pixel 50r in the sixteenth embodiment, and has a transfer gate 271 like the pixel 50s in the seventeenth embodiment.

The memory 211t of the pixel 50t is formed using the surface of the Si substrate 70 as well. With such a configuration, electric charge can be accumulated near the surface of the Si substrate 70t immediately below the gate, and the capacity of the memory 211t can be increased.

In the pixel 50t, when the vertical direction in FIG. 29 is defined as a height direction, the following relation is satisfied where the height of a PD 71t is defined as a height H1, the height of the memory 211t is defined as a height H2, and the height of the DTI 201 is defined as a height H3.

Height H1 of PD 71t<Height H3 of DTI 201<Height H2 of memory 211t

Due to the configuration in which the memory 211t is not embedded as described above, a gate having no vertical transistor trench can be used. That is, as shown in FIG. 29, the transfer gate 271 that transfers the electric charge read from the PD 71t to the memory 211t and the memory gate 281 are constituted by gates having no vertical transistor trench. The memory gate 281 is a gate that performs writing and reading of electric charge from the memory 211t.

Since the transfer gate 271 is provided, electric charge read from the PD 71t is once held in a region under the transfer gate 271 or both in the region under the transfer gate 271 and in the memory 211t. Then, after the read gate 213 is turned off, all electric charges are moved from the region under the transfer gate 271 to the memory 211t. Therefore, electric charge can be more reliably transferred from the PD 71s to the memory 211.

As shown in FIG. 28, a reset transistor 92, an amplifier transistor 93, a selection transistor 94, and a well contact section 231 are formed on the PD 71t of the pixel 50t. Further, a read gate 213 is formed on a DTI 201t-1 so as to extend over the PD 71t and the memory 211t.

In addition, a transfer gate 271 is formed on a Pwell region 77 existing between the PD 71t and the memory 211t. The transfer gate 271 is formed so as to extend over the DTI 201t-2. In addition, an N+ diffusion layer 272 is also formed in the Pwell region 77 existing between the PD 71t and the memory 211t. A memory gate 281 and a transfer transistor gate 261 are formed on the memory 211t.

As shown in FIG. 25, an N+ diffusion layer 222 is formed in the pixel 50t. Therefore, when the PD 71t is saturated, electric charge from the PD 71t does not flow into the memory 211t.

The pixel 50t according to the eighteenth embodiment can also provide an effect similar to that of the pixel 50a according to the fourteenth embodiment, that is, an effect of preventing deterioration in dark characteristics and an effect of suppressing blooming. Further, according to the pixel 50t in the eighteenth embodiment, electric charge can be more reliably transferred from the PD 71t to the memory 211t.

Nineteenth Embodiment

Figure 30:
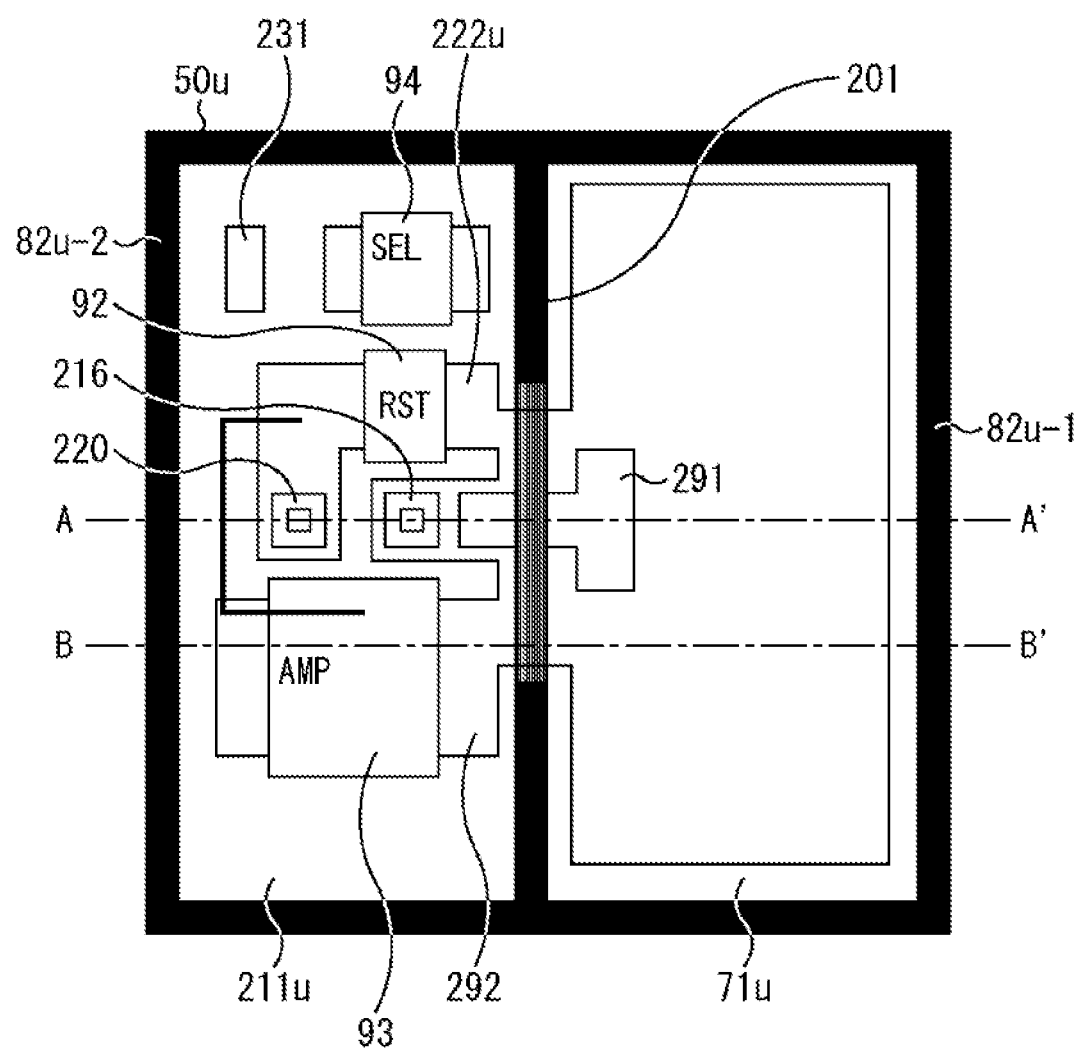
FIG. 30 is a horizontal plan view showing a nineteenth configuration example of the pixel to which the present technology is applied.
Figure 31:
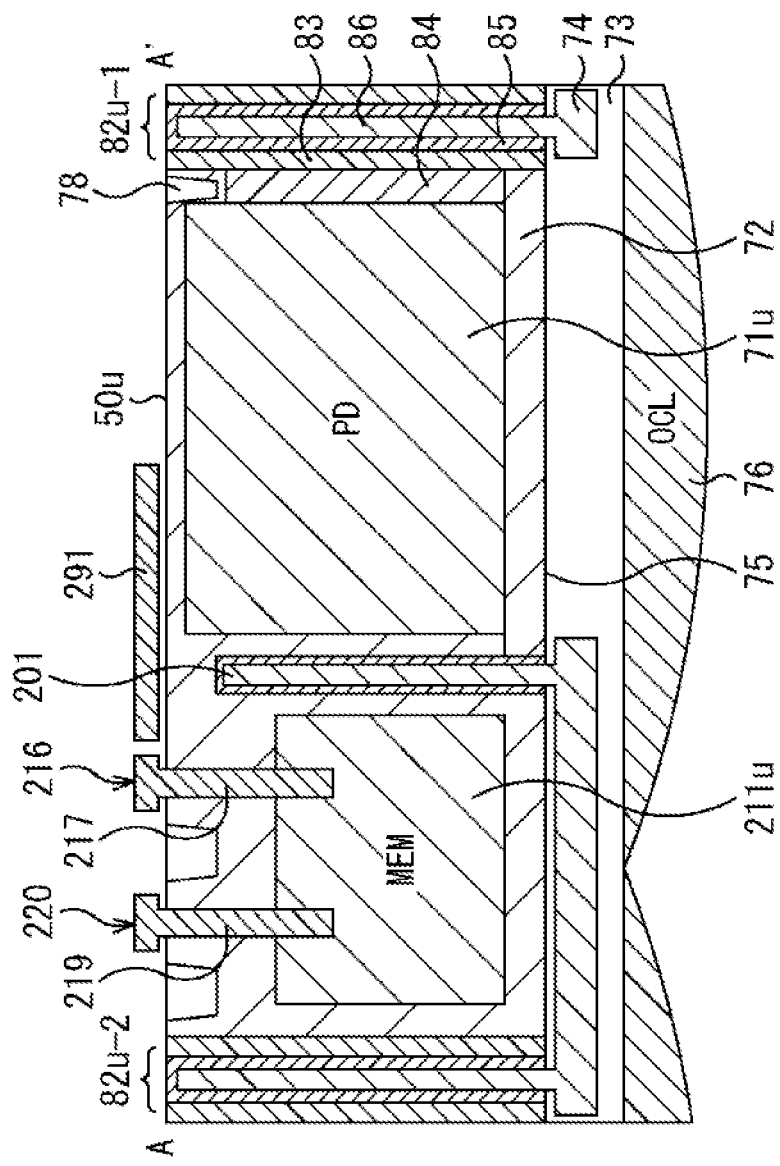
FIG. 31 is a vertical sectional view showing the nineteenth configuration example of the pixel to which the present technology is applied.
Figure 32:
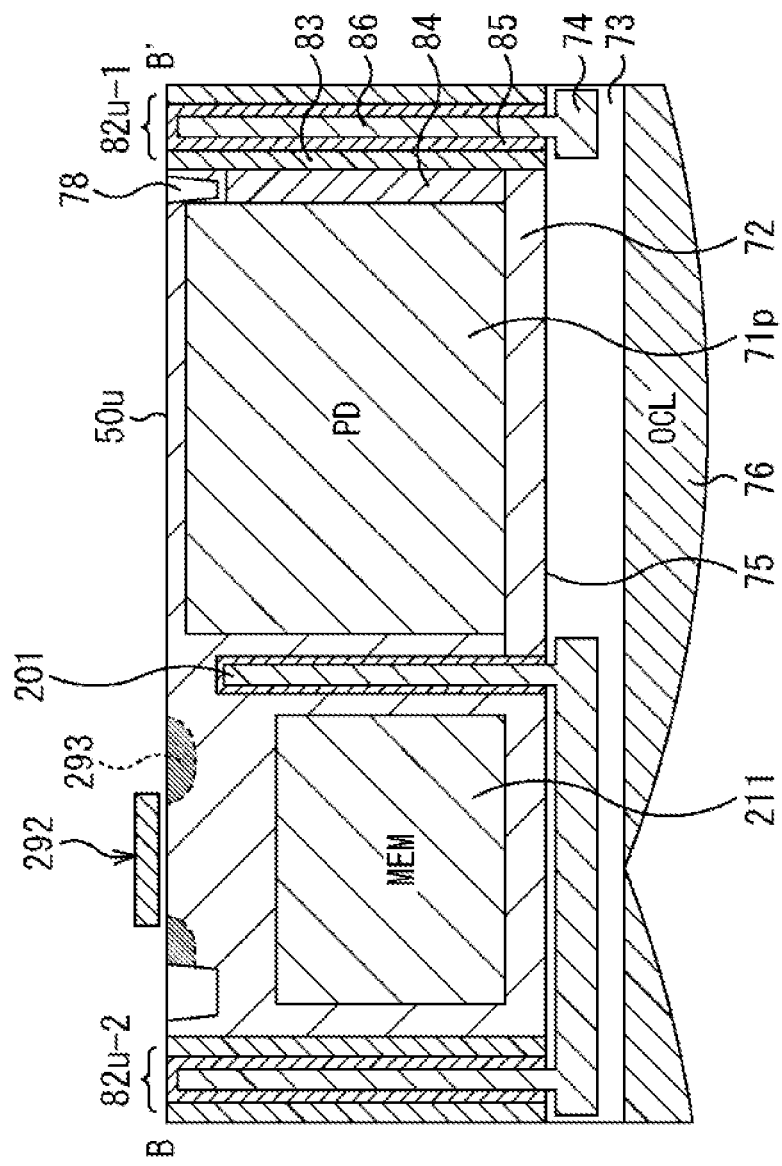
FIG. 32 is a vertical sectional view showing the nineteenth configuration example of the pixel to which the present technology is applied.

FIG. 30 is a horizontal plan view of a pixel 50u according to a nineteenth embodiment to which the present technology is applied, FIG. 31 is a vertical sectional view of the pixel 50u cut along a line A-A' in the pixel 50u shown in FIG. 30, and FIG. 32 is a vertical sectional view of the pixel 50u cut along a line B-B' in the pixel 50u shown in FIG. 30.

In the above fourteenth to eighteenth embodiments, the PD 71 is embedded as an example. However, the present technology is also applicable to a pixel 50 in which the PD 71 is not embedded. In the pixel 50u shown in FIGS. 30 to 32, a PD 71u is not embedded, and a memory 211r is embedded.

The PD 71u of the pixel 50u shown in FIG. 31 is formed using the surface of the Si substrate 70 as well.

With such a configuration, an electric field can be ensured, and the saturation signal amount Qs can be increased.

In the pixel 50u, when the vertical direction in FIG. 31 is defined as a height direction, the following relation is satisfied where the height of the PD 71u is defined as a height H1, the height of the memory 211u is defined as a height H2, and the height of the DTI 201 is defined as a height H3.

Height H2 of memory 211u<Height H3 of DTI 201<Height H1 of PD 71u

Due to the configuration in which the PD 71u is not embedded as described above, a gate having no vertical transistor trench can be used. That is, as shown in FIG. 31, a read gate 291 for reading electric charge from the PD 71u is constituted by a gate having no vertical transistor trench.

Since the memory 211u is embedded, a write gate 216 has a vertical transistor trench 217, and a read gate 220 has a vertical transistor trench 219.

In the pixel 50u, an N+ diffusion layer 293 is formed so that electric charge from the PD 71u does not flow into the memory 211u when the PD 71u is saturated. The N+ diffusion layer 293 is formed near an amplifier gate 292 and between the DTI 201 and the amplifier gate 292, as shown in FIG. 32. In this case, the N+ diffusion layer 293 is formed at the drain of the amplifier transistor 93.

Further, as shown in the plan view of FIG. 30, an N+ diffusion layer 222u is also formed at the drain of the reset transistor 92. The N+ diffusion layer 293 and the N+ diffusion layer 222u are biased to voltage VDD.

In FIG. 50u, when the PD 71u is saturated, electric charge flows into the N+ diffusion layer 293 and the N+ diffusion layer 222u. Further, the PD 71u is surrounded by the DTI 82u and the DTI 201. Thus, an occurrence of blooming can be prevented.

In a plan view of the pixel 50u as shown in FIG. 30, a read gate 291 is formed on the DTI 201 so as to extend over the PD 71u and the memory 211u. Further, a reset transistor 92, an amplifier transistor 93, a selection transistor 94, and a well contact section 231 are formed on the memory 211u. Moreover, as described above, the N+ diffusion layer 222u is formed at the drain of the reset transistor 92, and the N+ diffusion layer 293 is formed at the drain of the amplifier transistor 93.

As described above, due to the formation of the N+ diffusion layer 222u and the N+ diffusion layer 293, electric charge does not flow into the memory 211u from the PD 71u in the pixel 50u when the PD 71u is saturated.

The pixel 50u can be manufactured by a manufacturing process similar to the manufacturing process (for example, the process described with reference to FIG. 22) of the abovementioned pixel 50, for example, pixel 50p (FIG. 20). During the manufacturing process, the N+ diffusion layer 293 (N+ diffusion layer 222u) of the pixel 50u is formed at a position as described below.

In a case of the pixel 50u, no STI is formed between the N+ diffusion layer 293 (N+ diffusion layer 222u) and the PD 71u. Therefore, the N+ diffusion layer 293 (N+ diffusion layer 222u) and the PD 71u need to be positioned distant from each other to some extent so as to prevent the potential barrier in this portion from being lowered.

On the other hand, if the distance between the N+ diffusion layer 293 (N+ diffusion layer 222u) and the PD 71u is too large, the potential barrier becomes too high and may not function as a blooming destination. The distance between the N+ diffusion layer 293 (N+ diffusion layer 222u) and the PD 71u is set in consideration of such factors. As an example, the distance between the N+ diffusion layer 293 (N+ diffusion layer 222u) and the PD 71u can be set to about 0.2 μm to 1 μm.

The pixel 50u according to the nineteenth embodiment can also provide an effect similar to that of the pixel 50a according to the fourteenth embodiment, that is, an effect of preventing deterioration in dark characteristics and an effect of suppressing blooming.

Note that, although not shown, the nineteenth embodiment can be combined with the fourteenth to eighteenth embodiments.

For example, it is also possible to form the DTI 82 in the STI 78 by combining the fifteenth embodiment (FIG. 23) and the nineteenth embodiment. Further, it is also possible to form a gate corresponding to the transfer gate 271 between the read gate 291 (FIG. 31) and the write gate 216 by combining the seventeenth embodiment (FIG. 27) and the nineteenth embodiment.

Twentieth Embodiment

Figure 33:
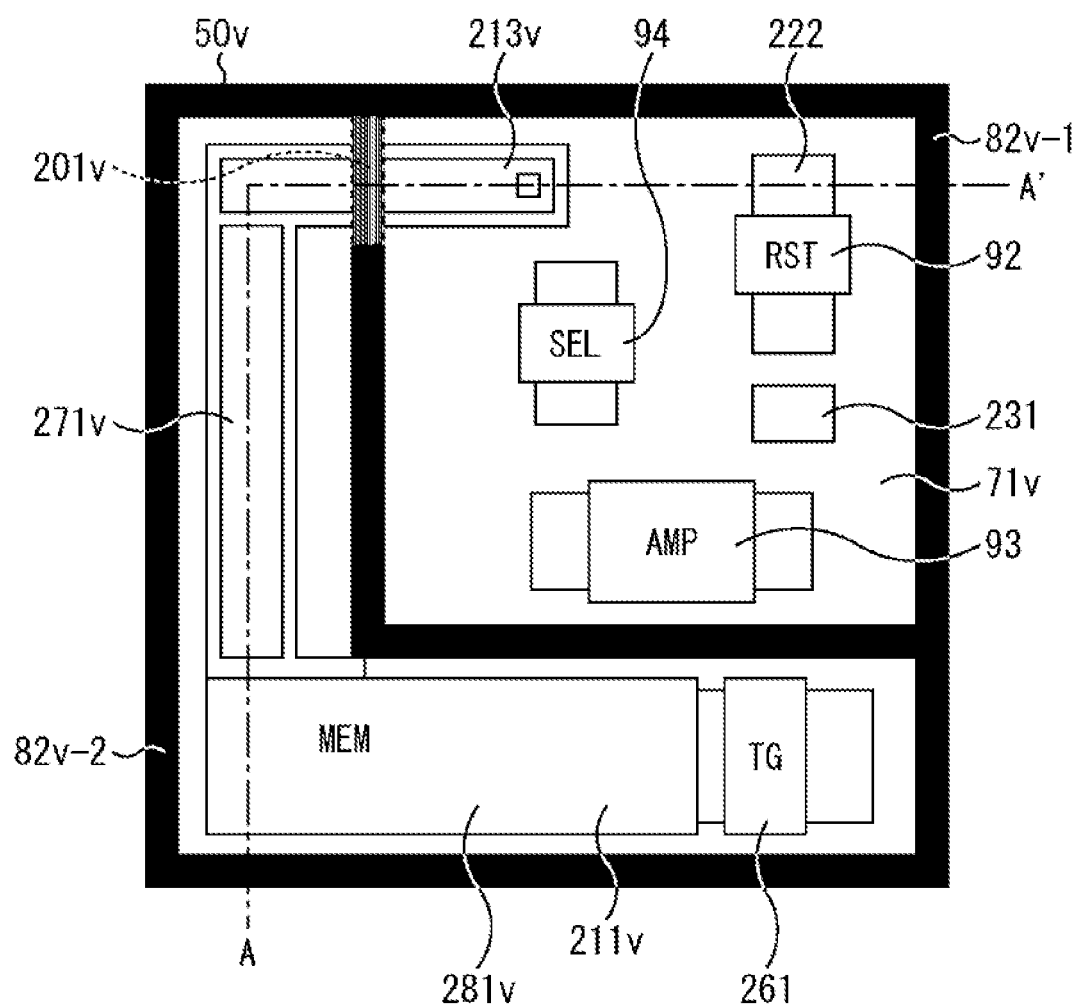
FIG. 33 is a horizontal sectional view showing a twentieth configuration example of the pixel to which the present technology is applied.
Figure 34:
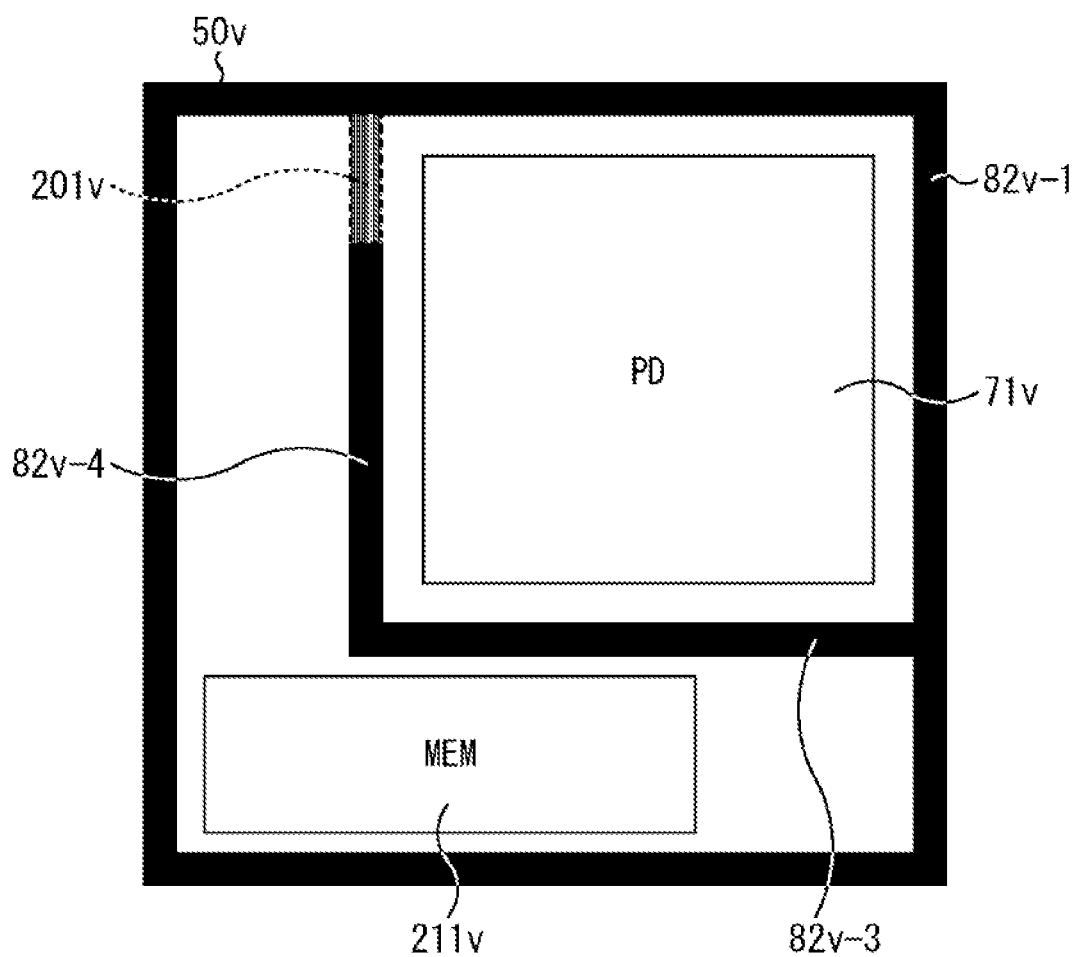
FIG. 34 is a horizontal sectional view showing the twentieth configuration example of the pixel to which the present technology is applied.
Figure 35:
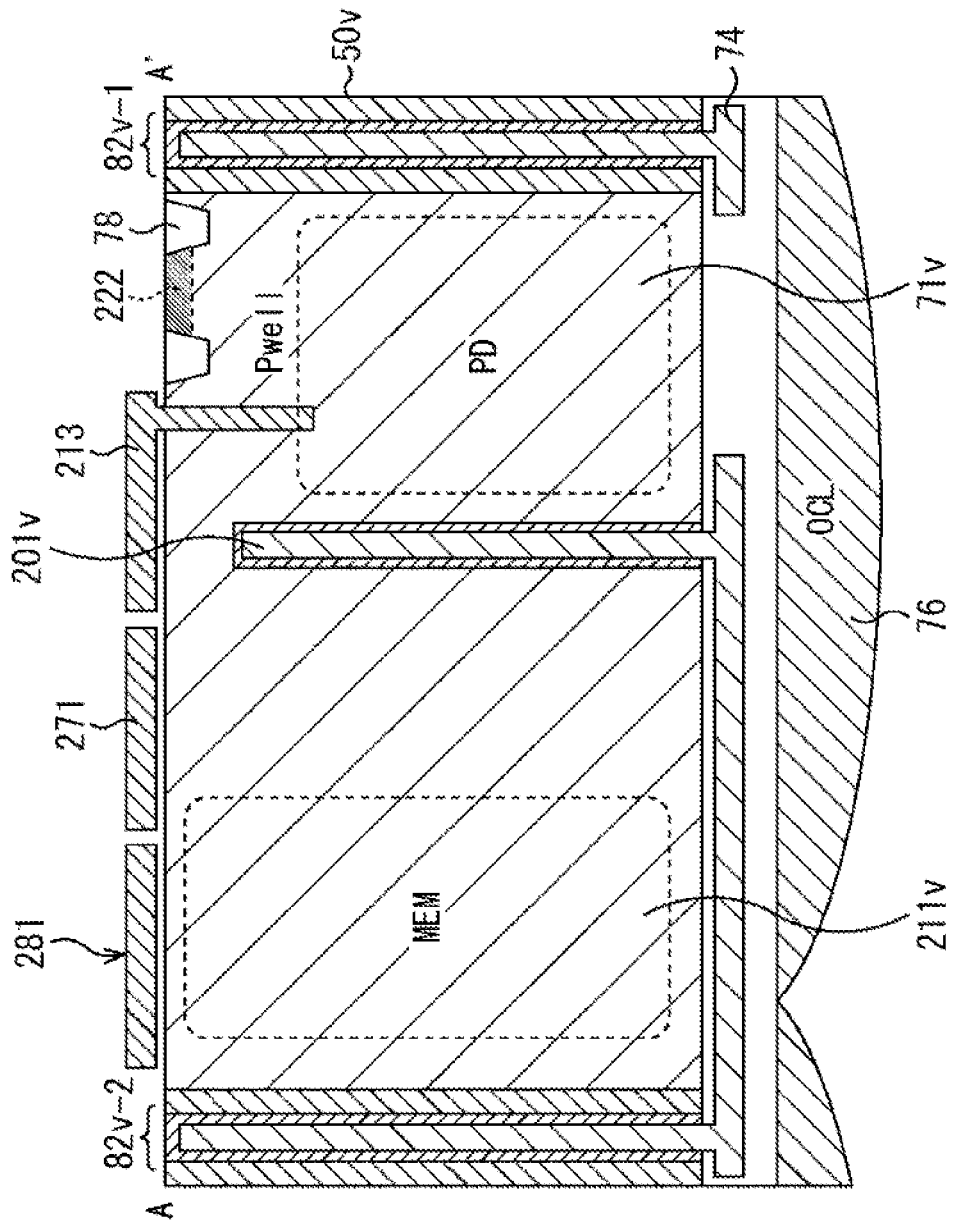
FIG. 35 is a vertical sectional view showing the twentieth configuration example of the pixel to which the present technology is applied.

FIG. 33 is a horizontal plan view of a pixel 50v according to a twentieth embodiment to which the present technology is applied, FIG. 34 is a view showing a positional relation between a PD 71v and a memory 211v in the pixel 50v shown in FIG. 33, and FIG. 35 is a vertical sectional view of the pixel 50v cut along a line A-A' in the pixel 50v shown in FIG. 33.

The twentieth embodiment can be applied to any of the fourteenth to nineteenth embodiments described above. That is, the twentieth embodiment described below can be applied to a case where both the PD 71 and the memory 211 are embedded and a case where either of the PD 71 or the memory 211 is embedded.

Here, the description will be continued by taking, as an example, a case where the PD 71 is embedded and the memory 211 is not embedded.

The basic configuration of the pixel 50v according to the twentieth embodiment is similar to that of the pixel 50t (FIGS. 28 and 29) according to the eighteenth embodiment, and therefore, the detailed description thereof will be omitted. The pixel 50v according to the twentieth embodiment includes a transfer gate 271v, like the pixel 50t according to the eighteenth embodiment, but the transfer gate 271v of the pixel 50v is longer than the transfer gate 271 of the pixel 50t.

Referring to FIG. 33, the transfer gate 271v is formed in a portion except for the portion where the read gate 213 and the memory gate 281 are formed along the side where a DTI 82v-2 is formed. Since the transfer gate 271v is longer as described above, the PD 71v and the memory 211v can be arranged at positions distant from each other. This will be described with reference to FIG. 34.

FIG. 34 is a horizontal plan view of the pixel 50v, showing positions of the PD 71v and the memory 211v. The PD 71v is formed in a rectangular shape on the upper right side of the pixel 50v in the figure. Referring to FIG. 33 together, the PD 71v is formed in a region where a reset transistor 92, an amplifier transistor 93, a selection transistor 94, and a well contact section 231 are formed.

The memory 211v is formed in a rectangular shape in a lower part of the pixel 50v in the figure. Referring to FIG. 33 together, the memory 211v is formed immediately below a memory gate 281v.

The PD 71v is surrounded by a DTI 82v penetrating the Si substrate 70 except for the portion where the DTI 201 is formed. The portion surrounded by the DTI 82v has a structure capable of preventing light from leaking from the PD 71v to the memory 211v.

The DTI 201 does not penetrate the Si substrate 70. There is a possibility that light leaks from the PD 71v to the memory 211v via the portion where the DTI 201 is formed, in other words, the Pwell region 77 where the DTI 201 does not penetrate. However, the distance from the PD 71v to the memory 211v via the DTI 201v and the Pwell region 77 immediately below the transfer gate 271v is long, and the memory 211v is not formed near the DTI 201v. Therefore, light leakage from the PD 71v to the memory 211v can be prevented.

That is, the pixel 50v according to the twentieth embodiment can suppress a stray light component more than the abovementioned embodiments due to the PD 71v and the memory 211v being positioned distant from each other.

FIG. 35 which is a vertical sectional view of the pixel 50v will be referred to. Here, the memory 211v is not embedded as one example. Therefore, the memory 211v is formed using the surface of the Si substrate 70 as shown in FIG. 35. With such a configuration, electric charge can be accumulated also near the surface of the Si substrate 70v immediately below the gate, and the capacity of the memory 211v can be increased.

Further, like the pixel 50t shown in FIG. 29, the transfer gate 271 that transfers the electric charge read from the PD 71v to the memory 211v and the memory gate 281 are constituted by gates having no vertical transistor trench. Since the transfer gate 271v is provided, electric charge read from the PD 71v is once held in a region under the transfer gate 271v or both in the region under the transfer gate 271v and in the memory 211v. Then, after the read gate 213 is turned off, all electric charges are moved from the region under the transfer gate 271v to the memory 211v. Therefore, electric charge can be more reliably transferred from the PD 71v to the memory 211v.

In the pixel 50v shown in FIGS. 33 to 35, only one DTI 201v is formed as one example. However, two DTIs, a DTI 201v-i and a DTI 201v-2 corresponding to the DTI 201t-1 and the DTI 201t-2 shown in FIGS. 28 and 29, may be formed, for example.

The pixel 50v according to the twentieth embodiment also has an N+ diffusion layer 222. Therefore, when the PD 71v is saturated, electric charge from the PD 71v does not flow into the memory 211v.

The pixel 50v according to the twentieth embodiment can also provide an effect similar to that of the pixel 50a according to the fourteenth embodiment, that is, an effect of preventing deterioration in dark characteristics and an effect of suppressing blooming. Further, according to the pixel 50v in the twentieth embodiment, electric charge can be more reliably transferred from the PD 71v to the memory 211v. Furthermore, according to the pixel 50v in the twentieth embodiment, a stray light component can be further suppressed.

Embodiment 20-2

The embodiment described with reference to FIGS. 33 to 35 is referred to as an embodiment 20-1. In the pixel 50v according to the embodiment 20-1, the transfer gate 271v is formed longer because the PD 71v and the memory 211v are positioned distant from each other. When the transfer gate 271v is formed longer, the transfer efficiency may be reduced.

Figure 36:
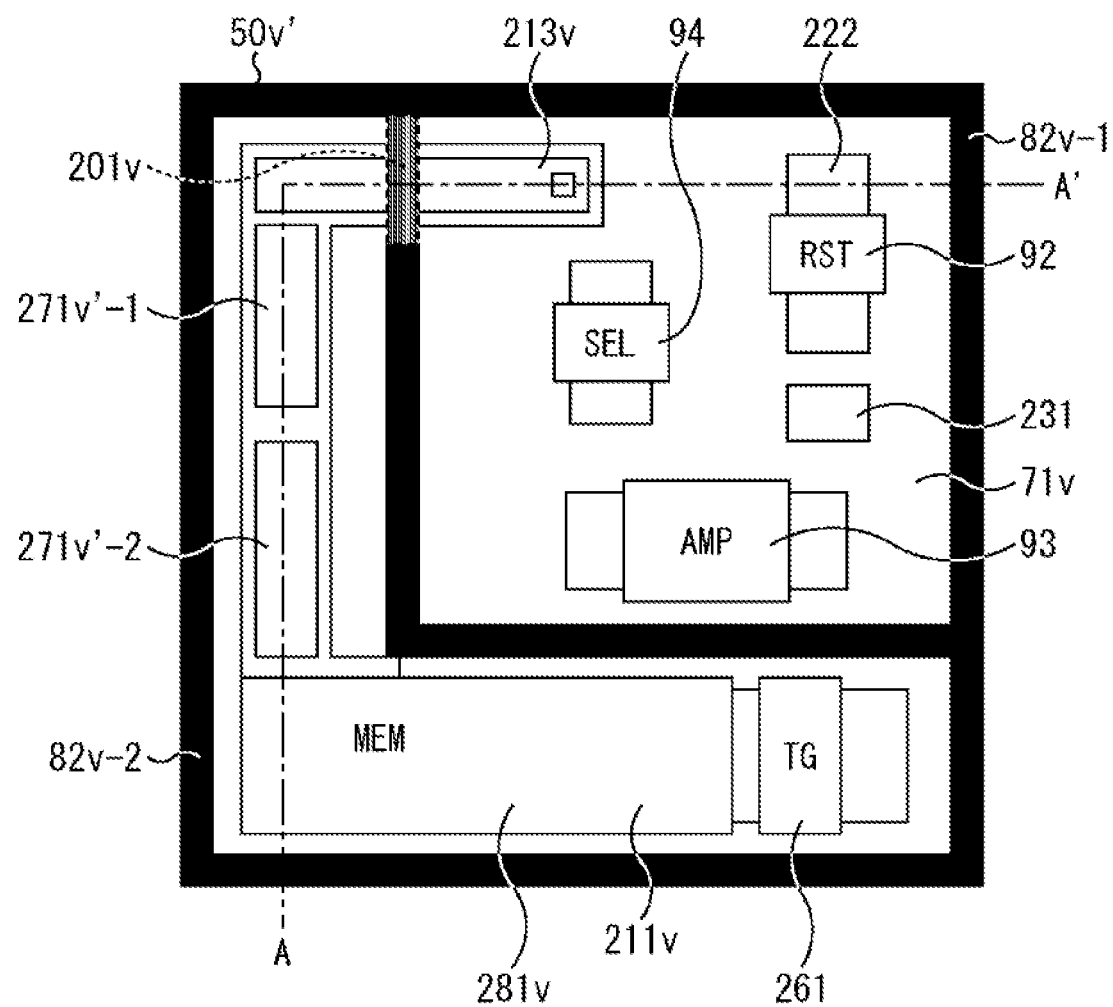
FIG. 36 is a horizontal sectional view showing another example of the twentieth configuration example of the pixel to which the present technology is applied.
Figure 37:
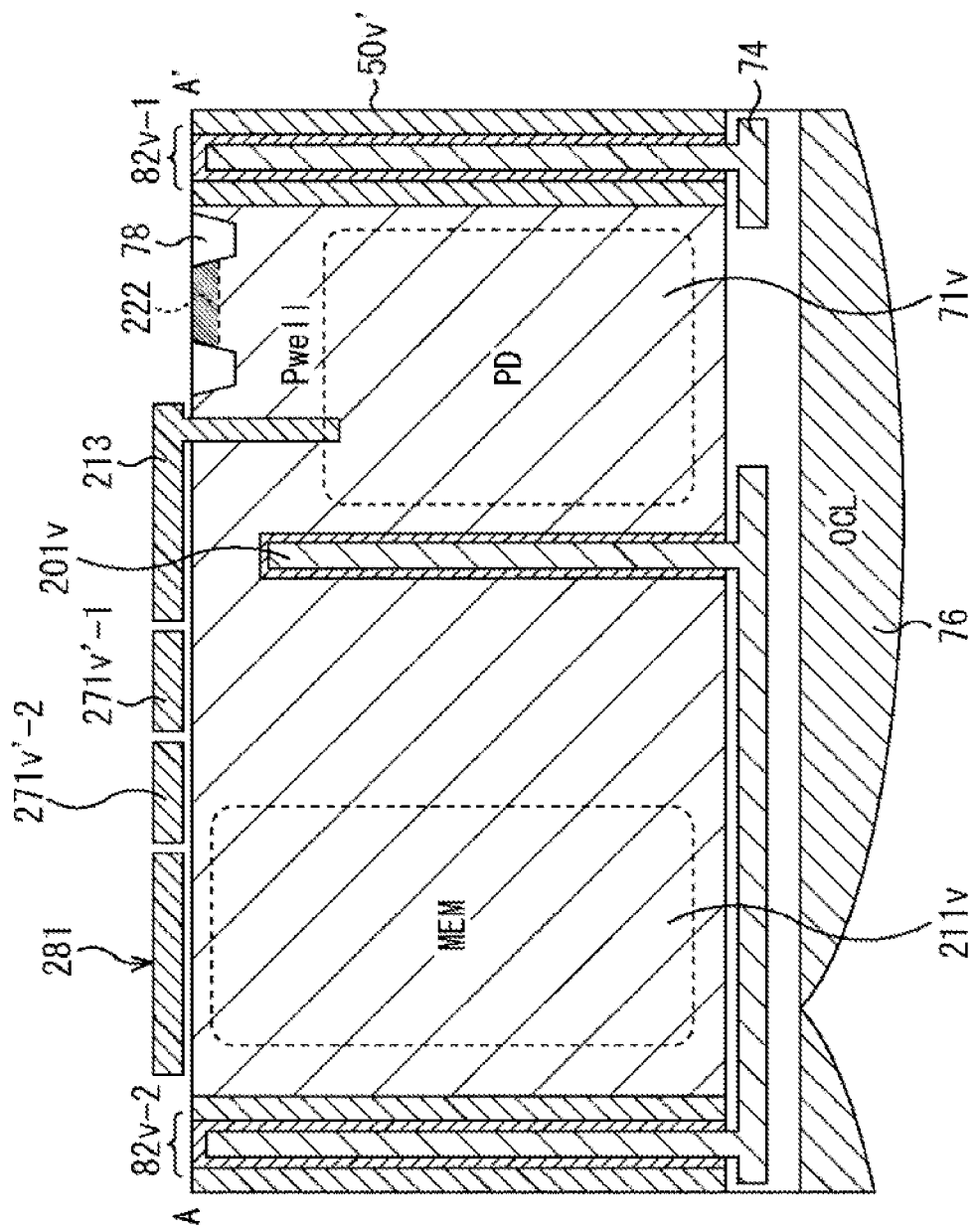
FIG. 37 is a vertical sectional view showing the other example of the twentieth configuration example of the pixel to which the present technology is applied.

In order to improve the transfer efficiency of electric charge from the PD 71v to the memory 211v, a multi-stage transfer gate as shown in FIGS. 36 and 37 may be provided. A pixel 50v' shown in FIGS. 36 and 37 is referred to as an embodiment 20-2, and components different from those of the pixel 50v according to the embodiment 20-1 are denoted with a dash in order to be distinguished from the components in the pixel 50v.

FIG. 36 is a horizontal plan view of the pixel 50v' according to the embodiment 20-2 to which the present technology is applied, and FIG. 37 is a vertical sectional view of the pixel 50v' cut along a line A-A' in the pixel 50v' shown in FIG. 36.

The pixel 50v' is different from the pixel 50v shown in FIG. 33 in that a transfer gate 271v' has a two-stage structure including a transfer gate 271v'-1 and a transfer gate 271v'-2. The other configurations are the same as those of the pixel 50v.

Due to the transfer gate 271v' having a multi-stage structure as described above, deterioration in transfer efficiency can be prevented, even if the distance for transferring electric charge from the PD 71v to the memory 211v is long.

Note that, although the case where the transfer gate 271v' has two stages has been described here as an example, the transfer gate 271v' may have three or more stages.

In the pixel 50v' shown in FIGS. 36 and 37, only one DTI 201v' is formed as one example. However, two or more non-penetrating DTIs can be formed.

The pixel 50v' according to the embodiment 20-2 also has an N+ diffusion layer 222. Therefore, when the PD 71v is saturated, electric charge from the PD 71v does not flow into the memory 211v.

The pixel 50v' according to the embodiment 20-2 can also provide an effect of preventing deterioration in dark characteristics and an effect of suppressing blooming. Further, according to the pixel 50v' in the embodiment 20-2, electric charge can be more reliably transferred from the PD 71v to the memory 211v. Furthermore, according to the pixel 50v' in the embodiment 20-2, a stray light component can be further suppressed.

Embodiment 20-3

Figure 38:
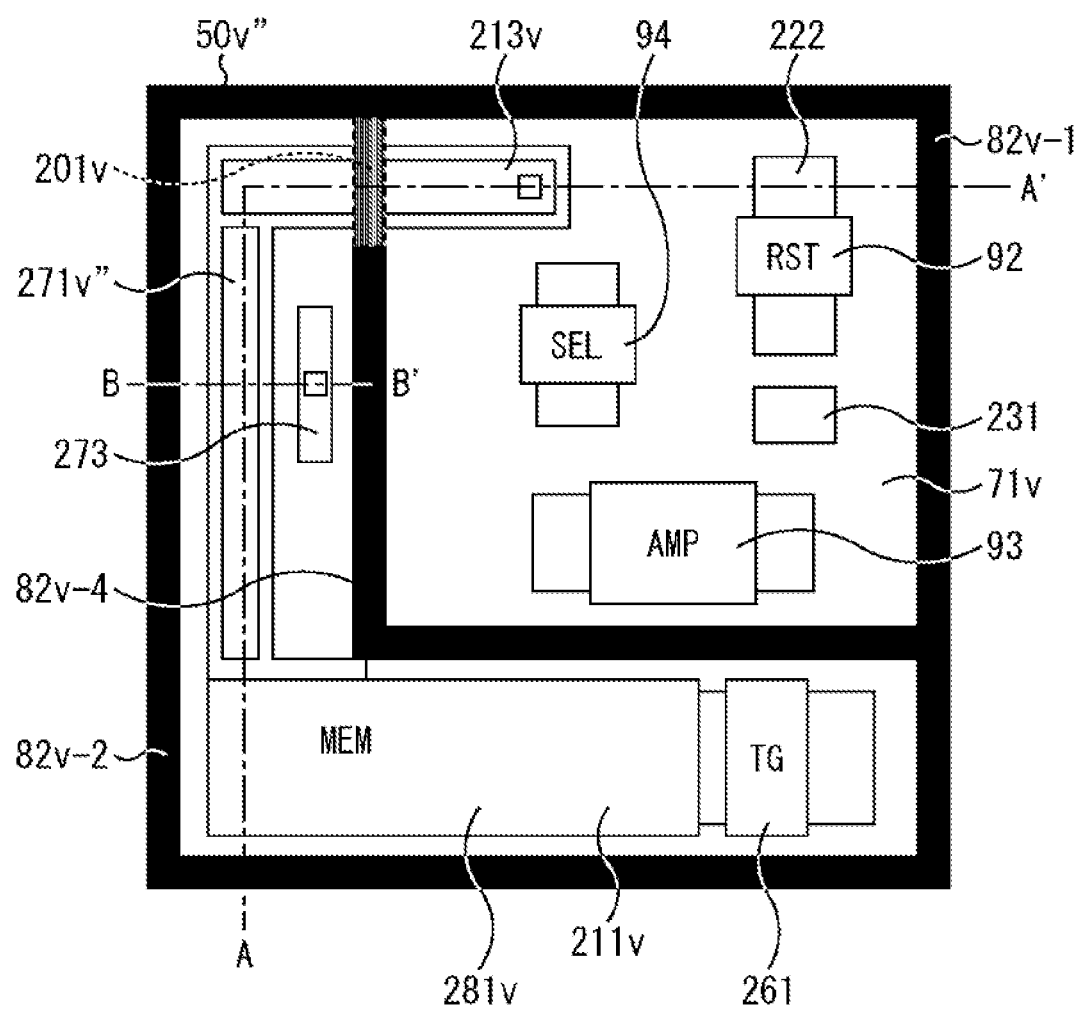
FIG. 38 is a horizontal sectional view showing another example of the twentieth configuration example of the pixel to which the present technology is applied.
Figure 39:
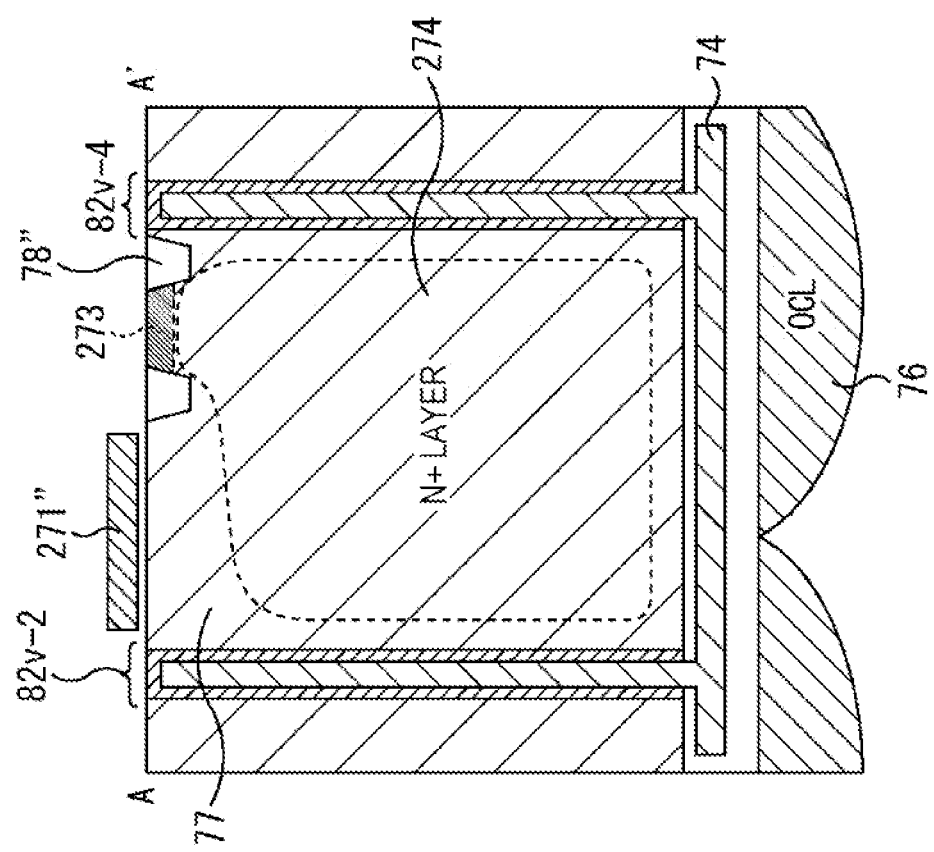
FIG. 39 is a vertical sectional view showing the other example of the twentieth configuration example of the pixel to which the present technology is applied.

Still another configuration of the pixel 50v will be described. FIG. 38 is a horizontal plan view of a pixel 50v" according to the embodiment 20-3 to which the present technology is applied, and FIG. 39 is a vertical sectional view of the pixel 50v" cut along a line B-B' in the pixel 50v" shown in FIG. 38. The sectional view of FIG. 35 is applied as a vertical sectional view of the pixel 50v" cut along a line A-A' of the pixel 50v".

The basic configuration of the pixel 50v" according to the embodiment 20-3 is similar to that of the pixel 50v according to the embodiment 20-1. Therefore, the similar portions are denoted by the same reference signs, and the description thereof will be omitted. The pixel 50v" according to the embodiment 20-3 is different from the pixel 50v according to the embodiment 20-1 in that a drain discharge section 273 is added. The other configurations are the same as those of the pixel 50v.

The drain discharge section 273 is formed in a region between the region where a transfer gate 271v" is formed and a DTI 82v-3. Referring to the sectional view shown in FIG. 39, the drain discharge section 273 has the same configuration as the N+ diffusion layer 222 (FIG. 35), and is a region having a high N-type impurity concentration. An STI 78" is formed on each side of the drain discharge section 273. Further, the drain discharge section 273 is connected to an N+ layer 274 formed in the Si substrate 70.

The N+ layer 274 is formed so as not to contact the transfer gate 271v". In other words, the N+ layer 274 is formed so as to avoid the region on the surface side of the Si substrate 70 where the transfer gate 271v" is formed.

Further, the drain discharge section 273 is biased to the voltage VDD. Electric charge accumulated in the N+ layer 274 is discharged from the drain discharge section 273 by applying the voltage VDD to the drain discharge section 273.

Due to the formation of the drain discharge section 273 as described above, even if light entering a PD 71v" leaks through the non-penetrating portion of the DTI 201v toward the side where the transfer gate 271v" is formed, the light is photoelectrically converted in the N+ layer 274, and the photoelectrically converted electric charge can be discharged from the drain discharge section 273. Therefore, a stray light component can be suppressed.

The pixel 50V" shown in FIG. 38 is configured by adding the drain discharge section 273 to the pixel 50v (FIG. 33) according to the embodiment 20-1. However, the drain discharge section 273 may be added to the pixel 50v' (FIG. 36) according to the embodiment 20-2. That is, a configuration in which the drain discharge section 273 is added and the multi-stage transfer gate 271v" is formed may be applied.

Further, although only one DTI 201v' is formed in the pixel 50v" shown in FIG. 38 as one example, two or more non-penetrating DTIs may be formed.

The pixel 50v" according to the embodiment 20-3 also has the N+ diffusion layer 222. Therefore, when the PD 71v is saturated, electric charge from the PD 71v does not flow into the memory 211v.

The pixel 50v" according to the embodiment 20-3 can also provide an effect of preventing deterioration in dark characteristics and an effect of suppressing blooming. Further, according to the pixel 50v″ in the embodiment 20-3, electric charge can be more reliably transferred from the PD 71v to the memory 211v. Furthermore, according to the pixel 50v″ in the embodiment 20-3, a stray light component can be further suppressed.

Twenty-First Embodiment

Figure 40:
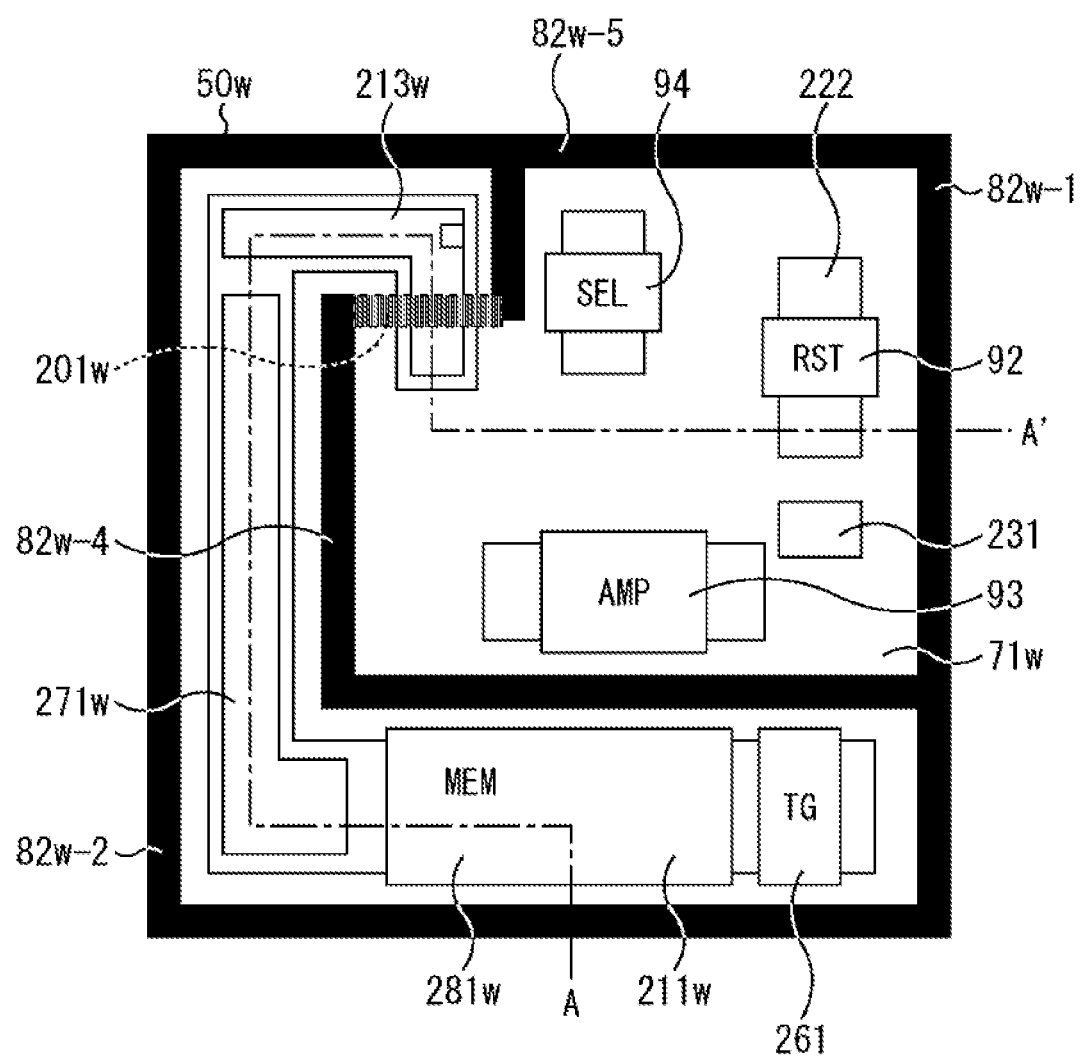
FIG. 40 is a horizontal sectional view showing a twenty-first configuration example of the pixel to which the present technology is applied.
Figure 41:
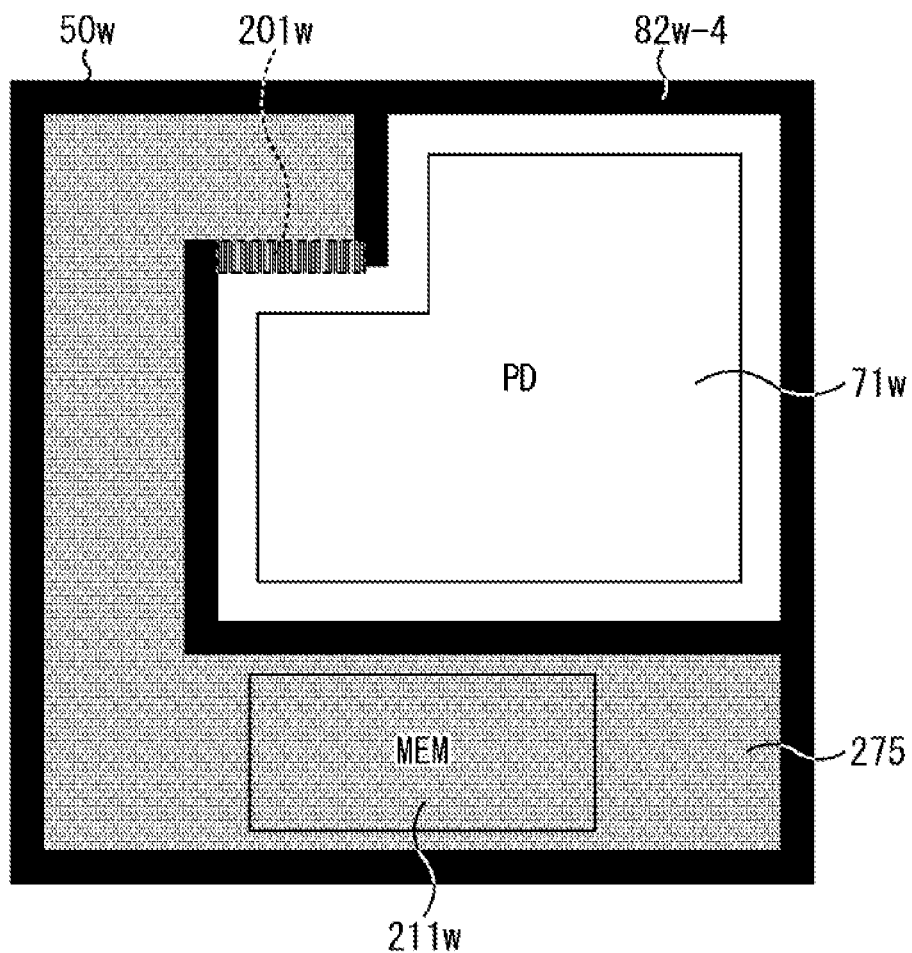
FIG. 41 is a horizontal sectional view showing the twenty-first configuration example of the pixel to which the present technology is applied.

FIG. 40 is a horizontal plan view of a pixel 50w according to a twenty-first embodiment to which the present technology is applied, when viewed from a wiring layer side. The sectional view of FIG. 35 is applied as a vertical sectional view of the pixel 50w cut along a line A-A' of the pixel 50w shown in FIG. 40. FIG. 41 is a horizontal plan view of the pixel 50w shown in FIG. 40, as viewed from the light entrance surface side.

The twenty-first embodiment can also be applied to any of the fourteenth to nineteenth embodiments described above. That is, the twenty-first embodiment described below can be applied to a case where both the PD 71 and the memory 211 are embedded and a case where either of the PD 71 or the memory 211 is embedded.

Here, the description will be continued by taking, as an example, a case where the PD 71 is embedded and the memory 211 is not embedded.

The basic configuration of the pixel 50w according to the twenty-first embodiment is similar to that of the pixel 50v (FIG. 33) according to the twentieth embodiment, and therefore, the detailed description thereof will be omitted. The pixel 50w according to the twenty-first embodiment includes a transfer gate 271w, like the pixel 50v according to the twentieth embodiment, but the transfer gate 271w of the pixel 50w is longer than the transfer gate 271v of the pixel 50v. Further, a read gate 213w of the pixel 50w is formed longer than the read gate 213 of the pixel 50v.

Referring to FIG. 40, the transfer gate 271w is formed along a side where a DTI 82w-2 is formed, and one end thereof is bent and extends to a memory gate 281w. The transfer gate 271w is formed in an L shape. The read gate 213w is also formed in an L shape. The read gate 213w is formed along a side where a DTI 82w-5 is formed, and one end thereof is bent and extends to the PD 71w.

Referring to FIG. 41, a light-shielding film 275 is formed on the light entrance surface side of the pixel 50w. The light-shielding film 275 is formed in a region of the pixel 50w except for the region where the PD 71w is formed. In other words, the light-shielding film 275 is formed on a region where the memory 211w and the transfer gate 271w are formed. The light-shielding film 275 is formed on the memory 211w so that incident light does not enter the memory 211w.

As shown in FIG. 41, the PD 71w is formed in a region on the upper right part of the pixel 50w where the light-shielding film 275 is not formed. The memory 211w is formed in a rectangular shape in a lower part of the pixel 50w in the figure.

Although not shown, in the pixels 50 in the other embodiments, the portion except for the PD 71 is also covered with the light-shielding film 275, so that a stray light component does not enter the memory or the like.

The PD 71w is surrounded by a DTI 82w penetrating the Si substrate 70 except for the portion where a DTI 201w is formed. The portion surrounded by the DTI 82w has a structure capable of preventing light from leaking from the PD 71w to the memory 211w.

The DTI 201w does not penetrate the Si substrate 70. Light entering the PD 71w through the portion where the DTI 201w is formed may leak to a region other than the PD 71w. However, the distance from the PD 71w to the memory 211w via the DTI 201w and the Pwell region 77 immediately below the transfer gate 271w is long, and the memory 211w is not formed near the DTI 201w. Therefore, light leakage from the PD 71w to the memory 211w can be prevented.

The DTI 201w is formed at a position parallel to the long side of the memory 211w. Since the DTI 201w is formed at such a position, even if light obliquely enters the PD 71w and leaks through a non-penetrating portion of the DTI 201w, such light goes to the DTI 82w-5 side, and is unlikely to reach the memory 211w.

The pixel 50w according to the twenty-first embodiment can suppress a stray light component due to the PD 71w and the memory 211w being positioned distant from each other.

In the pixel 50w shown in FIG. 40, only one DTI 201w is formed as one example. However, two DTIs, a DTI 201w-1 and a DTI 201w-2 corresponding to the DTI 201t-1 and the DTI 201t-2 shown in FIGS. 28 and 29, may be formed, for example.

The pixel 50w according to the twenty-first embodiment also has an N+ diffusion layer 222. Therefore, when the PD 71w is saturated, electric charge from the PD 71w does not flow into the memory 211w.

The pixel 50w according to the twenty-first embodiment can also provide an effect similar to that of the pixel 50a according to the fourteenth embodiment, that is, an effect of preventing deterioration in dark characteristics and an effect of suppressing blooming. Further, according to the pixel 50w in the twenty-first embodiment, electric charge can be more reliably transferred from the PD 71w to the memory 211w. Furthermore, according to the pixel 50w in the twenty-first embodiment, a stray light component can be further suppressed.

Embodiment 21-2

The embodiment described with reference to FIG. 40 is referred to as an embodiment 21-1. In the pixel 50w according to the embodiment 21-1, the transfer gate 271w is formed longer because the PD 71w and the memory 211w are positioned distant from each other. When the transfer gate 271w is formed longer, the transfer efficiency may be reduced.

Figure 42:
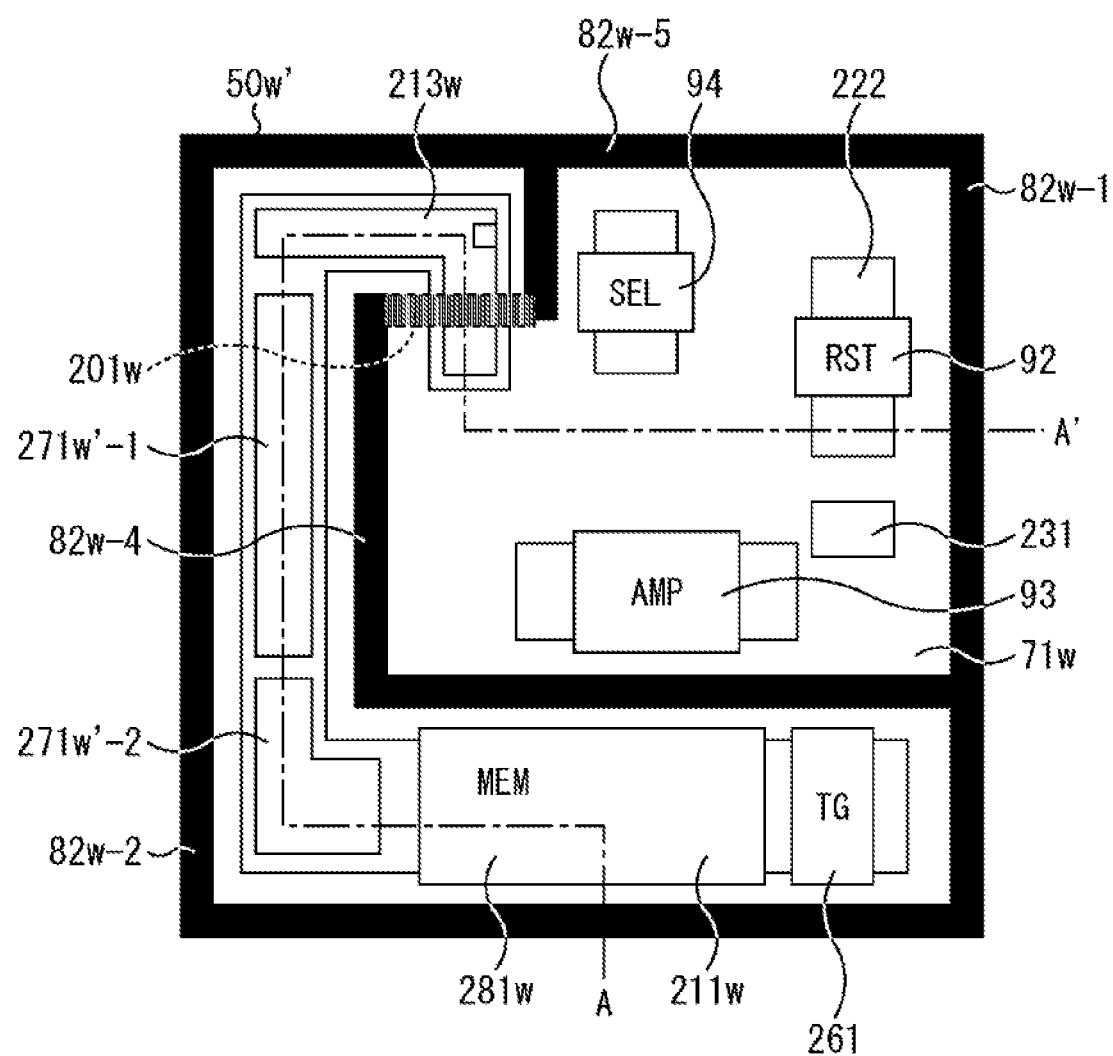
FIG. 42 is a horizontal sectional view showing another example of the twenty-first configuration example of the pixel to which the present technology is applied.

In order to improve the transfer efficiency of electric charge from the PD 71w to the memory 211w, a multi-stage transfer gate as shown in FIG. 42 may be provided. The pixel 50w' shown in FIG. 42 is referred to as an embodiment 21-2, and components different from those of the pixel 50w according to the embodiment 21-1 are denoted with a dash in order to be distinguished from the components in the pixel 50w.

FIG. 42 is a horizontal plan view of the pixel 50w' according to the embodiment 21-2 to which the present technology is applied. The sectional view of FIG. 37 is applied as a vertical sectional view of the pixel 50w' cut along a line A-A' of the pixel 50w' shown in FIG. 42.

The pixel 50w' is different from the pixel 50w shown in FIG. 40 in that a transfer gate 271w' has a two-stage structure including a transfer gate 271w'-1 and a transfer gate 271w'-2. The other configurations are the same as those of the pixel 50w.

Due to the transfer gate 271w' having a multi-stage structure as described above, deterioration in transfer efficiency can be prevented, even if the distance for transferring electric charge from the PD 71w to the memory 211w is long.

It is to be noted that, although the case where the transfer gate 271w' has two stages has been described herein as an example, the transfer gate 271w' may have three or more stages.

In the pixel 50w' shown in FIG. 42, only one DTI 201w' is formed as one example. However, two or more non-penetrating DTIs may be formed.

The pixel 50w' according to the embodiment 21-2 also has an N+ diffusion layer 222. Therefore, when the PD 71w is saturated, electric charge from the PD 71w does not flow into the memory 211w.

The pixel 50w' according to the embodiment 21-2 can also provide an effect of preventing deterioration in dark characteristics and an effect of suppressing blooming. Further, according to the pixel 50w' in the embodiment 21-2, electric charge can be more reliably transferred from the PD 71w to the memory 211w. Furthermore, according to the pixel 50w' in the embodiment 21-2, a stray light component can be further suppressed.

Embodiment 21-3

Figure 43:
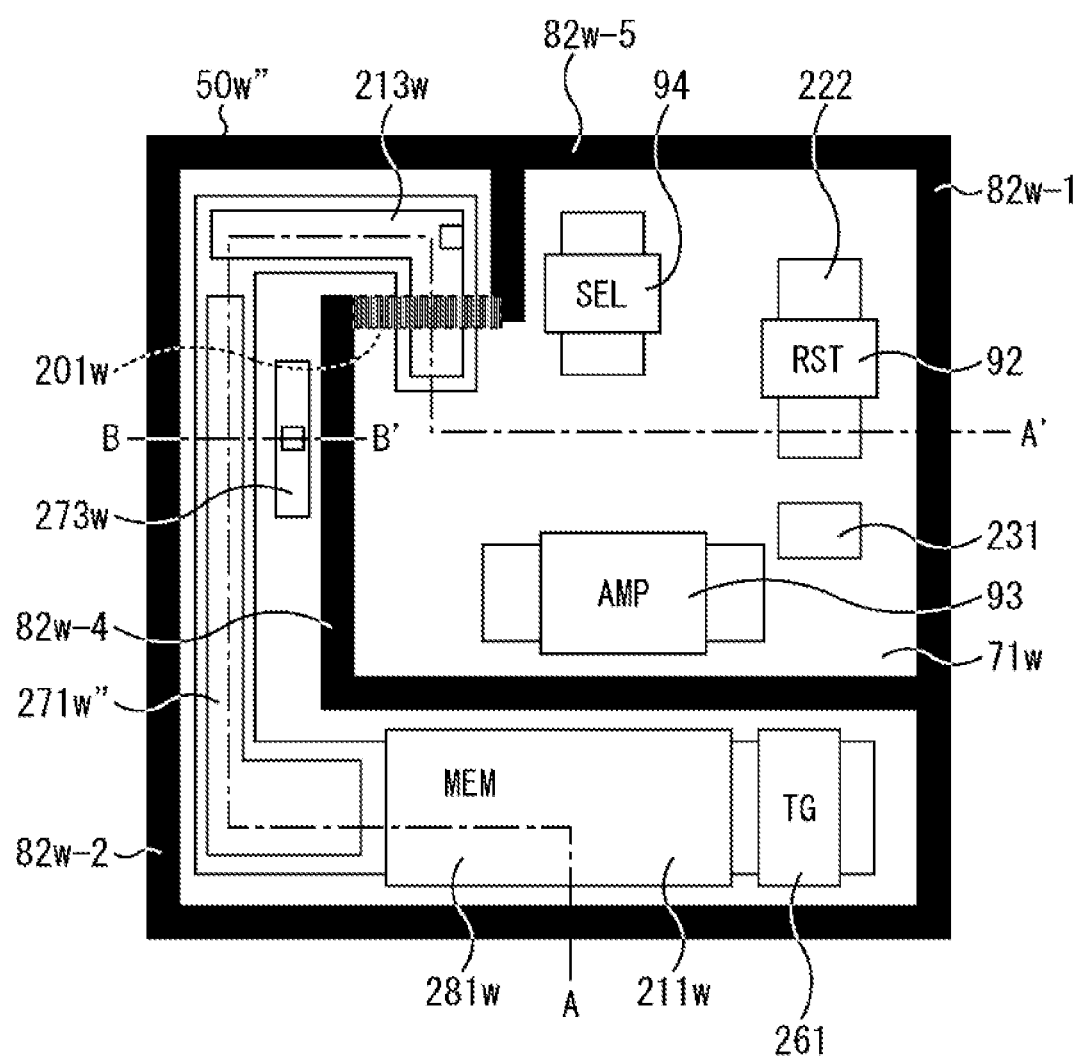
FIG. 43 is a horizontal sectional view showing another example of the twenty-first configuration example of the pixel to which the present technology is applied.

Still another configuration of the pixel 50w will be described. FIG. 43 is a horizontal plan view of a pixel 50w'" according to the embodiment 21-3 to which the present technology is applied. The sectional view of FIG. 35 is applied as a vertical sectional view of the pixel 50w'" cut along a line A-A' of the pixel 50w'". The sectional view of FIG. 39 is applied as a vertical sectional view of the pixel 50w'" cut along a line B-B' of the pixel 50w'" shown in FIG. 43.

The basic configuration of the pixel 50w'" according to the embodiment 21-3 is similar to that of the pixel 50w according to the embodiment 21-1. Therefore, the similar portions are denoted by the same reference signs, and the description thereof will be omitted. The pixel 50w'" according to the embodiment 21-3 is different from the pixel 50w according to the embodiment 21-1 in that a drain discharge section 273w is added. The other configurations are the same as those of the pixel 50w.

The drain discharge section 273w is formed in a region between the region where a transfer gate 271w'" is formed and a DTI 82w-3. As in the pixel 50v'" according to the embodiment 20-3 described with reference to FIG. 39, the drain discharge section 273w has the same configuration as the N+ diffusion layer 222 (FIG. 35), and is a region having a high N-type impurity concentration. An STI 78'" is formed on each side of the drain discharge section 273. Further, the drain discharge section 273 is connected to an N+ layer 274 formed in the Si substrate 70.

The N+ layer 274 is formed so as not to contact the transfer gate 271w'". In other words, the N+ layer 274 is formed so as to avoid the region on the surface side of the Si substrate 70 where the transfer gate 271w'" is formed.

Further, the drain discharge section 273w is biased to the voltage VDD. Electric charge accumulated in the N+ layer 274 is discharged from the drain discharge section 273w by applying the voltage VDD to the drain discharge section 273w.

Due to the formation of the drain discharge section 273w as described above, even if light entering a PD 71w'" leaks through the non-penetrating portion of the DTI 201w toward the side where the transfer gate 271w'" is formed, the light is photoelectrically converted in the N+ layer 274, and the photoelectrically converted electric charge can be discharged from the drain discharge section 273w. Therefore, a stray light component can be suppressed.

The pixel 50V'" shown in FIG. 43 is configured by adding the drain discharge section 273w to the pixel 50w (FIG. 40) according to the embodiment 21-1. However, the drain discharge section 273w may be added to the pixel 50w' (FIG. 42) according to the embodiment 21-2. That is, a configuration in which the drain discharge section 273w is added and the multi-stage transfer gate 271w'" is formed may be applied.

Further, although only one DTI 201w' is formed in the pixel 50w'" shown in FIG. 43 as one example, two or more non-penetrating DTIs may be formed.

The pixel 50w'" according to the embodiment 21-3 also has an N+ diffusion layer 222. Therefore, when the PD 71w is saturated, electric charge from the PD 71w does not flow into the memory 211w.

The pixel 50w'" according to the embodiment 21-3 can also provide an effect of preventing deterioration in dark characteristics and an effect of suppressing blooming. Further, according to the pixel 50w'" in the embodiment 21-3, electric charge can be more reliably transferred from the PD 71w to the memory 211w. Furthermore, according to the pixel 50w'" in the embodiment 21-3, a stray light component can be further suppressed.

Twenty-Second Embodiment

Figure 44:
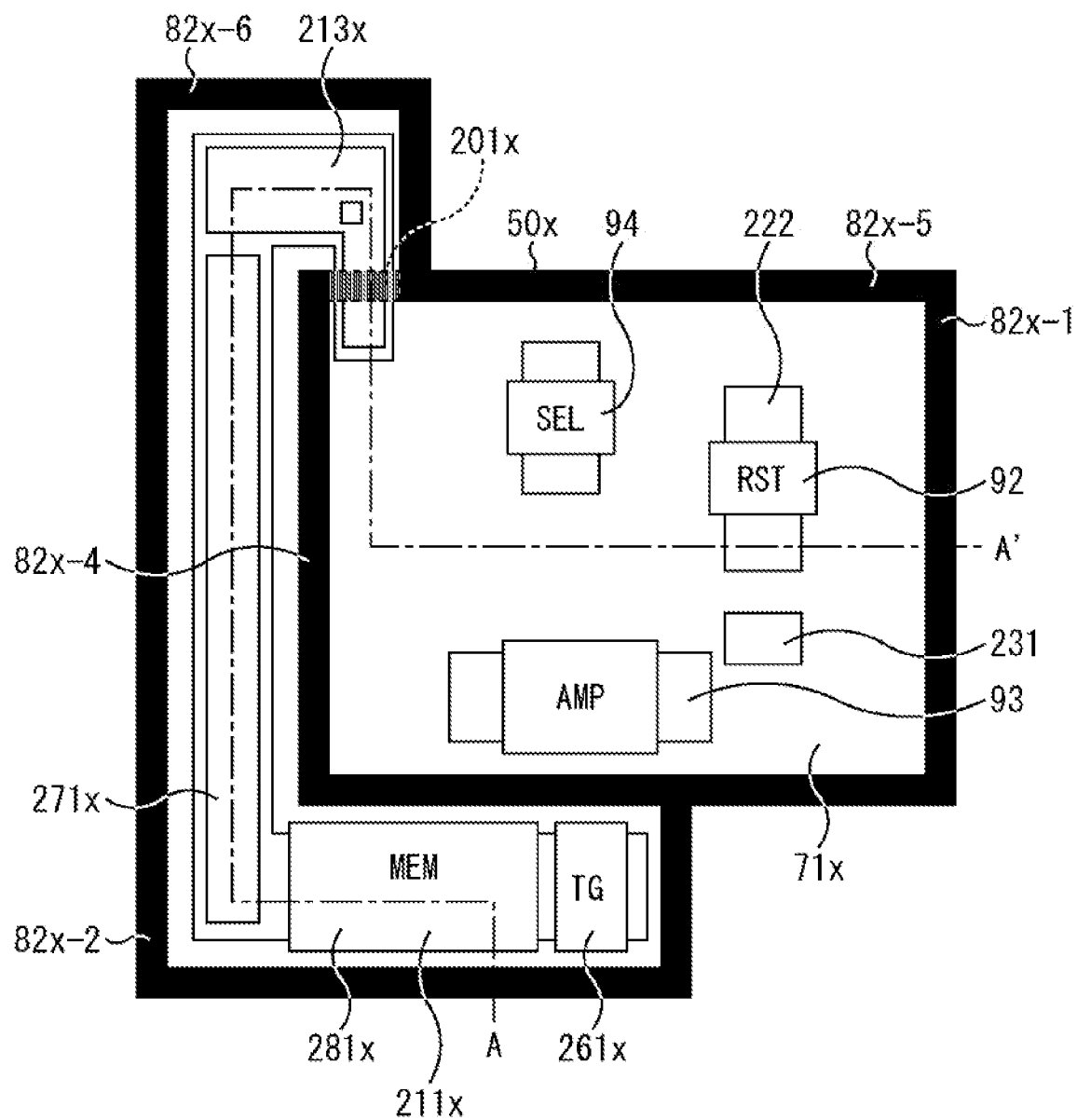
FIG. 44 is a horizontal sectional view showing a twenty-second configuration example of the pixel to which the present technology is applied.

FIG. 44 is a horizontal plan view of a pixel 50x according to a twenty-second embodiment to which the present technology is applied, when viewed from a wiring layer side. The sectional view of FIG. 35 is applied as a vertical sectional view of the pixel 50x cut along a line A-A' of the pixel 50x shown in FIG. 44.

The twenty-second embodiment can be applied to any of the fourteenth to nineteenth embodiments described above. That is, the twenty-second embodiment described below can be applied to a case where both the PD 71 and the memory 211 are embedded and a case where either of the PD 71 or the memory 211 is embedded.

Here, the description will be continued by taking, as an example, a case where the PD 71 is embedded and the memory 211 is not embedded.

The basic configuration of the pixel 50x according to the twenty-second embodiment is similar to that of the pixel 50w (FIG. 40) according to the twenty-first embodiment, and therefore, the detailed description thereof will be omitted. The pixel 50x according to the twenty-second embodiment includes a transfer gate 271x, like the pixel 50w according to the twenty-first embodiment, but the transfer gate 271x of the pixel 50x is longer than the transfer gate 271w of the pixel 50w.

Further, a PD 71w of the pixel 50x in the twenty-second embodiment has a larger light receiving surface than the PD 71w of the pixel 50w in the twenty-first embodiment. Since the PD 71x is formed larger, the transfer gate 271x formed along one side of the PD 71x is also formed longer. The PD 71w of the pixel 50x in the twenty-second embodiment has a larger light receiving surface than the PD 71w of the pixel 50w in the twenty-first embodiment. Thus, the PD 71x has higher sensitivity than the PD 71w.

Referring to FIG. 44, the transfer gate 271x is formed along the side where a DTI 82x-2 is formed. A read gate 213x is formed into an L shape. Specifically, the read gate 213x extends along a side where a DTI 82x-6 is formed, and further, one end thereof is bent and extends to the PD 71x.

Figure 45:
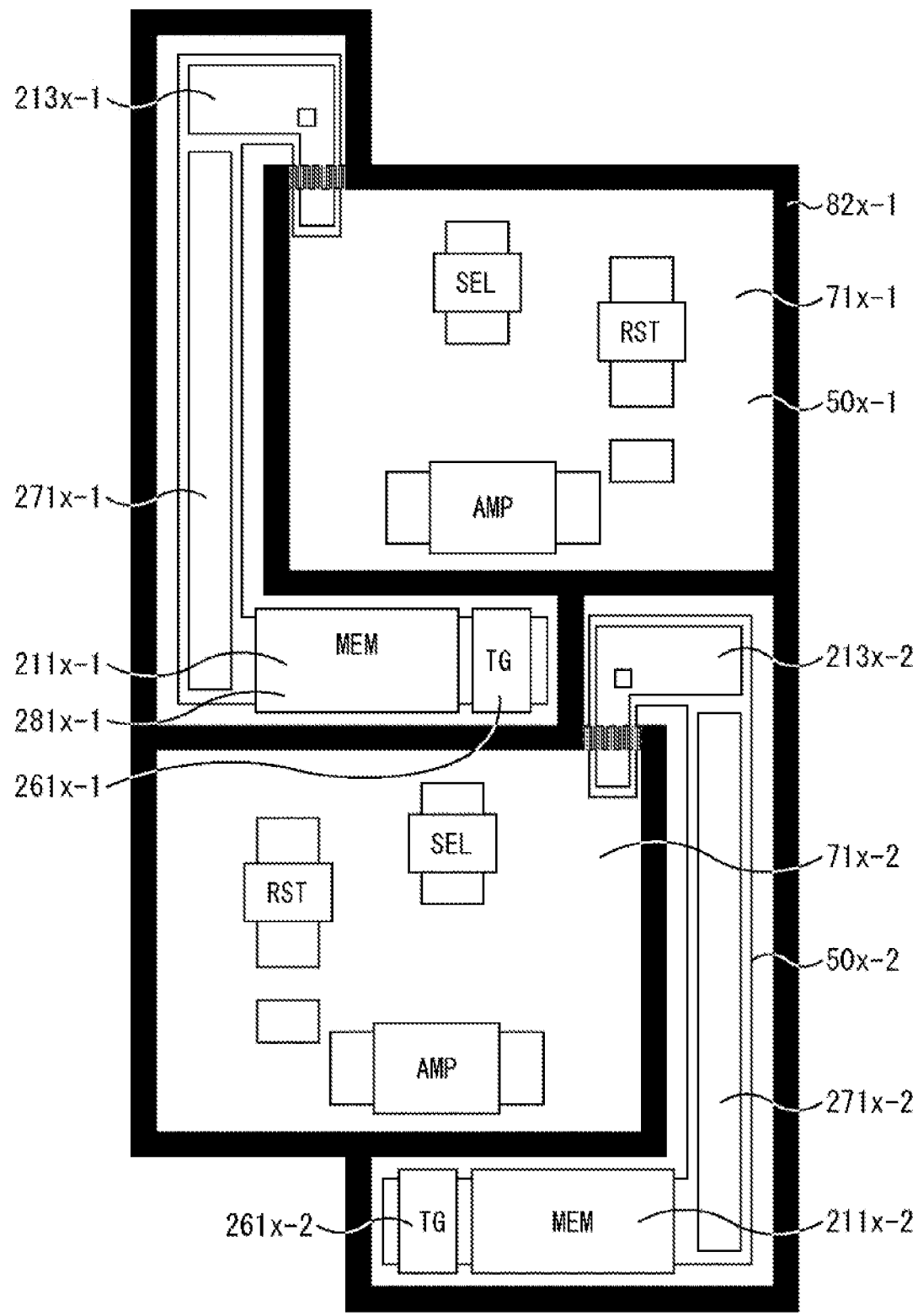
FIG. 45 is a horizontal sectional view showing the twenty-second configuration example of the pixel to which the present technology is applied.

FIG. 45 is a view showing that the pixels 50x are vertically arranged. When a pixel 50x-1 and a pixel 50x-2 which are pixels 50x are vertically arranged, they are horizontally symmetrical. For example, a transfer gate 271x-1 of the pixel 50x-1 is arranged on the left side in the figure, and a transfer gate 271x-2 of the pixel 50x-2 is arranged on the right side in the figure.

A memory gate 281x-1 (memory 211x-l) of the pixel 50x-1, a transfer gate 261x-1 of the pixel 50x-1, and a read gate 213x-2 of the pixel 50x-2 are linearly arranged between a PD 71x-1 of the pixel 50x-1 and a PD 71x-2 of the pixel 50x-2.

Referring back to FIG. 44, the PD 71x is surrounded by a DTI 82x penetrating the Si substrate 70 except for the portion where a DTI 201x is formed. The portion surrounded by the DTI 82x has a structure capable of preventing light from leaking from the PD 71x to the memory 211x.

The DTI 201x does not penetrate the Si substrate 70. Light entering the PD 71x through the portion where the DTI 201x is formed may leak to a region other than the PD 71x. However, the distance from the PD 71x to the memory 211x via the DTI 201x and the Pwell region 77 immediately below the transfer gate 271x is long, and the memory 211x is not formed near the DTI 201x. Therefore, light leakage from the PD 71x to the memory 211x can be prevented.

The DTI 201x is formed at a position parallel to the long side of the memory 211x. Since the DTI 201x is formed at such a position, even if light obliquely enters the PD 71x and leaks through a non-penetrating portion of the DTI 201x, such light goes to the DTI 82x-6 side, and is unlikely to reach the memory 211x.

The pixel 50x according to the twenty-second embodiment can suppress a stray light component due to the PD 71x and the memory 211x being positioned distant from each other.

In the pixel 50x according to the twenty-second embodiment, the PD 71x and the memory 211x are more distant from each other, as compared with the configuration of the pixel 50w (FIG. 40) according to the twenty-first embodiment. Therefore, the pixel 50x according to the twenty-second embodiment can suppress a stray light component more than the pixel 50w according to the twenty-first embodiment. Further, the PD 71w of the pixel 50x according to the twenty-second embodiment has a larger light receiving surface than the PD 71w of the pixel 50w according to the twenty-first embodiment. Thus, the pixel 50x according to the twenty-second embodiment can improve sensitivity more than the pixel 50w according to the twenty-first embodiment.

In the pixel 50x shown in FIG. 44, only one DTI 201x is formed as one example. However, two DTIs, a DTI 201x-1 and a DTI 201x-2 corresponding to the DTI 201t-1 and the DTI 201t-2 shown in FIGS. 28 and 29, may be formed, for example.

The pixel 50x according to the twenty-second embodiment also has an N+ diffusion layer 222. Therefore, when the PD 71x is saturated, electric charge from the PD 71x does not flow into the memory 211x.

The pixel 50x according to the twenty-second embodiment can also provide an effect similar to that of the pixel 50a according to the fourteenth embodiment, that is, an effect of preventing deterioration in dark characteristics and an effect of suppressing blooming. Further, according to the pixel 50x in the twenty-second embodiment, electric charge can be more reliably transferred from the PD 71x to the memory 211x. Furthermore, according to the pixel 50x in the twenty-second embodiment, a stray light component can be further suppressed.

Embodiment 22-2

The embodiment described with reference to FIG. 44 is referred to as an embodiment 22-1. In the pixel 50x according to the embodiment 22-1, the transfer gate 271x is formed longer because the PD 71x and the memory 211x are positioned distant from each other. When the transfer gate 271x is longer, the transfer efficiency may be reduced.

Figure 46:
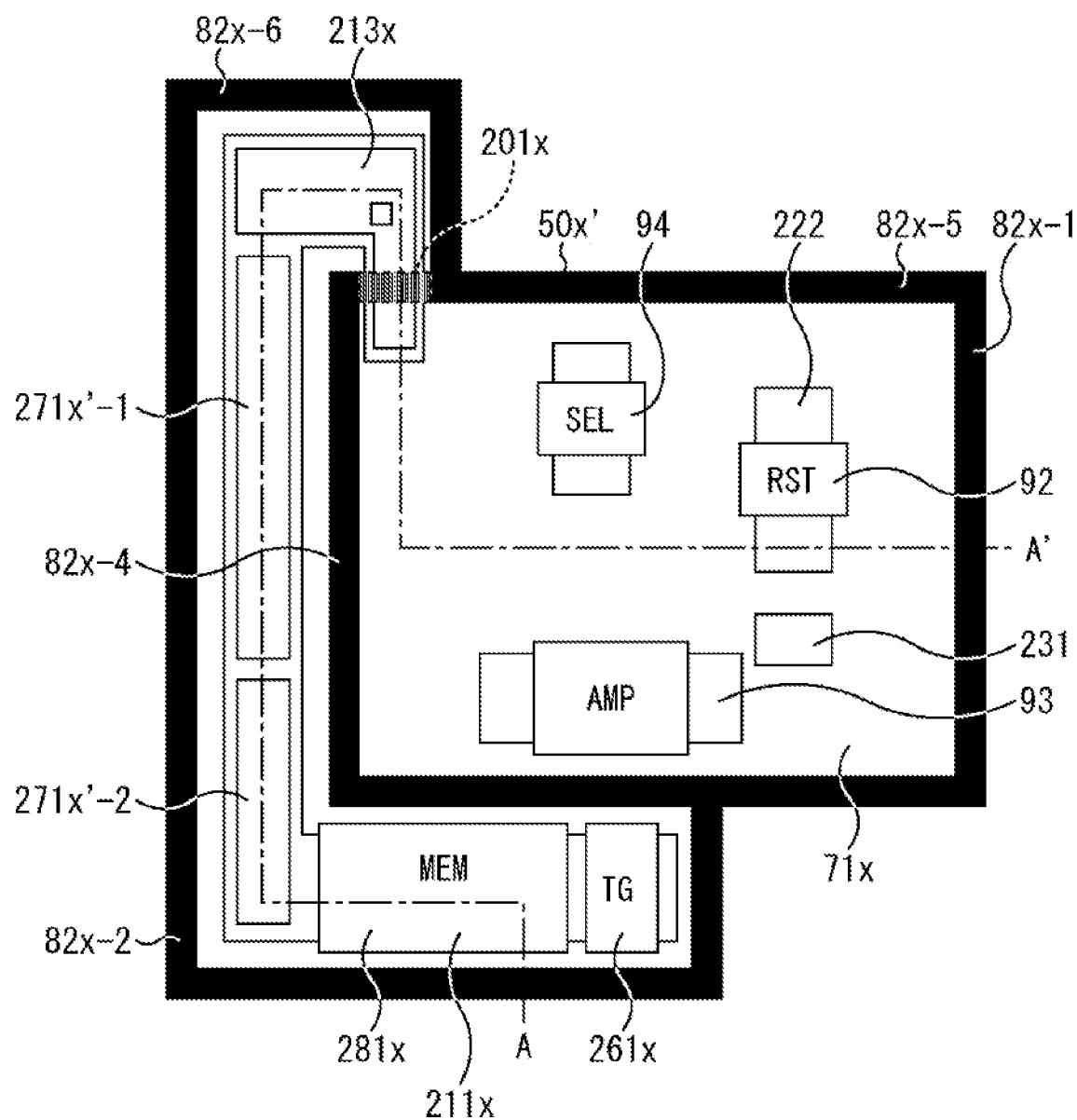
FIG. 46 is a horizontal sectional view showing another example of the twenty-second configuration example of the pixel to which the present technology is applied.

In order to improve the transfer efficiency of electric charge from the PD 71x to the memory 211x, a multi-stage transfer gate as shown in FIG. 46 may be provided. A pixel 50x' shown in FIG. 46 is referred to as an embodiment 22-2, and components different from those of the pixel 50x according to the embodiment 22-1 are denoted with a dash in order to be distinguished from the components in the pixel 50x.

FIG. 46 is a horizontal plan view of the pixel 50x' according to the embodiment 22-2 to which the present technology is applied. The sectional view of FIG. 37 is applied as a vertical sectional view of the pixel 50x' cut along a line A-A' of the pixel 50x' shown in FIG. 46.

The pixel 50x' is different from the pixel 50x shown in FIG. 44 in that a transfer gate 271x' has a two-stage structure including a transfer gate 271x'-1 and a transfer gate 271x'-2. The other configurations are the same as those of the pixel 50x.

Due to the transfer gate 271x' having a multi-stage structure as described above, deterioration in transfer efficiency can be prevented, even if the distance for transferring electric charge from the PD 71x to the memory 211x is long.

It is to be noted that, although the case where the transfer gate 271x' has two stages has been described herein as an example, the transfer gate 271x' may have three or more stages.

In the pixel 50x' shown in FIG. 46, only one DTI 201x' is formed as one example. However, two or more non-penetrating DTIs may be formed.

The pixel 50x' according to the embodiment 22-2 also has an N+ diffusion layer 222. Therefore, when the PD 71x is saturated, electric charge from the PD 71x does not flow into the memory 211x.

The pixel 50x' according to the embodiment 22-2 can also provide an effect of preventing deterioration in dark characteristics and an effect of suppressing blooming. Further, according to the pixel 50x' in the embodiment 22-2, electric charge can be more reliably transferred from the PD 71x to the memory 211x. Furthermore, according to the pixel 50x' in the embodiment 22-2, a stray light component can be further suppressed.

Embodiment 22-3

Figure 47:
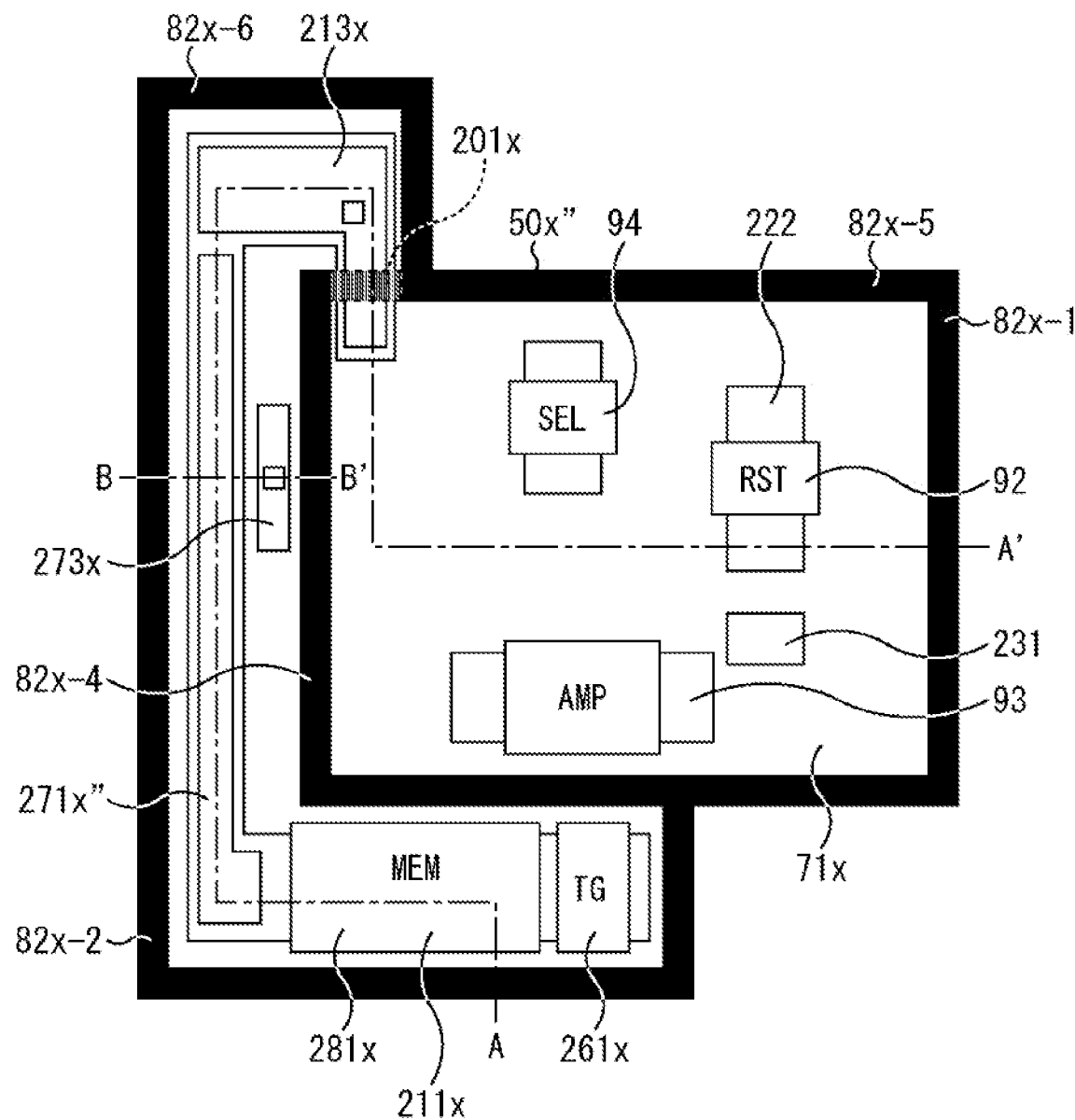
FIG. 47 is a horizontal sectional view showing another example of the twenty-second configuration example of the pixel to which the present technology is applied.

Still another configuration of the pixel 50x will be described. FIG. 47 is a horizontal plan view of a pixel 50x" according to the embodiment 22-3 to which the present technology is applied. The sectional view of FIG. 35 is applied as a vertical sectional view of the pixel 50x" cut along a line A-A' of the pixel 50x". The sectional view of FIG. 39 is applied as a vertical sectional view of the pixel 50x" cut along a line B-B' of the pixel 50x" shown in FIG. 47.

The basic configuration of the pixel 50x" according to the embodiment 22-3 is similar to that of the pixel 50x according to the embodiment 22-1. Therefore, the similar portions are denoted by the same reference signs, and the description thereof will be omitted. The pixel 50x" according to the embodiment 22-3 is different from the pixel 50x according to the embodiment 22-1 in that a drain discharge section 273x is added. The other configurations are the same as those of the pixel 50x.

The drain discharge section 273x is formed in a region between the region where a transfer gate 271x" is formed and a DTI 82x-3. Similarly to the pixel 50v" according to the embodiment 20-3 described with reference to FIG. 39, the drain discharge section 273x has the same configuration as the N+ diffusion layer 222 (FIG. 35), and is a region having a high N-type impurity concentration. An STI 78" is formed on each side of the drain discharge section 273x. Further, the drain discharge section 273x is connected to an N+ layer 274 formed in the Si substrate 70.

Further, the drain discharge section 273x is biased to the voltage VDD. Electric charge accumulated in the N+ layer 274 is discharged from the drain discharge section 273x by applying the voltage VDD to the drain discharge section 273x.

Due to the formation of the drain discharge section 273x as described above, even if light entering a PD 71x" leaks through the non-penetrating portion of the DTI 201x toward the side where the transfer gate 271x" is formed, the light is photoelectrically converted in the N+ layer 274, and the photoelectrically converted electric charge can be discharged from the drain discharge section 273x. Therefore, a stray light component can be suppressed.

The pixel 50x" shown in FIG. 47 is configured by adding the drain discharge section 273x to the pixel 50x (FIG. 44) according to the embodiment 22-1. However, the drain discharge section 273x may be added to the pixel 50x' (FIG. 46) according to the embodiment 22-2. That is, a configuration in which the drain discharge section 273x is added and the multi-stage transfer gate 271x" is formed may be applied.

Further, although only one DTI 201x' is formed in the pixel 50x" shown in FIG. 47 as one example, two or more non-penetrating DTIs may be formed.

The pixel 50x" according to the embodiment 22-3 also has an N+ diffusion layer 222. Therefore, when the PD 71x is saturated, electric charge from the PD 71x does not flow into the memory 211x.

The pixel 50x" according to the embodiment 22-3 can also provide an effect of preventing deterioration in dark characteristics and an effect of suppressing blooming. Further, according to the pixel 50x" in the embodiment 22-3, electric charge can be more reliably transferred from the PD 71x to the memory 211x. Furthermore, according to the pixel 50x" in the embodiment 22-3, a stray light component can be further suppressed.

Note that, although the above embodiments describe, as one example, the case where the P-type solid-phase diffusion layer 83 and the N-type solid-phase diffusion layer 84 are formed on the sidewall of the DTI 82, the present technology can be applied to the pixel 50 in which the P-type solid-phase diffusion layer 83 and the N-type solid-phase diffusion layer 84 are not formed. That is, the present technology can be applied to a pixel having no solid-phase diffusion layer.

Further, although the DTI 82 is formed by a trench penetrating the Si substrate, a light-shielding material may be embedded in the trench so that the trench functions as a light-shielding wall.

Embodiment 23-1

Figure 48:
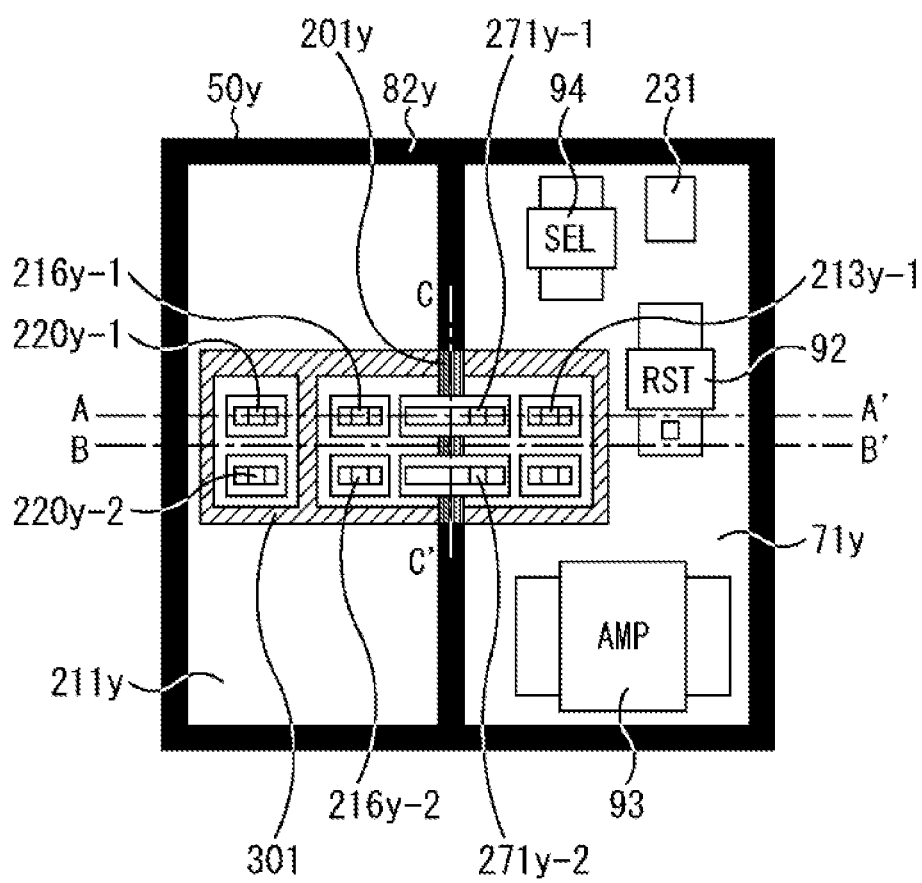
FIG. 48 is a horizontal sectional view showing a twenty-third configuration example of the pixel to which the present technology is applied.
Figure 49:
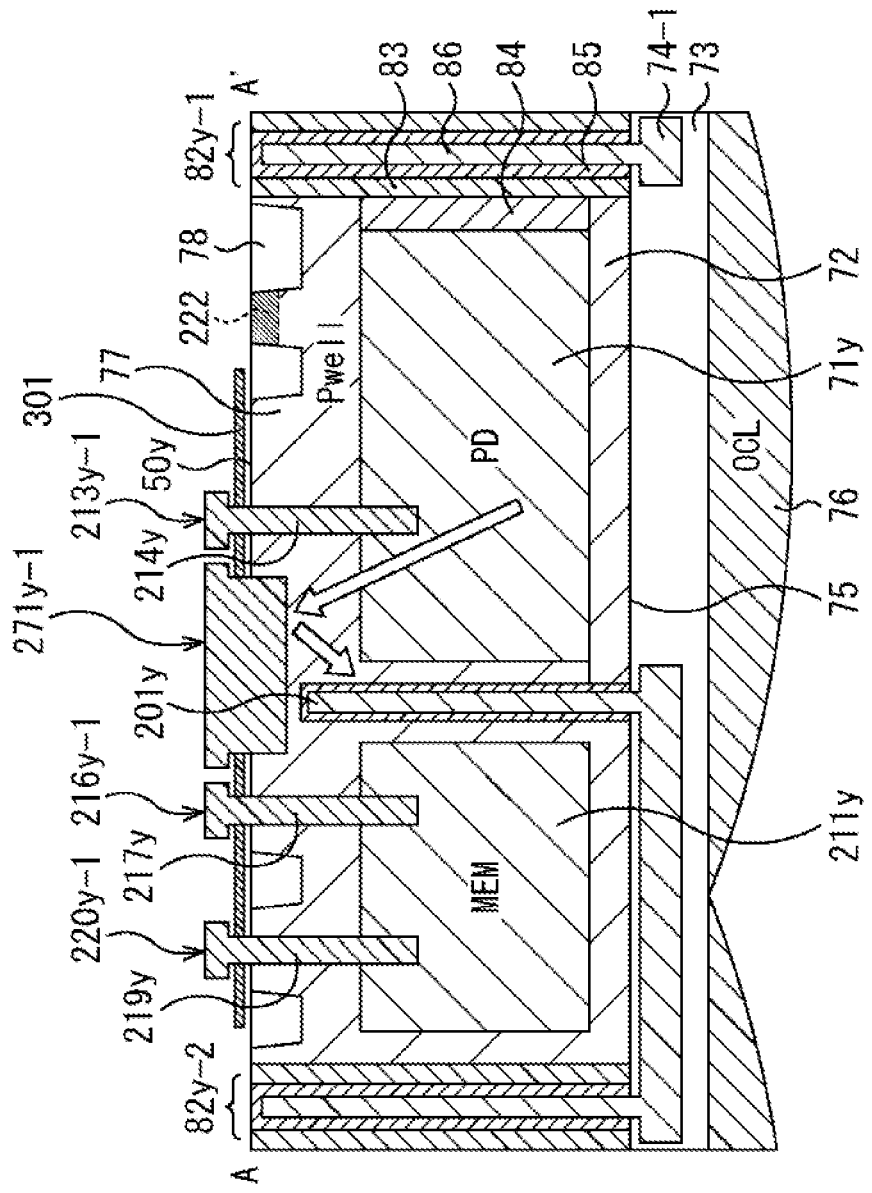
FIG. 49 is a vertical sectional view showing the twenty-third configuration example of the pixel to which the present technology is applied.
Figure 50:
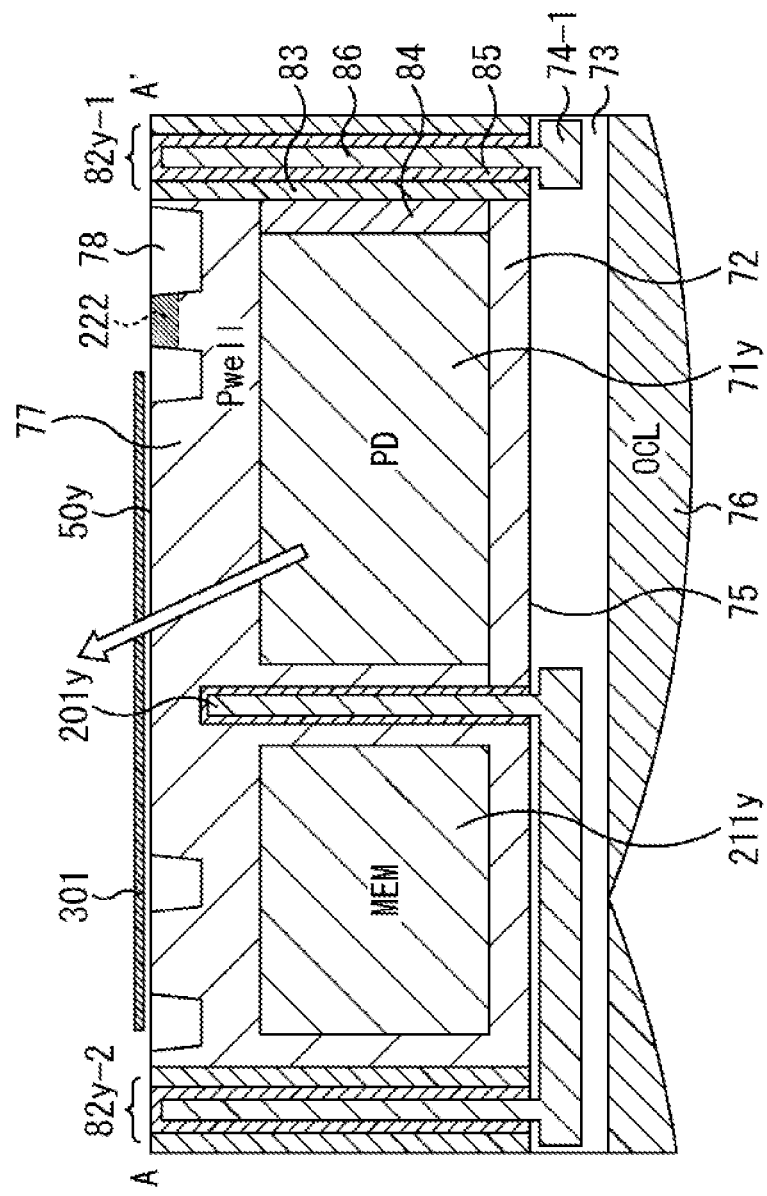
FIG. 50 is a vertical sectional view showing the twenty-third configuration example of the pixel to which the present technology is applied.
Figure 51:
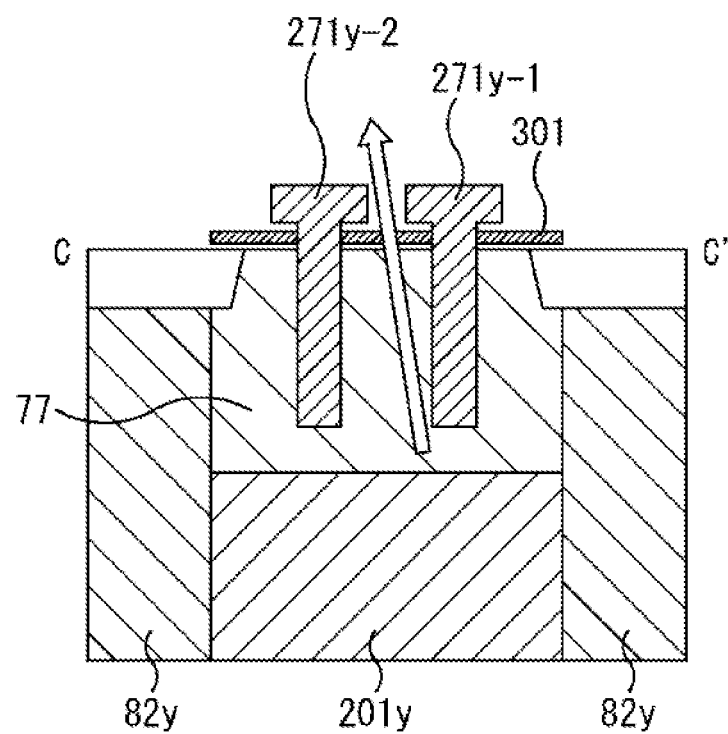
FIG. 51 is a vertical sectional view showing the twenty-third configuration example of the pixel to which the present technology is applied.

FIG. 48 is a horizontal plan view of a pixel 50y according to an embodiment 23-1 to which the present technology is applied, when viewed from a wiring layer side. FIG. 49 is a vertical sectional view of the pixel 50y cut along a line A-A' of the pixel 50y shown in FIG. 48. FIG. 50 is a vertical sectional view of the pixel 50y cut along a line B-B' of the pixel 50y shown in FIG. 48. FIG. 51 is a vertical sectional view of the pixel 50y cut along a line C-C' of the pixel 50y shown in FIG. 48.

The twenty-third embodiment (embodiments 23-1 and 23-2) can be applied to any of the fourteenth to twenty-second embodiments described above. That is, the twenty-third embodiment described below can be applied to a case where both the PD 71 and the memory 211 are embedded and to a case where either of the PD 71 or the memory 211 is embedded.

The basic configuration of the pixel 50y according to the embodiment 23-1 is similar to that of the pixel 50p (FIGS. 19 and 20) according to the fourteenth embodiment. Therefore, the similar portions are denoted by the same reference signs, and the description thereof will be omitted as appropriate.

The pixel 50y is different from the pixel 50p in that an antireflection film 301 is added to the pixel 50p. Further, the pixel 50y shown in FIGS. 48 to 51 is different from the pixel 50p in that the read gate 213 is divided into two. Moreover, the pixel 50y shown in FIGS. 48 to 51 is also different from the pixel 50p in that the gates such as the read gate 213 have two vertical transistor trenches.

Referring to the sectional view of the pixel 50y shown in FIG. 49, the antireflection film 301 is formed above the Pwell region 77 (on the wiring layer side). Referring to the plan view of the pixel 50y shown in FIG. 48, the antireflection film 301 is formed in a region in which a read gate 213y, a transfer gate 271y, a write gate 216y, and a read gate 220y are arranged and which includes an area above the DTI 201 formed in a non-penetrating manner.

Reflection may occur near the interface between the Si substrate 70 and the wiring layer 79 (not shown in FIG. 49). Light entering a PD 71y may be reflected on the non-penetrating portion of the DTI 201y near the interface between the Si substrate 70 and the wiring layer 79, and may enter a memory 211y. The antireflection film 301 is formed near the interface to prevent reflection near the interface and to prevent light from leaking into the memory 211y.

Examples of materials usable for the antireflection film 301 include silicon nitride (SiN), hafnium oxide (HfO2), aluminum oxide (Al2O3), zirconium oxide (ZrO2), tantalum oxide (Ta2Ta5), titanium oxide (TiO2), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), and yttrium oxide (Y2O3).

Due to the formation of the antireflection film 301, reflection near the interface can be suppressed.

The formation of the antireflection film 301 may reduce the transfer efficiency of electric charge near the interface. Therefore, as shown in FIGS. 49 and 50, a gate that reads electric charge from the PD 71y and transfers the electric charge to the memory 211y is divided into two. Here, FIG. 20 is referred to again for comparison. In the pixel 50p illustrated in FIG. 20, a gate that reads electric charge from the PD 71p and transfers the electric charge to the memory 211 is the read gate 213 including the vertical transistor trench 214.

The pixel 50y shown in FIG. 49 includes a read gate 213y-1 for reading electric charge from the PD 71y, and a transfer gate 271y-1 for transferring the read electric charge to the memory 211y. The read gate 213y-1 has a vertical transistor trench 214y.

The gate of the pixel 50y corresponding to the read gate 213 of the pixel 50p includes the read gate 213y-1 and the transfer gate 271y-1. Due to the configuration in which a gate for reading electric charge from the PD 71y and a gate for transferring the read electric charge are separately provided as described above, transfer of electric charge using the side surface is enabled. Therefore, even in a case where the antireflection film 301 is formed near the interface, electric charge can be transferred without deteriorating transfer efficiency.

Further, as shown in FIG. 48, two read gates 213y, two transfer gates 271y, two write gates 216y, and two read gates 220y are formed. In other words, in a case where the read gate 213y, the transfer gate 271y, the write gate 216y, and the read gate 220y are considered to be one set, two sets of gates related to reading and writing are formed.

Since two sets of gates related to reading and writing are formed in this way, efficiency involved with reading and writing can be improved.

Note that, although the description will be continued herein by taking, as one example, a case in which the read gate 213y-1 and the transfer gate 271y-1 are provided, a configuration in which one read gate 213 is provided is possible like the pixel 50p shown in FIG. 20 by appropriately designing the material of the antireflection film 301, the portion where the antireflection film 301 is formed (for example, the antireflection film 301 is not formed immediately below the gate), and the like. Further, although the description will be continued by taking, as an example, the case where two sets of gates involved with reading and writing are provided, the present technology is applicable to a case where one set of gates is provided and to a case where two or more sets of gates are provided.

Referring to FIG. 49, the transfer gate 271y-1 is arranged above the non-penetrating DTI 201y, and the depth thereof is shallower than the vertical transistor trenches 214y, 217y, and 219y.

As indicated by the thick arrow in FIG. 49, light entering the PD 71y may impinge upon the bottom of the transfer gate 271y-1 and may be reflected. The reflected light impinges on the DTI 201y and returns to the inside of the PD 71y. Even in the non-penetrating portion of the DTI 201y, leakage of light from the PD 71y into the memory 211y is prevented in the area where the transfer gate 271y is formed.

Further, referring to FIG. 50, even if light entering the PD 71y reaches the non-penetrating portion of the DTI 201, reflection of light near the interface is prevented due to the antireflection film 301 being formed in the region where the gate is not formed. Thus, leakage of light into the memory 211y can be suppressed.

Further, referring to FIG. 51, even if light from the PD 71y enters between the transfer gate 271y-1 and the transfer gate 271y-2, reflection of light near the interface does not occur due to the antireflection film 301 being formed. Therefore, light passes toward the wiring layer 79 side, whereby leakage of light from the PD 71y into the memory 211 can be prevented.

As described above, leakage of light from the PD 71y into the memory 211y can be prevented, whereby parasitic light sensitivity (PLS) can be improved.

Embodiment 23-2

Figure 52:
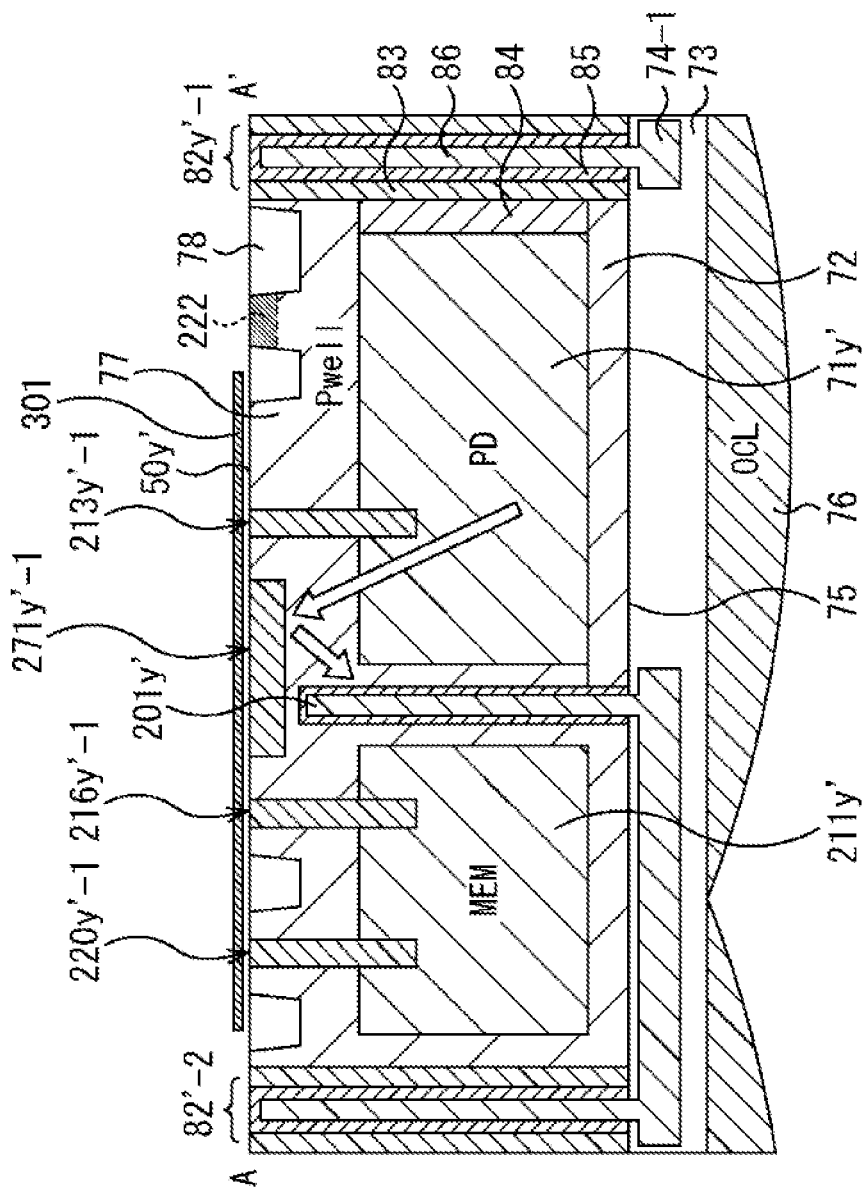
FIG. 52 is a vertical sectional view showing another example of the twenty-third configuration example of the pixel to which the present technology is applied.

Another configuration of the pixel 50y will be described. FIG. 52 is a vertical sectional view of a pixel 50y' according to an embodiment 23-2 to which the present technology is applied. The sectional view shown in FIG. 52 corresponds to the sectional view of the pixel 50y cut along the line A-A' of the pixel 50y shown in FIG. 48. In addition, the cross section of the pixel 50y' according to the embodiment 23-2 cut along a line corresponding to the line B-B' of the pixel 50y shown in FIG. 48 is similar to the cross section of the pixel 50y shown in FIG. 50.

The basic configuration of the pixel 50y' according to the embodiment 23-2 is similar to that of the pixel 50y according to the embodiment 23-1. Therefore, the similar portions are denoted by the same reference signs, and the description thereof will be omitted. The pixel 50y' in the embodiment 23-2 is different from the pixel 50y according to the embodiment 23-1 in that the respective gates are embedded in the Si substrate 70. The other configurations are the same as those of the pixel 50y.

Referring again to FIG. 49, for example, the read gate 213y-1 is formed to extend in the vertical direction and in the horizontal direction with respect to the PD 71y, and the read gate 213y-1 (vertical transistor trench 214y) extending in the vertical direction is in contact with the PD 71y.

Referring to FIG. 52, for example, a read gate 213y'-1 is formed to extend in the vertical direction with respect to a PD 71y', and the read gate 213y'-1 extending in the vertical direction (corresponding to the vertical transistor trench 214y) is in contact with the PD 71y.

As described above, the read gate 213y'-1 is embedded in the Si substrate 70. Note that, although a contact is connected to the embedded read gate 213y'-1, this contact is not shown in FIG. 52.

Similarly to the read gate 213y', a transfer gate 271y', a write gate 216y', and a read gate 220y' are also embedded in the Si substrate 70. In other words, the read gate 213y', the transfer gate 271y', the write gate 216y', and the read gate 220y' include portions corresponding to the vertical transistor trenches, respectively.

The embodiment in which the gates are embedded in the Si substrate 70 as in the embodiment 23-2 can be applied to the pixel 50 according to any one of the first to twenty-second embodiments described above. In such a configuration, electric charge is transferred from the PD 71y' to the memory 211y' using the side surfaces of the embedded gates without using the surface of the Si substrate 70.

The pixel 50y' having such gates can be formed in such a manner that a groove for forming an embedded gate is formed in the Si substrate 70, and a polysilicon is formed on the entire surface of the groove and etched back.

In the embodiment 23-2, an antireflection film 301y' is formed in a region, which is near the location where the gates are formed and which includes an area above a DTI 201y' formed in a non-penetrating manner, on the Si substrate 70 as in the embodiment 23-1.

Therefore, in the pixel 50y' according to the embodiment 23-2, reflection of light does not occur near the interface, and leakage of light from the PD 71y' into the memory 211y' can be prevented, as in the pixel 50y in the embodiment 23-1.

Further, the influence of light reflected at the bottom of the gate can be reduced. Referring again to FIG. 51, for example, in a case where light from the PD 71y passes through the antireflection film 301 and impinges on the bottom of the read gate 213y-1 (a horizontal part with respect to the PD 71y), such light may be reflected on the bottom, and return to the PD 71y or leak into the memory 211y.

There is no horizontal part with respect to the PD 71y' in the pixel 50y' (FIG. 52) according to the embodiment 23-2.

Therefore, light passes through without impinging on the bottom of the read gate 213y', which can prevent light from returning to the PD 71y' or leaking into the memory 211y'. Therefore, PLS can be further improved.

As described above, leakage of light from the PD 71y into the memory 211y can be prevented, whereby PLS can be improved.

Embodiment 24-1

Figure 53:
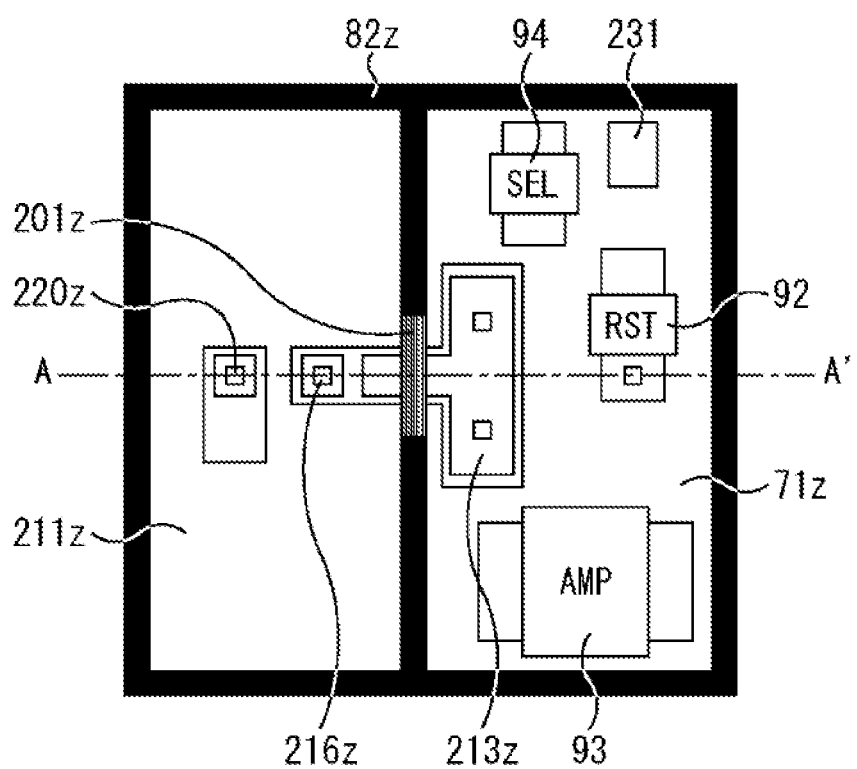
FIG. 53 is a horizontal sectional view showing a twenty-fourth configuration example of the pixel to which the present technology is applied.
Figure 54:
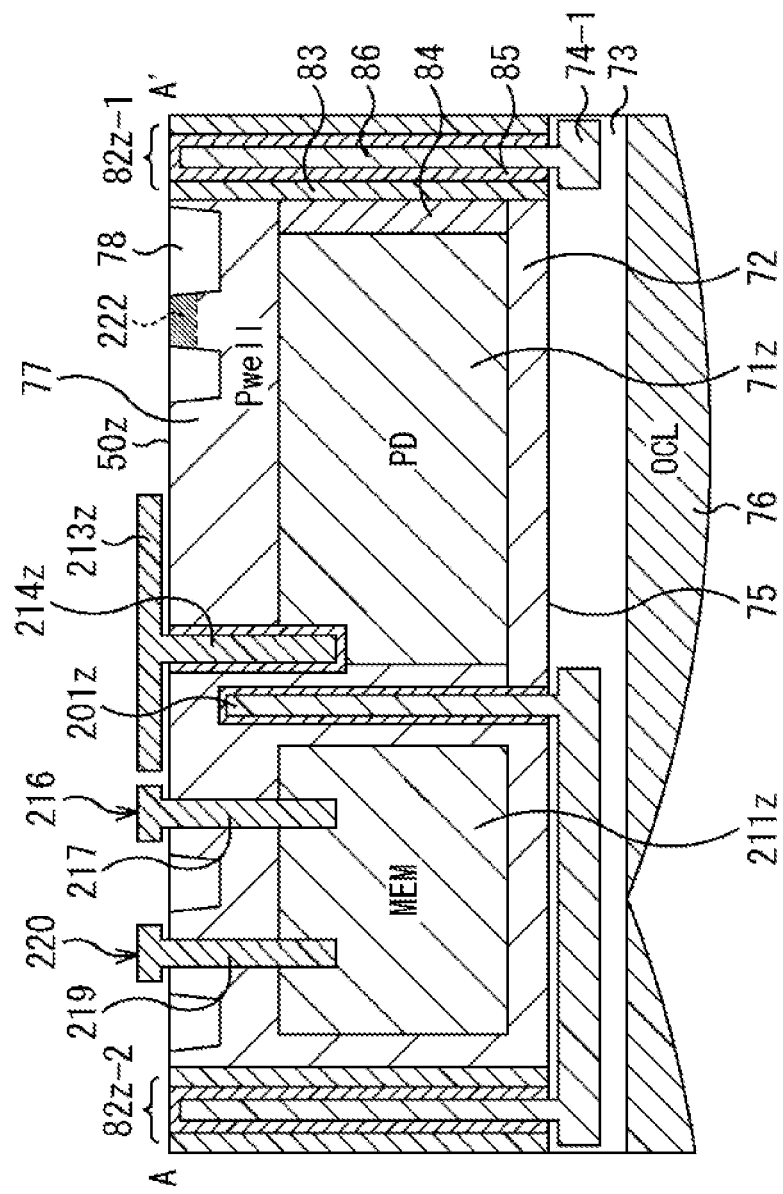
FIG. 54 is a vertical sectional view showing the twenty-fourth configuration example of the pixel to which the present technology is applied.

FIG. 53 is a horizontal plan view of a pixel 50z according to an embodiment 24-1 to which the present technology is applied, when viewed from a wiring layer side. FIG. 54 is a vertical sectional view of the pixel 50z cut along a line A-A' of the pixel 50z shown in FIG. 53.

The twenty-third embodiment can be applied to any of the fourteenth to twenty-third embodiments described above. That is, the twenty-fourth embodiment described below can be applied to a case where both the PD 71 and the memory 211 are embedded and to a case where either of the PD 71 or the memory 211 is embedded.

The basic configuration of the pixel 50z according to the twenty-fourth embodiment is similar to that of the pixel 50p (FIGS. 19 and 20) according to the fourteenth embodiment. Therefore, the similar portions are denoted by the same reference signs, and the description thereof will be omitted as appropriate.

The pixel 50z is different from the pixel 50p in that a read gate 213z is disposed near a DTI 201z which is formed in a non-penetrating manner. The other configurations are similar to those of the pixel 50p. Referring to FIG. 54, a vertical transistor trench 214z of the read gate 213z is not in contact with the DTI 201z, but is arranged as close to the DTI 201z as possible. Further, referring to the plan view of FIG. 53, the read gate 213z is formed to be longer than the opening (length in the vertical direction in the figure) of the non-penetrating DTI 201z.

Due to the configuration in which the read gate 213z (vertical transistor trench 214z thereof) is formed in the vicinity of the non-penetrating DTI 201z, the vertical transistor trench 214z can function as a light-shielding wall for shielding light leaking from a PD 71z to a memory 211z. This will be described with reference to FIG. 55.

Figure 55:
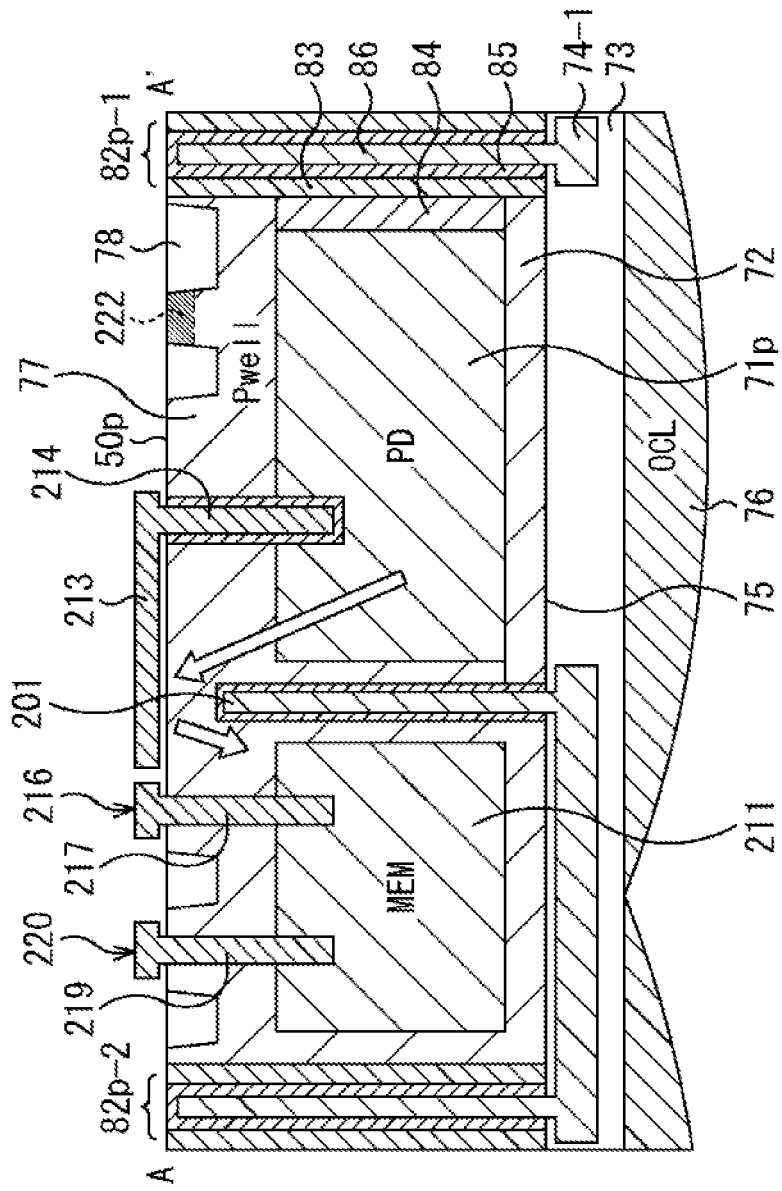
FIG. 55 is a view for describing leakage of light from a PD to a memory.

FIG. 55 is a sectional view of the pixel 50p shown in FIG. 20 according to the fourteenth embodiment. Referring to FIG. 55, when light reaches the non-penetrating portion of the non-penetrating DTI 201 from the PD 71p, the light may be reflected on the interface of the Si substrate 70 or the read gate 213p and leak into the memory 211p.

As shown in FIG. 54, when the vertical transistor trench 214z is provided as close to the non-penetrating DTI 201z as possible, light from the PD 71p impinges on the vertical transistor trench 214z without reaching the non-penetrating portion of the DTI 201. Thus, the light can be prevented from reaching the memory 211z.

As shown in FIG. 53, the vertical transistor trench 214z is longer than the non-penetrating DTI 201, in other words, longer than the non-penetrating portion (hereinafter referred to as an opening) of the penetrating DTI 82z for providing the gate. In other words, the vertical transistor trench 214z is formed so as to cover the opening (non-penetrating portion).

Due to the opening being covered by the vertical transistor trench 214z, leakage of unnecessary light from the PD 71z toward the memory 211z can be prevented.

As described above, PLS can be improved by providing the vertical transistor trench 214z closer to the DTI 201z.

Figure 56:
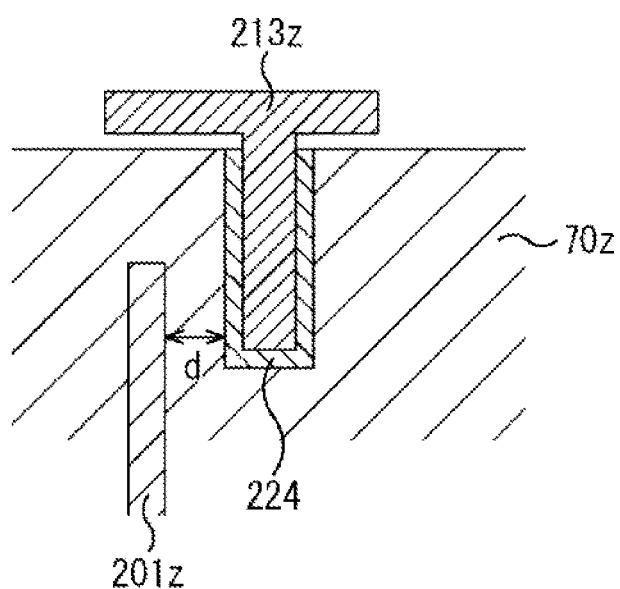
FIG. 56 is a view for describing a distance between trenches.

The distance between the vertical transistor trench 214z and the DTI 201z will be described with reference to FIG. 56.

The read gate 213z including the vertical transistor trench 214z is formed using polysilicon. The vertical transistor trench 214z is formed such that a groove is formed in the Si substrate 70, and the groove is filled with polysilicon. A gate oxide film 224 is formed between the vertical transistor trench 214z and the Si substrate 70.

When the distance between the sidewall of the vertical transistor trench 214z (the sidewall of the gate oxide film 224) and the sidewall of the DTI 201 is defined as d, the distance d is, for example, about 50 to 500 nm.

In a case where the distance d is smaller than 50 nm, the vertical transistor trench 214z may contact the DTI 201z. In a case where the vertical transistor trench 214z and the DTI 201z can be respectively formed with the accuracy of preventing them from being in contact with each other, the distance d may be set to 50 nm or less. In a case where the distance d is larger than 500 nm, the vertical transistor trench 214z and the DTI 201z are too distant from each other, so that the function of the vertical transistor trench 214z as a light-shielding wall may be reduced.

Note that the function as a light-shielding wall may be further improved by increasing the thickness of the gate oxide film 224. When the vertical transistor trench 214z is formed such that the crystal orientation is <110>, the gate oxide film 224 becomes thicker, so that the light shielding performance can be improved.

As described above, leakage of light from the PD 71z into the memory 211z can be prevented, whereby PLS can be improved.

Note that the pixel 50z according to the embodiment 24-1 may be provided with the antireflection film 301, or may be configured such that, for example, the read gate 213z has two vertical transistor trenches 214z, by applying the twenty-third embodiment.

Embodiment 24-2

Figure 57:
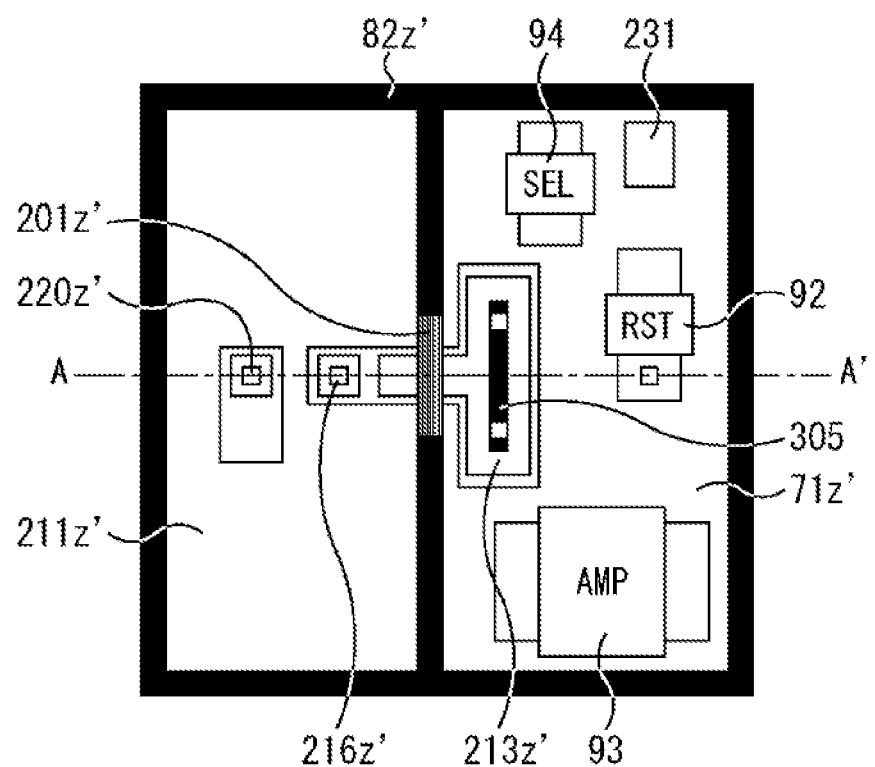
FIG. 57 is a horizontal sectional view showing another example of the twenty-fourth configuration example of the pixel to which the present technology is applied.
Figure 58:
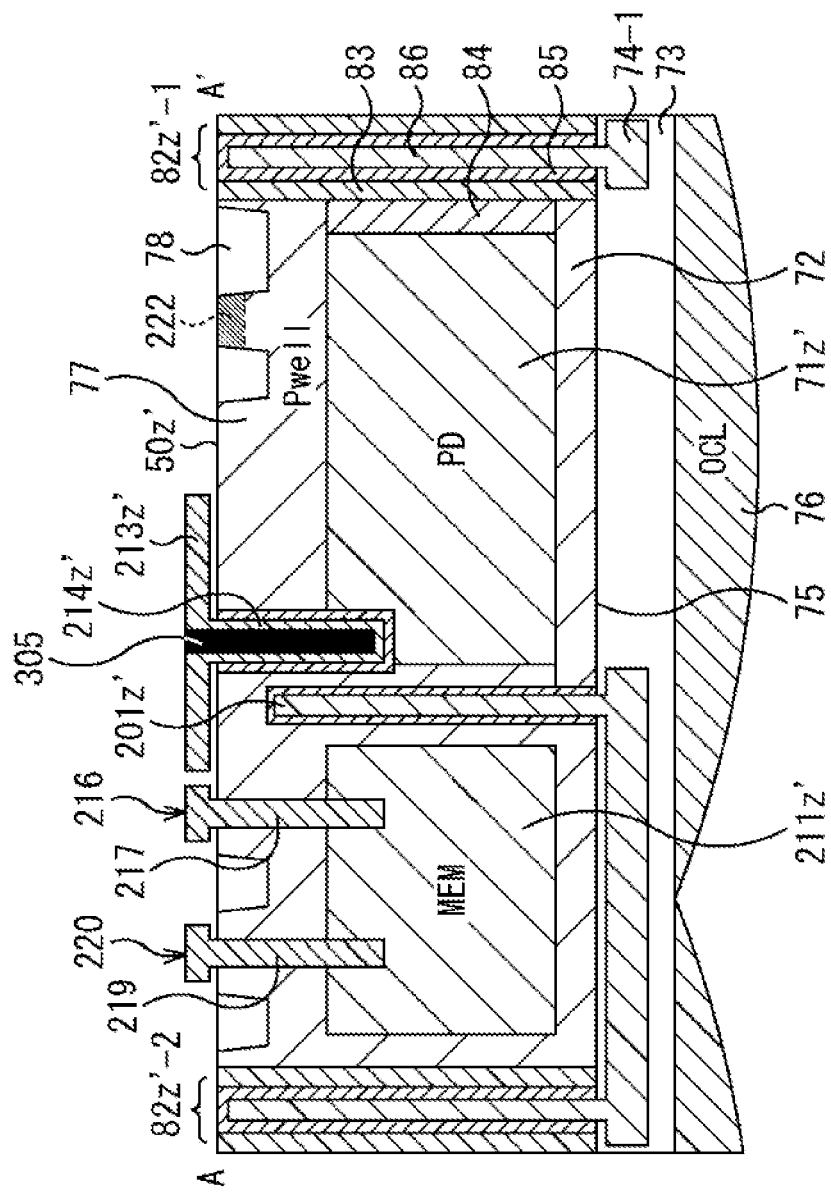
FIG. 58 is a vertical sectional view showing the other example of the twenty-fourth configuration example of the pixel to which the present technology is applied.

FIG. 57 is a horizontal plan view of a pixel 50z' according to an embodiment 24-2 to which the present technology is applied, when viewed from a wiring layer side. FIG. 58 is a vertical sectional view of the pixel 50z' cut along a line A-A' of the pixel 50z' shown in FIG. 57.

The basic configuration of the pixel 50z' according to the embodiment 24-2 is similar to that of the pixel 50z (FIGS. 53 and 54) according to the embodiment 24-1. The pixel 50z' is different from the pixel 50z in that a material having a high light-shielding property is embedded in a vertical transistor trench 214z' in order to enhance the light-shielding property. The other configurations are the same as those of the pixel 50z.

Referring to FIGS. 57 and 58, a read gate 213z' (a vertical transistor trench 214z' thereof) is formed at a position close to a DTI 201z' so as to cover a non-penetrating portion (opening) of the DTI 201z'. This is similar to the pixel 50z in the above-described embodiment 24-1. The pixel 50z' is further different from the pixel 50z in that a light-shielding material 305 is further formed inside the vertical transistor trench 214z'.

The light-shielding material 305 is a material having a high light-shielding property. For example, a single-layer metal film including titanium (Ti), titanium nitride (TiN), tungsten (W), aluminum (Al), tungsten nitride (WN), etc. can be used. Further, a laminated film of these metals (for example, a laminated film of titanium and tungsten, a laminated film of titanium nitride and tungsten, or the like) may be used as the light-shielding material 305.

Further, the light-shielding material 305 may be formed so as to have a light-shielding property due to a difference in refractive index between the light-shielding material 305 and the polysilicon layer formed around the light-shielding material 305. For example, SiO2 may be used as the light-shielding material 305.

Due to the formation of the light-shielding material 305 within the vertical transistor trench 214z', the light-shielding property can be further improved, and leakage of light from a PD 71z' into a memory 211z' can be prevented. Thus, PLS can be improved.

Embodiment 24-3

Figure 59:
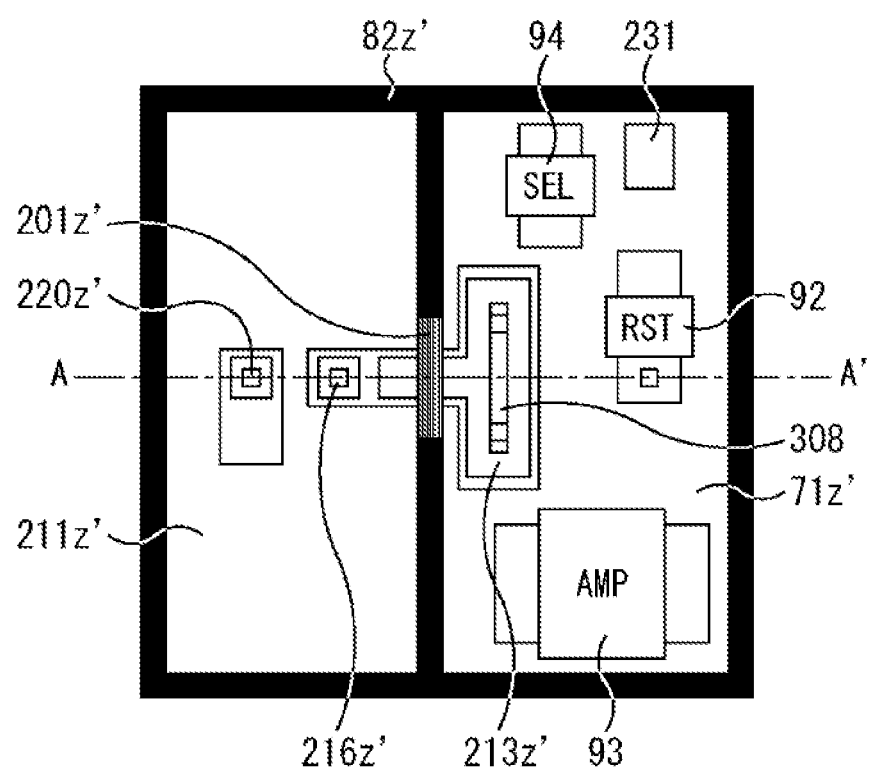
FIG. 59 is a horizontal sectional view showing another example of the twenty-fourth configuration example of the pixel to which the present technology is applied.
Figure 60:
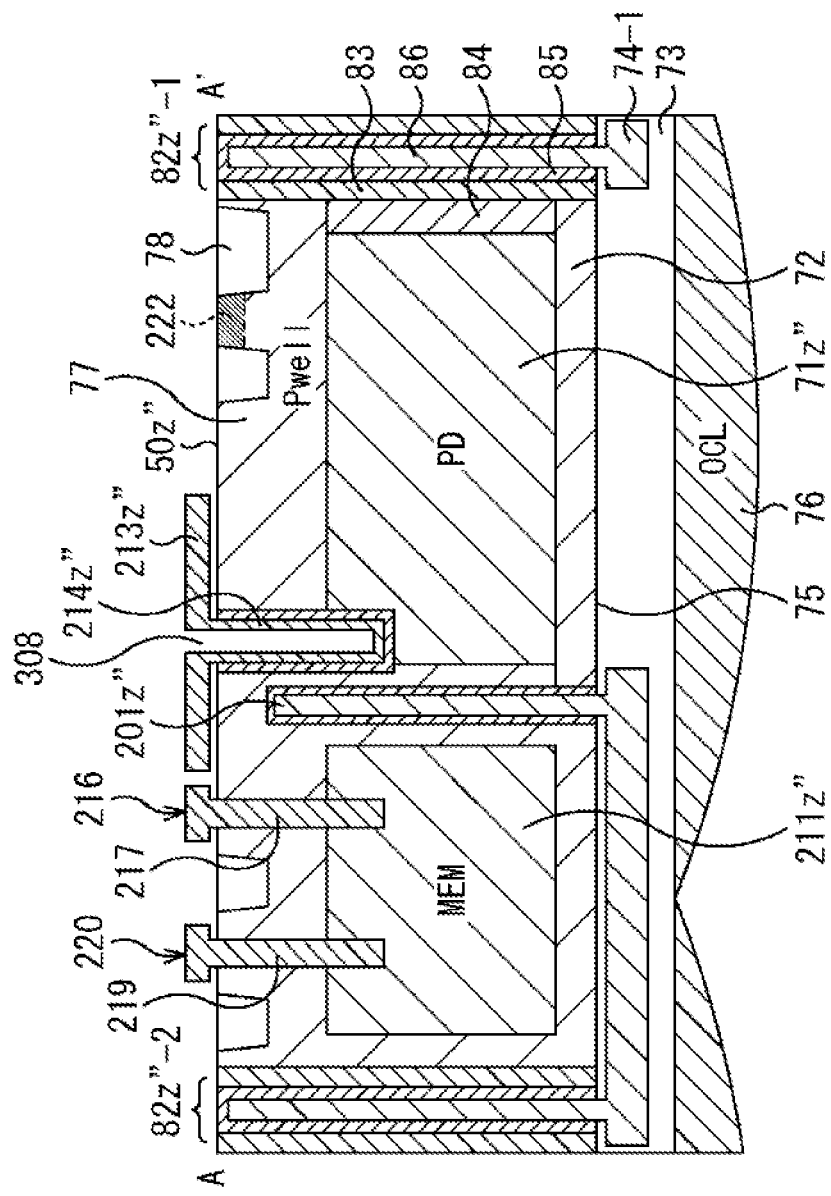
FIG. 60 is a vertical sectional view showing the other example of the twenty-fourth configuration example of the pixel to which the present technology is applied.

FIG. 59 is a horizontal plan view of a pixel 50z" according to an embodiment 24-3 to which the present technology is applied, when viewed from a wiring layer side. FIG. 60 is a vertical sectional view of the pixel 50z" cut along a line A-A' of the pixel 50z" shown in FIG. 59.

The basic configuration of the pixel 50z" according to the embodiment 24-3 is similar to that of the pixel 50z' (FIGS. 57 and 58) according to the embodiment 24-2. The pixel 50z" has a configuration of further enhancing light-shielding performance like the pixel 50z' according to the embodiment 24-2. The pixel 50z" is different from the pixel 50z' in that a hollow section 308 is formed within a vertical transistor trench 214z" instead of the light-shielding material 305. The other configurations are the same as those of the pixel 50z'.

Referring to FIGS. 59 and 60, a read gate 213z" (a vertical transistor trench 214z" thereof) is formed at a position close to a DTI 201z" so as to cover a non-penetrating portion (opening) of the DTI 201z". This is similar to the pixel 50z (50z') in the above-described embodiments 24-1 and 24-2.

Figure 61:
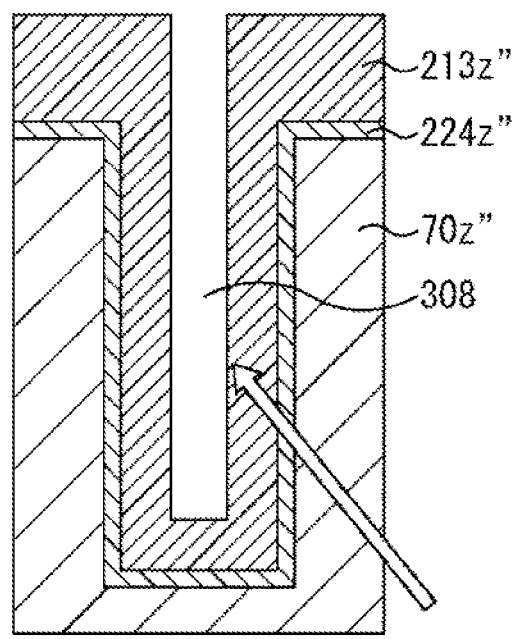
FIG. 61 is a view for describing the configuration of a hollow section.

The hollow section 308 is configured as shown in FIG. 61. The read gate 213z" including the vertical transistor trench 214z" is formed using polysilicon. The vertical transistor trench 214z" is formed such that a groove is formed in a Si substrate 70z", and the groove is filled with polysilicon. A gate oxide film 224z" is formed between the vertical transistor trench 214z" and the Si substrate 70z".

Further, the hollow section 308 is formed in the vertical transistor trench 214z". Due to the formation of the hollow section 308 as described above, transmission of light is suppressed in the hollow section 308 because of a difference in refractive index between the polysilicon and the hollow part. Therefore, the vertical transistor trench 214z" can function as a light-shielding section.

Due to the formation of the hollow section 308 within the vertical transistor trench 214z", the light-shielding property can be further improved, and leakage of light from a PD 71z" into a memory 211z" can be prevented. Thus, PLS can be improved.

Embodiment 24-4

Figure 62:
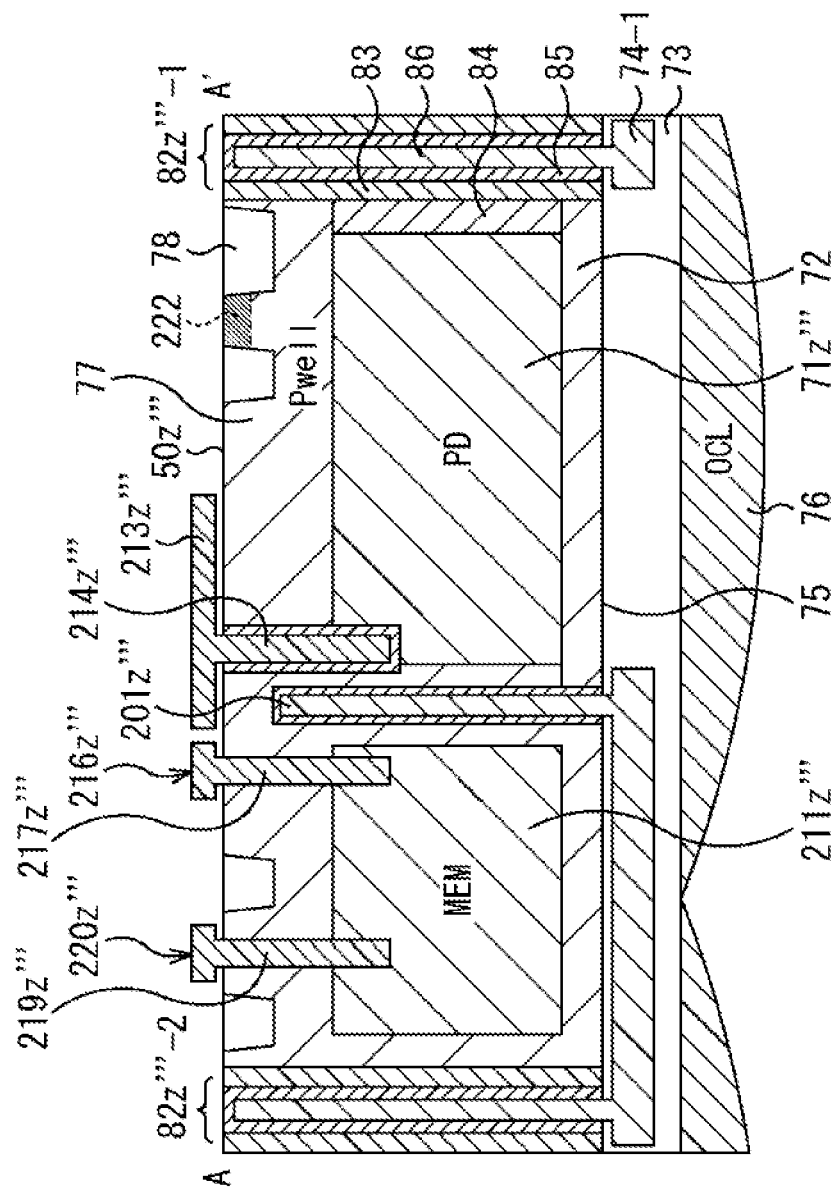
FIG. 62 is a vertical sectional view showing another example of the twenty-fourth configuration example of the pixel to which the present technology is applied.

FIG. 62 is a sectional view of a pixel 50z''' according to an embodiment 25-4 to which the present technology is applied. Specifically, FIG. 62 is a sectional view of the pixel 50z''' cut along a line A-A' of the pixel 50z shown in FIG. 53.

The embodiments 24-1 to 24-3 describe the case where the read gate 213z (the vertical transistor trench 214z thereof) is formed at a position close to the DTI 201z. The write gate 216z (the vertical transistor trench 217z thereof) can be formed also at a position close to the DTI 201z.

In the pixel 50z''' according to the embodiment 24-4 shown in FIG. 62, a read gate 213z''' (vertical transistor trench 214z''' thereof) is formed at a position close to a DTI 201z''', and a write gate 216z''' (vertical transistor trench 217z''' thereof) is also formed at a position close to the DTI 201z'''.

Due to the configuration in which the vertical transistor trench 217z''' is also formed at a position close to the DTI 201z''' as described above, leakage of light from a PD 71z''' into a memory 211z''' can be further suppressed. Therefore, PLS can be improved.

FIG. 62 shows the case where the embodiment 24-4 is applied to the pixel 50z according to the embodiment 24-1. However, the embodiment 24-4 is also applicable to the pixel 50z' according to the embodiment 24-2. That is, either of the vertical transistor trench 214z''' or the vertical transistor trench 217z''' or both of them may be provided with the light-shielding material 305.

In addition, either of the vertical transistor trench 214z''' or the vertical transistor trench 217z''' or both of them may be provided with the hollow section 308 by applying the embodiment 24-4 to the pixel 50z" according to the embodiment 24-3.

<Regarding Shape of Strong Electric Field Region>

Figure 63:
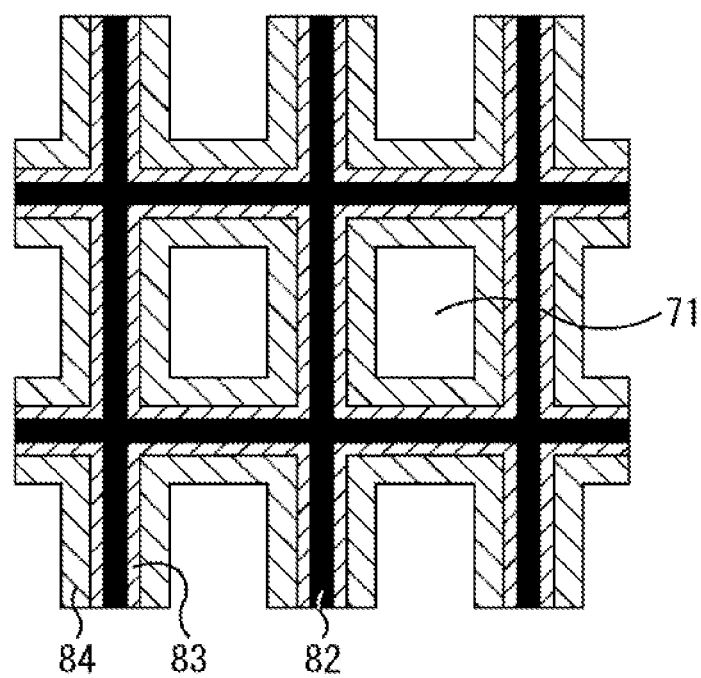
FIG. 63 is a view for describing a strong electric field region.

The pixels 50 in the above-described first to twenty-fourth embodiments are formed so as to be surrounded by the DTI 82 in a plan view as shown in FIG. 63, for example. A PN junction region due to the formation of the P-type solid-phase diffusion layer 83 and the N-type solid-phase diffusion layer 84 is formed on the sidewall of the DTI 82. The PN junction region forms a strong electric field region. Note that, in the above and the following description, the PN junction region obviously includes a PN junction region including only the P-type solid-phase diffusion layer 83 and the N-type solid-phase diffusion layer 84, and further includes a PN junction region having a depletion layer region between the P-type solid-phase diffusion layer 83 and the N-type solid-phase diffusion layer 84.

As shown in FIG. 63, the PD 71 is surrounded by the N-type solid-phase diffusion layer 84. The N-type solid-phase diffusion layer 84 is surrounded by the P-type solid-phase diffusion layer 83. Further, the P-type solid-phase diffusion layer 83 is surrounded by the DTI 82.

As described above, the PN junction region is formed by the P-type solid-phase diffusion layer 83 and the N-type solid-phase diffusion layer 84, and thus, a strong electric field region is formed around the PD 71. Therefore, a saturation charge amount can be increased. The shape of the PN junction region, in a plan view, which can further increase the saturation charge amount as compared with the case where the PN junction region is linearly formed as shown in FIG. 20, will be described below.

Hereinafter, the shape of the strong electric field region will be described as twenty-fifth to twenty-seventh embodiments, and any one of the twenty-fifth to twenty-seventh embodiments can be combined with any one of the first to twenty-fourth embodiments mentioned above.

In addition, the twenty-fifth to twenty-seventh embodiments will be described, taking a pixel having the memory 211 described in the fourteenth to twenty-fourth embodiments as an example. However, the twenty-fifth to twenty-seventh embodiments are applicable to a pixel without having the memory 211 as described in the first to thirteenth embodiments.

Further, in the above and the following description, the PN junction region includes the P-type solid-phase diffusion layer 83 and the N-type solid-phase diffusion layer 84 which are arranged in this order from the DTI 82 side toward the PD 71 side as one example. However, depending on the configuration of the PD 71, the PN junction region may include the N-type solid-phase diffusion layer 84 and the P-type solid-phase diffusion layer 83 which are arranged in this order from the DTI 82 side toward the PD 71 side. The present technology is applicable to a case where the PN junction region provided on the sidewall of the DTI 82 includes a first impurity region containing a first impurity and a second impurity region containing a second impurity, the first impurity being an N-type impurity and the second impurity being a P-type impurity, or the first impurity being a P-type impurity and the second impurity being an N-type impurity.

Further, the P-type impurity or the N-type impurity described above and below indicates an impurity functioning as a P-type or an N-type with respect to a predetermined material. Here, a pixel using the Si substrate 70 will be described as an example. Therefore, for example, an impurity functioning as a P-type with respect to silicon (Si) is defined as a P-type impurity and an impurity functioning as an N-type with respect to Si is defined as an N-type impurity in the following description.

Twenty-Fifth Embodiment

Figure 64:
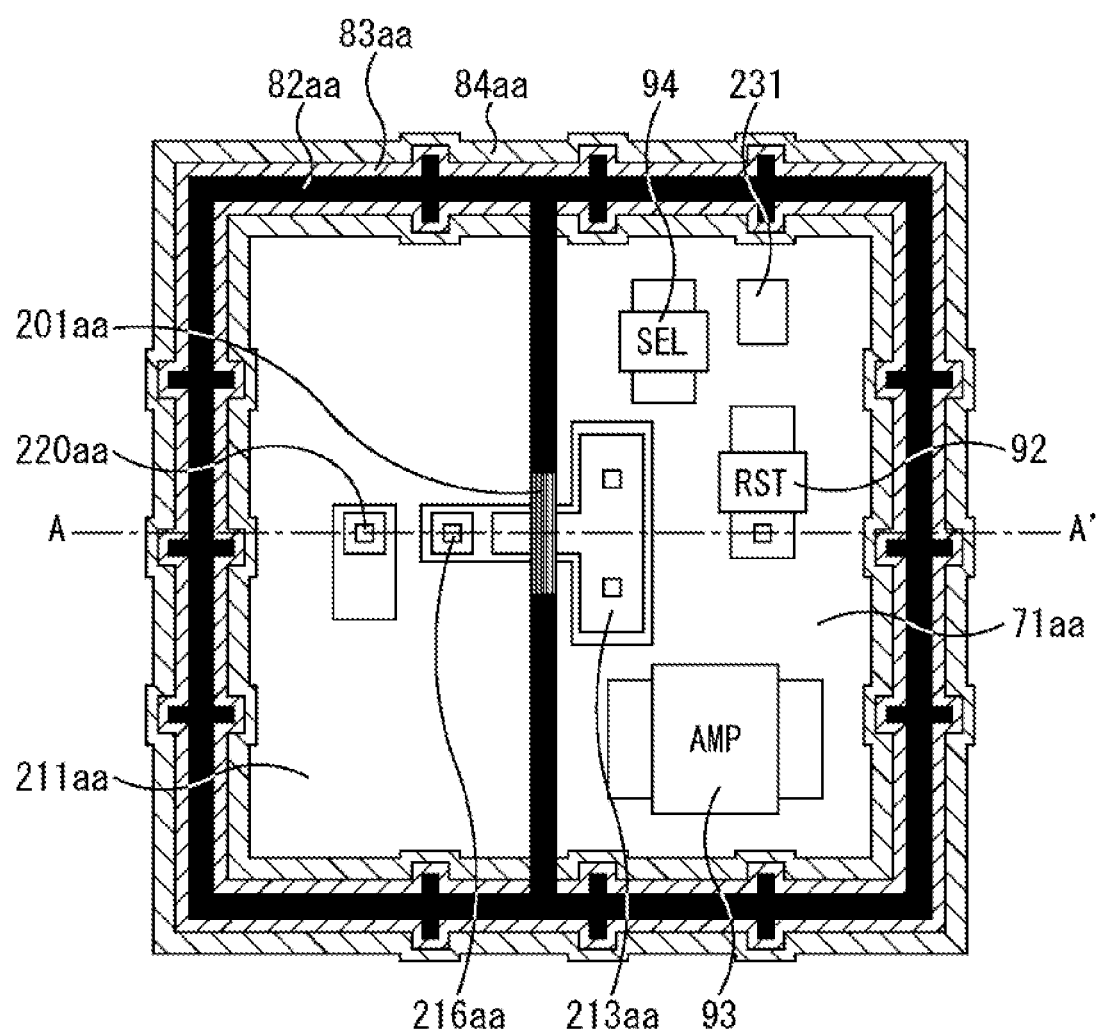
FIG. 64 is a horizontal sectional view showing a twenty-fifth configuration example of the pixel to which the present technology is applied.

FIG. 64 is a horizontal sectional view (plan view) of a pixel 50aa according to a twenty-fifth embodiment to which the present technology is applied.

In the pixel 50aa according to the twenty-fifth embodiment, a strong electric field region surrounding a PD 71aa and a memory 211aa has protrusions and recesses. Referring to the pixel 50aa shown in FIG. 64, when the PD 71aa and the memory 211aa included in the pixel 50aa are focused, a DTI 82aa along the side surrounding the PD 71aa and the memory 211aa has protrusions (recesses).

In the description here, the DTI 82aa has protrusions. However, whether the DTI 82aa has protrusions or recesses may be determined on the basis of a side which is defined as a reference. Here, a portion of the DTI 82aa that is continuously formed in a linear shape (the portion illustrated as DTI 82 in FIG. 63) is defined as a reference, and a portion that protrudes from the reference portion of the DTI 82aa is described as a protrusion in the following description.

A P-type solid-phase diffusion layer 83aa is also formed to have protrusions in conformity with the shape of the DTI 82aa. Further, an N-type solid-phase diffusion layer 84aa is also formed to have protrusions (the protruding part of the P-type solid-phase diffusion layer 83aa corresponds to a recess of the N-type solid-phase diffusion layer 84aa) in conformity with the shape of the P-type solid-phase diffusion layer 83aa.

Due to the formation of the protrusions on the P-type solid-phase diffusion layer 83aa, the contact area with the N-type solid-phase diffusion layer 84aa can be increased. As a result, the PN junction region formed by the P-type solid-phase diffusion layer 83aa and the N-type solid-phase diffusion layer 84aa increases, whereby a strong electric field region increases. Due to an increase in the strong electric field region, an amount of electric charges that can be retained in the strong electric field region increases, whereby a saturation charge amount can be increased.

In the pixel 50aa shown in FIG. 64, three protrusions are formed on each of four sides of the DTI 82aa surrounding the PD 71aa and the memory 211aa, for example. The number of the protrusions is an example, and one or more protrusions may be formed. Further, the protrusion is not limited to having a rectangular shape, and may have another shape. For example, the protrusion may have a triangular shape as described later in a twenty-sixth embodiment.

Further, although three protrusions are formed each on four sides surrounding the PD 71aa and the memory 211aa in the pixel 50aa shown in FIG. 64 as an example, the protrusion may be formed on at least one of four sides. Although not shown, the protrusion may be formed on one, two, or three of four sides.

Due to the formation of the protrusions, the strong electric field region can be increased, but the light-receiving area of the PD 71aa may be reduced. The size of each protrusion can be set in relation to the size of the PD 71aa. In addition, the size of the protrusion can be adjusted by setting the side on which the protrusion is provided (whether the protrusions are formed on one, two, three, or all of four sides) as described above. Also, the size of the strong electric field region can be adjusted by adjusting the size of the protrusion.

In addition, since the strong electric field region can be increased by providing the protrusions, the size of the memory 211aa can be reduced as compared with a case where the protrusions are not provided. Since the memory 211aa is reduced, the PD 71aa can be increased, whereby light-receiving sensitivity of the PD 71aa can be improved.

As described above, the junction area between the P-type solid-phase diffusion layer 83 and the N-type solid-phase diffusion layer 84 can be increased by providing protrusions in the P-type solid-phase diffusion layer 83. Thus, the saturation charge amount can be increased. In this case, the saturation charge amount of the PD 71aa and the memory 211aa can be increased. Further, the memory 211aa can be decreased and the PD 71aa can be increased.

Twenty-Sixth Embodiment

Figure 65:
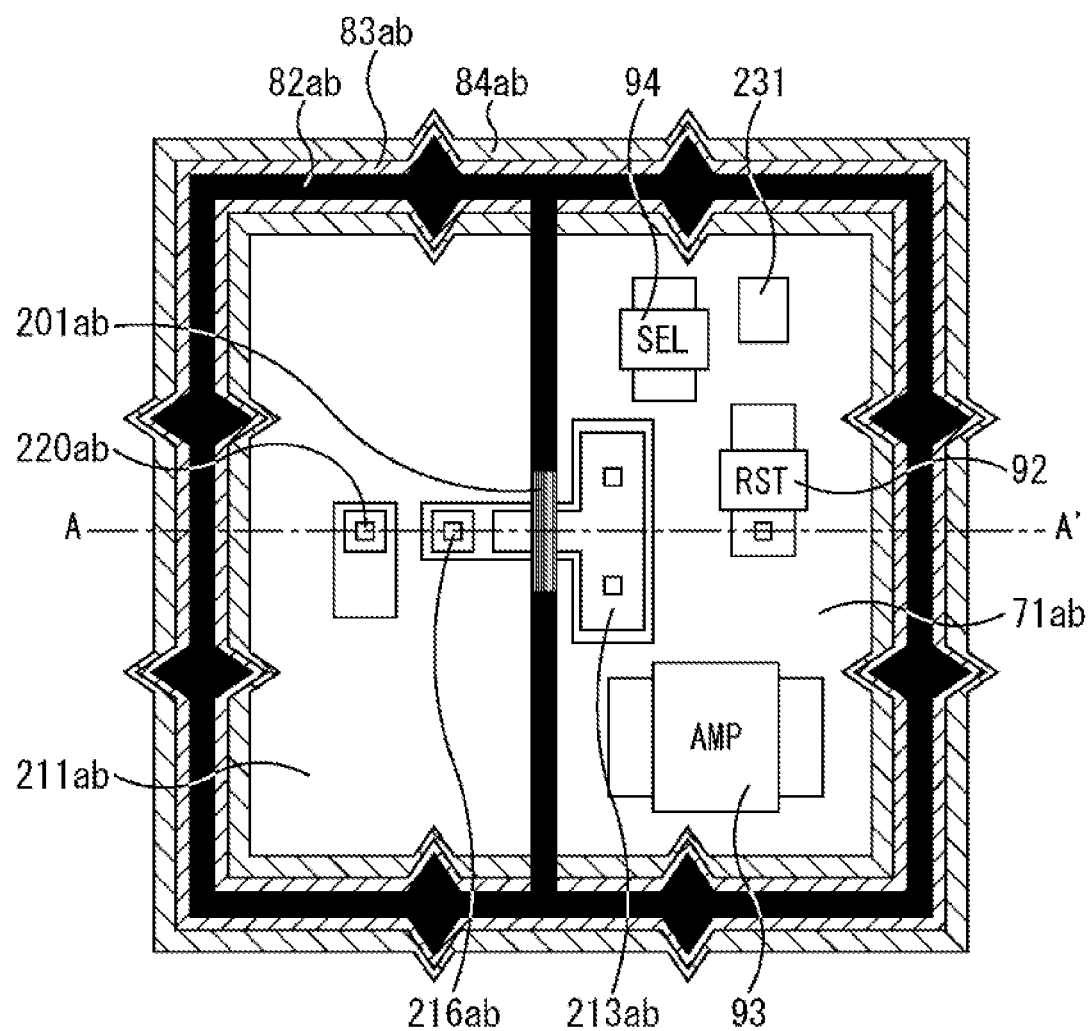
FIG. 65 is a horizontal sectional view showing a twenty-sixth configuration example of the pixel to which the present technology is applied.

FIG. 65 is a plan view of a pixel 50ab according to a twenty-sixth embodiment to which the present technology is applied.

In the pixel 50ab according to the twenty-sixth embodiment, a strong electric field region surrounding a PD 71ab and a memory 211ab has protrusions and recesses as in the pixel 50aa according to the twenty-fifth embodiment. The pixel 50ab shown in FIG. 65 is different from the pixel 50aa shown in FIG. 64 in that the protrusion of the pixel 50ab has a triangular shape. The other configurations are basically similar to those of the pixel 50aa, so that the redundant description will not be repeated.

In the pixel 50ab shown in FIG. 65, protrusions are formed on all of four sides surrounding the PD 71. The pixel 50ab can be configured such that the protrusions are formed on at least one of the four sides surrounding the PD 71, that is, formed on one, two, three, or all of the four sides.

In the pixel 50ab shown in FIG. 65, two triangular protrusions are formed on the left side of four sides of the DTI 82ab surrounding the PD 71ab and the memory 211ab, for example. The number of the protrusions is an example, and one or more protrusions may be formed. Also, the protrusion may have a triangular shape with a rounded vertex or a triangular shape having curved sides instead of linear sides. Further, the protrusion may have a semicircular shape, a shape close to an ellipse, or a polygonal shape, instead of a triangular shape.

The pixel 50ab according to the twenty-sixth embodiment can also be configured such that the length of a P-type solid-phase diffusion layer 83aa is greater than the distance between two sides parallel to each other of the four sides surrounding the PD 71aa, as in the pixel 50aa according to the twenty-fifth embodiment. Thus, the PN junction area can be increased, whereby the strong electric field region can be increased. In other words, the PN junction area can be increased by setting the length of the sidewall of the DTI 82ab to be greater than the distance between the sides of the DTI 82ab parallel to each other in the DTI 82ab surrounding the PD 71ab and the memory 211ab, whereby the strong electric field region can be increased.

As described above, the junction area between the P-type solid-phase diffusion layer 83 and the N-type solid-phase diffusion layer 84 can be increased by providing protrusions in the P-type solid-phase diffusion layer 83. Thus, the saturation charge amount can be increased. In this case, the saturation charge amount of the PD 71ab and the memory 211ab can be increased. Further, the memory 211ab can be decreased and the PD 71ab can be increased.

Twenty-Sixth Embodiment

Figure 66:
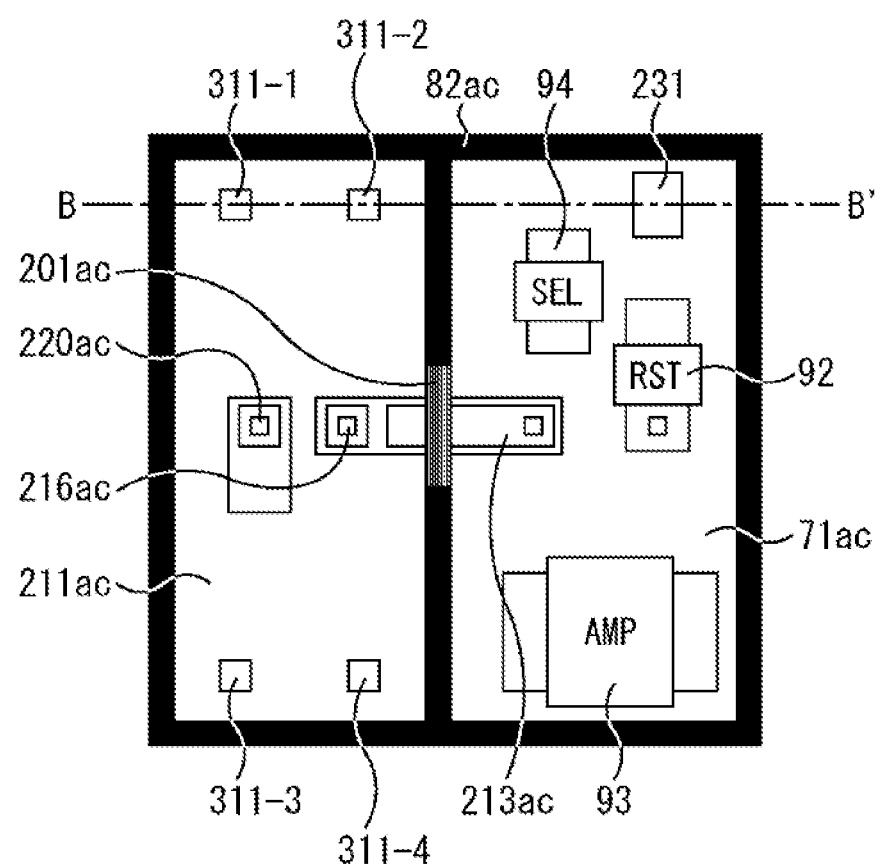
FIG. 66 is a horizontal sectional view showing a twenty-seventh configuration example of the pixel to which the present technology is applied.
Figure 67:
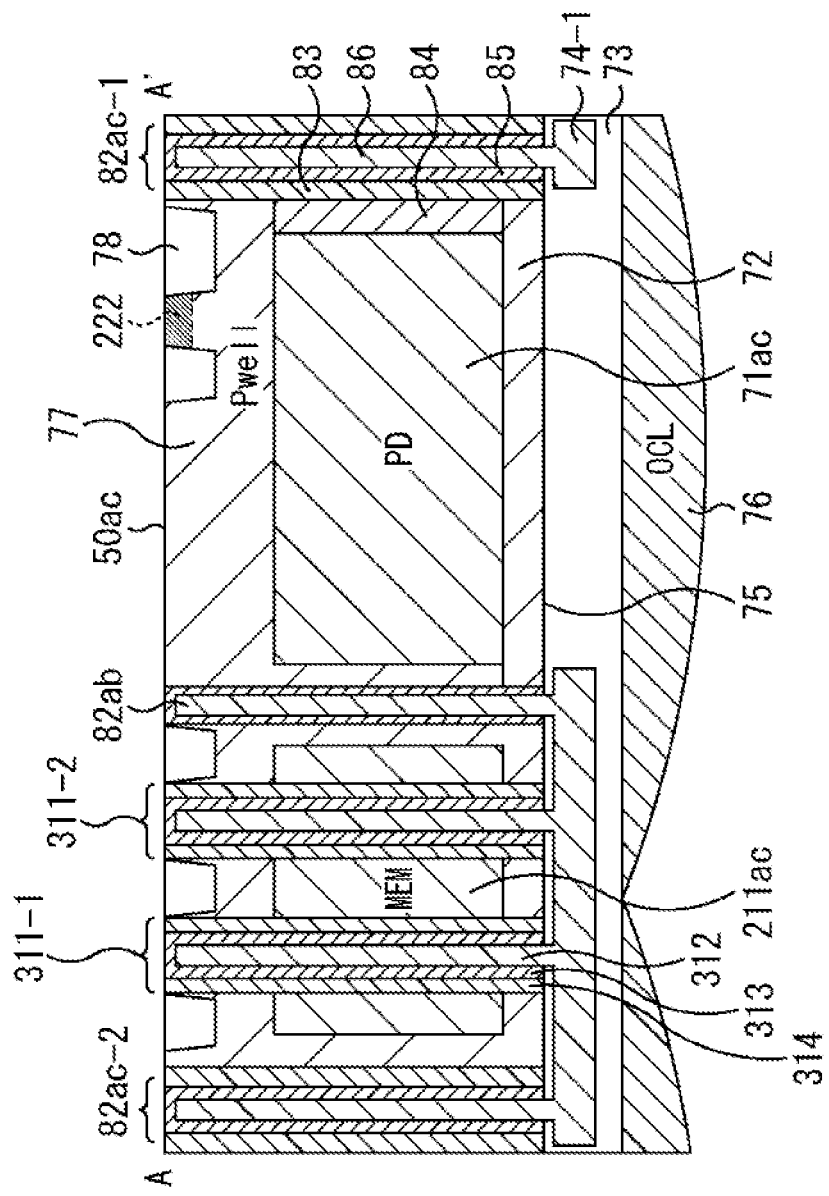
FIG. 67 is a vertical sectional view showing the twenty-seventh configuration example of the pixel to which the present technology is applied.

FIG. 66 is a plan view of a pixel 50ac according to a twenty-sixth embodiment to which the present technology is applied. FIG. 67 is a vertical sectional view of the pixel 50ac cut along a line B-B' of the pixel 50ac shown in FIG. 66.

In the pixel 50ac according to the twenty-sixth embodiment, a strong electric field expansion region is formed in a part of a memory 211ac in order to expand a strong electric field region. The strong electric field expansion region is a PN junction region formed to expand the strong electric field region. FIG. 66 shows an example in which rectangular strong electric field regions are formed near the four corners of the memory 211ac.

The rectangular strong electric field regions 311-1 to 311-4 respectively formed near the four corners of the memory 211ac have the same configuration as the strong electric field region formed around the memory 211ac and the PD 71ac. Specifically, each of the strong electric field regions 311-1 to 311-4 is formed with a DTI 312 penetrating the Si substrate 70 at the center, and a P-type solid-phase diffusion layer 313 is formed around the DTI 312. Further, an N-type solid-phase diffusion layer 314 is formed around the P-type solid-phase diffusion layer 313.

FIG. 66 shows an example in which the strong electric field region is rectangular. However, the strong electric field region may have another shape such as a circular shape or a polygonal shape. Further, FIG. 66 shows the case where the rectangular strong electric field regions are formed near the four corners of the memory 211ac. However, it is sufficient that at least one strong electric field region is formed. Moreover, the size of one strong electric field region is not limited to the size as shown in FIG. 66.

Furthermore, the strong electric field region formed on the sidewall of the DTI 82ac surrounding the memory 211ac and the PD 71ac may be provided with protrusions and recesses by combining the twenty-sixth embodiment with the twenty-fourth or twenty-fifth embodiment.

Due to the formation of the strong electric field expansion region constituted by the P-type solid-phase diffusion layer 313 and the N-type solid-phase diffusion layer 314 in a region other than the DTI 82ac surrounding the memory 211Ac as described above, the strong electric field region formed in one pixel 50ac can be expanded, whereby the saturation charge amount can be increased.

The pixel 50ac according to the twenty-sixth embodiment can also be configured such that the length of the P-type solid-phase diffusion layer 83 (313) is greater, as in the pixel 50aa according to the twenty-fourth embodiment. Thus, the PN junction area can be increased, whereby the strong electric field region can be increased.

In the pixel 50ac according to the twenty-sixth embodiment, the length of the P-type solid-phase diffusion layer 83ac is the total of the length of the sidewall of the DTI 82ac and the length of the P-type solid-phase diffusion layers 313 included in the rectangular strong electric field regions 311 formed near the four corners of the memory 211ac. Therefore, the length of the P-type solid-phase diffusion layer 83ac can be increased as described above.

Accordingly, the PN junction area can be increased, and the strong electric field region can be increased.

Twenty-Sixth Embodiment

Figure 68:
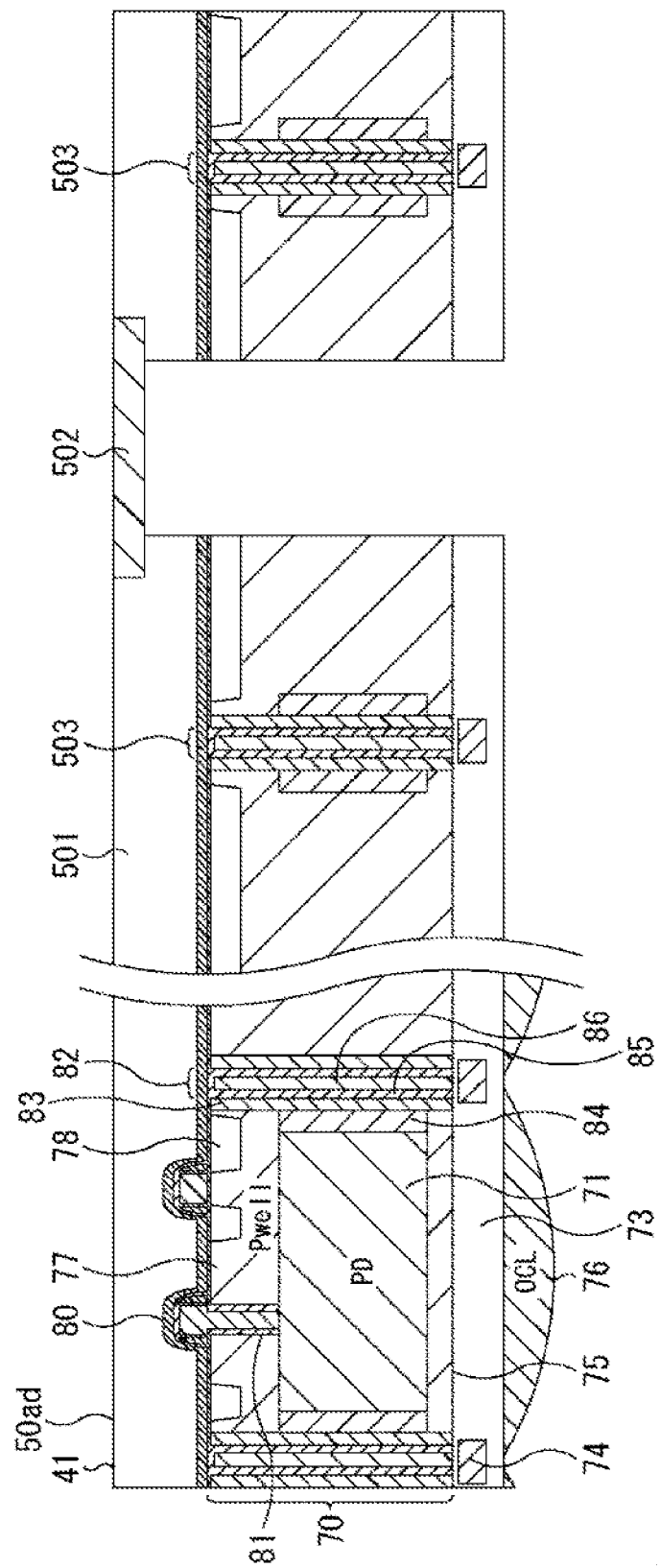
FIG. 68 is a vertical sectional view showing the twenty-third configuration example of the pixel to which the present technology is applied.
Figure 69:
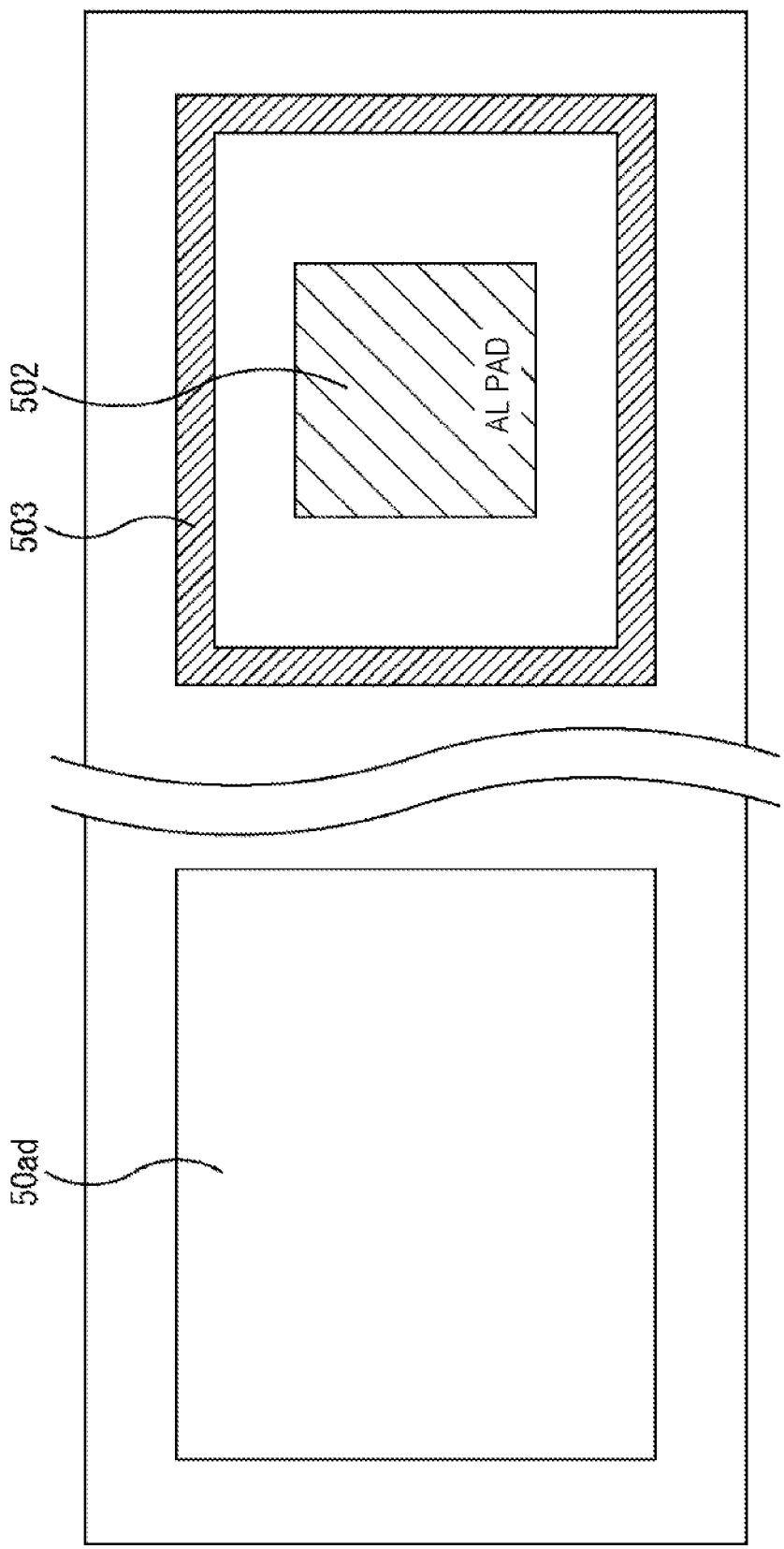
FIG. 69 is a plan view corresponding to the twenty-third configuration example shown in FIG. 48.

FIG. 68 is a vertical sectional view of a pixel 50ad according to a twenty-sixth embodiment to which the present technology is applied. FIG. 69 is a plan view of the pixel 50ad including an AL pad extraction section included in the twenty-sixth embodiment.

A configuration including an AL pad for connecting the pixel 50 to another semiconductor substrate or the like will be described as the twenty-sixth embodiment. FIG. 68 shows an example in which an AL pad is provided for the pixel 50a in the first embodiment shown in FIG. 3. However, any pixel 50 of the pixels 50b to 50u according to the second to nineteenth embodiments can be provided with an AL pad by combining with the twenty-sixth embodiment.

As shown in FIGS. 68 and 69, the pixel array section 41 (FIG. 2) is formed on the left side in the figure, and an AL pad extraction section 501 is provided on the right side in the figure. Regarding the AL pad extraction section 501, AL pads 502 that are connection terminals between the pixel 50ad and other semiconductor substrates and the like are formed in a substrate surface (upper side in the figure).

As shown in FIG. 68, a solid-phase diffusion trench 503 is formed around each AL pad 502 in the AL pad extraction section 501. The solid-phase diffusion trench 503 is formed in a manner similar to the DTI 82 in the first embodiment. Thus, it is possible to electrically isolate each AL pad 502 from the pixel array section 41 and other peripheral circuit sections (not shown).

Note that the solid-phase diffusion trench 503 formed in the AL pad extraction section 501 can be utilized as a mark for photoresist, for example. Moreover, with this, the solid-phase diffusion trench 503 can also be used as an alignment mark for the subsequent processes.

Twenty-Seventh Embodiment

Figure 70:
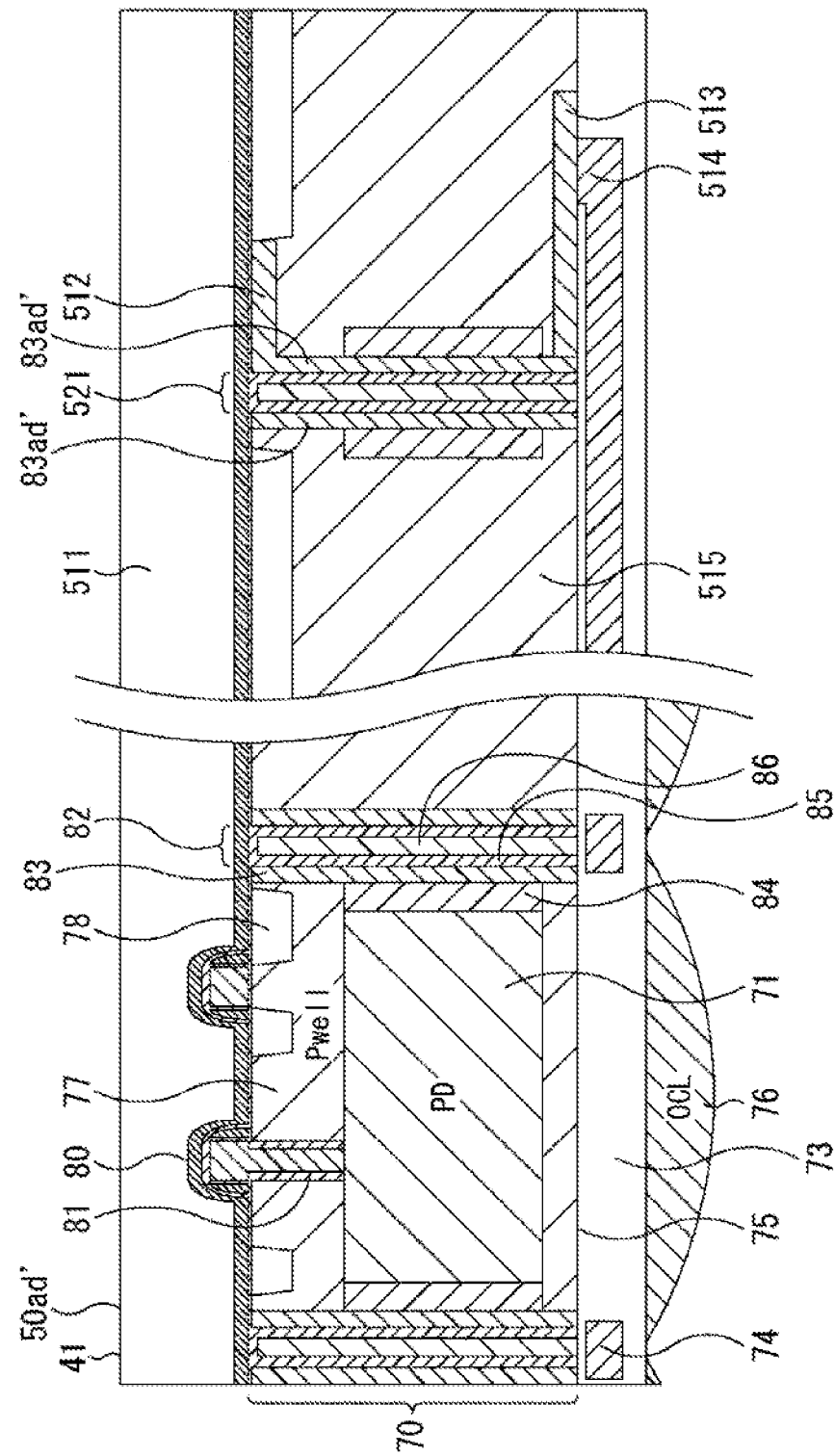
FIG. 70 is a vertical sectional view showing the twenty-fourth configuration example of the pixel to which the present technology is applied.

FIG. 70 is a vertical sectional view of a pixel 50ad' according to a twenty-seventh embodiment to which the present technology is applied.

A configuration including the pixel 50 and the peripheral circuit section will be described as the twenty-seventh embodiment. FIG. 70 shows an example in which a peripheral circuit is provided for the pixel 50a in the first embodiment shown in FIG. 3. However, any pixel 50 of the pixels 50b to 50u according to the second to nineteenth embodiments can be provided with a peripheral circuit by combining with the twenty-seventh embodiment.

As shown in FIG. 70, the pixel array section 41 (FIG. 2) is formed on the left side in the figure, and a peripheral circuit section 511 is provided on the right side in the figure. A solid-phase diffusion trench 521 is formed in the peripheral circuit section 511. The solid-phase diffusion trench 521 is formed in a manner similar to the DTI 82 in the first embodiment.

A front surface side (upper side in the figure) of a P-type solid-phase diffusion layer 83u formed along the solid-phase diffusion trench 521 is electrically connected to a P+ diffusion layer 512 formed in the front surface of the Si substrate 70. Further, the back surface side (lower side in the figure) of the P-type solid-phase diffusion layer 83u is electrically connected to a Pwell region 513 formed near the backside Si interface 75 or a hole layer 515 formed by a pinning film in the vicinity of a backside interface of the Si substrate 70.

The Pwell region 513 is connected to a light-shielding film 74 including a metal material such as tungsten (W) via a backside contact 514. As a result, the front surface side and the back surface side of the Si substrate 70 are electrically connected to each other and fixed to potential of the light-shielding film 74.

In the twenty-seventh embodiment, the P-type solid-phase diffusion layer 83u can also serve as the Pwell region, which has been traditionally necessary for connecting the front surface side and the back surface side of the Si substrate 70 to each other. Thus, the number of steps of forming the Pwell region can be reduced.

Twenty-Eighth Embodiment

Figure 71:
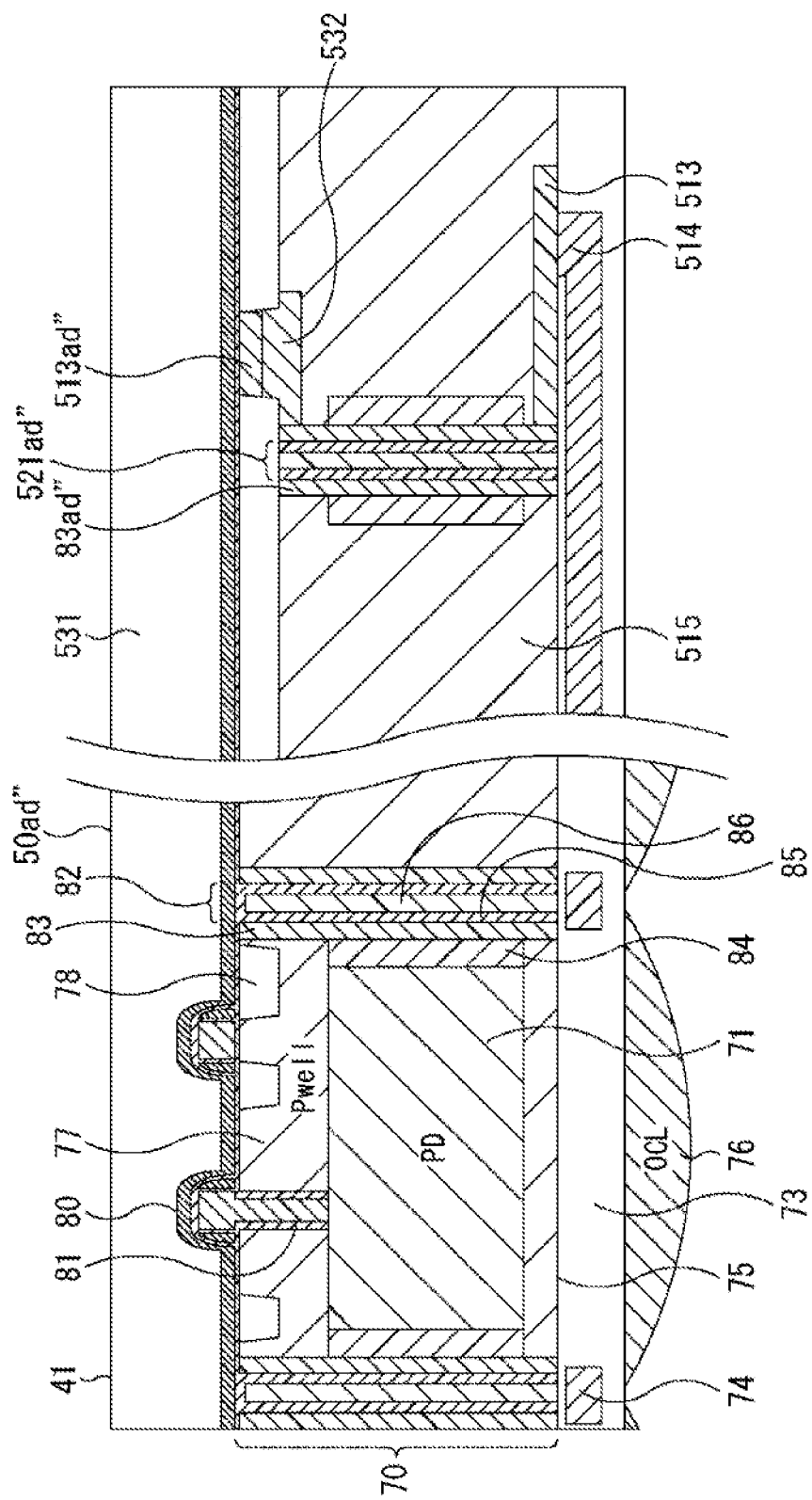
FIG. 71 is a vertical sectional view showing the twenty-fifth configuration example of the pixel to which the present technology is applied.

FIG. 71 is a vertical sectional view of a pixel 50ad'" according to a twenty-eighth embodiment to which the present technology is applied.

Similarly to the twenty-seventh embodiment, a configuration including the pixel 50 and the peripheral circuit section will be described as the twenty-eighth embodiment. FIG. 71 shows an example in which a peripheral circuit is provided for the pixel 50a in the first embodiment shown in FIG. 3. However, any pixel 50 of the pixels 50b to 50u according to the second to twenty-second embodiments can be provided with a peripheral circuit by combining with the twenty-eighth embodiment.

The pixel 50ad'" according to the twenty-eighth embodiment has a pixel array section 41 on the left side in the figure and a peripheral circuit section 531 on the right side in the figure as shown in FIG. 71, like the pixel 50ad according to the twenty-seventh embodiment. A solid-phase diffusion trench 521ad is formed in the peripheral circuit section 531. The solid-phase diffusion trench 521ad is formed in a manner similar to the DTI 82 in the first embodiment.

A solid-phase diffusion trench 521ad is formed in the peripheral circuit section 531. The solid-phase diffusion trench 521ad is formed in a manner similar to the DTI 82 in the first embodiment. The front surface side (upper side in the figure) of a P-type solid-phase diffusion layer 83ad formed along the solid-phase diffusion trench 521ad is electrically connected to a P+ diffusion layer 512ad formed in the front surface of the Si substrate 70 via a Pwell region 532. This point is different from the pixel 50ad' shown in FIG. 70.

Further, the back surface side (lower side in the figure) of the P-type solid-phase diffusion layer 83ad is electrically connected to a Pwell region 513 formed near the backside Si interface 75 or a hole layer 515. The Pwell region 513 is connected to a light-shielding film 74 including a metal material such as W via a backside contact 514. As a result, the front surface side and the back surface side of the Si substrate 70 are electrically connected to each other and fixed to potential of the light-shielding film 74.

In the twenty-eighth embodiment, the P-type solid-phase diffusion layer 83ad can also serve as the Pwell region, which has been traditionally necessary for connecting the front surface side and the back surface side of the Si substrate 70 to each other. Thus, the number of steps of forming the Pwell region can be reduced.

Twenty-Ninth Embodiment

Figure 72:
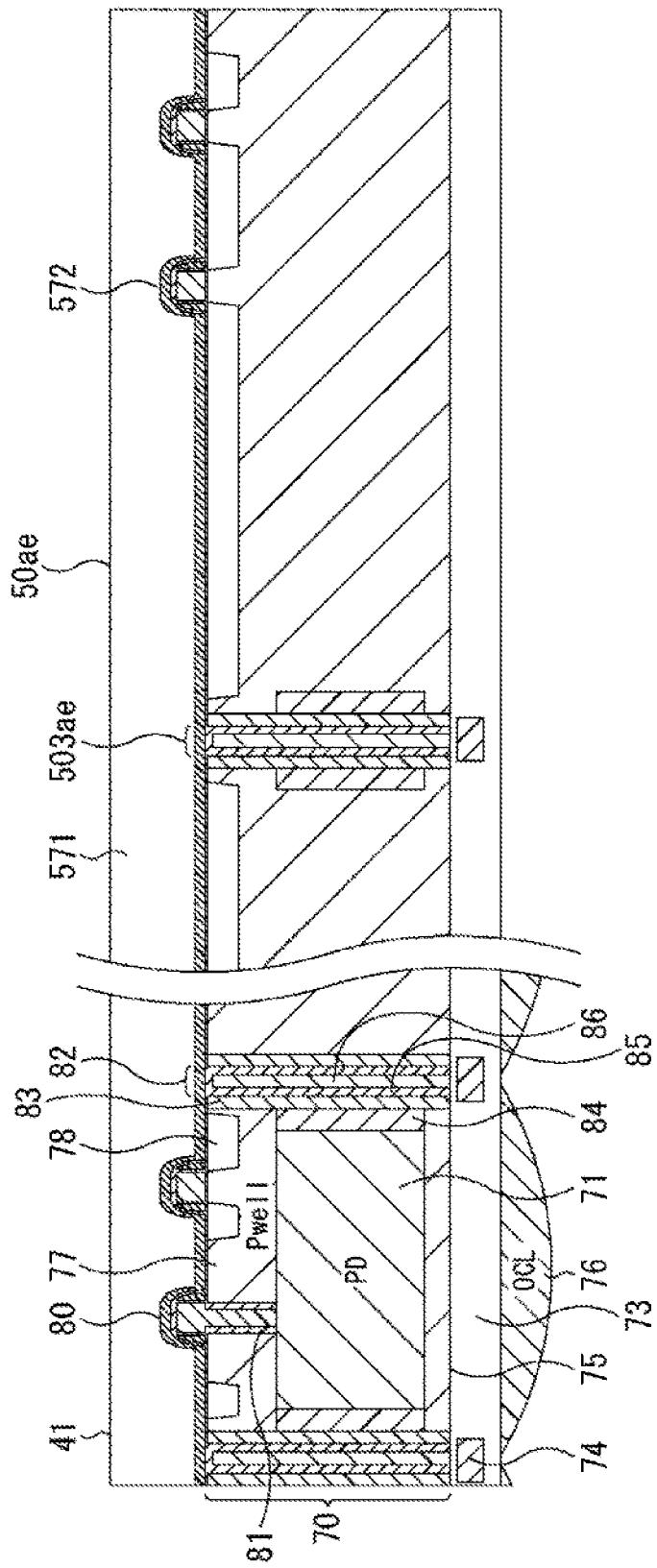
FIG. 72 is a vertical sectional view showing the twenty-sixth configuration example of the pixel to which the present technology is applied.

FIG. 72 is a vertical sectional view of a pixel 50ae according to a twenty-ninth embodiment to which the present technology is applied.

Similarly to the twenty-seventh embodiment, a configuration including the pixel 50 and the peripheral circuit section will be described as the twenty-ninth embodiment. FIG. 72 shows an example in which a peripheral circuit is provided for the pixel 50a in the first embodiment shown in FIG. 3. However, any pixel 50 of the pixels 50b to 50ad'" according to the second to twenty-eighth embodiments can be provided with a peripheral circuit by combining with the twenty-ninth embodiment.

The pixel 50ae according to the twenty-ninth embodiment has a pixel array section 41 on the left side in the figure and a peripheral circuit section 571 on the right side in the figure as shown in FIG. 72, like the pixel 50ae according to the twenty-seventh embodiment.

A solid-phase diffusion trench 503 is formed at a boundary section 572 located at a boundary between the pixel array section 41 and the peripheral circuit section 571.

Therefore, the pixel 50ae according to the twenty-ninth embodiment can provide an effect similar to the effect of the pixel 50a according to the first embodiment, and further prevent light generated in the peripheral circuit section 571 from entering the pixel array section 41 due to the solid-phase diffusion trench 503ae'.

Note that the abovementioned first to twenty-ninth embodiments can be appropriately combined.

<First Modification>

In the abovementioned first to twenty-ninth embodiments, each pixel 50 has the FD 91 (FIG. 4) and the pixel transistor (for example, the reset transistor 92 (FIG. 2) and the like). However, the FD 91 or the pixel transistor may be shared by a plurality of pixels 50.

Figure 73:
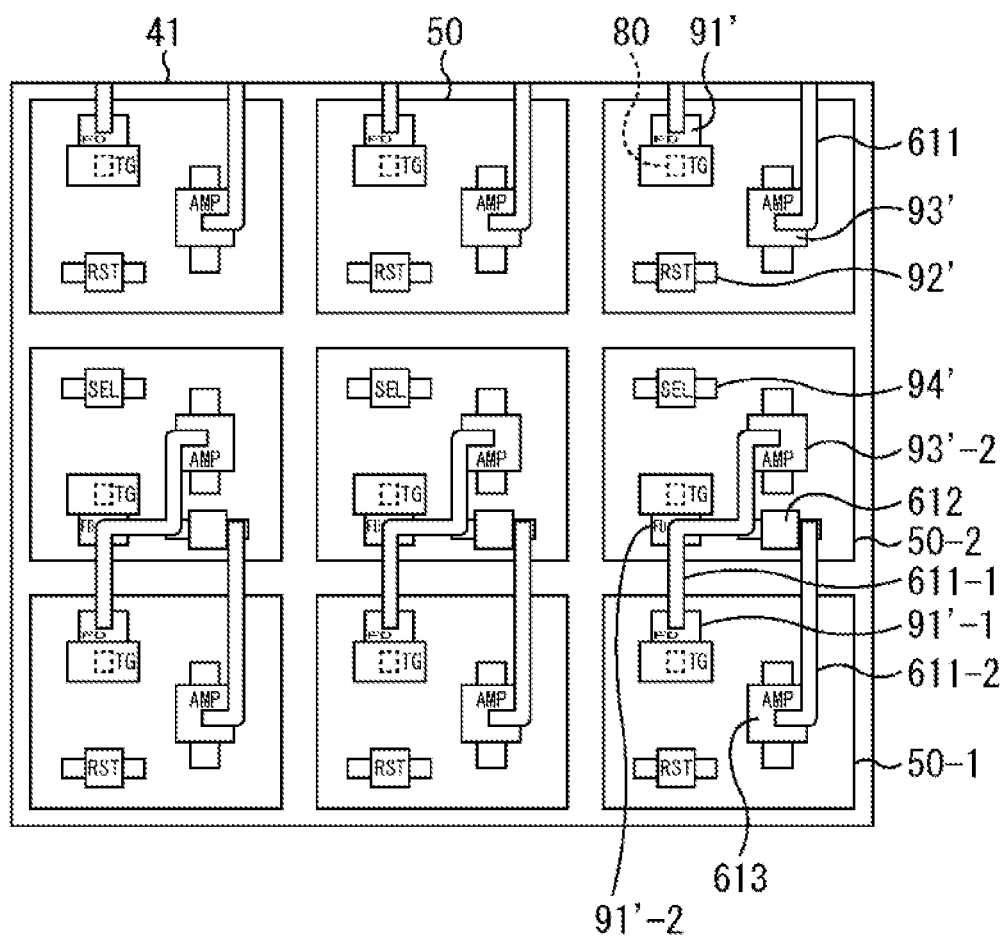

FIG. 73 shows a plan view in a case where two pixels 50 adjacent to each other in a vertical direction share the FD 91 and the pixel transistor.

In the example shown in FIG. 73, for example, the lower-right pixel 50-1 and the pixel 50-2 located above the pixel 50-1 share the FD 91 and the pixel transistor. An FD 91'-1 of the pixel 50-1, an FD 91'-2 of the pixel 50-2, a conversion efficiency switching transistor 612, and an amplifier transistor 93'-2 of the pixel 50-2 are connected by a means of a wire 611-1.

Further, a MOS capacitor 613 of the pixel 50-1 and a conversion efficiency switching transistor 612 of the pixel 50-2 are connected by means of a wire 611-2.

When the sharing structure is applied as described above, the number of elements per pixel decreases and an occupation area in each pixel is sufficiently large. Thus, the conversion efficiency switching transistor 612 and the MOS capacitor 613 to be added to the FD 91' can be provided.

The conversion efficiency switching transistor 612 can switch to high conversion efficiency for an application intended to enhance a sensitivity output and switch to low conversion efficiency for an application intended to increase the saturation charge amount Qs.

The MOS capacitor 613 added to the FD 91' can increase the FD capacity. Therefore, the low conversion efficiency can be achieved, and thus, the saturation charge amount Qs can be increased.

<Other Modifications>

The first to twenty-ninth embodiments can also be applied to a pixel 50 formed by stacking a plurality of substrates as described below, for example.

<Configuration Example of Stacked-Type Solid-State Imaging Device to which Technology According to Present Disclosure can be Applied>

Figure 74:
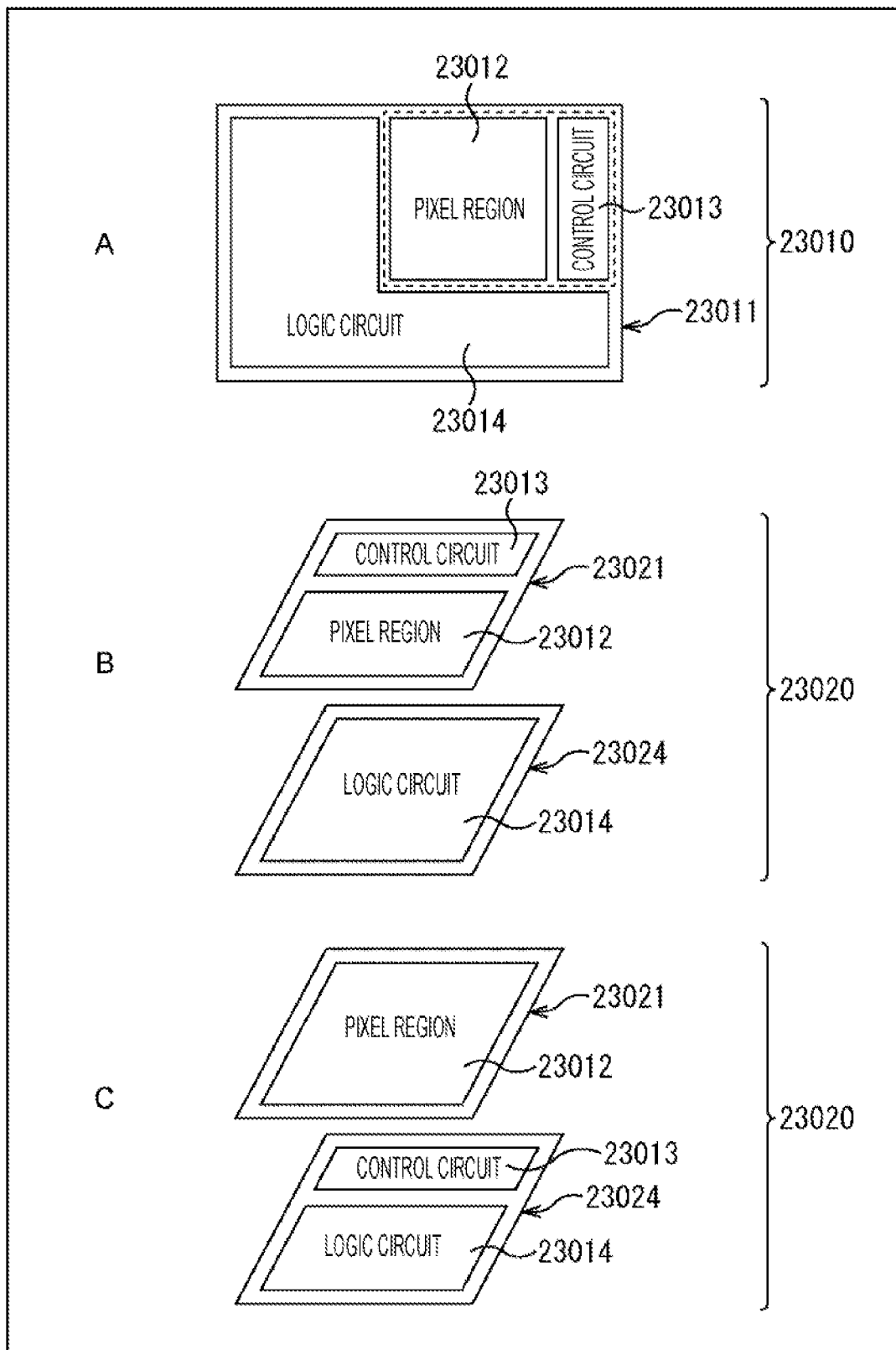
FIG. 74 is a diagram showing the outline of a configuration example of a stacked-type solid-state imaging device to which the technology according to the present disclosure can be applied.

FIG. 74 is a diagram showing the outline of a configuration example of a stacked-type solid-state imaging device to which the technology according to the present disclosure can be applied.

A of FIG. 74 shows a schematic configuration example of a non-stacked-type solid-state imaging device. As shown in A of FIG. 74, a solid-state imaging device 23010 includes a single die (semiconductor substrate) 23011. This die 23011 has a pixel region 23012 in which pixels are arranged in an array, and is mounted with a control circuit 23013 that controls driving of the pixels and performs other various kinds of control, and a logic circuit 23014 for signal processing.

B and C of FIG. 74 show schematic configuration examples of a stacked-type solid-state imaging device. As shown in B and C of FIG. 74, in a solid-state imaging device 23020, two dies, a sensor die 23021 and a logic die 23024, are stacked and electrically connected to each other. In this manner, the solid-state imaging device 23020 is configured as a single semiconductor chip.

In B of FIG. 74, the sensor die 23021 includes the pixel region 23012 and the control circuit 23013, and the logic die 23024 includes the logic circuit 23014 including a signal processing circuit that performs signal processing.

In C of FIG. 74, the sensor die 23021 includes the pixel region 23012, and the logic die 23024 includes the control circuit 23013 and the logic circuit 23014.

Figure 75:
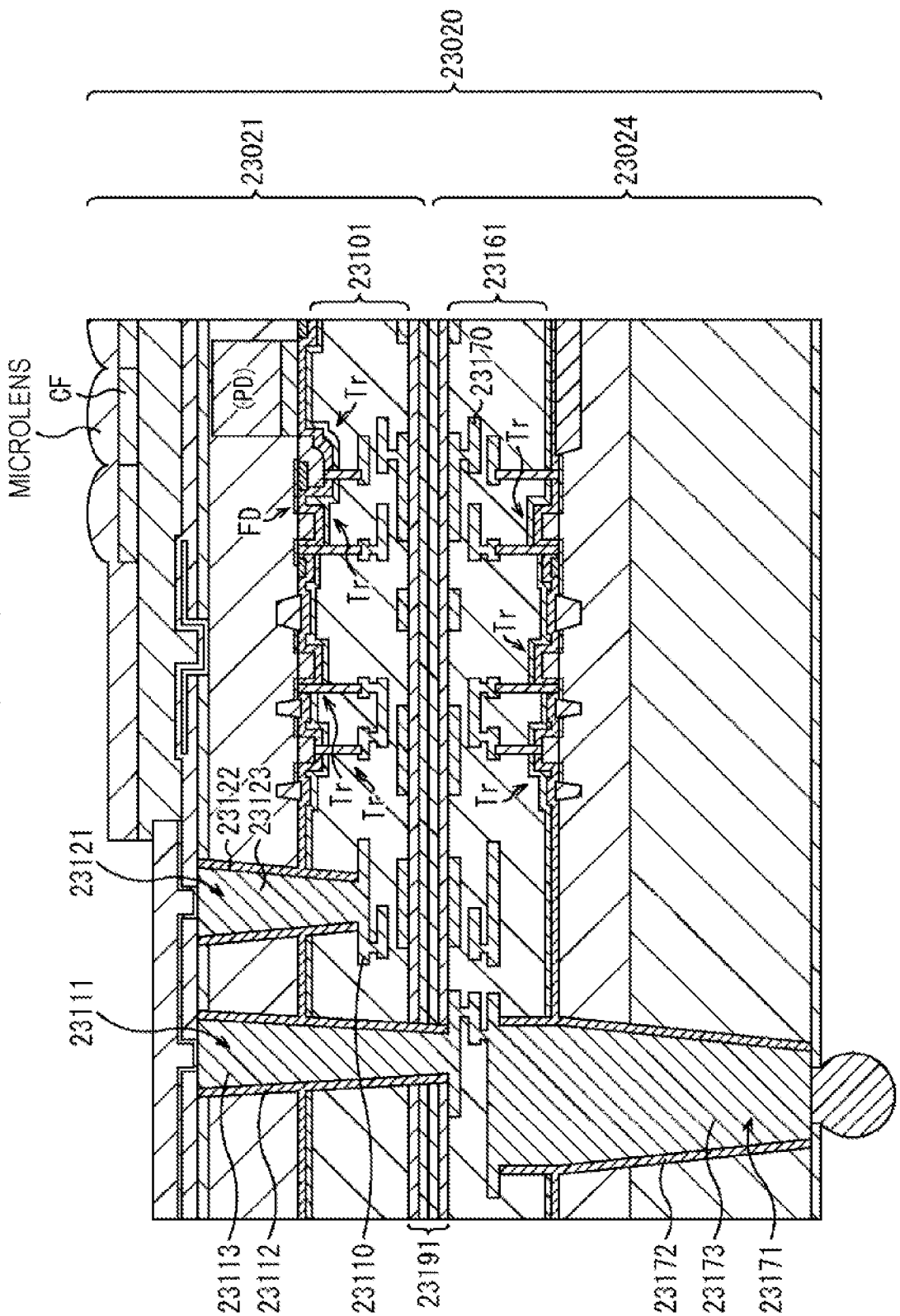
FIG. 75 is a sectional view showing a first configuration example of a stacked-type solid-state imaging device 23020.

FIG. 75 is a sectional view showing a first configuration example of the stacked-type solid-state imaging device 23020.

The sensor die 23021 includes a photodiode (PD), a floating diffusion (FD), and transistors (Tr) (MOSFETs), which constitute a pixel arranged in the pixel region 23012, and Tr and the like which become the control circuit 23013. In addition, a wiring layer 23101 is formed in the sensor die 23021. The wiring layer 23101 includes a plurality of layers, in this example, three layers of wires 23110. Note that the control circuit 23013 (Tr that becomes the control circuit 23013) can be formed in the logic die 23024 instead of in the sensor die 23021.

The logic die 23024 includes Tr constituting the logic circuit 23014. Further, the logic die 23024 includes a wiring layer 23161 having a plurality of layers, in this example, three layers of wires 23170. Further, in the logic die 23024, a connection hole 23171 is formed. The connection hole 23171 has an insulating film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. Accordingly, the stacked-type solid-state imaging device 23020 in which the sensor die 23021 and the logic die 23024 are stacked is formed. A film 23191 such as a protective film is formed in a face on which the sensor die 23021 and the logic die 23024 are bonded to each other.

The sensor die 23021 is formed with a connection hole 23111 which penetrates the sensor die 23021 from the back surface side (from the side where light enters toward the PD) (upper side) of the sensor die 23021 and reaches the wire 23170 in the uppermost layer in the logic die 23024. In addition, the sensor die 23021 is formed with a connection hole 23121 which is located in proximity to the connection hole 23111 and reaches the wire 23110 in the first layer from the back surface side of the sensor die 23021. An insulating film 23112 is formed on the inner wall surface of the connection hole 23111, and an insulating film 23122 is formed on the inner wall surface of the connection hole 23121. Then, connection conductors 23113 and 23123 are embedded in the connection holes 23111 and 23121, respectively. The connection conductor 23113 and the connection conductor 23123 are electrically connected on the back surface side of the sensor die 23021. Thus, the sensor die 23021 and the logic die 23024 are electrically connected to each other via the wiring layer 23101, the connection hole 23121, the connection hole 23111, and the wiring layer 23161.

Figure 76:
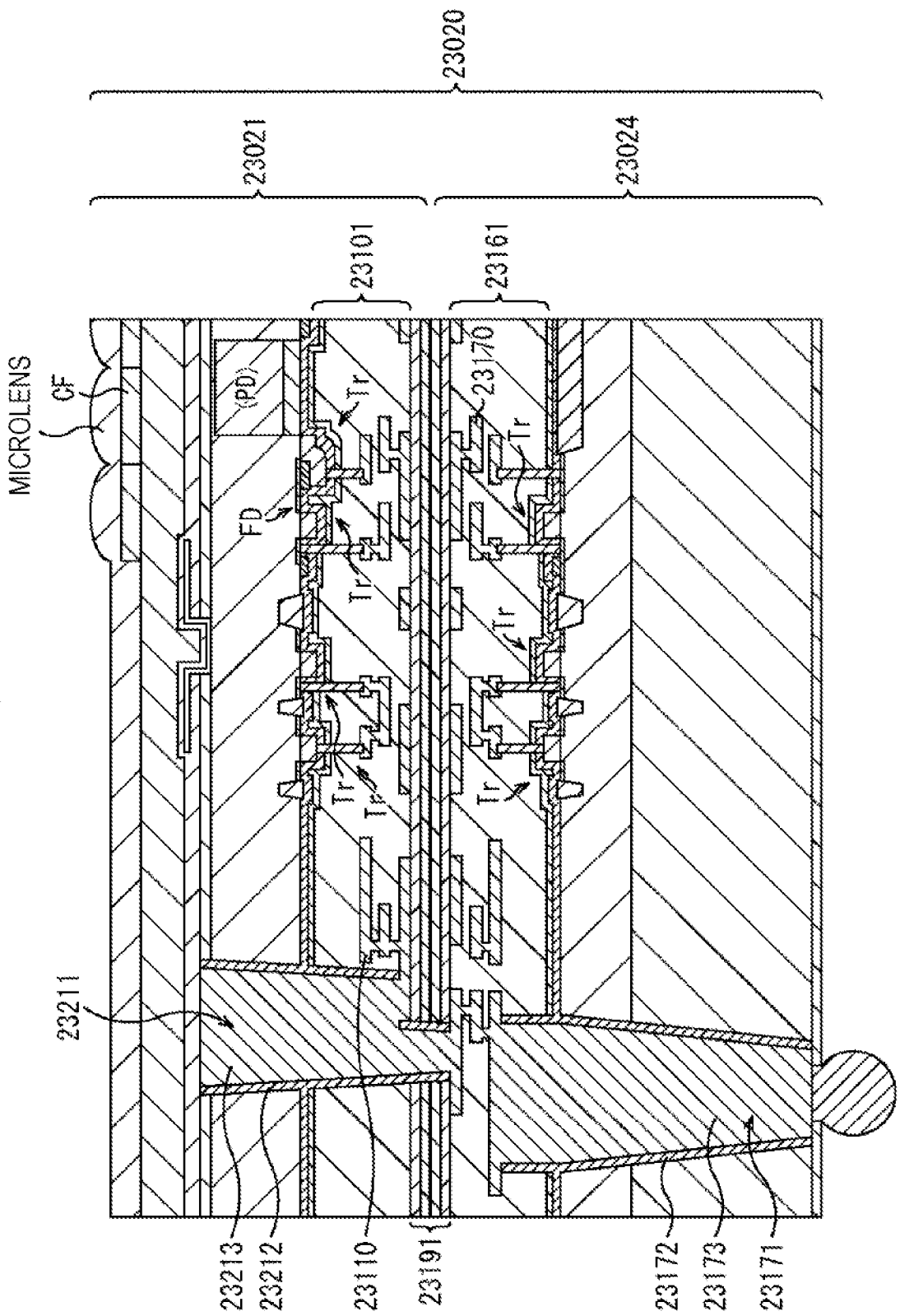
FIG. 76 is a sectional view showing a second configuration example of the stacked-type solid-state imaging device 23020.

FIG. 76 is a sectional view showing a second configuration example of the stacked-type solid-state imaging device 23020.

In the second configuration example of the solid-state imaging device 23020, the sensor die 23021 ((the wire 23110) of the wiring layer 23101 of the sensor die 23021) and the logic die ((the wire 23170) of the wiring layer 23161 of the logic die 23024) are electrically connected to each other via a single connection hole 23211 formed in the sensor die 23021.

That is, in FIG. 76, the connection hole 23211 penetrates the sensor die 23021 from the back surface side of the sensor die 23021 and reaches the wire 23170 in the uppermost layer in the logic die 23024 and the wire 23110 in the uppermost layer in the sensor die 23021. An insulating film 23212 is formed on the inner wall surface of the connection hole 23211, and a connection conductor 23213 is embedded in the connection hole 23211. In FIG. 75 described above, the sensor die 23021 and the logic die 23024 are electrically connected to each other through the two connection holes 23111 and 23121. On the other hand, in FIG. 76, the sensor die 23021 and the logic die 23024 are electrically connected to each other through the single connection hole 23211.

Figure 77:
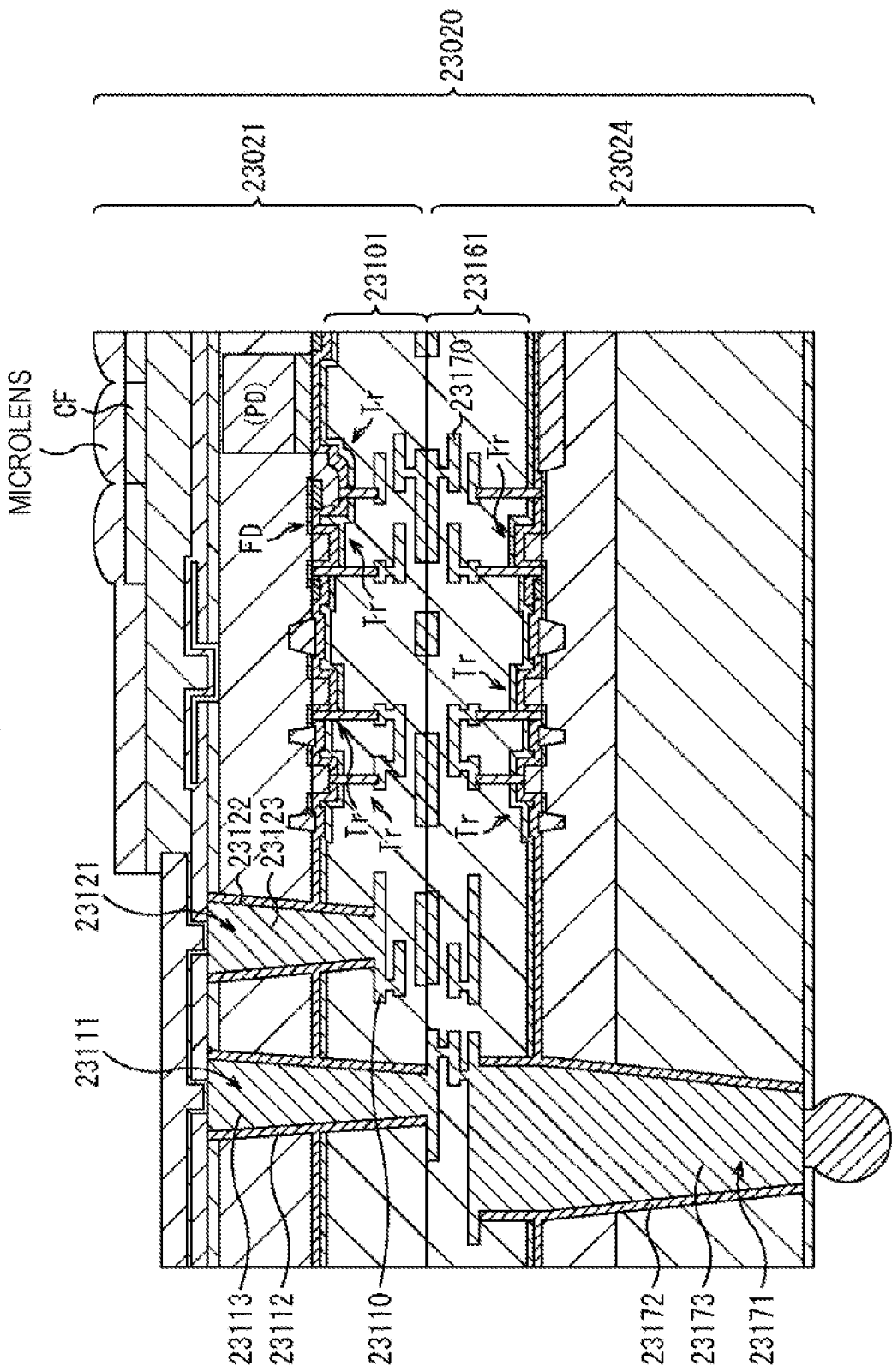
FIG. 77 is a sectional view showing a third configuration example of the stacked-type solid-state imaging device 23020.

FIG. 77 is a sectional view showing a third configuration example of the stacked-type solid-state imaging device 23020.

The solid-state imaging device 23020 shown in FIG. 77 does not include the film 23191 such as a protective film on the surface where the sensor die 23021 and the logic die 23024 are bonded to each other, and thus, is different from the configuration shown in FIG. 75 in which the film 23191 such as a protective film is formed in the surface where the sensor die 23021 and the logic die 23024 are bonded to each other.

The solid-state imaging device 23020 shown in FIG. 77 is formed in the manner described below. Specifically, the sensor die 23021 and the logic die 23024 are superimposed on each other such that the wires 23110 and 23170 are in direct contact with each other. Then, the wires 23110 and 23170 are directly joined with each other by heating the wires 23110 and 23170 while applying a necessary pressure.

Figure 78:
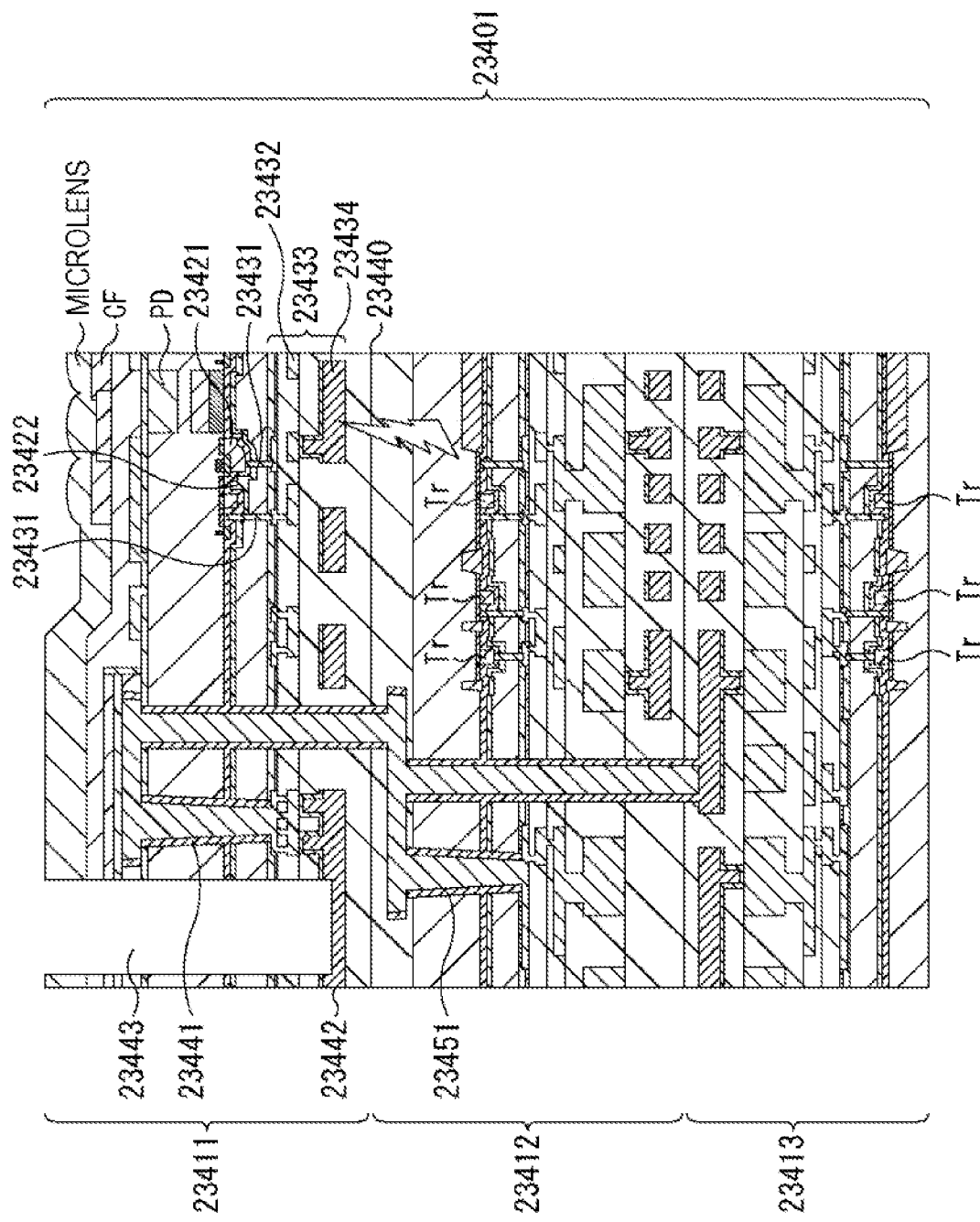
FIG. 78 is a sectional view showing another configuration example of the stacked-type solid-state imaging device to which the technology according to the present disclosure can be applied.

FIG. 78 is a sectional view showing another configuration example of the stacked-type solid-state imaging device to which the technology according to the present disclosure can be applied.

In FIG. 78, a solid-state imaging device 23401 has a three-layer stack structure in which three dies, that is, a sensor die 23411, a logic die 23412, and a memory die 23413, are stacked.

The memory die 23413 includes a memory circuit that stores data temporarily necessary in signal processing performed in the logic die 23412, for example.

In FIG. 78, the logic die 23412 and the memory die 23413 are stacked in this order below the sensor die 23411. However, the logic die 23412 and the memory die 23413 may be stacked below the sensor die 23411 in inverse order, i.e., in the order of the memory die 23413 and the logic die 23412.

Note that, in FIG. 78, a PD that serves as a photoelectric conversion section of the pixel and source/drain regions of pixel Trs are formed in the sensor die 23411.

A gate electrode is formed around the PD via a gate insulating film, and a pixel Tr 23421 and a pixel Tr 23422 are formed by the gate electrode and the paired source/drain regions.

The pixel Tr 23421 adjacent to the PD serves as a transfer Tr, and one of the paired source and drain regions that constitute the pixel Tr 23421 serves as an FD.

Further, an interlayer insulating film is formed in the sensor die 23411, and a connection hole is formed in the interlayer insulating film. In the connection hole, connection conductors 23431 connected to the pixel Tr 23421 and the pixel Tr 23422 are formed.

Further, the sensor die 23411 is provided with a wiring layer 23433 having a plurality of layers of wires 23432 connected to the respective connection conductors 23431.

Moreover, an aluminum pad 23434 serving as an electrode for external connection is formed on the lowermost layer of the wiring layer 23433 of the sensor die 23411. That is, in the sensor die 23411, the aluminum pad 23434 is formed at a position closer to a bonding surface 23440 with the logic die 23412 with respect to the wires 23432. The aluminum pad 23434 is used as one end of a wire involved with input/output of signals into/from outside.

Further, the sensor die 23411 is formed with a contact 23441 used for electrical connection with the logic die 23412. The contact 23441 is connected to a contact 23451 of the logic die 23412 and also connected to an aluminum pad 23442 of the sensor die 23411.

Further, the sensor die 23411 is formed with a pad hole 23443 that reaches the aluminum pad 23442 from the back surface side (upper side) of the sensor die 23411.

The technology according to the present disclosure can be applied to the solid-state imaging device as described above.

<Example of Application to Internal Information Acquisition System>

The technology according to the present disclosure (present technology) can be applied to various products. For example, the technology according to the present disclosure may be applied to an endoscopic surgery system.

Figure 79:
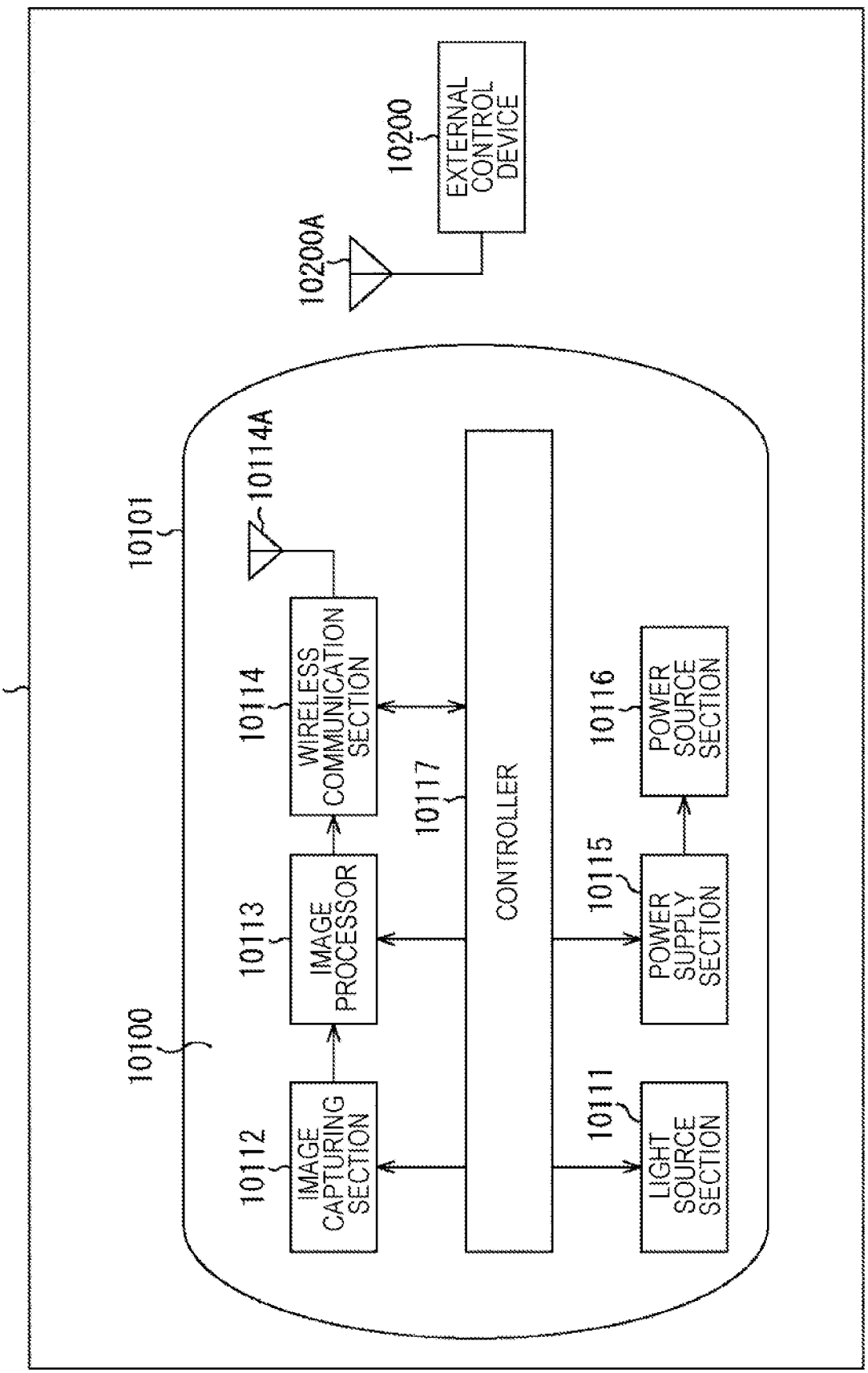
FIG. 79 is a block diagram showing an example of a schematic configuration of an internal information acquisition system.

FIG. 79 is a block diagram showing an example of a schematic configuration of a system for acquiring internal information of a patient using an endoscopic capsule, to which the technology (the present technology) according to the present disclosure may be applied.

An internal information acquisition system 10001 includes an endoscopic capsule 10100 and an external control device 10200.

The endoscopic capsule 10100 is swallowed by a patient during an inspection. The endoscopic capsule 10100 has an image capture function and a wireless communication function. The endoscopic capsule 10100 sequentially captures images (hereinafter also referred to as internal images) of the interior of organs such as the stomach and the intestines at predetermined intervals, and sequentially transmits information regarding the internal images to the external control device 10200 outside the body in a wireless manner, while moving through the interior of the relevant organs by peristaltic movement or the like until being excreted naturally from the patient.

The external control device 10200 centrally controls the operation of the internal information acquisition system 10001. Further, the external control device 10200 receives information about the internal images transmitted from the endoscopic capsule 10100, and generates image data for displaying the internal images on a display device (not illustrated) on the basis of the received information about the internal images.

In this way, with the internal information acquisition system 10001, images indicating the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source section 10111, an image capturing section 10112, an image processor 10113, a wireless communication section 10114, a power supply section 10115, a power source section 10116, and a controller 10117 which are housed in the capsule-shaped housing 10101.

The light source section 10111 includes a light source such as a light-emitting diode (LED), for example, and irradiates the imaging field of the image capturing section 10112 with light.

The image capturing section 10112 includes an imaging element, and an optical system including multiple lenses provided in front of the imaging element. Reflected light (hereinafter referred to as observation light) of light emitted toward a body tissue which is an observation target is condensed by the optical system and enters the imaging element. The image capturing section 10112 photoelectrically converts the observation light entering the imaging element, and generates an image signal corresponding to the observation light. The image signal generated by the image capturing section 10112 is provided to the image processor 10113.

The image processor 10113 includes a processor such as a central processing unit (CPU) or a graphics processing unit (GPU), and performs various kinds of signal processing on the image signal generated by the image capturing section 10112. The image processor 10113 provides the image signal subjected to signal processing to the wireless communication section 10114 as RAW data.

The wireless communication section 10114 performs a predetermined process such as a modulation process on the image signal that has been subjected to signal processing by the image processor 10113, and transmits the resultant image signal to the external control device 10200 via an antenna 10114A. In addition, the wireless communication section 10114 receives, from the external control device 10200, a control signal related to drive control of the endoscopic capsule 10100 via the antenna 10114A. The wireless communication section 10114 provides the control signal received from the external control device 10200 to the controller 10117.

The power supply section 10115 includes an antenna coil for receiving power, a power regeneration circuit for regenerating power from a current produced in the antenna coil, a booster circuit, and the like. In the power supply section 10115, the principle of what is called contactless charging is used to generate power.

The power source section 10116 includes a secondary battery, and stores power generated by the power supply section 10115. Although arrows or the like indicating the destination to which power from the power source section 10116 is supplied are not illustrated in FIG. 79 for preventing the illustration from being complex, power stored in the power source section 10116 is supplied to the light source section 10111, the image capturing section 10112, the image processor 10113, the wireless communication section 10114, and the controller 10117, and may be used to drive these sections.

The controller 10117 includes a processor such as a CPU, and appropriately controls drives of the light source section 10111, the image capturing section 10112, the image processor 10113, the wireless communication section 10114, and the power supply section 10115 in accordance with a control signal transmitted from the external control device 10200.

The external control device 10200 may be a processor such as a CPU or GPU, or a device such as a microcomputer or a control board on which a processor and a storage element such as a memory are mounted. The external control device 10200 controls the operation of the endoscopic capsule 10100 by transmitting a control signal to the controller 10117 of the endoscopic capsule 10100 via an antenna 10200A. In the endoscopic capsule 10100, for example, a light irradiation condition under which the light source section 10111 irradiates an observation target with light may be changed by a control signal from the external control device 10200. In addition, an image capturing condition (such as a frame rate and an exposure level in the image capturing section 10112, for example) may be changed by a control signal from the external control device 10200. In addition, the content of processing in the image processor 10113 and a condition (such as a transmission interval and the number of images to transmit, for example) under which the wireless communication section 10114 transmits the image signal may be changed by a control signal from the external control device 10200.

In addition, the external control device 10200 performs various types of image processing on the image signal transmitted from the endoscopic capsule 10100, and generates image data for displaying a captured internal image on a display device. As the image processing, various known signal processing may be performed, such as a development process (demosaicing process), an image quality-improving process (such as a band enhancement process, a super-resolution process, a noise reduction (NR) process, and/or a shake correction process), an enlargement process (electronic zoom process), and/or the like. The external control device 10200 controls the drive of the display device, and causes the display device to display a captured internal image on the basis of the generated image data. Alternatively, the external control device 10200 may also cause a recording device (not shown) to record the generated image data, or cause a printing device (not shown) to make a printout of the generated image data.

An example of the internal information acquisition system to which the technology according to the present disclosure can be applied has been described above. The technology according to the present disclosure can be applied to the image capturing section 10112 in the configuration described above.

<Example of Application to Mobile Object>

The technology according to the present disclosure (present technology) can be applied to various products. For example, the technology according to the present disclosure may be implemented as a device to be mounted on any type of mobile objects such as vehicles, electric vehicles, hybrid electric vehicles, motorcycles, bicycles, personal mobilities, airplanes, drones, ships, and robots.

Figure 80:
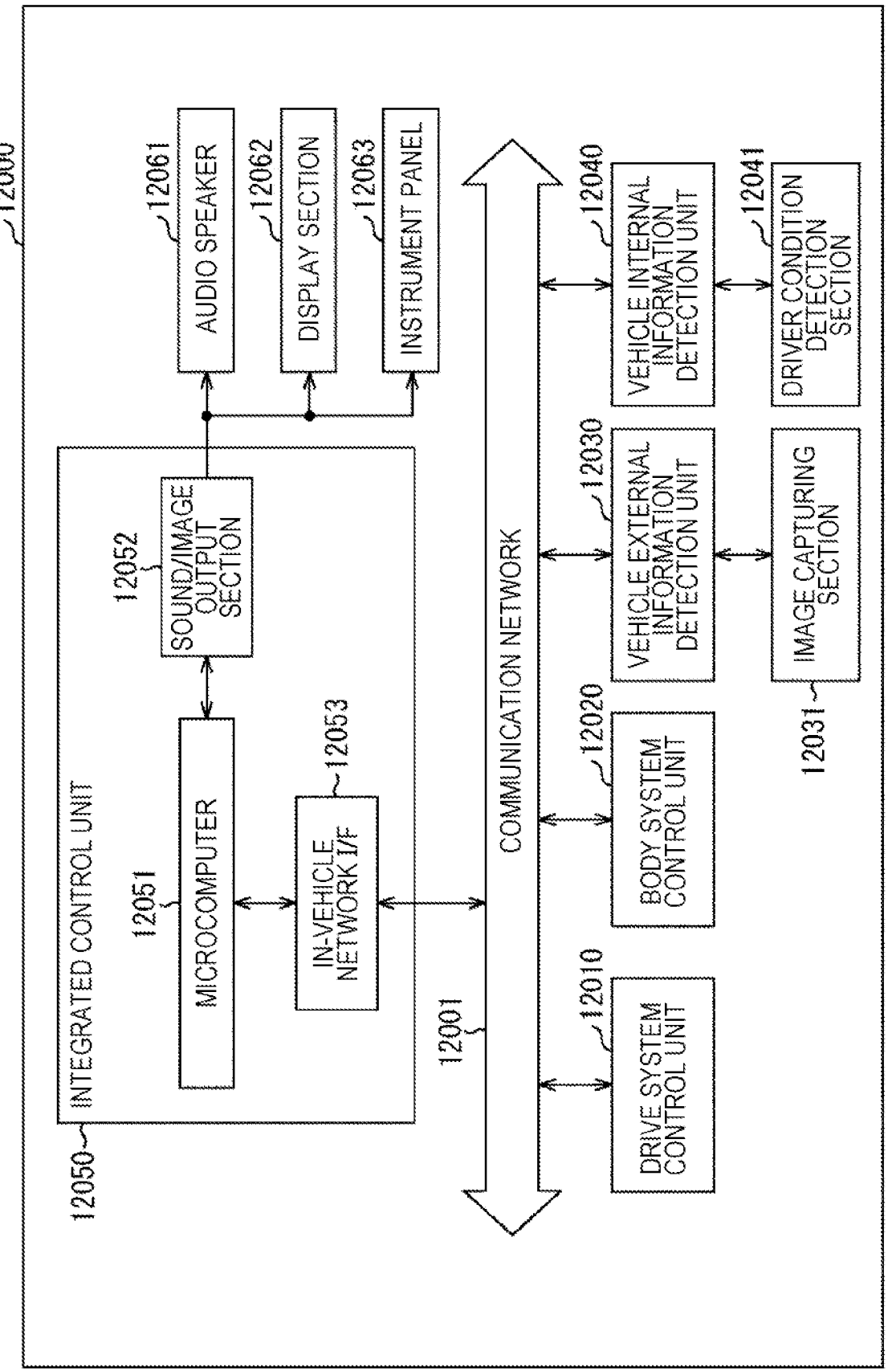
FIG. 80 is a block diagram showing an example of a schematic configuration of a vehicle control system.

FIG. 80 is a block diagram showing a schematic configuration example of a vehicle control system which is an example of a mobile object control system to which the technology according to the present disclosure can be applied.

The vehicle control system 12000 includes a plurality of electronic control units connected to each other via a communication network 12001. In the example shown in FIG. 80, the vehicle control system 12000 includes a drive system control unit 12010, a body system control unit 12020, a vehicle external information detection unit 12030, a vehicle internal information detection unit 12040, and an integrated control unit 12050. Further, as the functional configuration of the integrated control unit 12050, a microcomputer 12051, a sound/image output section 12052, and an in-vehicle network interface (I/F) 12053 are illustrated.

The drive system control unit 12010 controls the operation of devices related to a drive system of a vehicle according to various programs. For example, the drive system control unit 12010 functions as a control device over a driving force generating device such as an internal combustion engine or a driving motor for generating a driving force of the vehicle, a driving force transmission mechanism for transmitting the driving force to wheels, a steering mechanism for adjusting a steering angle of the vehicle, a braking device that generates a braking force of the vehicle, and the like.

The body system control unit 12020 controls operations of various devices mounted on the vehicle body according to various programs. For example, the body system control unit 12020 functions as a keyless entry system, a smart key system, a power window device, or a control device for various lamps such as a headlamp, a backup lamp, a brake lamp, a blinker, or a fog lamp. In this case, the body system control unit 12020 can receive radio waves transmitted from a portable device that can be used as a key or signals from various switches. The body system control unit 12020 receives input of these radio waves or signals, and controls a door lock device, power window device, lamps, and the like of the vehicle.

The vehicle external information detection unit 12030 detects information regarding the outside of the vehicle equipped with the vehicle control system 12000. For example, the vehicle external information detection unit 12030 is connected with an image capturing section 12031. The vehicle external information detection unit 12030 causes the image capturing section 12031 to capture an image outside the vehicle, and receives the captured image data. The vehicle external information detection unit 12030 may perform, on the basis of the received image, a process of detecting an object such as a person, a vehicle, an obstacle, a road sign, or a character on a road surface, or a process of detecting the distance thereto.

The image capturing section 12031 is an optical sensor that receives light and outputs an electric signal corresponding to the amount of received light. The image capturing section 12031 can output an electric signal as an image or as information for distance measurement. Further, the light received by the image capturing section 12031 may be visible light or invisible light such as infrared rays.

The vehicle internal information detection unit 12040 detects information regarding the inside of the vehicle. For example, the vehicle internal information detection unit 12040 is connected with a driver condition detection section 12041 that detects a condition of a driver. The driver condition detection section 12041 may include, for example, a camera that captures an image of the driver. On the basis of detection information input from the driver condition detection section 12041, the vehicle internal information detection unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside and outside of the vehicle obtained by the vehicle external information detection unit 12030 or the vehicle internal information detection unit 12040, and output a control command to the drive system control unit 12010. For example, the microcomputer 12051 may perform cooperative control intended to implement functions of an advanced driver assistance system (ADAS) which include collision avoidance or shock mitigation for the vehicle, following driving based on distance between vehicles, vehicle speed maintaining driving, a warning of collision of the vehicle, a warning of lane departure of the vehicle, or the like.

In addition, the microcomputer 12051 may perform cooperative control intended for automatic driving, which makes the vehicle to travel autonomously without the need of the operation of the driver, or the like, by controlling the driving force generating device, the steering mechanism, the braking device, or the like on the basis of the information about the surrounding situation of the vehicle obtained by the vehicle external information detection unit 12030 or the vehicle internal information detection unit 12040.

Further, the microcomputer 12051 can output a control command to the body system control unit 12020 on the basis of information about the outside of the vehicle acquired by the vehicle external information detection unit 12030. For example, the microcomputer 12051 may perform cooperative control including controlling the head lamps on the basis of the location of a preceding vehicle or an oncoming vehicle detected by the vehicle external information detection unit 12030 and changing high beams to low beams, for example, for the purpose of anti-glare.

The sound/image output section 12052 transmits at least one of a sound output signal and an image output signal to an output device, which is capable of notifying a passenger of the vehicle or a person outside the vehicle of information visually or auditorily. In the example in FIG. 80, an audio speaker 12061, a display section 12062, and an instrument panel 12063 are shown as examples of the output devices. For example, the display section 12062 may include at least one of an on-board display and a head-up display.

Figure 81:
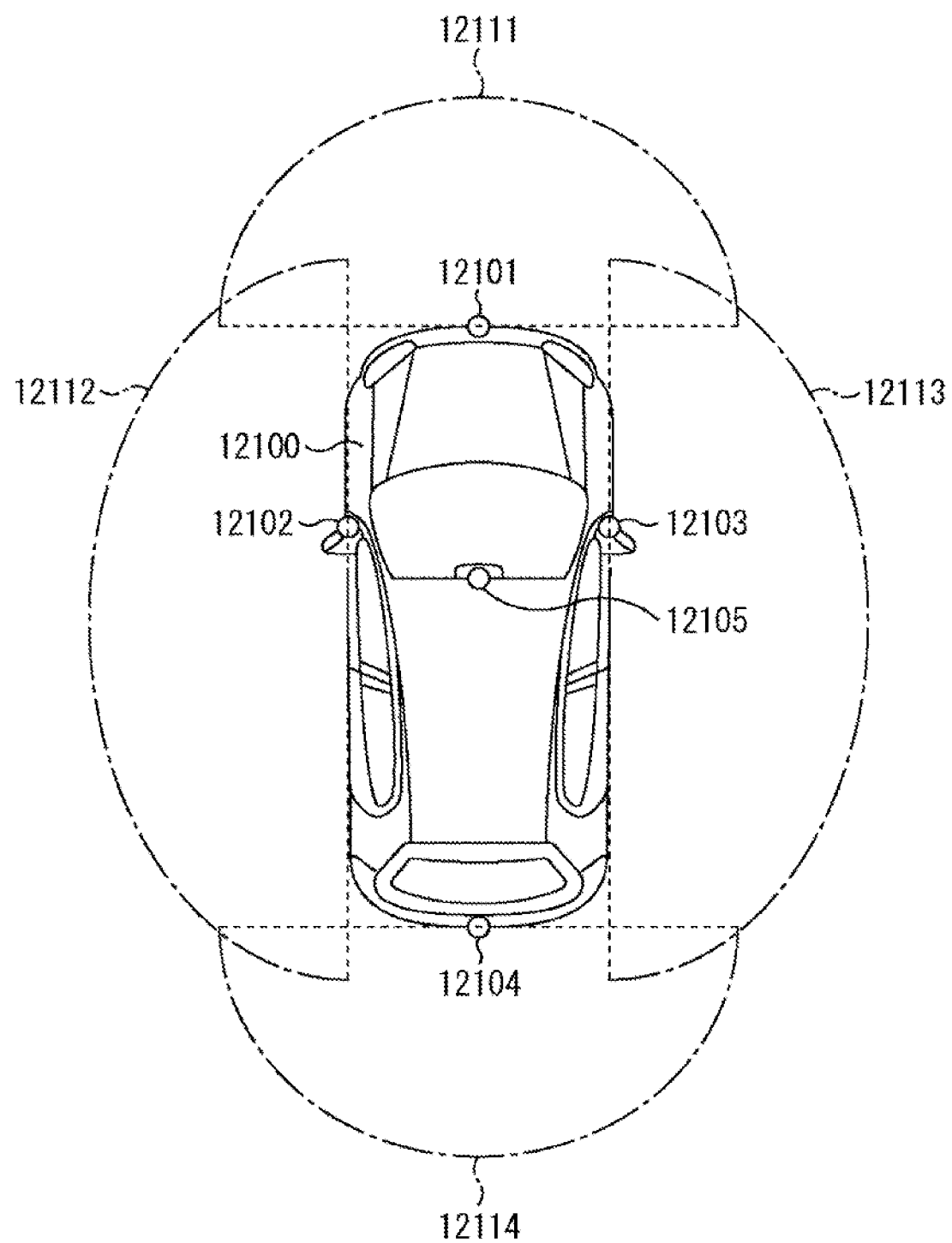
FIG. 81 is an explanatory view showing an example of mounting positions of a vehicle external information detection section and image capturing sections.

FIG. 81 is a diagram showing examples of mounting positions of the image capturing sections 12031.

In FIG. 81, a vehicle 12100 includes, as the image capturing sections 12031, image capturing sections 12101, 12102, 12103, 12104, and 12105.

For example, the image capturing sections 12101, 12102, 12103, 12104, and 12105 are provided at positions such as the front nose, the side-view mirrors, the rear bumper or the back door, and an upper part of the windshield in the cabin of the vehicle 12100. Each of the image capturing section 12101 on the front nose and the image capturing section 12105 on the upper part of the windshield in the cabin mainly obtains an image of an environment in front of the vehicle 12100. The image capturing sections 12102 and 12103 on the side-view mirrors mainly obtain an image of an environment on the side of the vehicle 12100. The image capturing section 12104 provided in the rear bumper or the back door mainly obtains an image of an environment behind the vehicle 12100. The images of the environment in front of the vehicle obtained by the image capturing sections 12101 and 12105 are mainly used for detecting a preceding vehicle, a pedestrian, an obstacle, a traffic light, a traffic sign, a lane, or the like.

Note that FIG. 81 shows examples of photographing ranges of the image capturing sections 12101 to 12104. The imaging range 12111 indicates the imaging range of the image capturing section 12101 on the front nose, the imaging ranges 12112 and 12113 indicate the imaging ranges of the image capturing sections 12102 and 12103 on the side-view mirrors, respectively, and the imaging range 12114 indicates the imaging range of the image capturing section 12104 on the rear bumper or the back door. For example, a bird's-eye image of the vehicle 12100 as viewed from above can be obtained by superimposing image data captured by the image capturing sections 12101 to 12104.

At least one of the image capturing sections 12101 to 12104 may have a function of obtaining distance information. For example, at least one of the image capturing sections 12101 to 12104 may be a stereo camera including a plurality of imaging elements or an imaging element including pixels for phase difference detection.

For example, the microcomputer 12051 obtains the distance between the vehicle 12100 and each three-dimensional object in the imaging ranges 12111 to 12114 and the temporal change (relative speed to the vehicle 12100) of the distance on the basis of the distance information obtained from the image capturing sections 12101 to 12104, and may extract, as a preceding vehicle, especially a three-dimensional object which is the closest to the vehicle 12100 on the path on which the vehicle 12100 is traveling and which is traveling at a predetermined speed (e.g., 0 km/h or more) in the direction substantially the same as the traveling direction of the vehicle 12100. Further, the microcomputer 12051 may perform autobrake control (including follow-up stop control), automatic acceleration control (including follow-up start-driving control), and the like by presetting a distance to be secured between the vehicle 12100 and a preceding vehicle. In this way, it is possible to perform cooperative control intended to achieve autonomous driving without the need of drivers' operations, and the like.

For example, the microcomputer 12051 may sort three-dimensional object data of three-dimensional objects into motorcycles, standard-size vehicles, large-size vehicles, pedestrians, and the other three-dimensional objects such as utility poles on the basis of the distance information obtained from the image capturing sections 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is equal to or higher than a preset value and thus there is a possibility of collision, the microcomputer 12051 may perform driving assistance to avoid a collision by outputting a warning to the driver via the audio speaker 12061 or the display section 12062, or by forcibly reducing the speed or performing collision-avoidance steering via the drive system control unit 12010.

At least one of the image capturing sections 12101 to 12104 may be an infrared camera that detects infrared light. For example, the microcomputer 12051 may recognize a pedestrian by determining whether or not images captured by the image capturing sections 12101 to 12104 include the pedestrian. The method of recognizing a pedestrian includes, for example, a step of extracting feature points in the images captured by the image capturing sections 12101 to 12104 being infrared cameras, and a step of performing a pattern matching process with respect to a series of feature points indicating an outline of an object, to thereby determine whether or not the object is a pedestrian. When the microcomputer 12051 determines that the images captured by the image capturing sections 12101 to 12104 include a pedestrian and recognizes the pedestrian, the sound/image output section 12052 controls the display section 12062 such that a rectangular contour is displayed overlaid on the recognized pedestrian to emphasize the pedestrian. Further, the sound/image output section 12052 may control the display section 12062 such that an icon or the like indicating a pedestrian is displayed at a desired position.

An example of the vehicle control system to which the technology according to the present disclosure can be applied has been described above. The technology according to the present disclosure can be applied to the image capturing section 12031 and the like in the configuration described above.

It should be noted that the embodiments of the present technology are not limited to the abovementioned embodiments, and various modifications can be made without departing from the gist of the present technology.

The present technology may also have the following configurations.

(1)

A solid-state imaging device including:

a photoelectric conversion section that performs photoelectric conversion;

a charge retaining section that temporarily retains electric charge converted by the photoelectric conversion section; and a first trench formed in a semiconductor substrate between the photoelectric conversion section and the charge retaining section, the first trench being higher than the photoelectric conversion section in a depth direction of the semiconductor substrate.

(2)

The solid-state imaging device according to (1) described above, in which the first trench is higher than the charge retaining section in the depth direction of the semiconductor substrate.

(3)

The solid-state imaging device according to (1) described above, in which the first trench is lower than the charge retaining section in the depth direction of the semiconductor substrate.

(4)

The solid-state imaging device according to any one of (1) to (3) described above, further including an N+ diffusion layer that receives electric charge when the photoelectric conversion section is saturated.

(5)

The solid-state imaging device according to any one of (1) to (4) described above, further including a read gate that reads electric charge from the photoelectric conversion section, in which the read gate is formed to extend in a vertical direction and in a horizontal direction with respect to the photoelectric conversion section.

(6)

The solid-state imaging device according to (5) described above, further including a transfer gate that transfers the electric charge read by the read gate to the charge retaining section.

(7)

The solid-state imaging device according to any one of (1) to (6) described above, further including:

a second trench formed in each of pixels adjacent to each other, the second trench penetrating the semiconductor substrate in the depth direction; and a PN junction region that is formed on a sidewall of the second trench and that includes a P-type region and an N-type region.

(8)

The solid-state imaging device according to (7) described above, in which the second trench is formed in a device isolation region.

(9)

The solid-state imaging device according to (7) described above, in which the first trench and the second trench are filled with a material that shields light.

(10)

The solid-state imaging device according to (1) described above, in which the first trench is formed at a position parallel to a long side of the charge retaining section.

(11)

An electronic apparatus equipped with a solid-state imaging device, the solid-state imaging device including:

a photoelectric conversion section that performs photoelectric conversion;

a charge retaining section that temporarily retains electric charge converted by the photoelectric conversion section; and a first trench formed in a semiconductor substrate between the photoelectric conversion section and the charge retaining section, the first trench being higher than the photoelectric conversion section in a depth direction of the semiconductor substrate.

(12)

A solid-state imaging device including:

a photoelectric conversion section that performs photoelectric conversion;

a charge retaining section that temporarily retains electric charge converted by the photoelectric conversion section; and a first trench formed in a semiconductor substrate between the photoelectric conversion section and the charge retaining section, the first trench being lower than the photoelectric conversion section and higher than the charge retaining section in a depth direction of the semiconductor substrate.

(13)

The solid-state imaging device according to (12) described above, further including an N+ diffusion layer that receives electric charge when the photoelectric conversion section is saturated.

(14)

The solid-state imaging device according to (13) described above, in which the N+ diffusion layer is formed between the photoelectric conversion section and the charge retaining section.

(15)

The solid-state imaging device according to (13) described above, in which the N+ diffusion layer and the photoelectric conversion section are formed at positions distant from each other by 0.2 μm to 1.0 μm.

(16)

The solid-state imaging device according to any one of (12) to (15) described above, further including a write gate that writes the electric charge converted by the photoelectric conversion section to the charge retaining section, in which the write gate is formed to extend in a vertical direction and in a horizontal direction with respect to the charge retaining section.

(17)

The solid-state imaging device according to any one of (12) to (16) described above, further including:

a second trench formed in each of pixels adjacent to each other, the second trench penetrating the semiconductor substrate in the depth direction; and a PN junction region that is formed on a sidewall of the second trench and that includes a P-type region and an N-type region.

(18)

The solid-state imaging device according to (17) described above, in which the second trench is formed in a device isolation region.

(19)

The solid-state imaging device according to (17) described above, in which the first trench and the second trench are filled with a material that shields light.

(20)

An electronic apparatus equipped with a solid-state imaging device, the solid-state imaging device including:

a photoelectric conversion section that performs photoelectric conversion;

a charge retaining section that temporarily retains electric charge converted by the photoelectric conversion section; and a first trench formed in a semiconductor substrate between the photoelectric conversion section and the charge retaining section, the first trench being lower than the photoelectric conversion section and higher than the charge retaining section in a depth direction of the semiconductor substrate.

REFERENCE SIGNS LIST

10 Imaging device
12 Imaging element
41 Pixel array section
50 Pixel
70 Si substrate
71 PD
72 P-type region
74 Light-shielding film
76 OCL
77 Active region
75 Backside Si interface
78 STI
81 Vertical transistor trench
82 DTI
83 P-type solid-phase diffusion layer
84 N-type solid-phase diffusion layer
85 Sidewall film
86 filler
101 film
121 P-type region
122 N-type region
131 MOS capacitor
151 Well contact section
152 Contact
153 Cu wire
211 Memory
213 Read gate
214 Vertical transistor trench
216 Write gate
217 Vertical transistor trench
219 Vertical transistor trench
220 Read gate
222 N+ diffusion layer
224 Gate oxide film
231 Well contact section
232 FD wire
241 FD wire
242 Polysilicon
261 Transfer gate
271 Transfer gate
272 N+ diffusion layer
273 Drain discharge section
275 Light-shielding film
281 Memory gate
291 Read gate
292 Amplifier gate
293 Diffusion layer
301 Light-shielding film
305 Light-shielding material
308 Hollow section
501 AL pad extraction section
502 AL pad
503 Solid-phase diffusion trench
511 Peripheral circuit section
512 P+ diffusion layer
513 Pwell region
514 Backside contact
515 Hole layer
521 Peripheral circuit section
532 Pwell region
571 Peripheral circuit section
572 Boundary section
612 Conversion efficiency switching transistor
613 MOS capacitor

What is claimed is:

1. A solid-state imaging device, comprising:
a photoelectric conversion section that performs photoelectric conversion;
a charge retaining section that temporarily retains electric charge converted by the photoelectric conversion section; and dual first trenches formed in a semiconductor substrate between the photoelectric conversion section and the charge retaining section, wherein the dual first trenches are higher than the photoelectric conversion section in a depth direction of the semiconductor substrate, and wherein the dual first trenches are lower than the charge retaining section in the depth direction of the semiconductor substrate.

2. The solid-state imaging device according to claim 1, further comprising a read gate that reads electric charge from the photoelectric conversion section, wherein the read gate is formed to extend in a vertical direction and in a horizontal direction with respect to the photoelectric conversion section.

3. The solid-state imaging device according to claim 2, further comprising a transfer gate that transfers the electric charge read by the read gate to the charge retaining section.

4. The solid-state imaging device according to claim 1, further comprising:

a second trench formed in each of pixels adjacent to each other, the second trench penetrating the semiconductor substrate in the depth direction; and a PN junction region that is formed on a sidewall of the second trench and that includes a P-type region and an N-type region.

5. The solid-state imaging device according to claim 4, wherein the second trench is formed in a device isolation region.

6. The solid-state imaging device according to claim 4, wherein the dual first trenches and the second trench are filled with a material that shields light.

7. The solid-state imaging device according to claim 1, wherein the dual first trenches are formed at a position parallel to a long side of the charge retaining section.

8. The solid-state imaging device according to claim 1, wherein each trench of the dual first trenches has a same configuration or a different configuration as the other trench of the dual first trenches.

9. An electronic apparatus, comprising:

an optical system;

a solid-state imaging device that receives light from the optical system, the solid-state imaging device including:

a photoelectric conversion section that performs photoelectric conversion;

a charge retaining section that temporarily retains electric charge converted by the photoelectric conversion section; and dual first trenches formed in a semiconductor substrate between the photoelectric conversion section and the charge retaining section, wherein the dual first trenches are higher than the photoelectric conversion section in a depth direction of the semiconductor substrate, and wherein the dual first trenches are lower than the charge retaining section in the depth direction of the semiconductor substrate; and a digital signal processor that processes signals received from the solid-state imaging device.

10. The electronic apparatus according to claim 9, further comprising a read gate that reads electric charge from the photoelectric conversion section, wherein the read gate is formed to extend in a vertical direction and in a horizontal direction with respect to the photoelectric conversion section.

11. The electronic apparatus according to claim 10, further comprising a transfer gate that transfers the electric charge read by the read gate to the charge retaining section.

12. The electronic apparatus according to claim 9, further comprising:

a second trench formed in each of pixels adjacent to each other, the second trench penetrating the semiconductor substrate in the depth direction; and a PN junction region that is formed on a sidewall of the second trench and that includes a P-type region and an N-type region.

13. The electronic apparatus according to claim 12, wherein the second trench is formed in a device isolation region.

14. The electronic apparatus according to claim 12, wherein the dual first trenches and the second trench are filled with a material that shields light.

15. The electronic apparatus according to claim 9, wherein the dual first trenches are formed at a position parallel to a long side of the charge retaining section.

16. The electronic apparatus according to claim 9, wherein each trench of the dual first trenches has a same configuration or a different configuration as the other trench of the dual first trenches.

* * * * *